United States Patent
Lee et al.

(10) Patent No.: US 8,952,543 B2
(45) Date of Patent: Feb. 10, 2015

(54) VIA CONNECTION STRUCTURES, SEMICONDUCTOR DEVICES HAVING THE SAME, AND METHODS OF FABRICATING THE STRUCTURES AND DEVICES

(71) Applicants: Ho-Jin Lee, Seoul (KR); Pil-Kyu Kang, Anyang-si (KR); Kyu-Ha Lee, Yongin-si (KR); Byung-Lyul Park, Seoul (KR); Hyun-Soo Chung, Hwaseong-si (KR); Gil-Heyun Choi, Seoul (KR)

(72) Inventors: Ho-Jin Lee, Seoul (KR); Pil-Kyu Kang, Anyang-si (KR); Kyu-Ha Lee, Yongin-si (KR); Byung-Lyul Park, Seoul (KR); Hyun-Soo Chung, Hwaseong-si (KR); Gil-Heyun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 13/718,580

(22) Filed: Dec. 18, 2012

(65) Prior Publication Data
US 2013/0200525 A1 Aug. 8, 2013

(51) Int. Cl.
*H01L 23/48* (2006.01)
*H01L 21/768* (2006.01)
*H01L 23/00* (2006.01)

(52) U.S. Cl.
CPC ........ *H01L 23/481* (2013.01); *H01L 21/76898* (2013.01); *H01L 24/05* (2013.01); *H01L 2224/05027* (2013.01); *H01L 24/13* (2013.01); *H01L 24/16* (2013.01); *H01L 2224/13111* (2013.01); *H01L 2224/13139* (2013.01); *H01L 2224/13147* (2013.01); *H01L 2224/05568* (2013.01); *H01L 2224/05024* (2013.01); *H01L 2224/05* (2013.01); *H01L 2224/02372* (2013.01); *H01L 2224/06181* (2013.01); *H01L 2224/16145* (2013.01)
USPC .......... 257/774; 257/762; 257/763; 257/765; 257/784; 257/751; 438/687; 438/627; 438/643; 438/653

(58) Field of Classification Search
CPC ..................................... H01L 23/48
USPC ................. 257/774, 762, 763, 765, 784, 751; 438/687, 627, 643, 653
See application file for complete search history.

(56) References Cited

U.S. PATENT DOCUMENTS

| | | | |
|---|---|---|---|
| 6,400,031 B1 * | 6/2002 | Harada ................. | 257/776 |
| 6,642,081 B1 | 11/2003 | Patti | |
| 6,731,007 B1 * | 5/2004 | Saito et al. ............. | 257/762 |
| 6,902,987 B1 | 6/2005 | Tong et al. | |
| 6,916,725 B2 | 7/2005 | Yamaguchi | |
| 6,962,835 B2 | 11/2005 | Tong et al. | |
| 7,446,424 B2 * | 11/2008 | Lu et al. ................ | 257/783 |
| 7,767,544 B2 | 8/2010 | Borthakur | |
| 7,928,534 B2 | 4/2011 | Hsu et al. | |
| 7,932,179 B2 | 4/2011 | Oliver et al. | |
| 2002/0171147 A1 * | 11/2002 | Yew et al. ............. | 257/751 |
| 2008/0258309 A1 * | 10/2008 | Chiou et al. ........... | 257/774 |
| 2010/0200961 A1 * | 8/2010 | Chauhan ................ | 257/621 |
| 2010/0233850 A1 | 9/2010 | Patti et al. | |

* cited by examiner

*Primary Examiner* — Thao X Le
*Assistant Examiner* — Sheng Zhu

(57) ABSTRACT

A semiconductor device including a lower layer, an insulating layer on a first side of the lower layer, an interconnection structure in the insulating layer, a via structure in the lower layer. The via structure protrudes into the insulating layer and the interconnection structure.

25 Claims, 98 Drawing Sheets

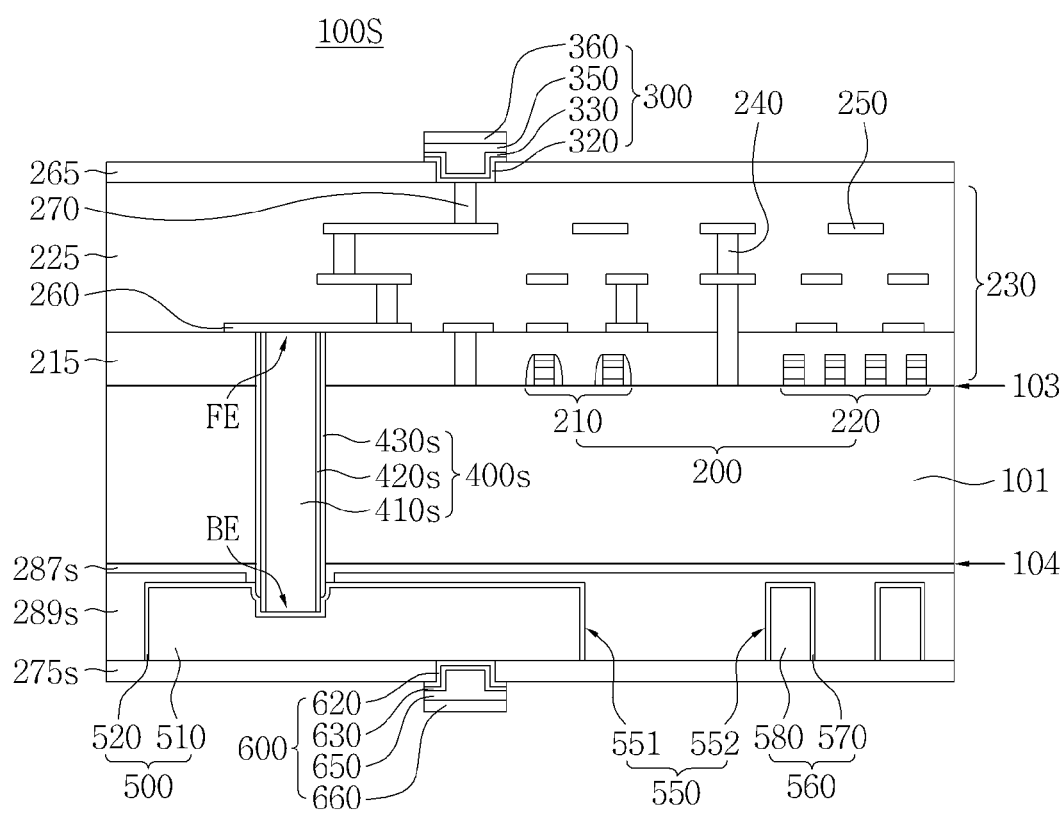

VIA CONNECTION STRUCTURES, SEMICONDUCTOR DEVICES HAVING THE SAME, AND METHODS OF FABRICATING THE STRUCTURES AND DEVICES

CROSS-REFERENCE TO RELATED APPLICATION

This application claims priority under 35 U.S.C. §119 to Korean Patent Application No. 10-2012-0010983 filed on Feb. 2, 2012, the disclosure of which is hereby incorporated by reference in its entirety.

BACKGROUND

1. Field

Embodiments of the inventive concepts relate to a via connection structure, a semiconductor device having the same, methods of fabricating the via connection structure and the semiconductor device, a stack structure of semiconductor devices, a module, an electronic system, and/or a wireless mobile phone.

2. Description of Related Art

Due to the increase in use of small-sized, lightweight, and thin communication apparatuses, such as mobile phones or tablet personal computers (PCs), research into high-integrated, high-speed semiconductor devices has been conducted. Thus, a stack-type semiconductor device having through-silicon vias (TSVs) has been proposed.

SUMMARY

At least one embodiment of the inventive concepts provides a via connection structure having a protruding via structure.

At least one embodiment of the inventive concepts provides a semiconductor device having a protruding through-silicon via (TSV) structure.

At least one embodiment of the inventive concepts provides also provide a stack structure of a semiconductor device having a protruding TSV structure.

At least one embodiment of the inventive concepts provides a semiconductor package including a semiconductor device having a protruding TSV structure.

At least one embodiment of the inventive concepts provides an electronic system including a semiconductor device having a protruding TSV structure.

At least one embodiment of the inventive concepts provides a via connection structure having an interconnection structure formed using a damascene process.

At least one embodiment of the inventive concepts provides a semiconductor device having a redistribution structure formed using a damascene process.

At least one embodiment of the inventive concepts provides a stack structure of a semiconductor device having a redistribution structure formed using a damascene process.

At least one embodiment of the inventive concepts provides a semiconductor package including a semiconductor device having a redistribution structure formed using a damascene process.

At least one embodiment of the inventive concepts provides an electronic system including a semiconductor device having a redistribution structure formed using a damascene process.

At least one embodiment of the inventive concepts provides a method of forming a via connection structure having a protruding via structure.

At least one embodiment of the inventive concepts provides a method of fabricating a semiconductor device having a protruding TSV structure.

At least one embodiment of the inventive concepts provides a method of forming a via connection structure having an interconnection structure formed using a damascene process.

At least one embodiment of the inventive concepts provides a method of fabricating a semiconductor device having a redistribution structure formed using a damascene process.

Aspects of the inventive concept should not be limited by the above description, and other unmentioned aspects will be clearly understood by one of ordinary skill in the art from example embodiments described herein.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
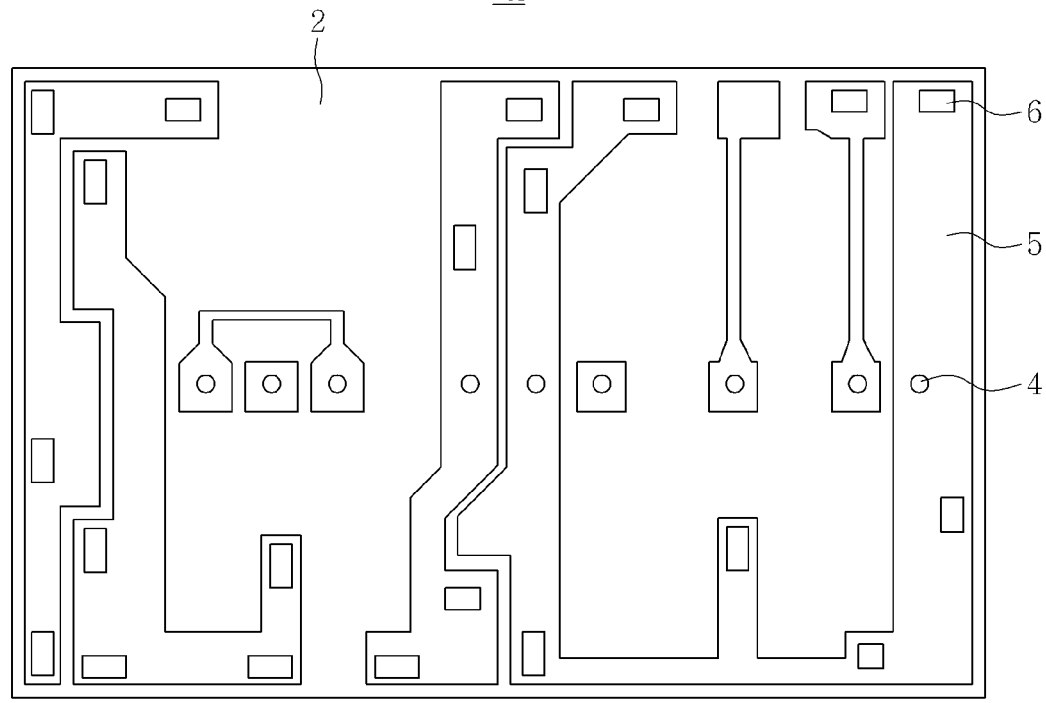
FIGS. 1A and 1B are conceptual layouts of surfaces of redistribution structures of semiconductor devices according to various embodiments of the inventive concepts.

The inventive concepts will now be described more fully hereinafter with reference to the accompanying drawings, in which exemplary embodiments of the inventive concepts are shown. This inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "below", "beneath", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the inventive concepts are described herein with reference to cross-section and/or plan illustrations that are schematic illustrations of idealized embodiments of the inventive concepts. As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concepts.

The same reference numerals are used to denote the same component throughout the specification. Thus, even if not mentioned or described in the corresponding drawing, the same reference numerals or similar reference numerals may be described with reference to other drawings. Also, even if no reference is used to denote a component, the component may be described with reference to other drawings.

Spatially relative terms, "front-side" and "back-side", may be used herein for ease of description to describe one element or feature's relationship to another element(s) or feature(s) as illustrated in the figures. It will be understood that the spatially relative terms, "front-side" and "back-side", are intended to encompass different orientations of the device in use or operation in addition to the orientation depicted in the figures. For example, the term "front-side" may be interpreted as the term "back-side", and the term "back-side" may be interpreted as the term "front-side". Thus, the term "front-side" may be expressed as "first", and the term "back-side" may be expressed as "second". Alternatively, the term "back-side" may be expressed as "first," and the term "front-side" may be expressed as "second". However, in one embodiment, the terms "front-side" and "back-side" should be interpreted as having different meanings.

In the present specification, a term "near" means that one of at least two elements having symmetrical concepts is disposed closer to another specific element than the other thereof. For example, when a first end is near to a first side, it will be understood that the first end is closer to the first side than a second end or the first end is closer to the first side than a second side.

Figure 1B:
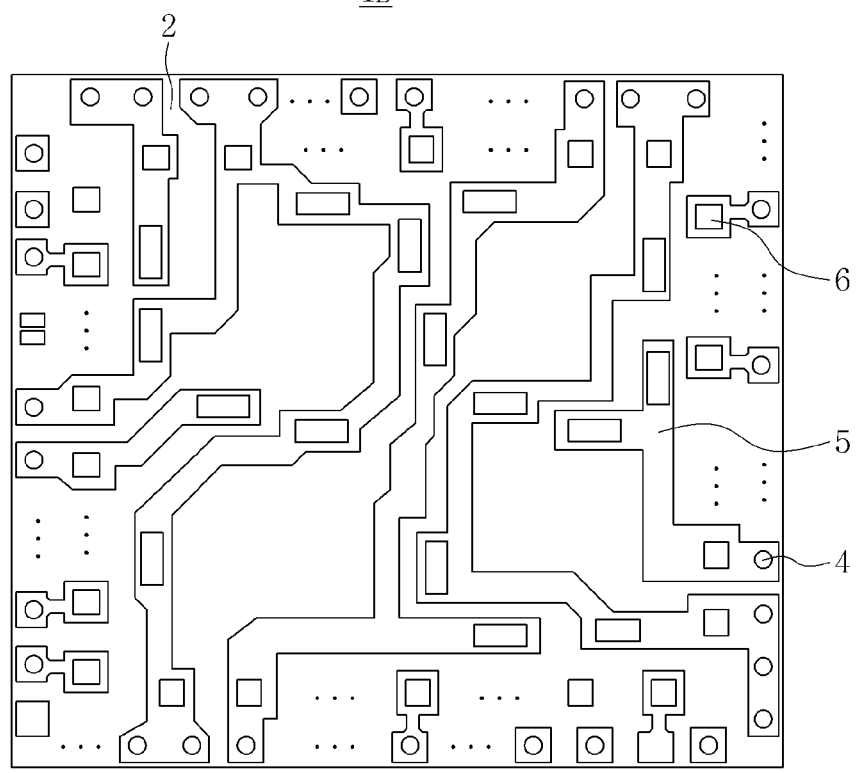

FIGS. 1A and 1B are conceptual layouts of surfaces of redistribution structures of semiconductor devices 1A and 1B according to various embodiments of the inventive concepts.

Referring to FIGS. 1A and 1B, each of the semiconductor devices 1A and 1B according to various embodiments of the inventive concepts may include exposed via structures 4, interconnection structures 5, and pads 6 disposed on a surface 2. The surface 2 may be covered with an insulating material, such as silicon nitride, silicon oxide, polyimide, photosensitive polyimide, benzocyclobutene (BCB), or other organic or inorganic polymers. The via structures 4, the interconnection structures 5, and the pads 6 will be described in more detail in other drawings. Referring back to FIG. 1A, the via structures 4 may be arranged in rows or columns in the center of the surface 2. The pads 6 may be arranged in various positions on the surface 2. The interconnection structures 5 may be variously disposed to electrically connect the via structures 4 or to electrically connect the via structure 4 and the pad 6. Referring back to FIG. 1B, the via structures 4 may be arranged in columns in an outer region of the surface 2. The pads 6 may be arranged in various positions on the surface 2. The interconnection structures 5 may be variously disposed to electrically connect the via structures 4 or to electrically connect the via structure 4 and the pad 6. Each of the semiconductor devices 1A and 1B according to various embodiments of the inventive concepts may receive a supply voltage, a reference voltage, a ground voltage, and various electric signals through the via structures 4 and distribute the received supply voltage, reference voltage, ground voltage, and various electric signals into the pads 6 arranged in various positions using a redistribution structure. Alternatively, each of the semiconductor devices 1A and 1B according to various embodiments of the inventive concepts may receive a supply voltage, a reference voltage, a ground voltage, and various electric signals through the pads 6 and distribute the received supply voltage, reference voltage, ground voltage, and various electric signals into the via structures 4 arranged in various positions using the redistribution structure.

Figure 2A:
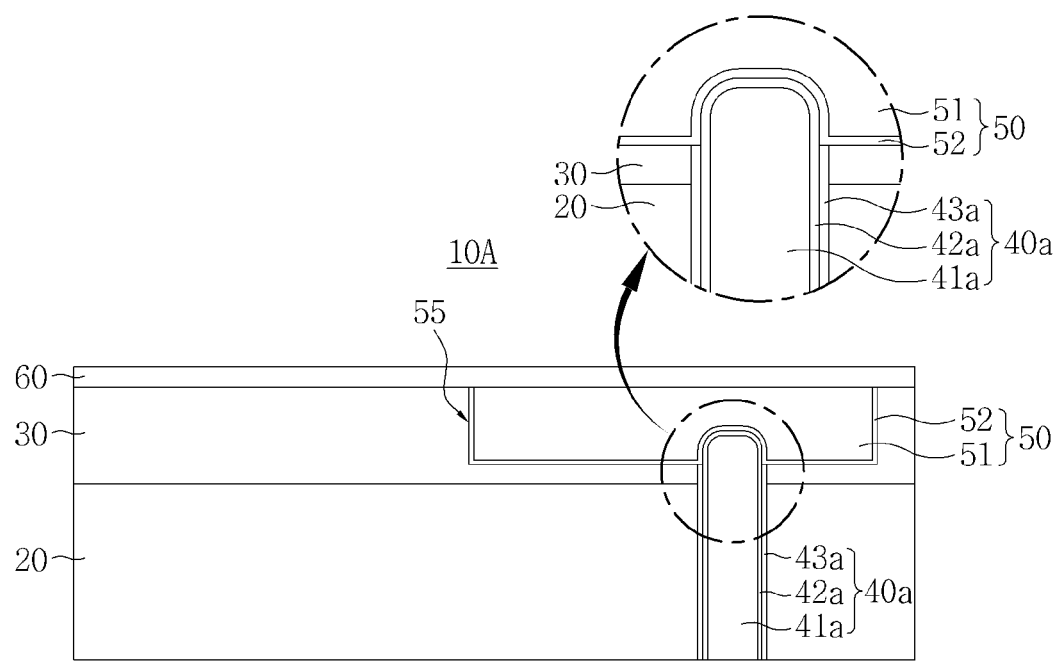
FIGS. 2A through 2S are conceptual longitudinal cross-sectional views of via connection structures according to various embodiments of the inventive concepts.
Figure 2B:
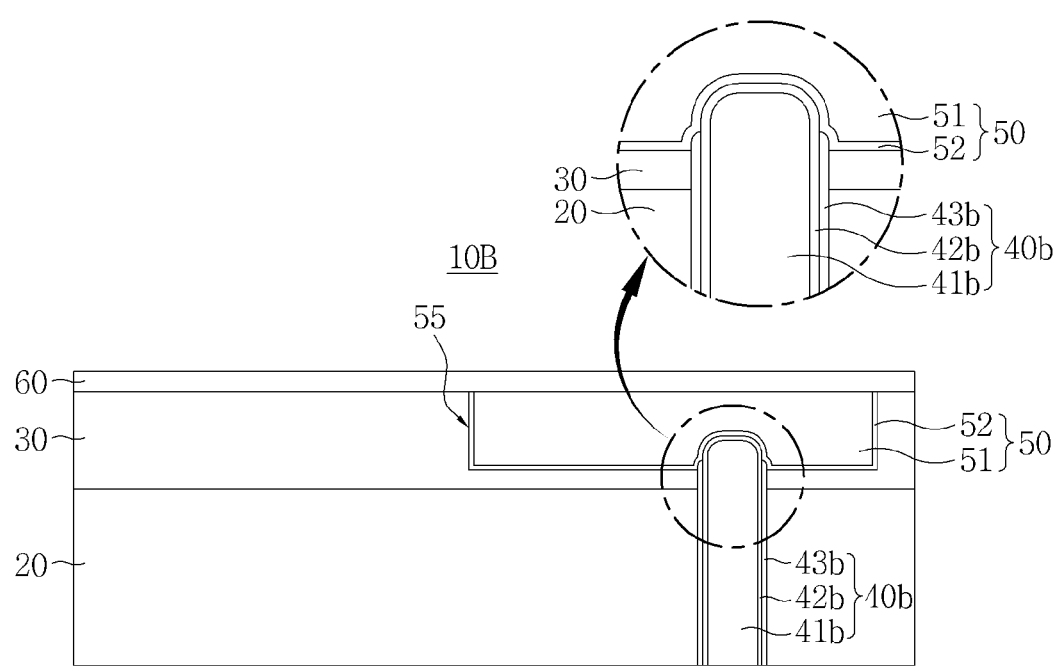
Figure 2C:
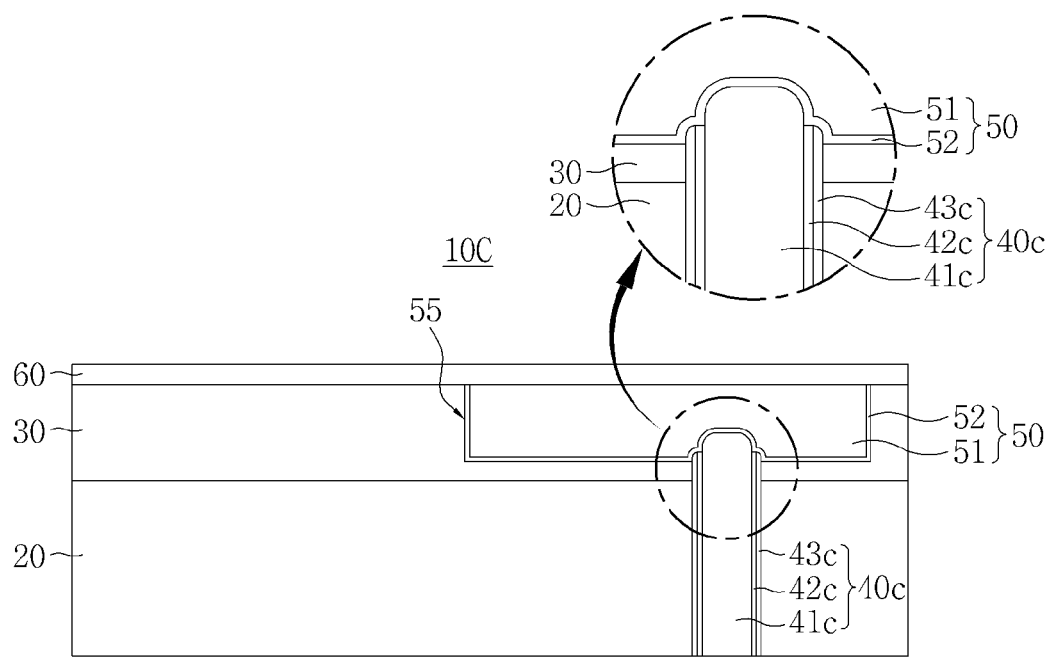
Figure 2D:
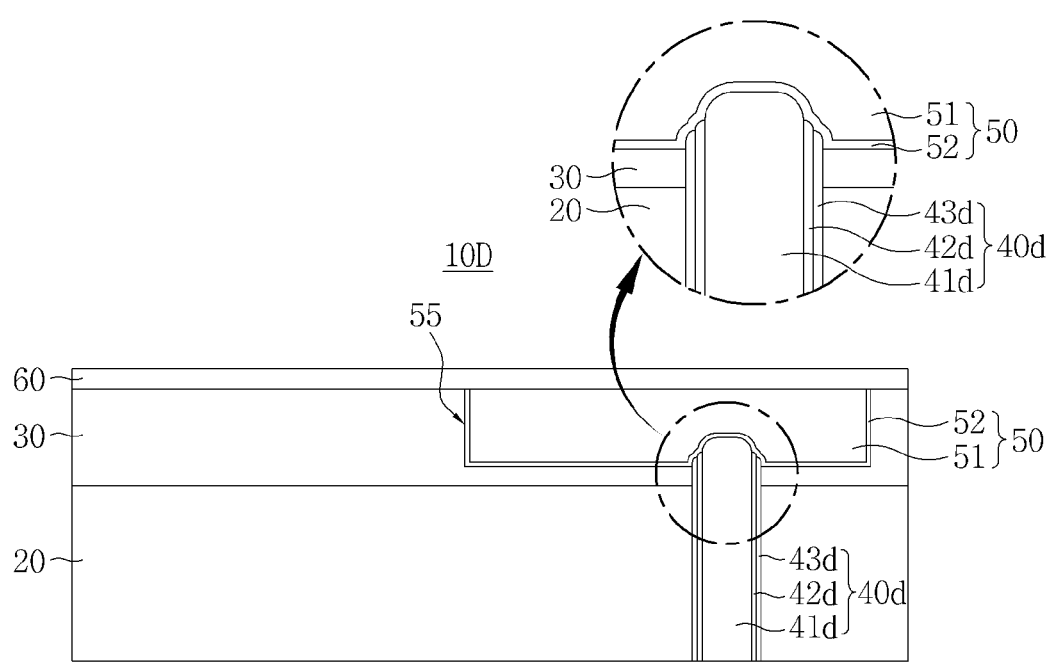
Figure 2E:
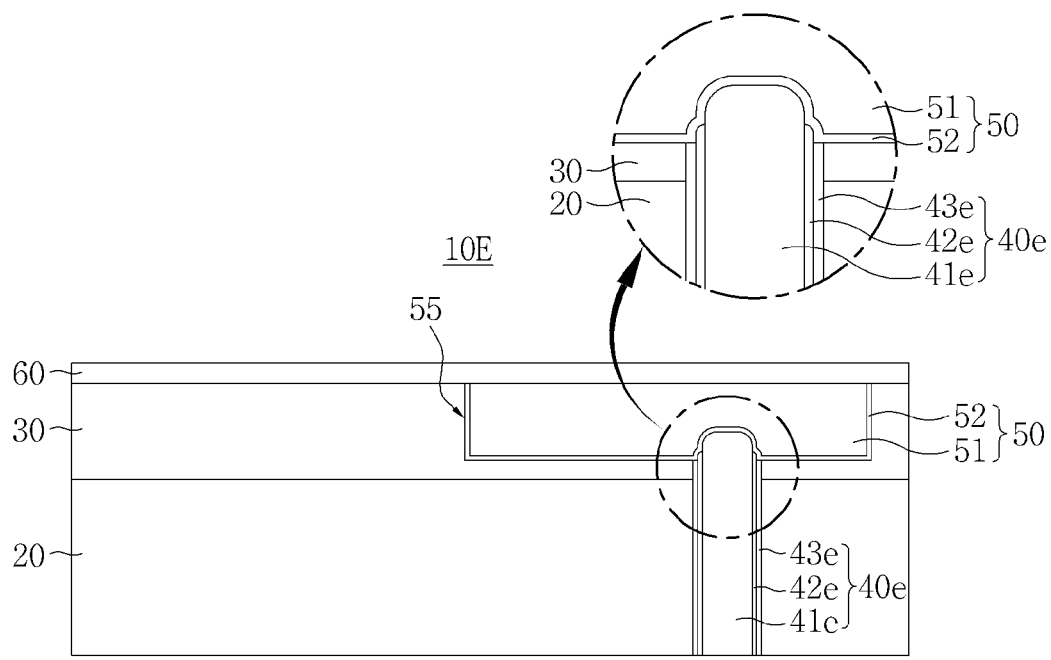
Figure 2F:
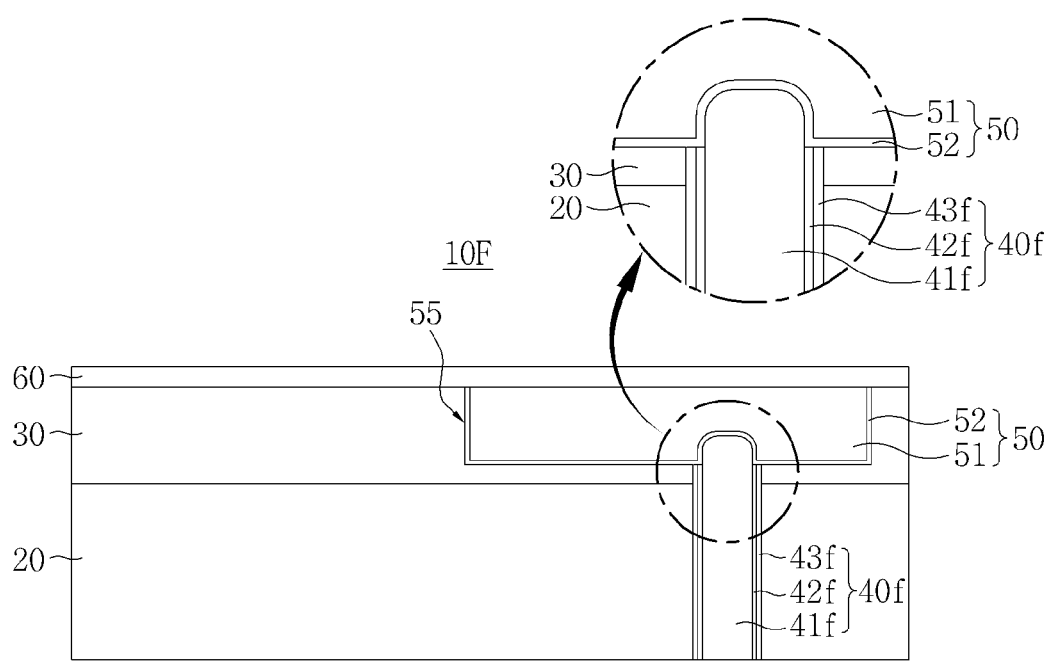
Figure 2G:
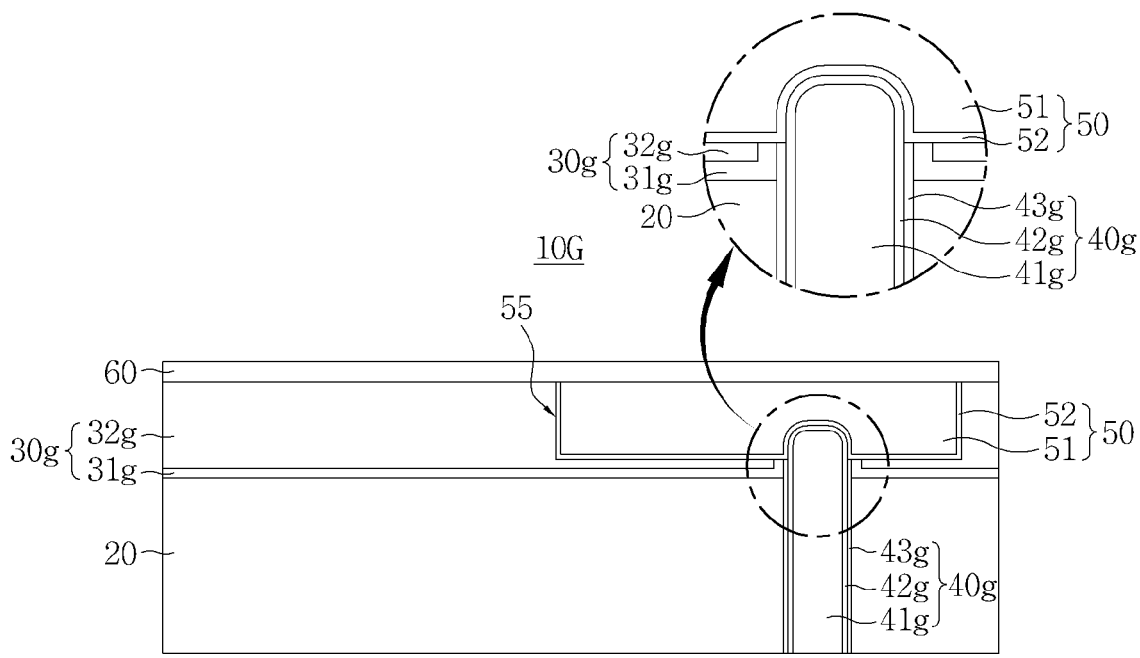
Figure 2H:
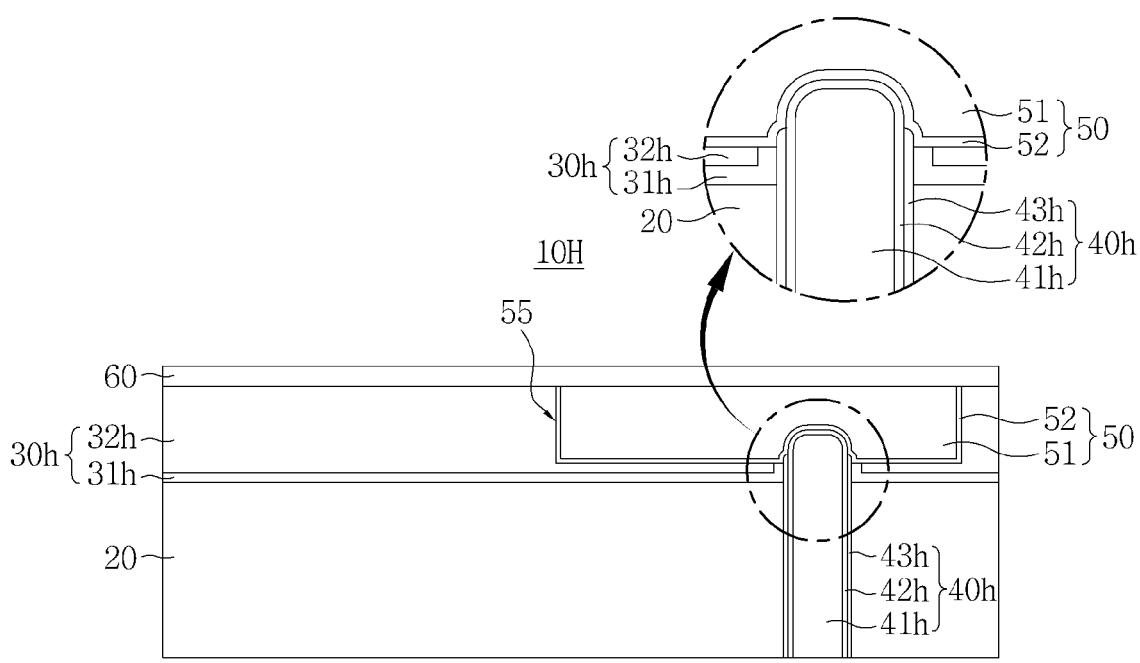
Figure 2I:
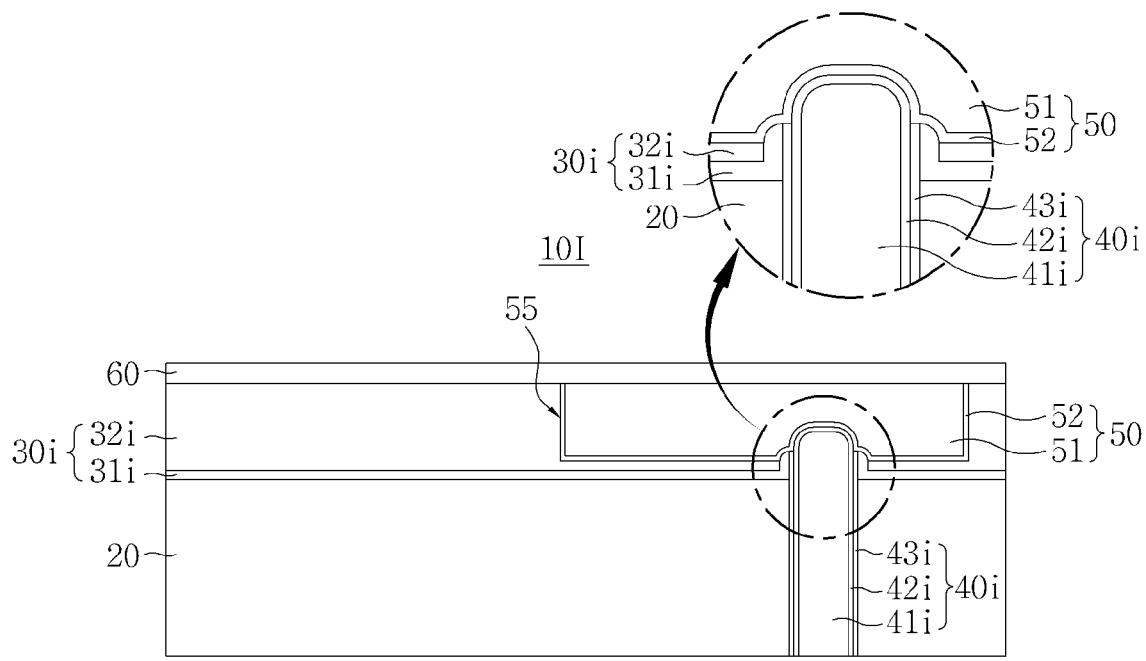
Figure 2J:
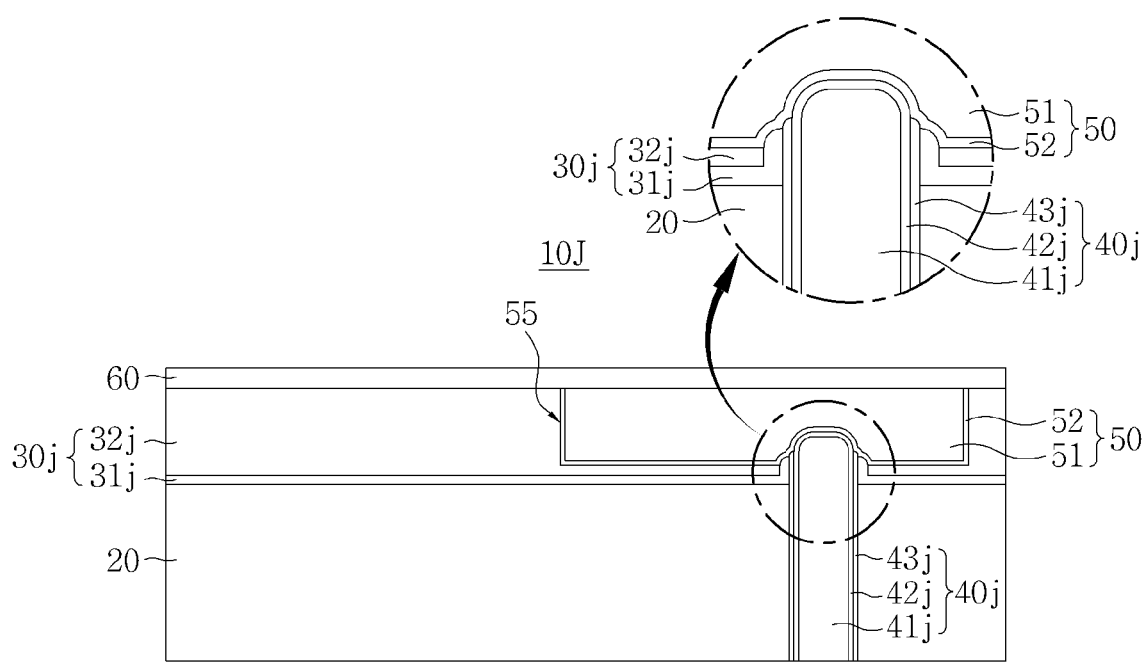
Figure 2K:
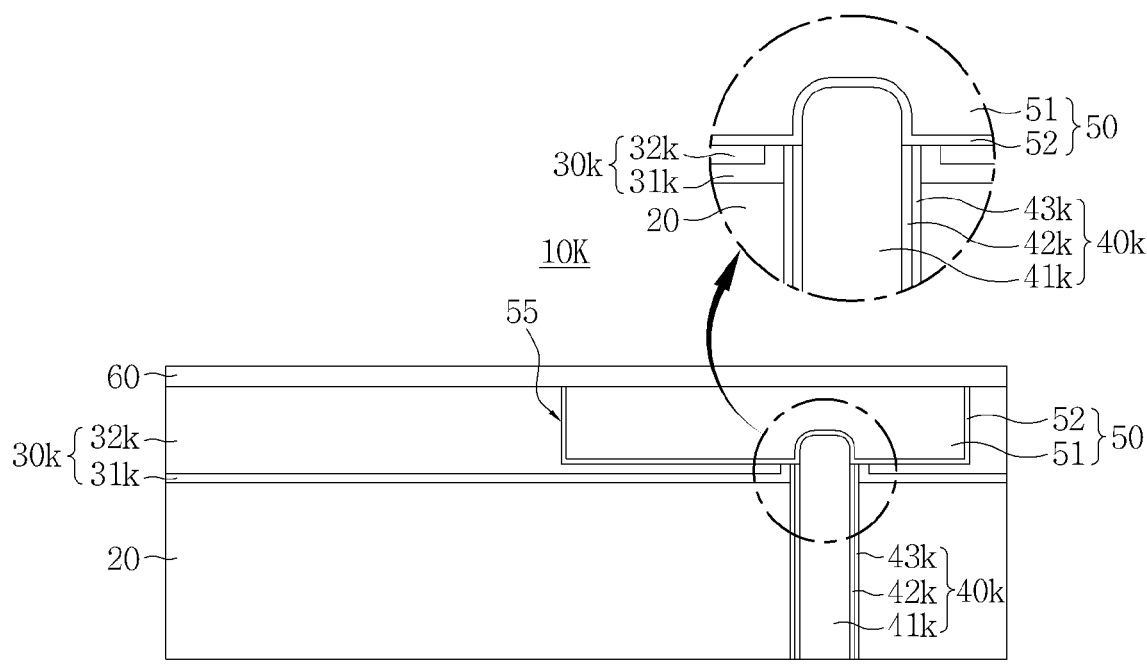
Figure 2L:
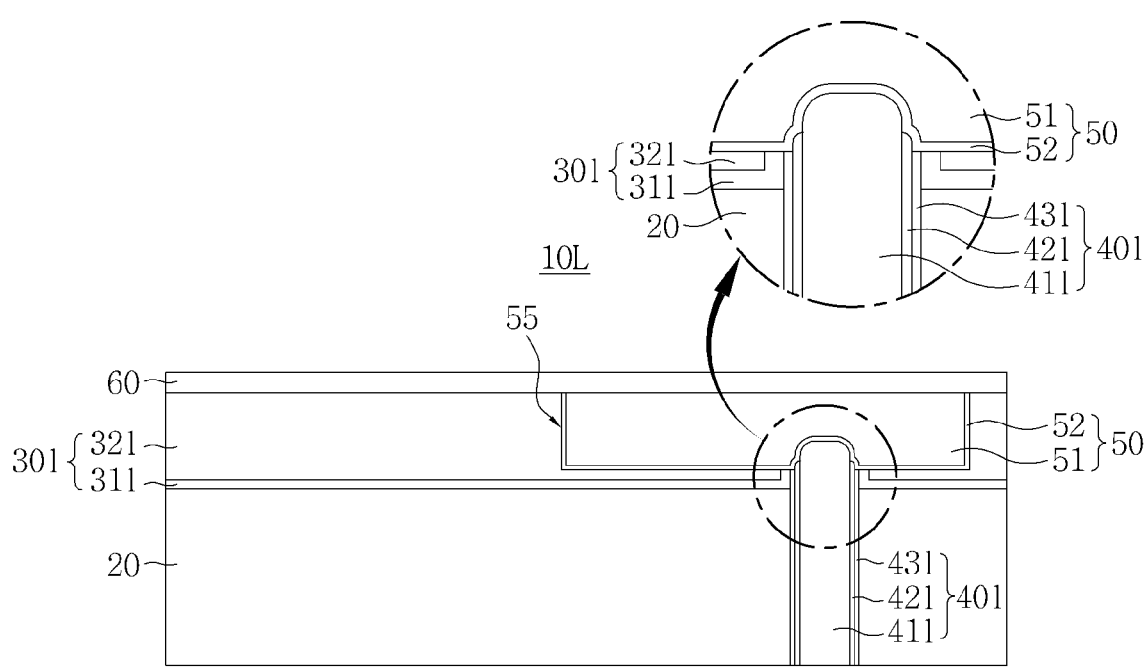
Figure 2M:
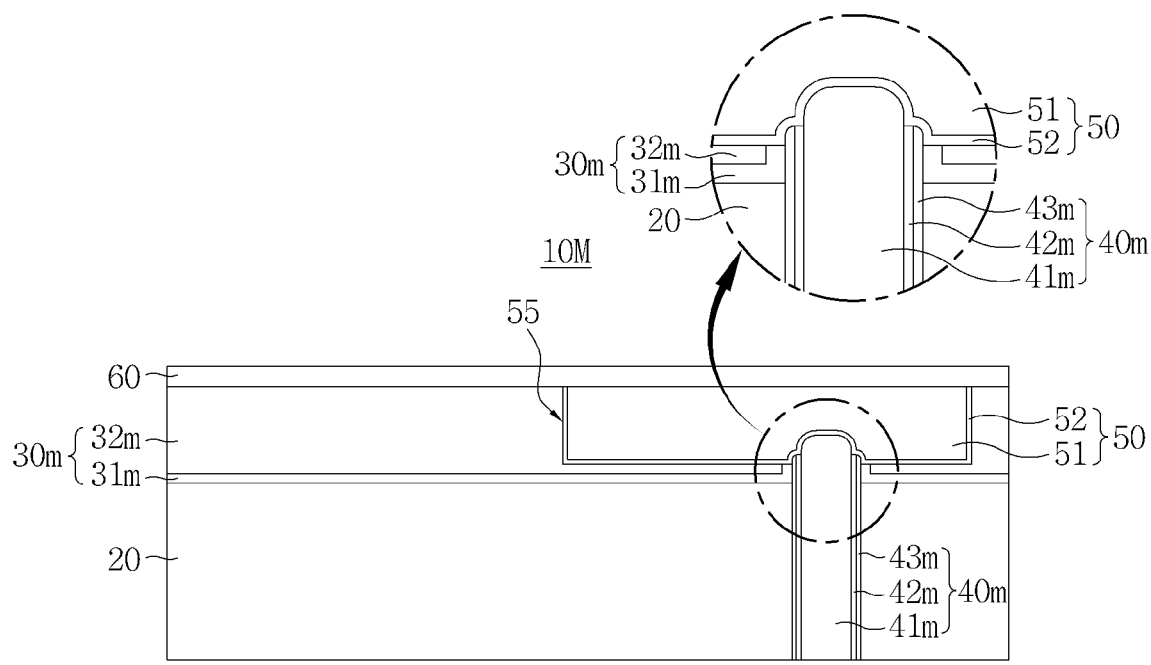
Figure 2N:
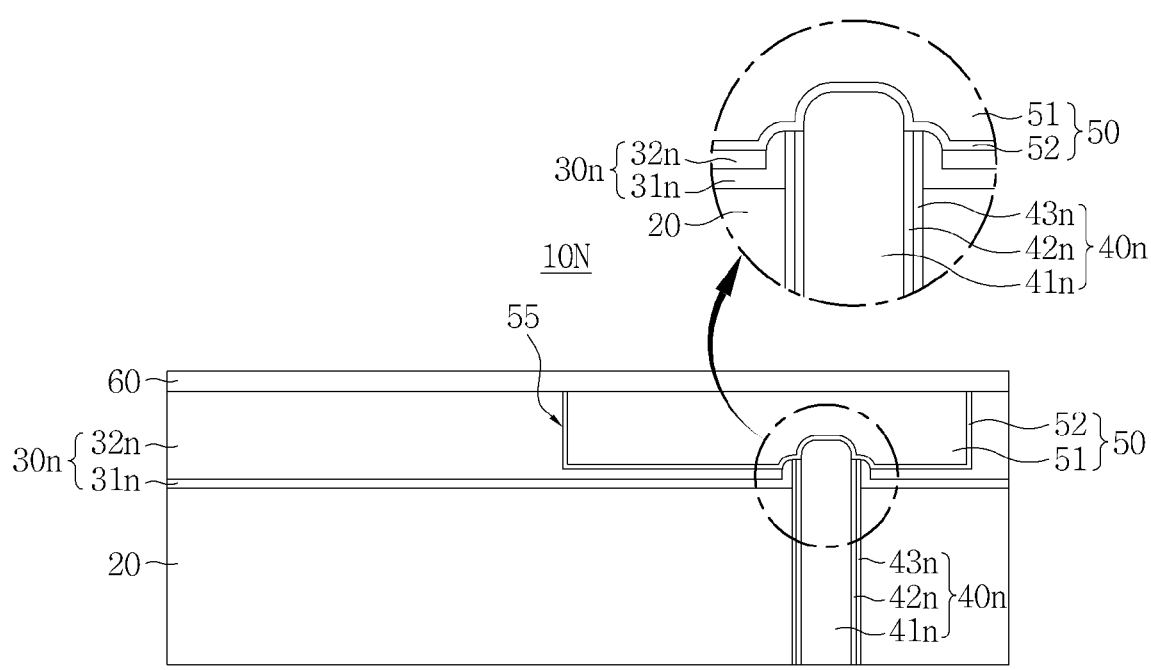
Figure 2O:
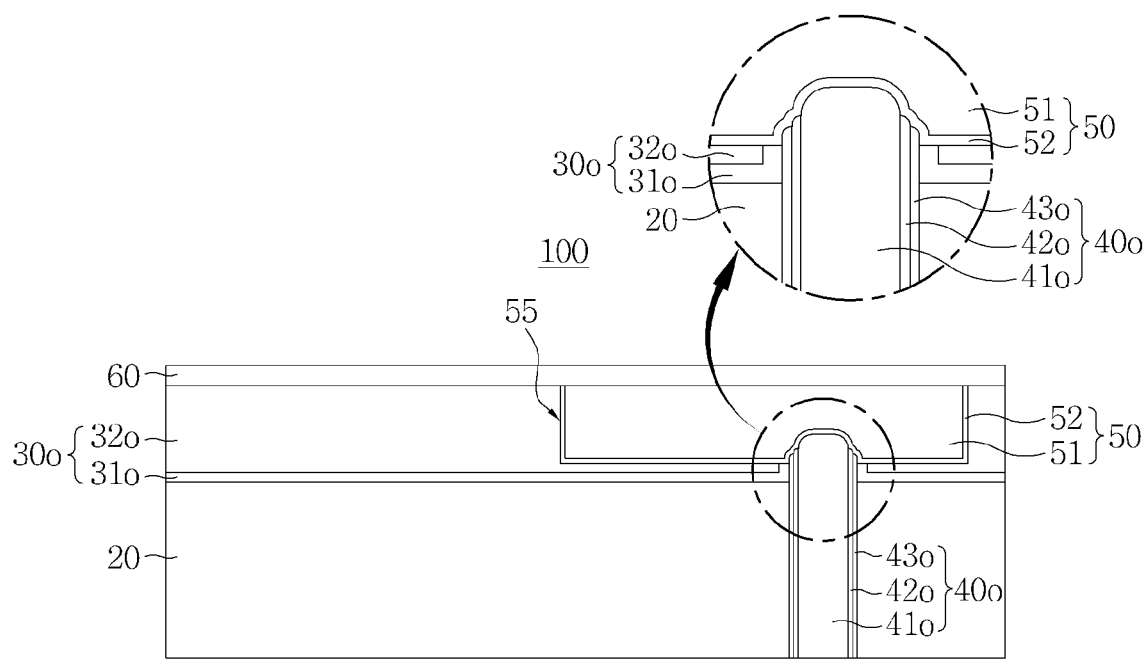
Figure 2P:
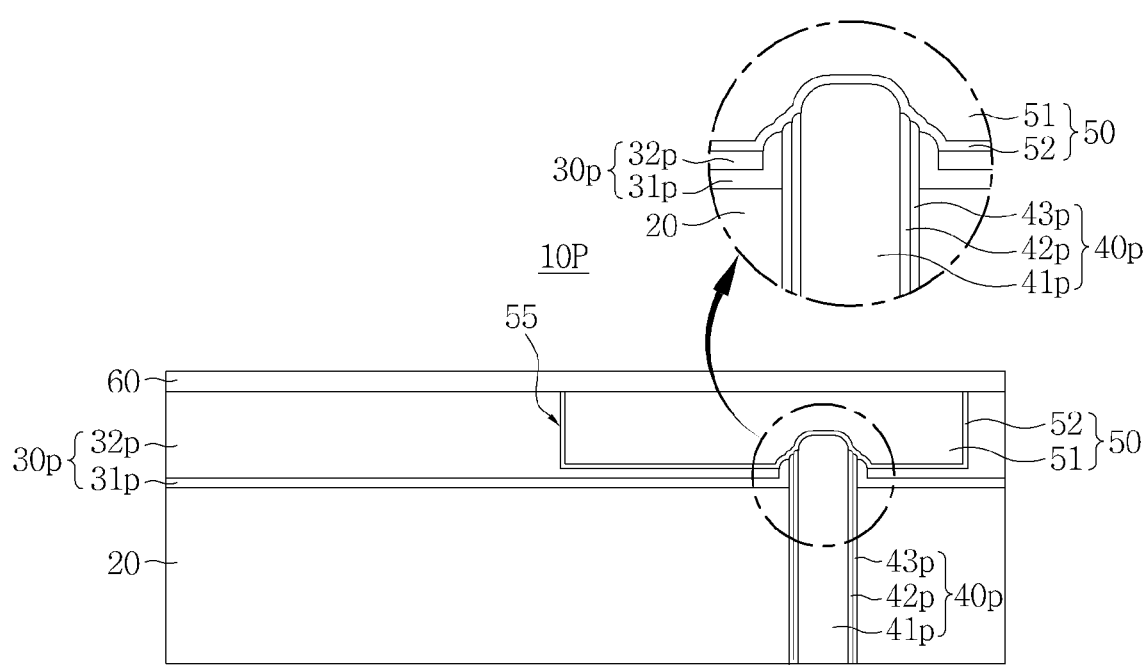
Figure 2Q:
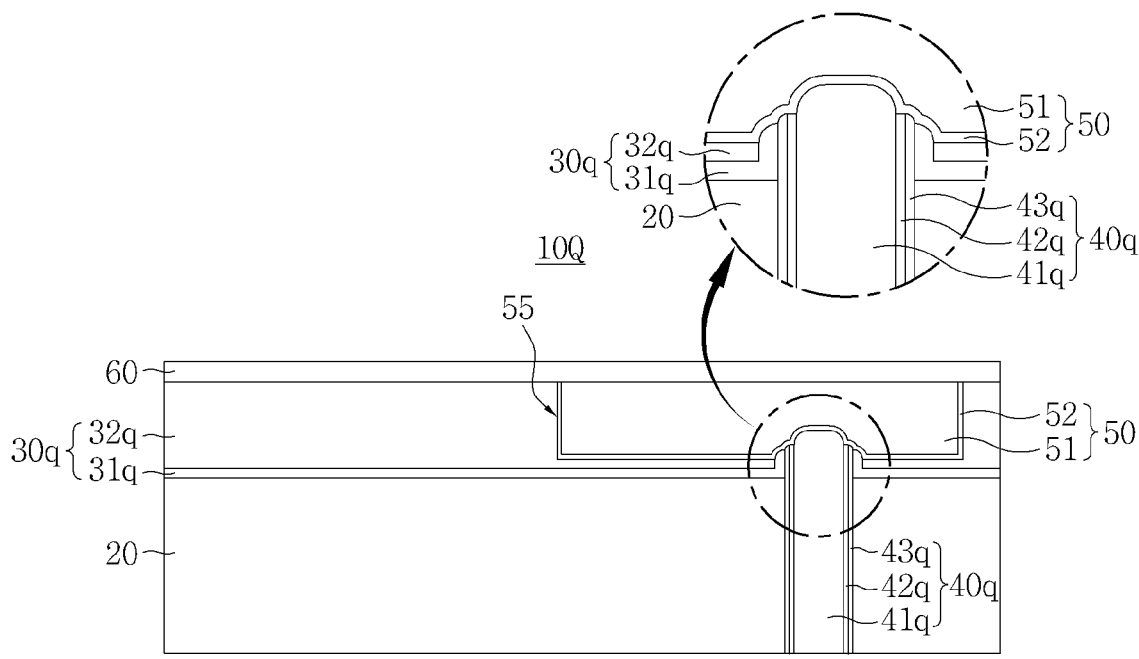
Figure 2R:
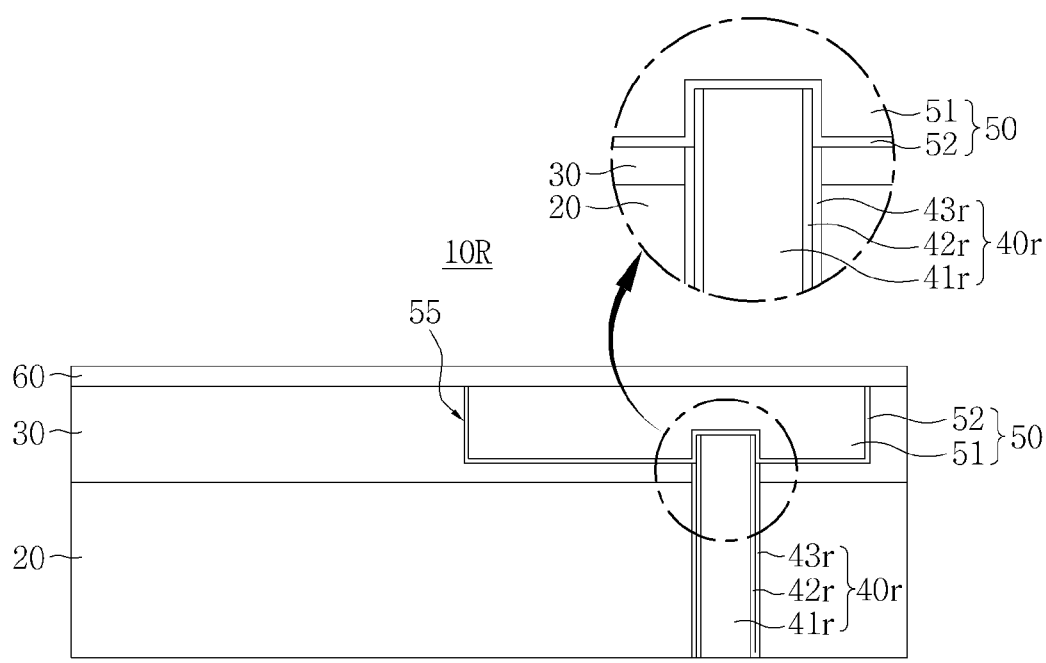
Figure 2S:
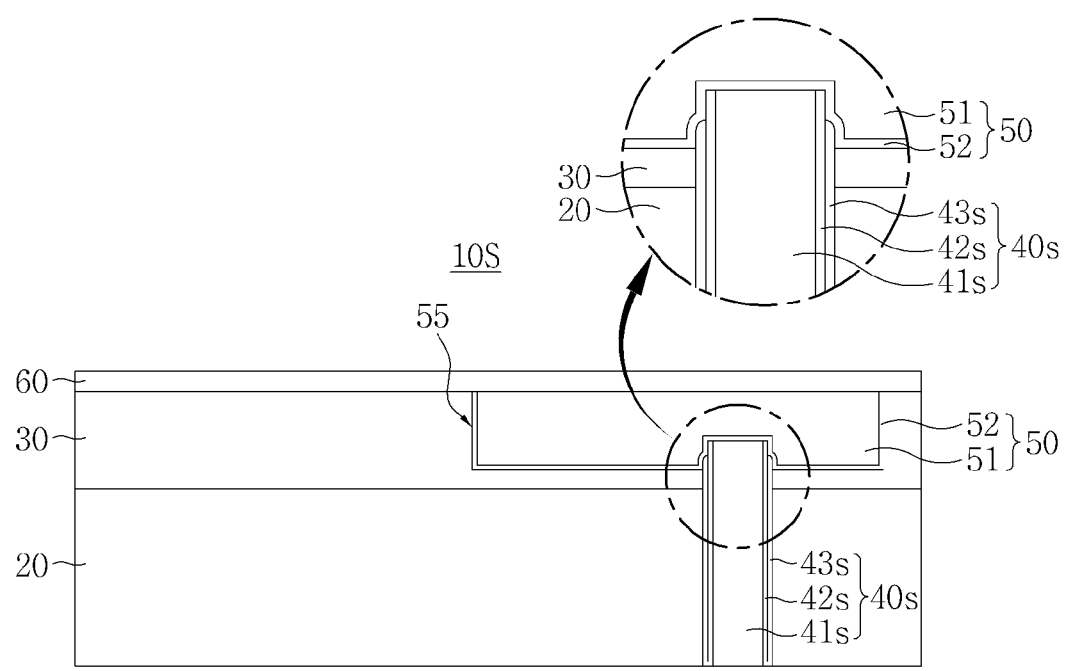
Figure 3A:
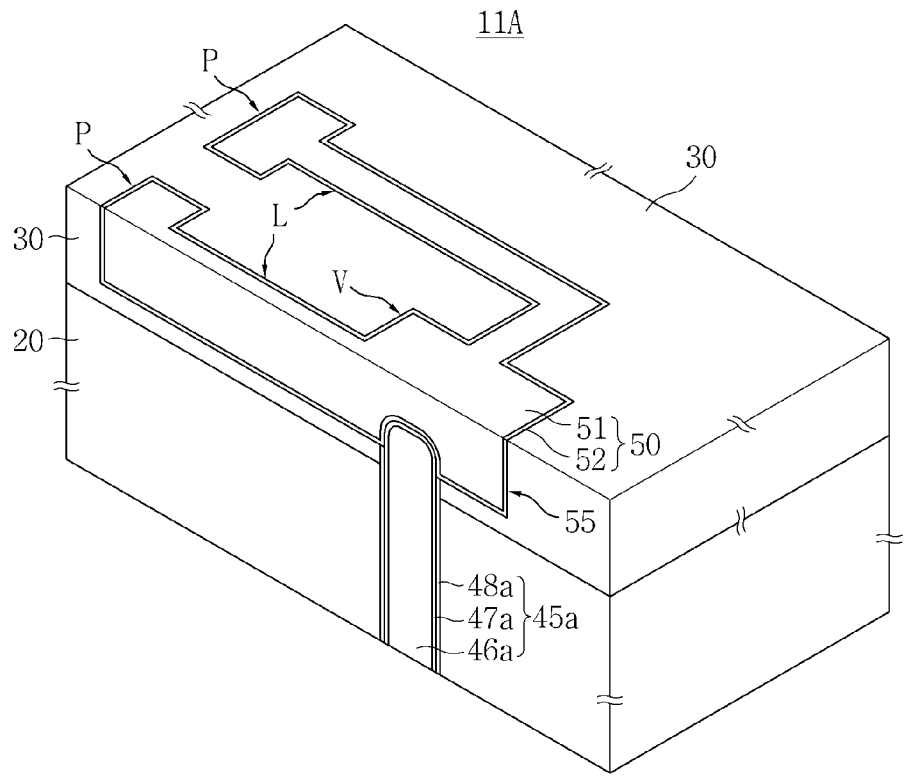
FIGS. 3A through 3H are conceptual perspective views of longitudinal cross-sectional of via connection structures according to embodiments of the inventive concepts.
Figure 3B:
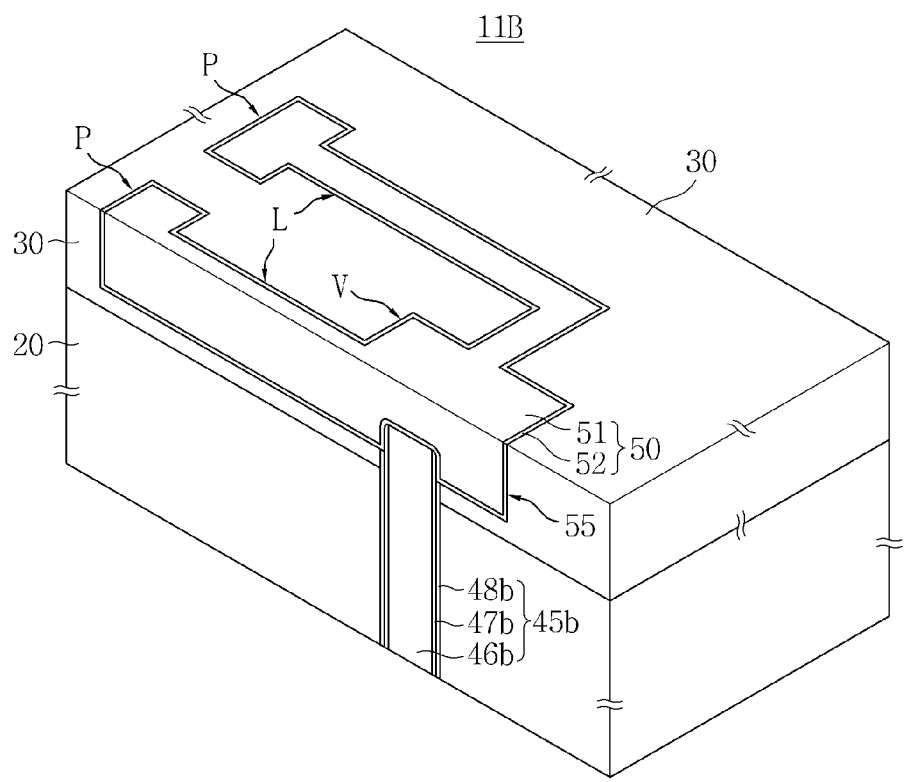
Figure 3C:
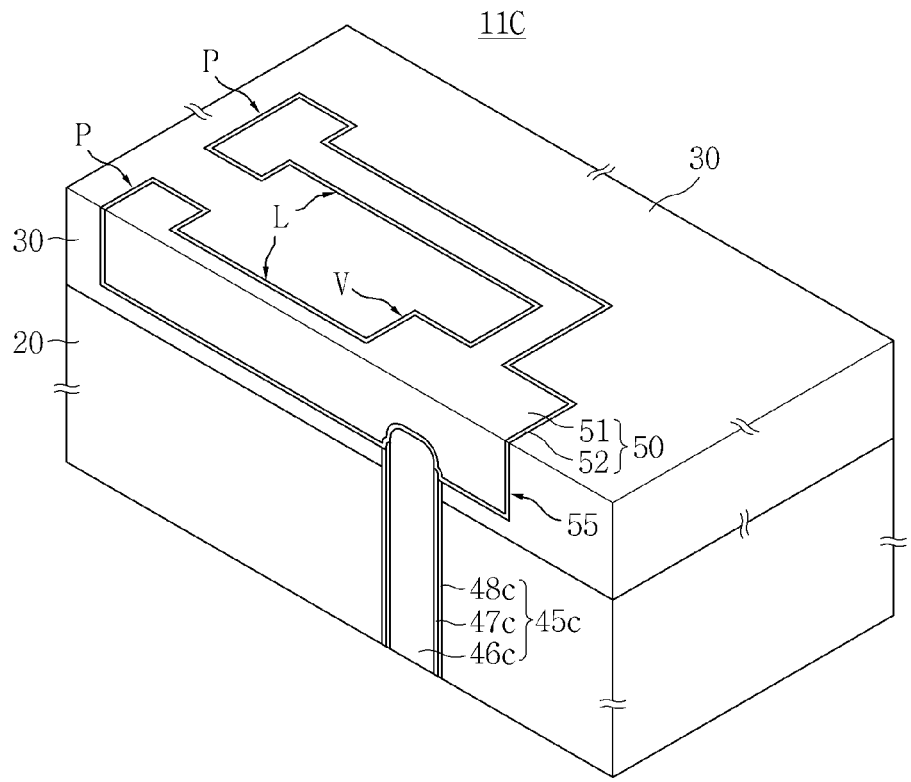
Figure 3D:
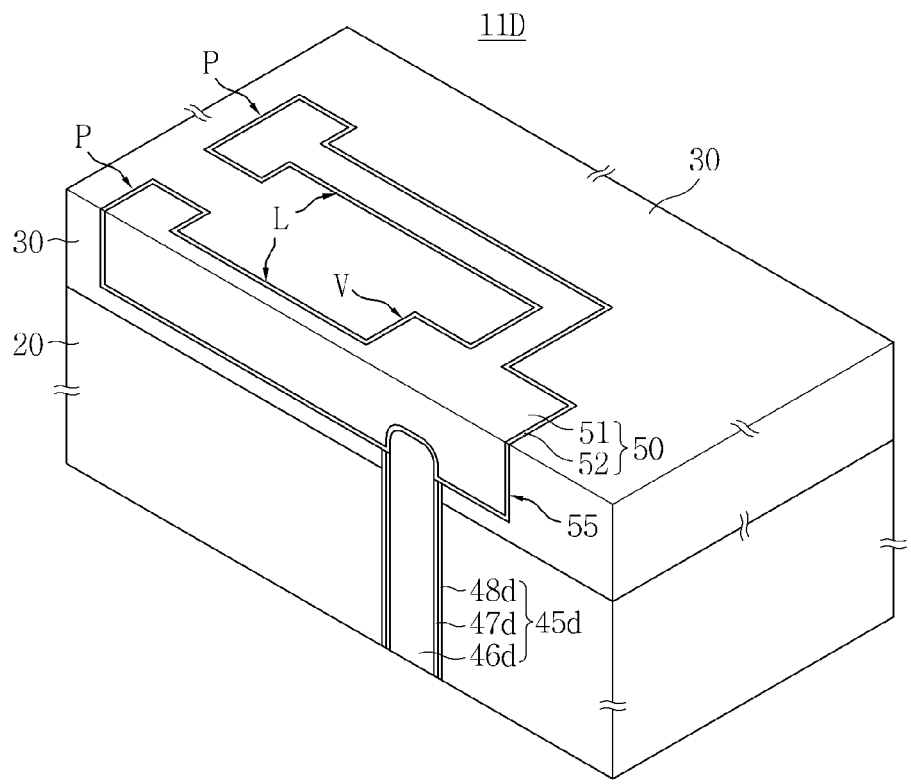
Figure 3E:
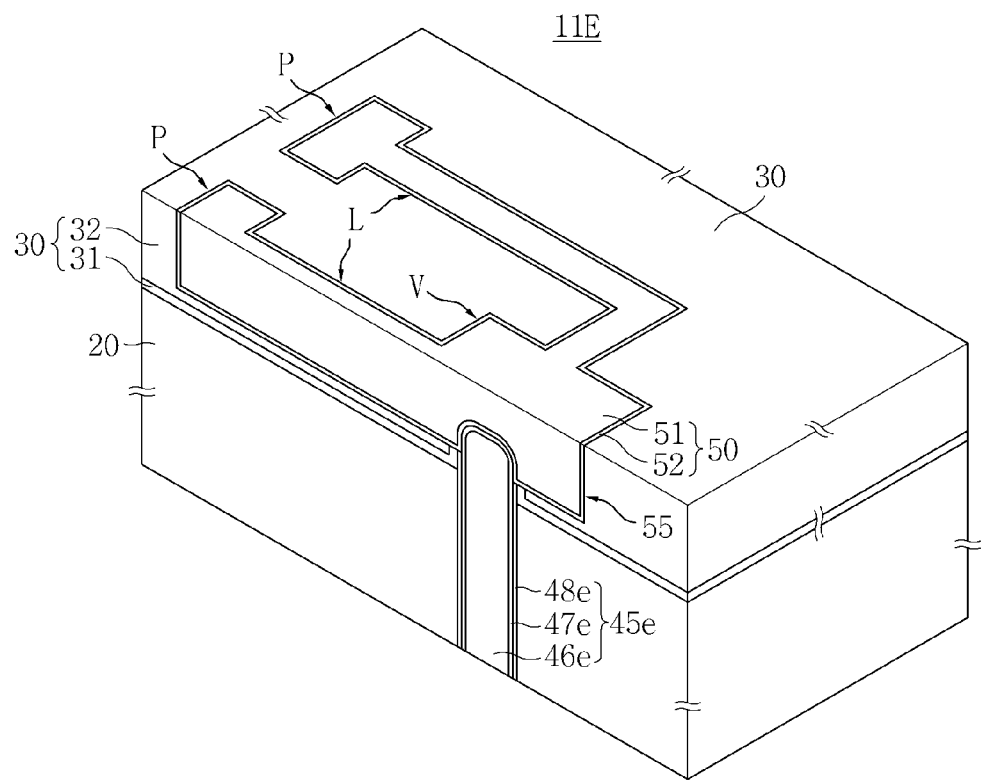
Figure 3F:
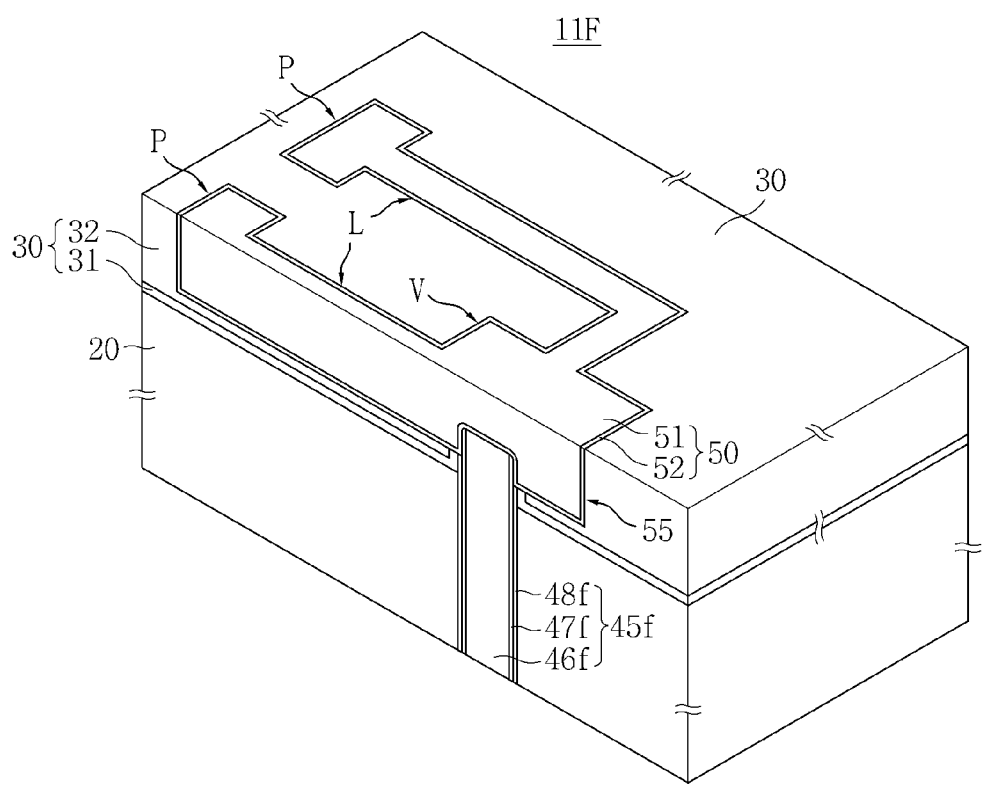
Figure 3G:
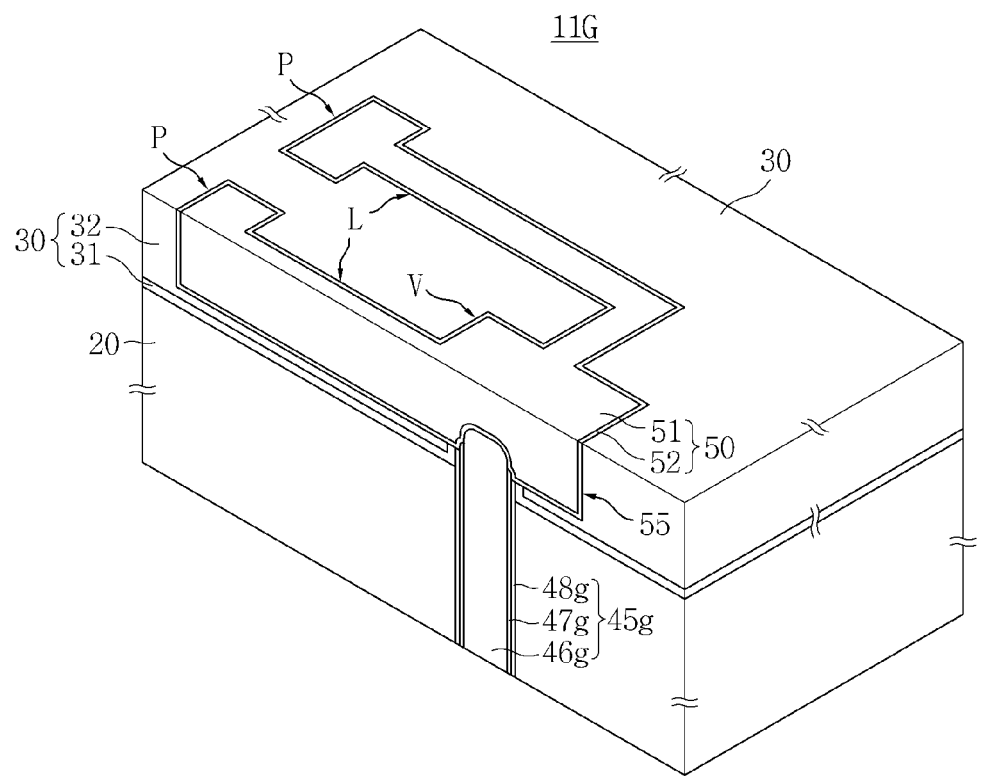
Figure 3H:
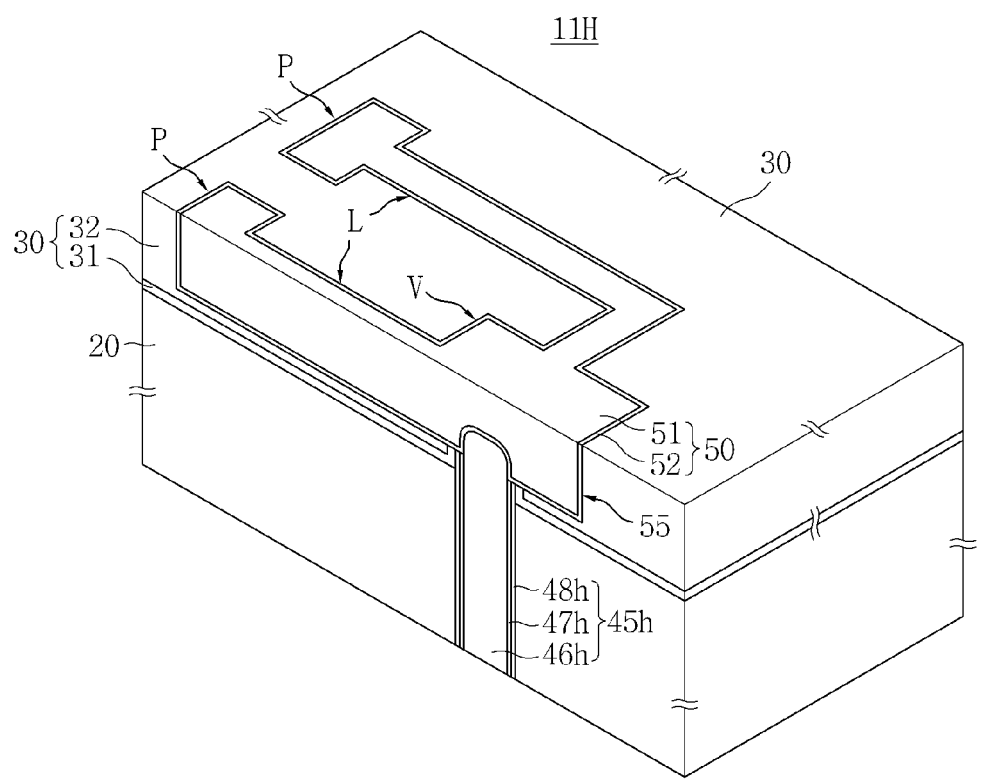

FIGS. 2A through 2S are conceptual longitudinal cross-sectional views of via connection structures 10A through 10S according to various embodiments of the inventive concepts.

Referring to FIG. 2A, a via connection structure 10A according to an embodiment of the inventive concepts may include an insulating layer 30 having a groove 55, a via structure 40a formed within the groove 55 and having a protruding upper portion, and an interconnection structure 50 formed within the groove 55.

The insulating layer 30 may be formed on a lower layer 20. The lower layer 20 may include a substrate or an interlayer insulating layer. For example, the lower layer 20 may include a silicon substrate. Alternatively, for instance, the lower layer 20 may include an interlayer insulating layer including silicon oxide or silicon nitride.

The via structure 40a may include a via core 41a, a via barrier layer 42a, and a via liner 43a. The via structure 40a may protrude from the inside of the lower layer 20 on a surface of the lower layer 20. A portion of a side surface of the via structure 40a may be exposed on the surface of the lower layer 20. For example, the via core 41a, the via barrier layer 42a, and the via liner 43a may be partially exposed on the lower layer 20.

The via core 41a may have a pillar shape. The via core 41a may include a metal, such as copper (Cu).

The via barrier layer 42a may conformally cover lateral and top surfaces of the via core 41a. The via barrier layer 42a may include a barrier metal, such as titanium (Ti), titanium nitride (TiN), tantalum (Ta), tantalum nitride (TaN), or tungsten nitride (WN). The via barrier layer 42a may be formed as a single-layered or multilayered type. For instance, the via barrier layer 42a may include a multilayered barrier metal layer.

The via liner 43a may conformally cover the side surface of the via core 41a. For instance, the via liner 43a may cover a side surface of the via barrier layer 42a. The via liner 43a may include silicon oxide ($SiO_2$), silicon nitride (SiN), or various other materials having a lower dielectric constant than silicon oxide.

The groove 55 may be formed in the insulating layer 30. Top ends and portions of side surfaces of the via structure 40a may be exposed within the groove 55. For example, portions of top ends and side surfaces of the via structure 40a may protrude within the groove 55. The via barrier layer 42a may be exposed on the top ends and the portions of side surfaces of the via structure 40a, which may protrude within the groove 55. For example, the via liner 43a may not be formed on the portions of the top ends and side surfaces of the via structure 40a, which may protrude within the groove 55. A surface of the insulating layer 30 may be disposed at substantially the same level as or at a similar level to a top end of the via liner 43a on a bottom surface of the groove 55. The insulating layer 30 may cover the side surface of the via structure 40a under the groove 55. For example, the side surface of the via structure 40a buried in the insulating layer 30 may be surrounded with the insulating layer 30. The insulating layer 30 may be in contact with the via liner 43a.

An interconnection 51 and an interconnection barrier layer 52 may be formed within the groove 55. The interconnection barrier layer 52 may be formed on an inner wall and bottom surface of the groove 55 and a surface of the exposed via structure 40a. The interconnection barrier layer 52 may be conformally formed along a profile of the via structure 40a exposed within the groove 55. The interconnection 51 may be formed on the interconnection barrier layer 52 within the groove 55 to fill the groove 55. The interconnection barrier layer 52 may include a barrier metal, such as Ti, TiN, Ta, TaN, or WN. Also, the interconnection barrier layer 52 may be a single barrier metal layer or a compound layer of barrier metals, such as a double or triple layer of barrier metals. The interconnection 51 may include a metal, such as copper (Cu). Each of the via barrier layer 42a and the interconnection barrier layer 52 may be formed as a single-layered or multi-layered type.

A single barrier layer, for example, only the via barrier layer 42a, may be formed on the side surface of the via core 41a buried in the insulating layer 30, while a double barrier layer, for example, the via barrier layer 42a and an interconnection barrier layer 52, may be formed on the side surface of the via core 41a, which may protrude within the groove 55. Accordingly, a thicker barrier layer may be formed on the side surface of the via core 41a, which may protrude within the groove 55, than on the side surface of the via core 41a, which may be buried in the lower layer 20 or the insulating layer 30.

Top surfaces of the insulating layer 30 and the interconnection structure 50 may be planar. For example, the top surfaces of the insulating layer 30 and the interconnection structure 50 may be at the same level. A passivation layer 60 may be directly formed on the insulating layer 30 and the interconnection structure 50. The passivation layer 60 may include silicon nitride or polyimide.

Referring to FIG. 2B, a via connection structure 10B according to another embodiment of the inventive concepts may include a via structure 40b protruding within a groove 55. The via structure 40b may include a via core 41b and a via liner 43b, which may protrude on a surface of an insulating layer 30. For example, the via barrier layer 42b may cover all top and side surfaces of the via core 41b, and the via liner 43b may cover a portion of a side surface of the via barrier layer 42b. A top end and a portion of side surface of the via liner 43b may be exposed within the groove 55 and in contact with an interconnection barrier.

Referring to FIG. 2C, a via connection structure 10C according to another embodiment of the inventive concepts may include a via structure 40c protruding within a groove 55. The via structure 40c may include a via core 41c, a via barrier layer 42c, and a via liner 43c, which may protrude on a surface of an insulating layer 30. For example, the via barrier layer 42c may cover a portion of a side surface of the via core 41c, and the via liner 43c may cover a side surface of the via barrier layer 42c. A top end of the via barrier layer 42c may be similar to a top end surface of the via liner 43c. The top end of the via barrier layer 42c and a top end and partial side surface of the via liner 43c may be exposed within the groove 55 and in contact with an interconnection barrier layer 52. The via core 41c may be in direct contact with the interconnection barrier layer 52.

Referring to FIG. 2D, a via connection structure 10D according to another embodiment of the inventive concepts may include a via structure 40d protruding within a groove 55. The via structure 40d may include a via core 41d, a via barrier layer 42d, and a via liner 43d, which may protrude on a surface of an insulating layer 30. For example, the via barrier layer 42d may cover a portion of a side surface of the via core 41d, and the via liner 43d may cover a portion of a side surface of the via barrier layer 42d. A top end of the via barrier layer 42d may be disposed at a higher level than a top end of the via liner 43d. The top end and a partial side surface of the via barrier layer 42d and the top end and a partial side surface of the via liner 43d may be exposed within the groove 55 and in contact with an interconnection barrier layer 52.

Referring to FIG. 2E, a via connection structure 10e according to another embodiment of the inventive concepts may include a via structure 40e protruding within a groove 55. The via structure 40e may include a via core 41e and a via barrier layer 42e, which may protrude on a surface of an insulating layer 30. For instance, an upper portion and/or portions of a side surface of the via core 41e may not be covered with the via barrier layer 42e and instead may be exposed. The upper portion and/or a portion of the side surface of the via core 41e may be in direct contact with an interconnection barrier layer 52. A top end of a via liner 43e may be at the same level as or at a similar level to a surface of an insulating layer 30.

Referring to FIG. 2F, a via connection structure 10f according to another embodiment of the inventive concepts may include a via structure 40f protruding within a groove 55. The via structure 40f may include a via core 41f protruding on a surface of an insulating layer 30. For example, an upper portion and a portion of a side surface of the via core 41f may not be covered with a via barrier layer 42f but be exposed. For example, only the via core 41f may protrude within the groove 55. The upper portion and side surface of the protruding via core 41f may be in direct contact with an interconnection barrier layer 52. A top end of the via barrier layer 42f and a top end of a via liner 43f may be at the same level as or at a similar level to the surface of the insulating layer 30.

Referring to FIG. 2G, a via connection structure 10G according to another embodiment of the inventive concepts may include a lower insulating layer 31g and an upper insulating layer 32g. Also, the via connection structure 10G may include a via core 41g and a via barrier layer 42g, which may protrude into a groove 55. The lower insulating layer 31g may be formed on a lower layer 20 and cover a side surface of a via structure 40g. The upper insulating layer 32g may be formed on the lower insulating layer 31g and have the groove 55. The upper insulating layer 32g may be spaced apart from and out of contact with the side surface of the via structure 40g. For example, the lower insulating layer 31g may be interposed between the upper insulating layer 32g and the via structure 40g. The via barrier layer 42g may cover protruding top and side surfaces of the via core 41g. Top and side surfaces of the via barrier layer 42g may be in direct contact with an interconnection barrier layer 52. Top surfaces of a via liner 43g, the lower insulating layer 31g, and the upper insulating layer 32g may be at the same level or at similar levels within the groove 55.

Referring to FIG. 2H, a via connection structure 10H according to another embodiment of the inventive concepts may include a lower insulating layer 31h and an upper insulating layer 32h and further include a via structure 40h protruding into a groove 55. A via barrier layer 42h may cover top and side surfaces of a via core 41h. A via liner 43h may cover a portion of a side surface of the protruding via barrier layer 42h. For instance, a top end of the via liner 43h may protrude from surfaces of the lower and upper insulating layers 31h and 32h within the groove 55. An upper portion and a portion of a side surface of the via barrier layer 42h may be in direct contact with an interconnection barrier layer 52.

Referring to FIG. 2I, a via connection structure 10I according to another embodiment of the inventive concepts may include a lower insulating layer 32i and an upper insulating layer 32i. The via connection structure 10I may include a via structure 40i and the lower insulating layer 31i, which may protrude into a groove 55. A protrusion of the lower insulating layer 31i may cover a side surface of a via liner 43i. A top end of the protrusion of the lower insulating layer 31i may be disposed at the same level as or at a similar level to a top end of the via liner 43i. A portion of a side surface of the lower insulating layer 31i may be in contact with an interconnection barrier layer 52.

Referring to FIG. 2J, a via connection structure 10J according to another embodiment of the inventive concepts may include a lower insulating layer 32j and an upper insulating layer 32j. The via connection structure 10J may include a via structure 40j and the lower insulating layer 31j, which may protrude into a groove 55. A protrusion of the lower insulating layer 31j may cover a portion of a side surface of a via liner 43j. A portion of a side surface of the lower insulating layer 31j may be in contact with an interconnection barrier layer 52.

Referring to FIG. 2K, a via connection structure 10K according to another embodiment of the inventive concepts may include a lower insulating layer 31k and an upper insulating layer 32k and further include a via core 41k, which may protrude into a groove 55. For example, surfaces of a via barrier layer 42k, a via liner 43k, a lower insulating layer 31k, and an upper insulating layer 32k may be disposed at the same level or at similar levels. The top and side surfaces of the protruding via core 41k may be in contact with an interconnection layer 52.

Referring to FIG. 2L, a via connection structure 10L according to another embodiment of the inventive concepts may include a lower insulating layer 31l and an upper insulating layer 32l and further include a via core 41l and a via barrier layer 42l, which may protrude into a groove 55. For example, the via barrier layer 42l may cover a portion of a side surface of the via core 41l. Surfaces of a via liner 43l, the lower insulating layer 31l, and the upper insulating layer 32l may be disposed at the same level or at similar levels. A top surface and a portion of a side surface of the protruding via core 41l may be in contact with an interconnection layer 52.

Referring to FIG. 2M, a via connection structure 10M according to another embodiment of the inventive concepts may include a lower insulating layer 31m and an upper insulating layer 32m and further include a via structure 40m that may protrude into a groove 55. For instance, a via barrier layer 42m may cover a portion of a side surface of a via core 41m. A via liner 43m may cover a side surface of a via barrier layer 42m. A top end of the via barrier layer 42m may be disposed at the same level as or at a similar level to a top end of the via liner 43*m*. A top surface and partial side surface of the protruding via core 41*m* may be in contact with an interconnection barrier layer 52.

Referring to FIG. 2N, a via connection structure 10N according to another embodiment of the inventive concepts may include a lower insulating layer 31*n* and an upper insulating layer 32*n*. The via connection structure 10N may include a via structure 40*n* and the lower insulating layer 31*n*, which may protrude into a groove 55. For example, a via barrier layer 42*n* may cover a portion of a side surface of a via core 41*n*. A via liner 43*n* may cover a side surface of the via barrier layer 42*n*. The protruding lower insulating layer 31*n* may cover a side surface of the via liner 43*n*. A top end of the via barrier layer 42*n*, a top end of the via liner 43*n*, and top ends of the lower insulating layer 31*n* may be at the same level or at similar levels. A top surface and partial side surface of the protruding via core 41*n* may be in contact with an interconnection barrier layer 52.

Referring to FIG. 2O, a via connection structure 10O according to another embodiment of the inventive concepts may include a lower insulating layer 31*o* and an upper insulating layer 32*o* and further include a via structure 40*o* that may protrude into a groove 55. For example, a via barrier layer 42*o* may cover a portion of a side surface of a via core 41*o*. A via liner 43*o* may cover a portion of a side surface of the via barrier layer 42*o*. A top surface and partial side surface of the protruding via core 41*o* may be in contact with an interconnection barrier layer 52.

Referring to FIG. 2P, a via connection structure 10P according to another embodiment of the inventive concepts may include a lower insulating layer 31*p* and an upper insulating layer 32*p*. The via connection structure 10P may include a via structure 40*p* and the lower insulating layer 31*p*, which may protrude into a groove 55. For instance, a via barrier layer 42*p* may cover a portion of a side surface of a via core 41*p*. A via liner 43*p* may cover a portion of a side surface of the via barrier layer 42*p*. The protruding lower insulating layer 31*p* may cover a side surface of the via liner 43*p*. A top surface and partial side surface of the protruding via core 41*p* may be in contact with an interconnection barrier layer 52.

Referring to FIG. 2Q, a via connection structure 10Q according to another embodiment of the inventive concepts may include a lower insulating layer 31*q* and an upper insulating layer 32*q*. The via connection structure 10Q may include a via structure 40*q* and the lower insulating layer 31*q*, which may protrude into a groove 55. For example, a via barrier layer 42*q* may cover a portion of a side surface of a via core 41*q*. A via liner 43*q* may cover a side surface of the via barrier layer 42*q*. A top end of the via liner 43*q* and a top end of the via barrier layer 42*q* may be disposed at the same level or at similar levels. The protruding lower insulating layer 31*q* may cover a portion of a side surface of the via liner 43*q*. A top surface and partial side surface of the protruding via core 41*q* may be in contact with an interconnection barrier layer 52.

Referring to FIG. 2R a via connection structure 10R according to another embodiment of the inventive concepts may include a via structure 40*r* that may protrude into a groove 55. The via structure 40*r* may include a via core 41*r* and a via barrier layer 42*r*, which may protrude on a surface of an insulating layer 30. For instance, top ends of the via core 41*r* and the via barrier layer 42*r* may be disposed at the same level or at similar levels (e.g., have co-planar upper surfaces). A via liner 43*r* may be disposed at the same level as or at a similar level to a bottom surface of the groove 55. The insulating layer 30 may be interpreted as an upper insulating layer 32, while a lower layer 20 may be interpreted as a lower insulating layer 31.

Referring to FIG. 2S, a via connection structure 10S according to another embodiment of the inventive concepts may include a via structure 40*s* that may protrude into a groove 55. The via structure 40*s* may include a via core 41*s* that may protrude on a surface of an insulating layer 30. For example, a top end of the via core 41*s* and a top end of a via barrier layer 42*s* may be disposed at the same level or at similar levels. A via liner 43*s* may partially or wholly cover a side surface of the via barrier layer 42*s*. The insulating layer 30 may be interpreted as an upper insulating layer 32, while a lower layer 20 may be interpreted as a lower insulating layer 31.

Top ends of components of all the via connection structures 10A to 10S shown in FIGS. 2A through 2S may have rounded corners.

Each of the via connection structures 10A to 10S according to various embodiments of the inventive concepts may include the interconnection structure 50 formed using a damascene process. Thus, the interconnection barrier layer 52 may completely surround bottom and side surfaces of the interconnection 51. For example, when the interconnection barrier layer 52 is removed using a wet etching process or selective etching process, the interconnection barrier layer 52 may not completely surround the bottom or side surface of the interconnection 51, thus causing physical and/or electrical instability. The via connection structures 10A to 10S according to various embodiments of the inventive concepts may be planarly formed using a CMP process instead of photolithography and etching processes, and pitches of the via structures 40*a* to 40*s* and pitches of the interconnection structures 50 may become finer and more elaborate. In each of the via connection structures 10A to 10S according to various embodiments of the inventive concepts, the via structure 40 may protrude into the interconnection structure 50. For instance, the via structure 40 may be inserted into the interconnection structure 50. Accordingly, a contact area between the via structure 40*a* to 40*s* and the interconnection structure 50 may increase so that a sheet resistance between the via structure 40*a* to 40*s* and the interconnection structure 50 can be reduced. Furthermore, since the interconnection structure 50 may be physically fixed by the via structure 40*a* to 40*s*, a contact failure or separation of components due to a floating phenomenon may be prevented.

FIGS. 3A through 3H are conceptual perspective views of longitudinal cross-sections of via connection structures 11A through 11H according to various embodiments of the inventive concepts. Referring to FIGS. 3A through 3D, each of the via connection structures 11A to 11D according to various embodiments of the inventive concepts may have a corresponding one of the via structures 45*a* to 45*d* configured to penetrate a lower layer 20, an insulating layer 30 formed on the lower layer 20 a groove 55 in the insulating layer 30 exposing a top end of the corresponding one of the via structures 45*a* to 45*d*, and an interconnection structure 50 configured to fill the groove 55. The groove 55 and the interconnection structure 50 may include a via region V, a pad region P, and an interconnection region L configured to connect the via region V and the pad region P. Each of the via structures 45*a* to 45*d* may be disposed within the via region V. Each of the via structures 45*a* to 45*d* may penetrate the lower layer 20 and the insulating layer 30 and protrude on a bottom surface of the groove 55. An interconnection barrier layer 52 may be conformally formed on side and bottom surfaces of the groove 55 and each of the protruding via structures 45*a* to 45*d*. An interconnection 51 may be formed on the interconnection barrier layer 52 to completely fill the groove 55. An I/O pad may be formed on the pad region P. A description of the I/O pad will be presented later. Thus, the I/O pad and the via structures 45a to 45d may be electrically connected through the interconnection structure 50. The via region V and the pad region P may have a greater horizontal width than the interconnection region L. The via region V may have at least one horizontal width greater than the pad region P.

Referring to FIGS. 3E through 3H, each of the via connection structures 11E to 11H according to various embodiments of the inventive concepts may include a lower insulating layer 31 formed on a lower layer 20. The corresponding one of via structures 45e to 45h is configured to penetrate the lower layer 20, the lower insulating layer 31, a groove 55 exposing a top end of the corresponding one of the via structures 45e to 45h, and an interconnection structure 50 configured to fill the groove 55. An upper insulating layer 32 may be formed on the lower insulating layer 31. The upper insulating layer 32 may not be in contact with each of the via structures 45e to 45h. The lower insulating layer 31 may be interposed between the upper insulating layer 32 and each of the via structures 45e to 45h. A top end of the lower insulating layer 31 may be in contact with an interconnection barrier layer 52.

Top ends of components of all the via structures 45a to 45h shown in FIGS. 3A through 3H may have rounded corners. All the via structures 45a to 45h shown in FIGS. 3A through 3H may have via cores 46a to 46h, via barrier layers 47a to 47h, and via liners 48a to 48h, respectively. The via cores 46a to 46h, the via barrier layers 47a to 47h, and the via liners 48a to 48h may be respectively replaced with the via cores 41a to 41s, the via barrier layers 42a to 42s, and the via liners 43a to 43s of the various via structures 40a to 40s shown in FIGS. 2A through 2S.

Figure 4A:
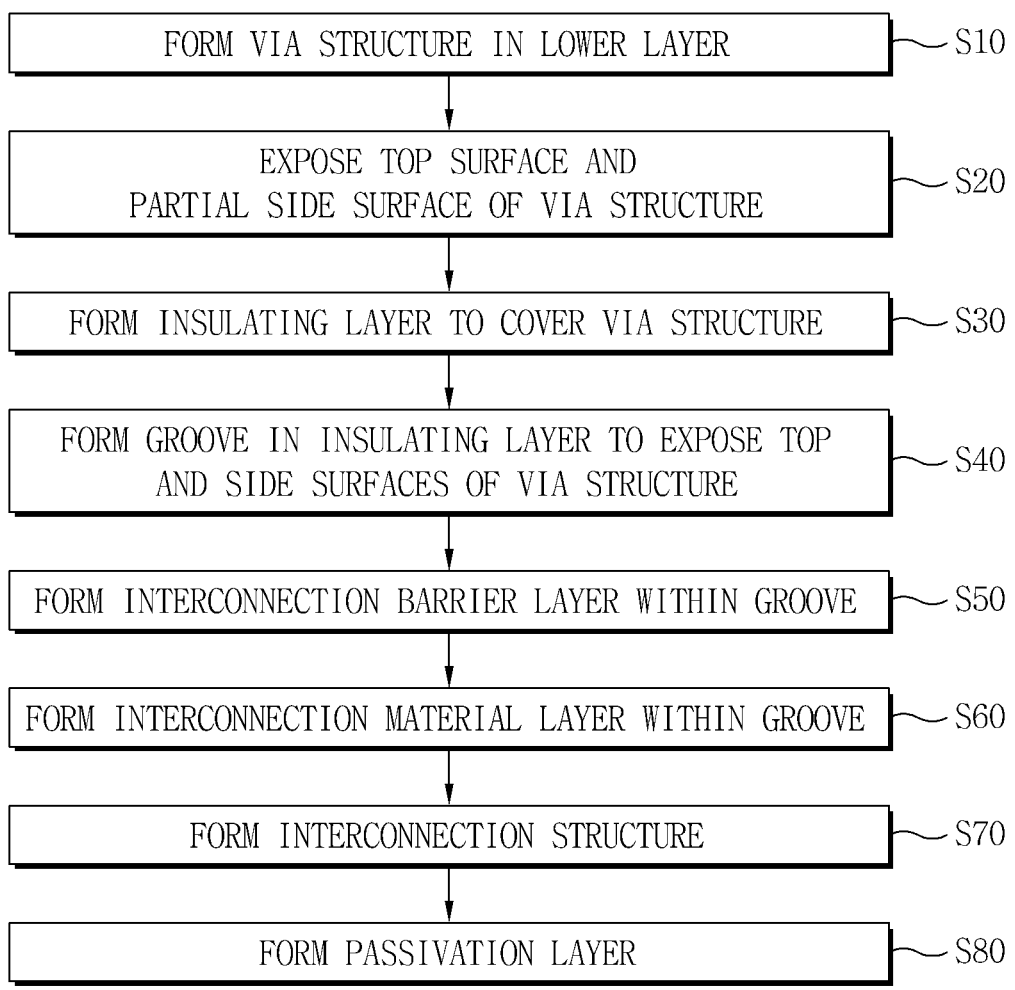
FIGS. 4A and 4B are flowcharts illustrating methods of forming via connection structures according to various embodiments of the inventive concepts.
Figure 4B:
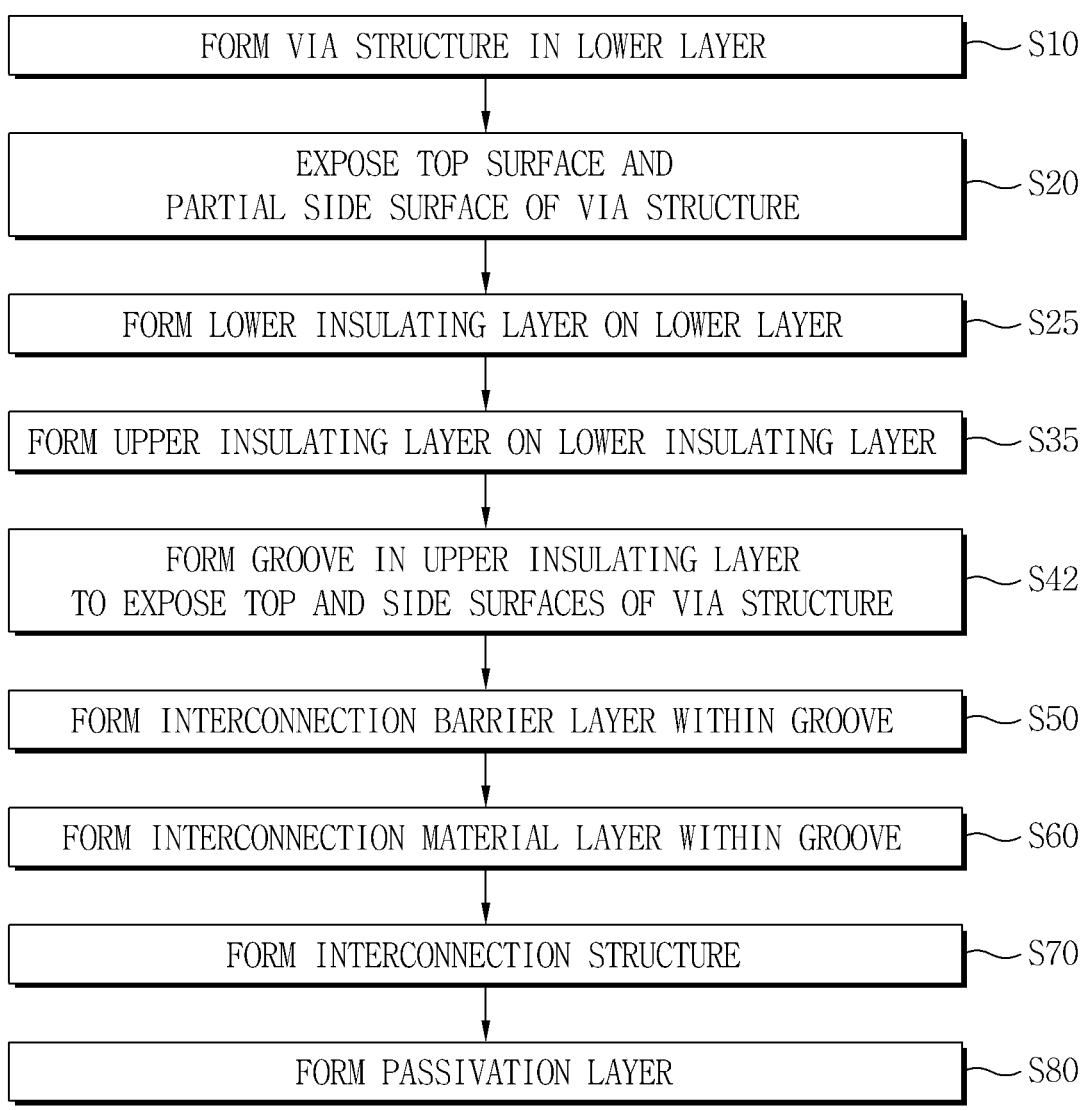

FIGS. 4A and 4B are flowcharts illustrating methods of forming via connection structures 10A to 10S according to various embodiments of the inventive concepts, and FIGS. 5A through 5G and 6A through 6C are longitudinal cross-sectional views illustrating methods of forming via connection structures 10A to 10S according to various embodiments of the inventive concepts.

Figure 5A:
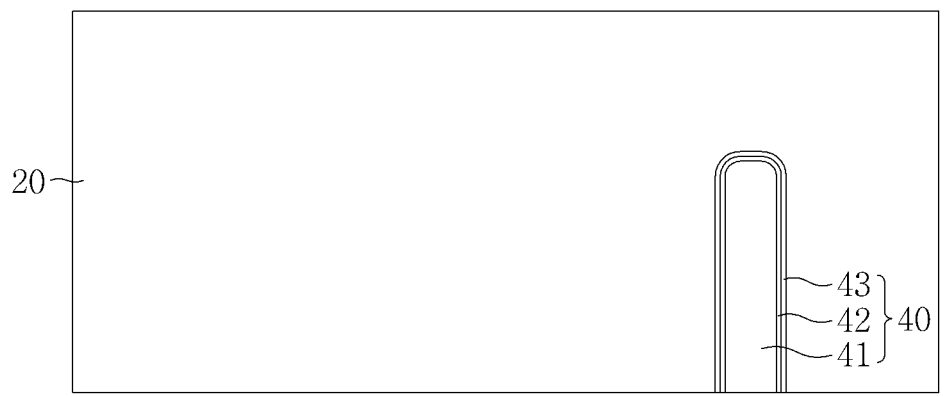
FIGS. 5A through 5G and 6A through 6C are longitudinal cross-sectional views illustrating methods of forming via connection structures according to various embodiments of the inventive concepts.

Referring to FIGS. 4A and 5A, a method of forming the via connection structures 10A to 10F according to an embodiment of the inventive concepts may include forming a via structure 40 in a lower layer 20 (operation S10). The via structure 40 may be buried in the lower layer 20. The via structure 40 may include a via core 41, a via barrier layer 42 configured to surround a surface of the via core 41, and a via liner 43 configured to surround a surface of the via barrier layer 42. A method of forming the via structure 40 will be described in detail with reference to other drawings of the present disclosure.

Figure 5B:
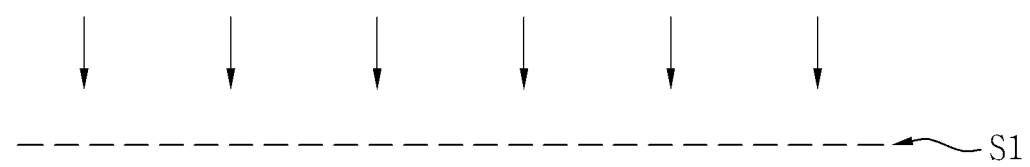
Figure 5B:

Referring to FIGS. 4A and 5B, the method of forming the via connection structures 10A to 10F according to the present embodiment of the inventive concepts may include blanketly removing an upper portion of the lower layer 20 to expose a top surface and partial side surface of the via structure 40 (operation S20). A top surface of the lower layer 20 may be lowered from an initial surface S1 to a final surface S2. A via liner 43 may be exposed on a surface of the via structure 40 that protrudes upward from the lowered lower layer 20. Alternatively, the via barrier layer 42 may be exposed. The removal of the upper portion of the lower layer 20 may include performing a grinding process, a wet etching process and/or a dry etching process.

Figure 5C:
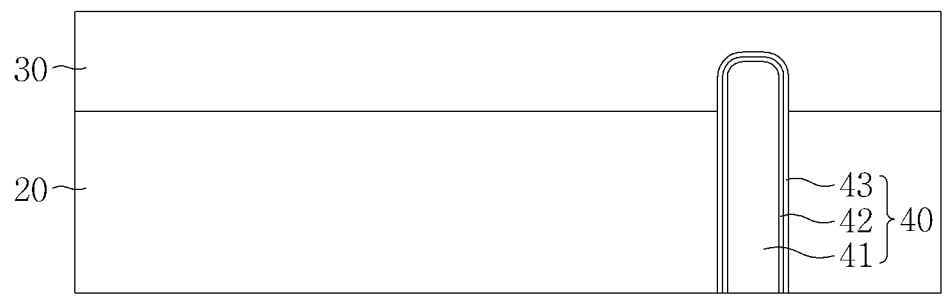

Referring to FIGS. 4A and 5C, the method of forming the via connection structures 10A to 10F according to the present embodiment of the inventive concepts may include forming an insulating layer 30 on the lower layer 20 to cover the via structure 40 (operation S30). The insulating layer 30 may include silicon oxide or silicon nitride.

Figure 5D:
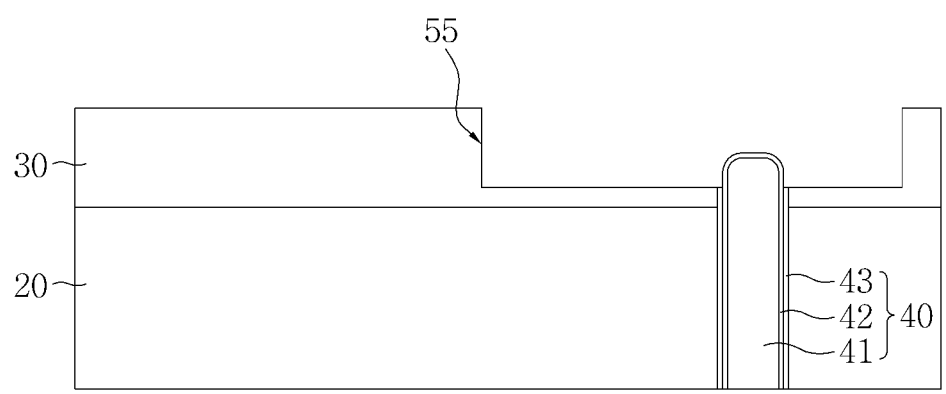

Referring to FIGS. 4A and 5D, the method of forming the via connection structures 10A to 10F according to the present embodiment of the inventive concepts may include forming a groove 55 in the insulating layer 30 to expose the top and side surfaces of the via structure 40 (operation S40). For example, the via structure 40 may protrude into the groove 55. During this process, the via liner 43 exposed on the surface of the via structure 40 protruding into the groove 55 may be removed to expose the via barrier layer 42.

Figure 5E:
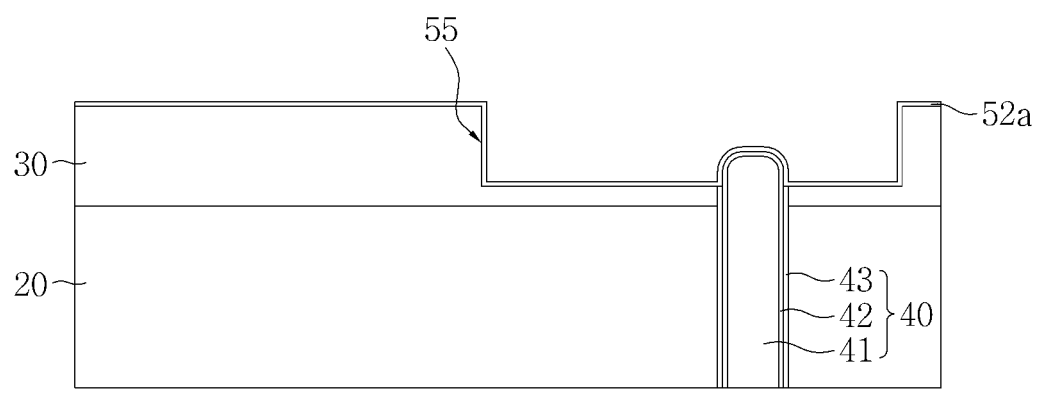

Referring to FIGS. 4A and 5E, the method of forming the via connection structures 10A to 10F according to the present embodiment of the inventive concepts may include forming an interconnection barrier material layer 52a within the groove 55, (operation S50). The interconnection barrier material layer 52a may be conformally formed on an inner wall and bottom surface of the groove 55 and the exposed surface of the via structure 40. The interconnection barrier material layer 52a may also be formed on a top surface of the insulating layer 30.

Figure 5F:
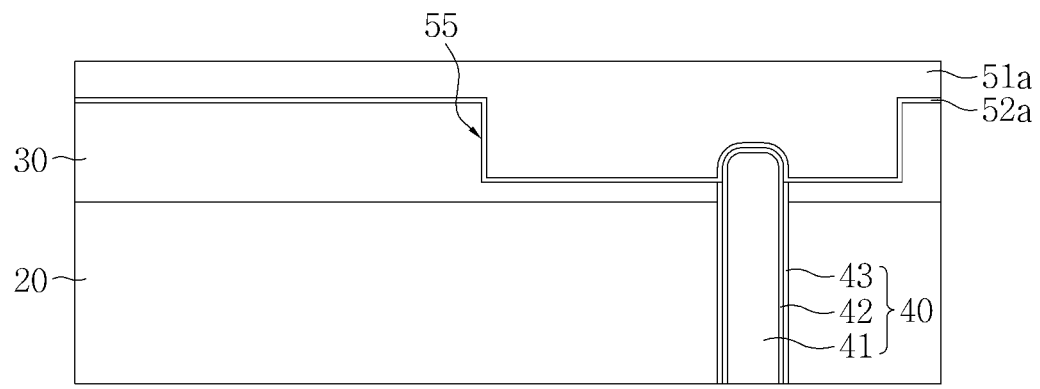

Referring to FIGS. 4A and 5F, the method of forming the via connection structures 10A to 10F according to the present embodiment of the inventive concepts may include forming an interconnection material layer 51a within the groove 55 (operation S60). The interconnection material layer 51a may be formed on the interconnection barrier material layer 52a to completely fill the groove 55. For example, the formation of the interconnection material layer 51a may include forming a seed layer on the interconnection barrier material layer 52a and performing a plating process. The interconnection material layer 51a may also be formed on the top surface of the insulating layer 30.

Figure 5G:
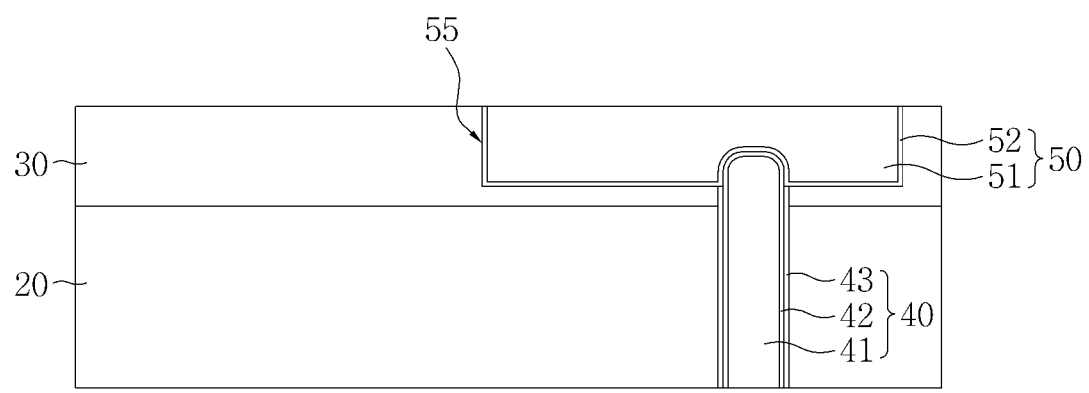

Referring to FIGS. 4A and 5G, the method of forming the via connection structures 10A to 10F according to the present embodiment of the inventive concepts may include forming an interconnection structure 50 to fill the groove 55 (operation S70). The formation of the interconnection structure 50 may include removing a portion of the interconnection material layer 51a formed on the insulating layer 30 and a portion of the interconnection barrier material layer 52a. The removal of the portions of the interconnection material layer 51a and the interconnection barrier material layer 52a may include performing a chemical mechanical polishing (CMP) process and/or a wet etching process. Due to this process, the interconnection structure 50 having an interconnection 51 and an interconnection barrier layer 52 may be formed. Subsequently, a passivation layer 60 may be formed on the insulating layer 30 and the interconnection structure 50, thereby completing formation of the via connection structure 10A shown in FIG. 2A (operation S80).

Figure 6A:
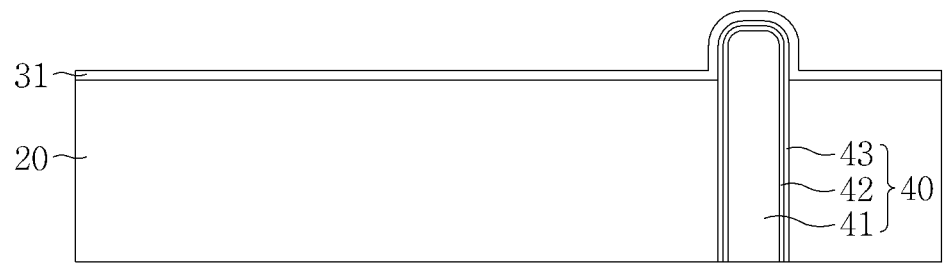

Referring to FIGS. 4B and 6A, a method of forming via connection structures 10G to 10S according to an embodiment of the inventive concepts may include performing the processes described with reference to FIGS. 5A and 5B (operations S10 and S20) and forming a lower insulating layer 31 on a lower layer 20 and a protruding via structure 40 (operation S25). The lower insulating layer 31 may include silicon oxide.

Figure 6B:
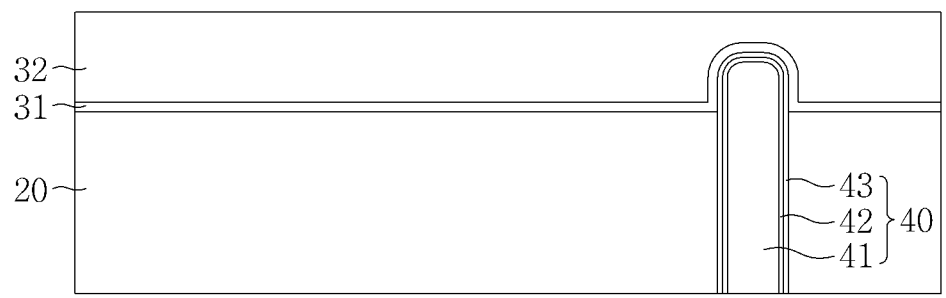

Referring to FIGS. 4B and 6B, the method of forming the via connection structures 10G to 10S according to the present embodiment of the inventive concepts may include forming an upper insulating layer 32 on the lower insulating layer 31 (operation S35). The upper insulating layer 32 may be formed to bury the protruding via structure 40. The upper insulating layer 32 may include silicon nitride.

Figure 6C:
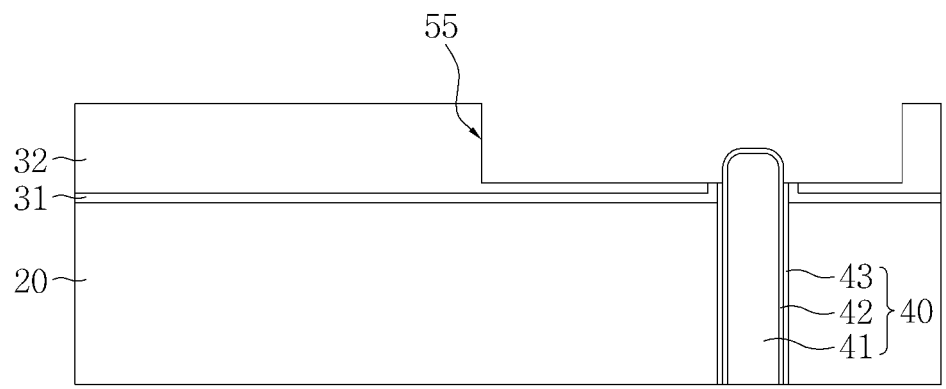

Referring to FIGS. 4B and 6C, the method of forming the via connection structures 10G to 10S according to the present embodiment of the inventive concepts may include forming a groove 55 in the upper insulating layer 32 to expose top and side surfaces of the via structure 40 (operation S42). During this process, the lower insulating layer 31 and the via liner 43 formed on the surface of the protruding via structure 40 may be removed. For instance, the via barrier layer 42 may be exposed. Also, a portion of the lower insulating layer 31 may be exposed on a bottom surface of the groove 55. Afterwards, the method of forming the via connection structures 10G to 10S according to the present embodiment of the inventive concepts may further include performing the processes described with reference to FIGS. 5E through 5G (operations S50 through S80), thereby completing the formation of the via connection structure 10G shown in FIG. 2G.

Figure 7A:
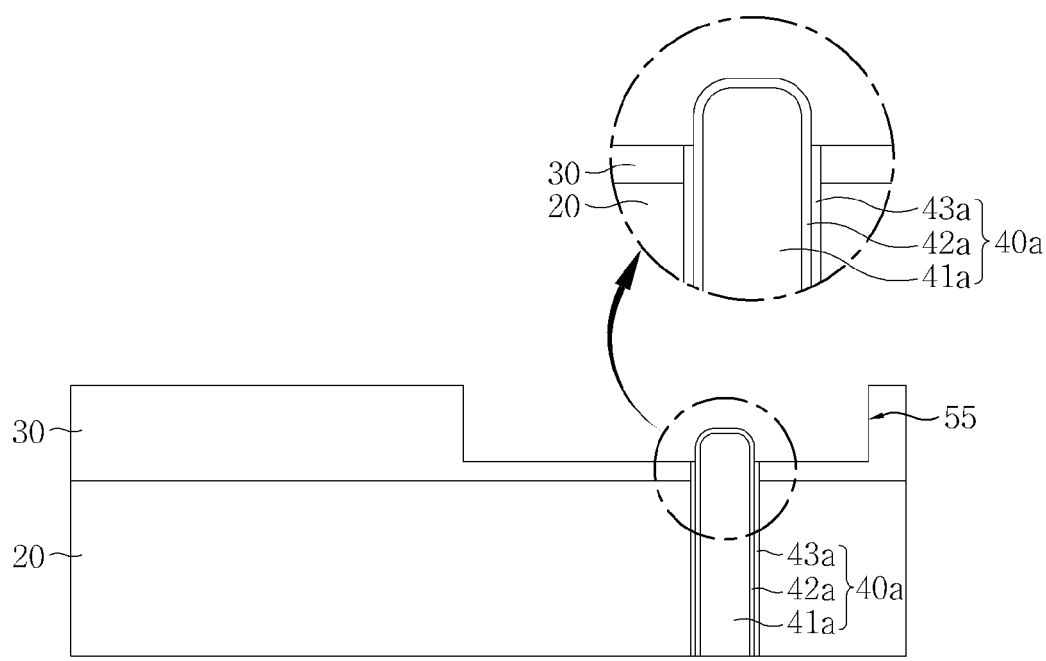
FIGS. 7A through 7Q are conceptual longitudinal cross-sectional views of via structures having various shapes, which are exposed within grooves according to some embodiments of the inventive concepts.
Figure 7B:
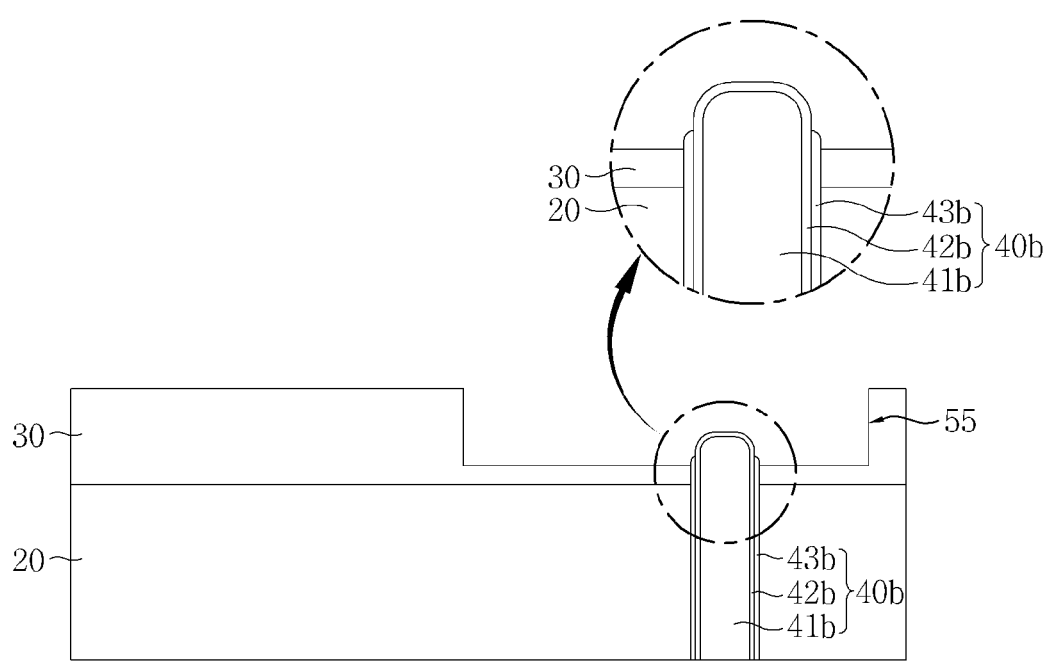
Figure 7C:
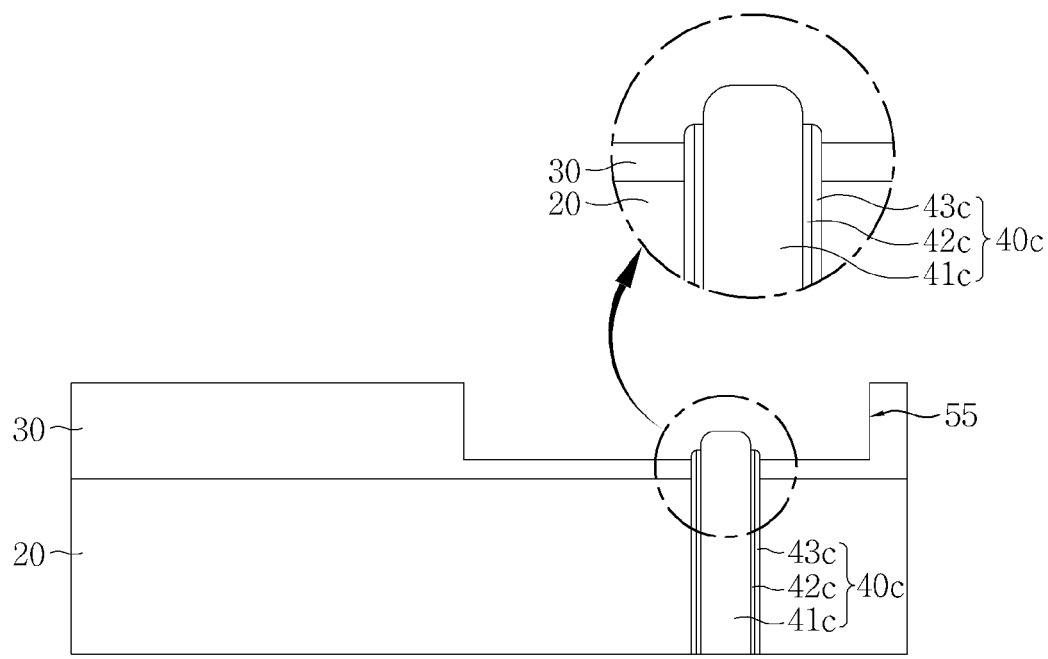
Figure 7D:
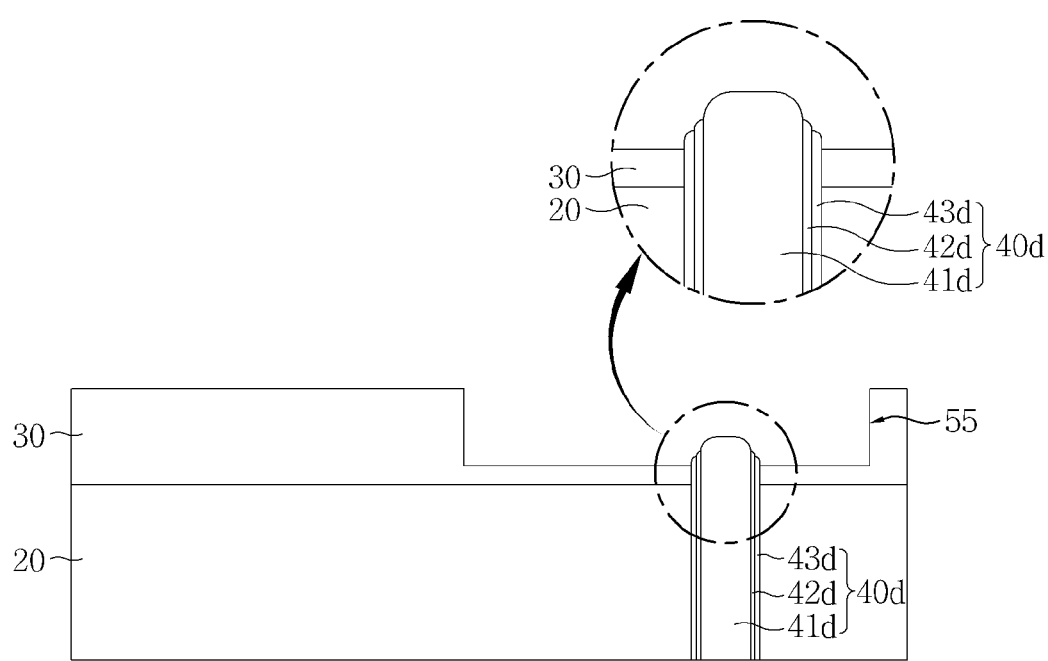
Figure 7E:
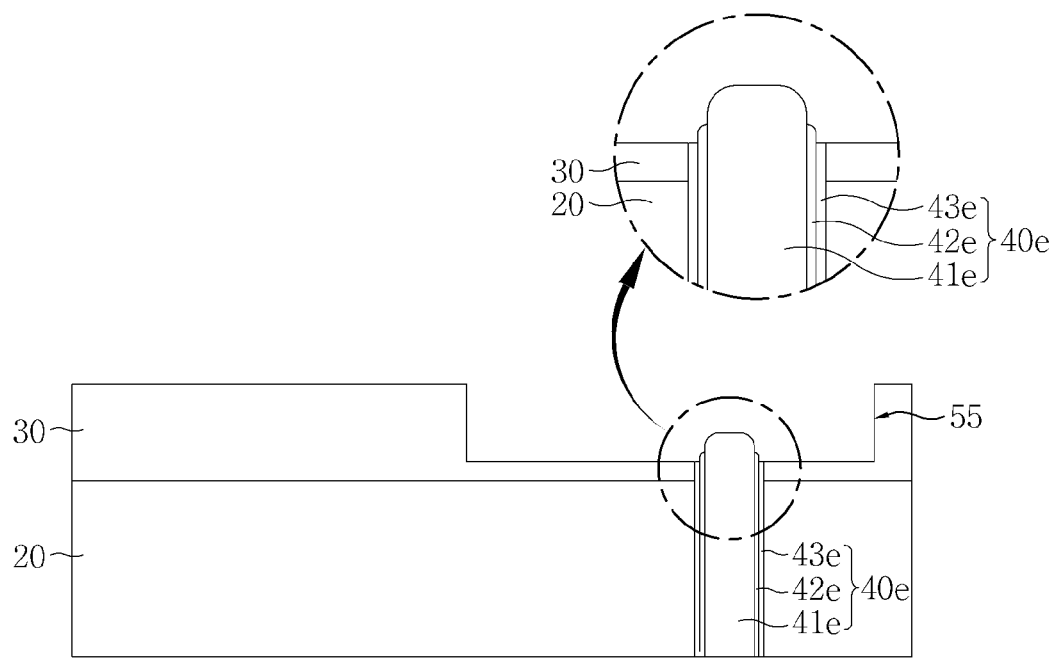
Figure 7F:
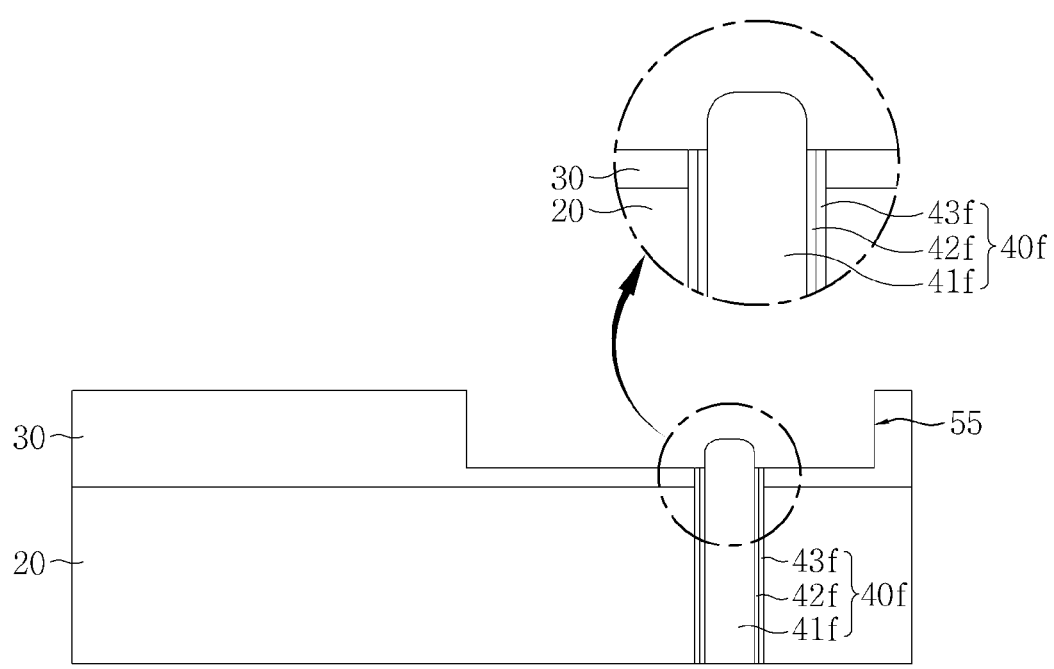
Figure 7G:
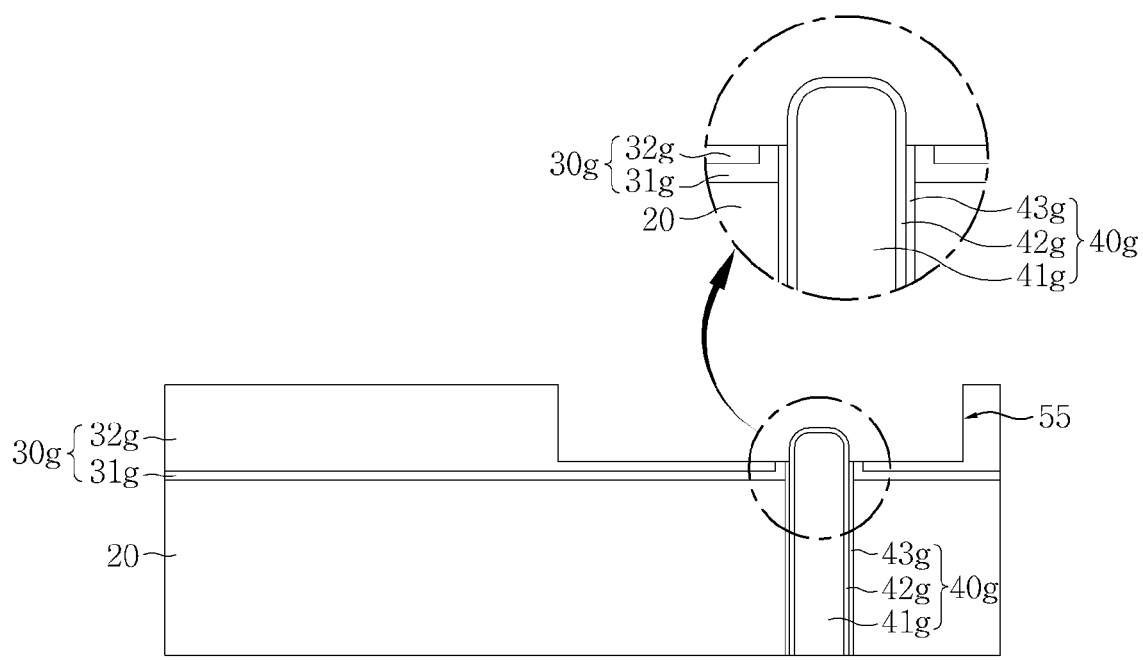
Figure 7H:
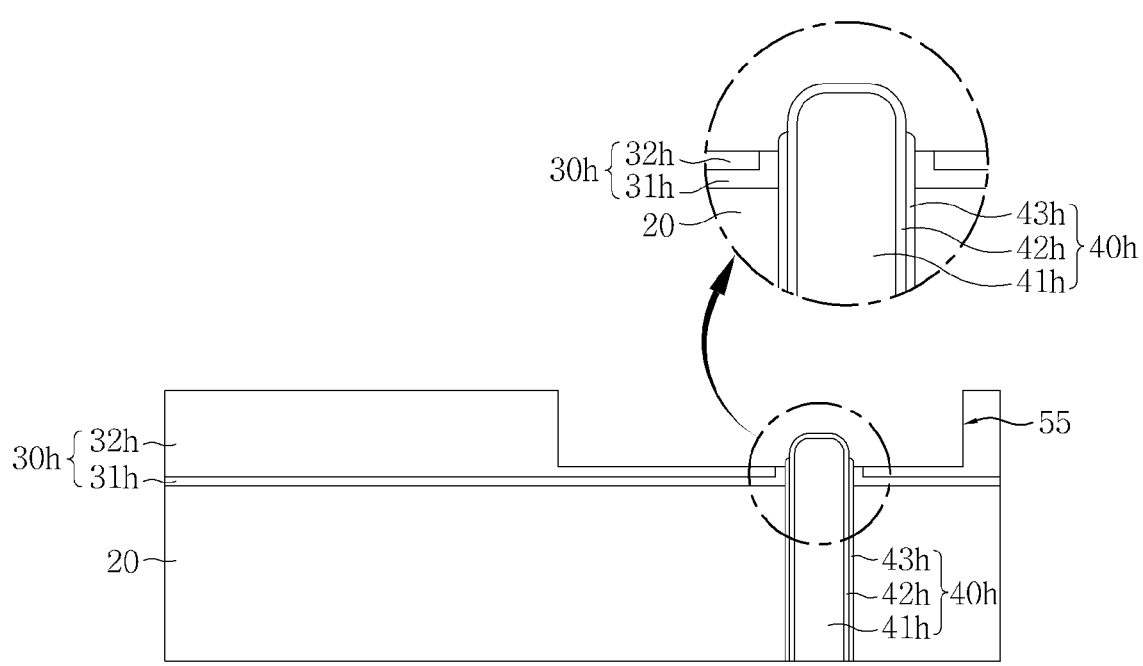
Figure 7I:
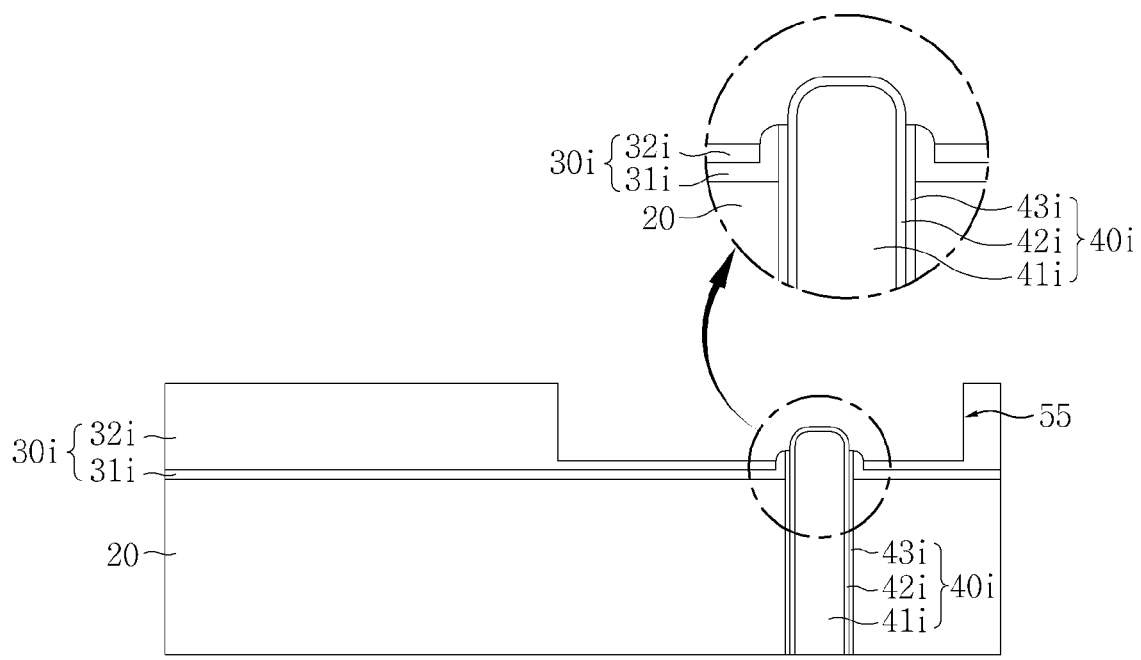
Figure 7J:
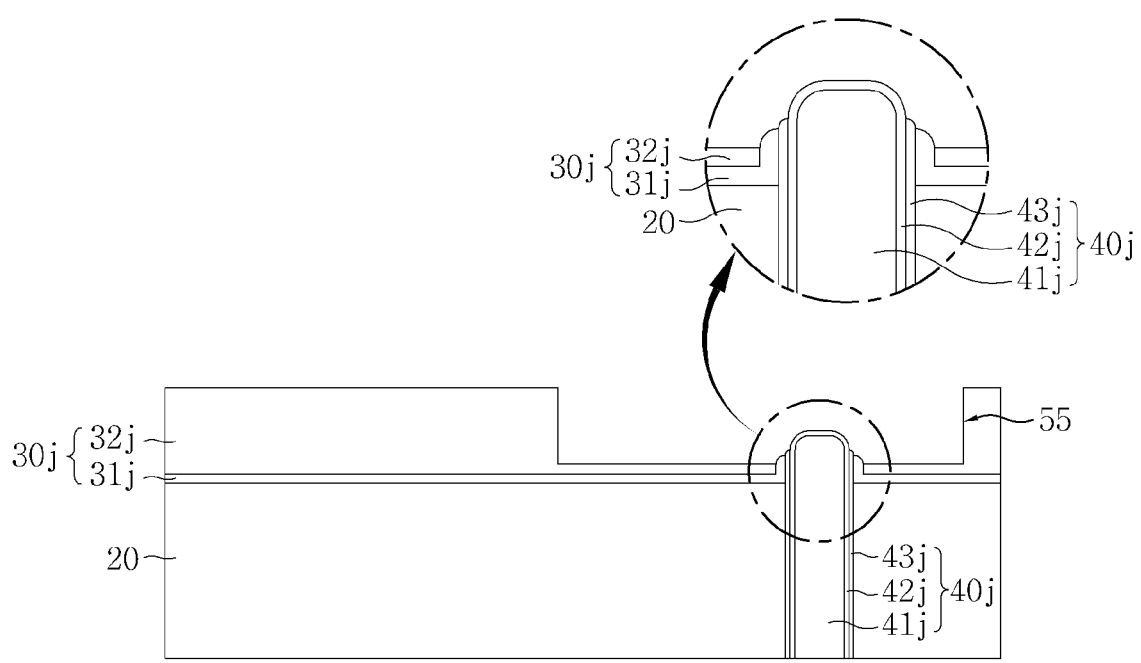
Figure 7K:
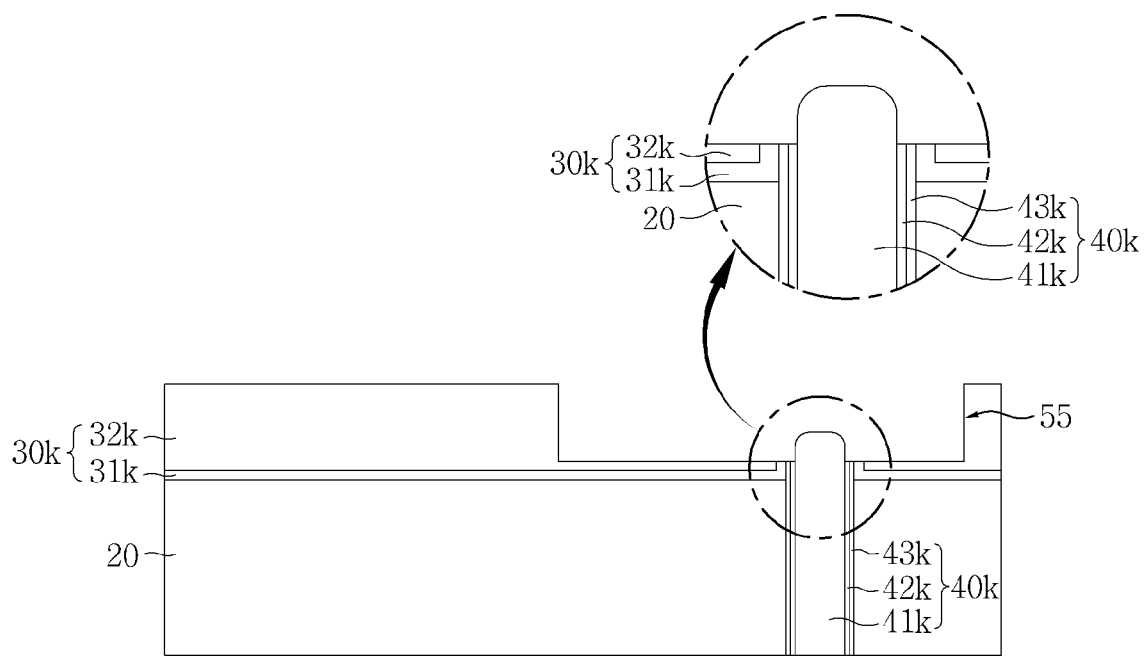
Figure 7L:
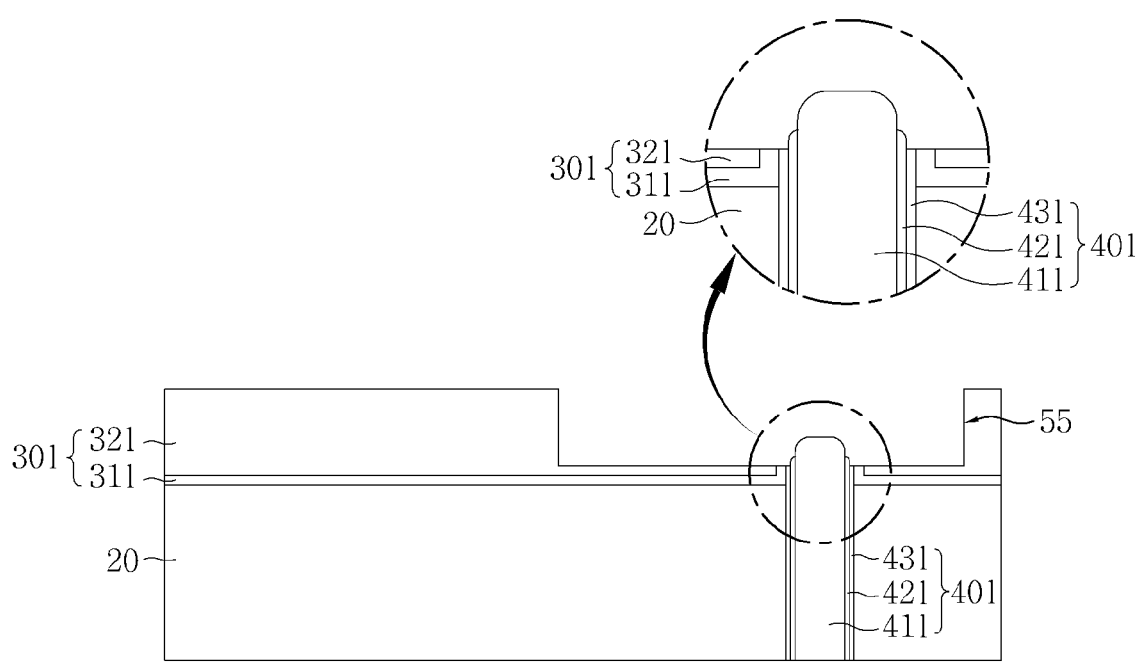
Figure 7M:
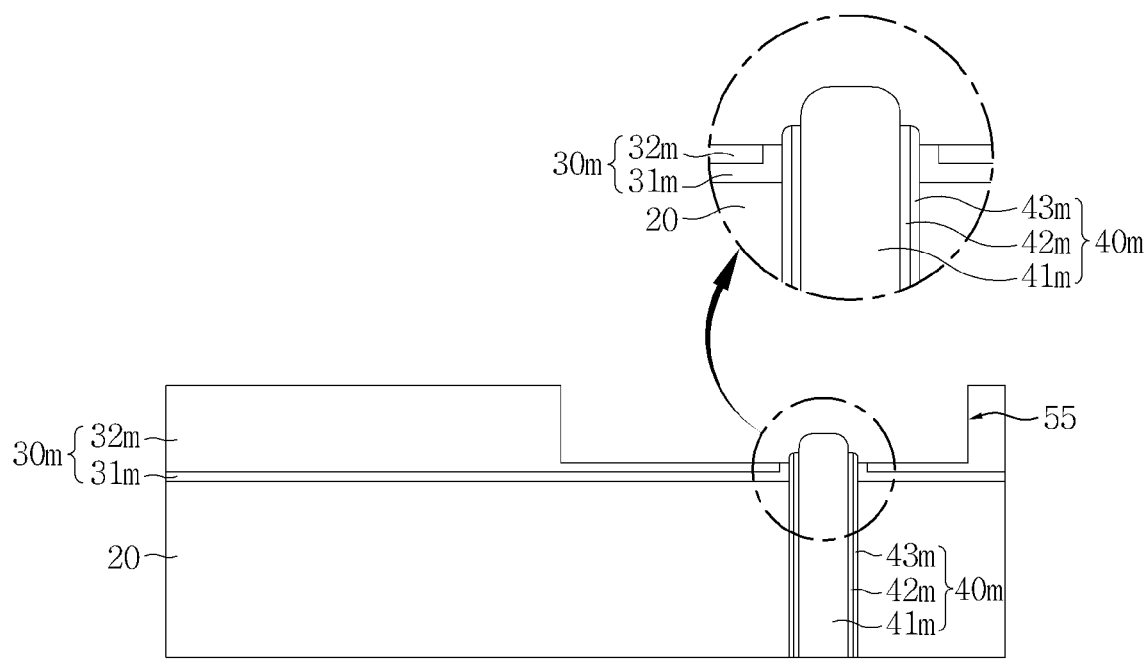
Figure 7N:
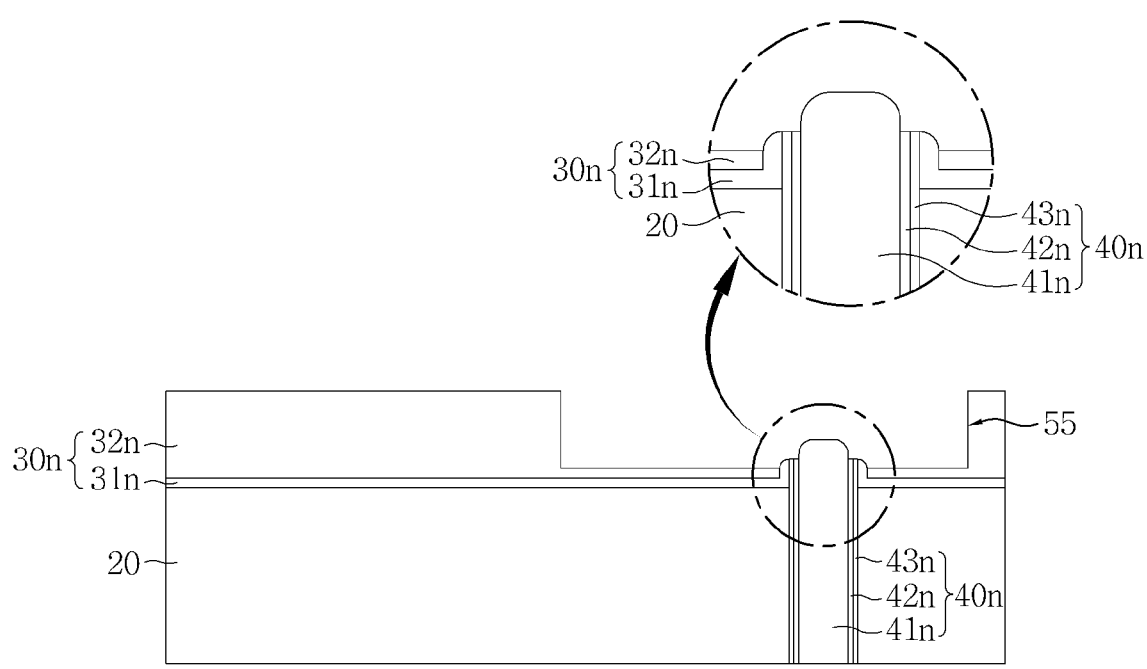
Figure 7O:
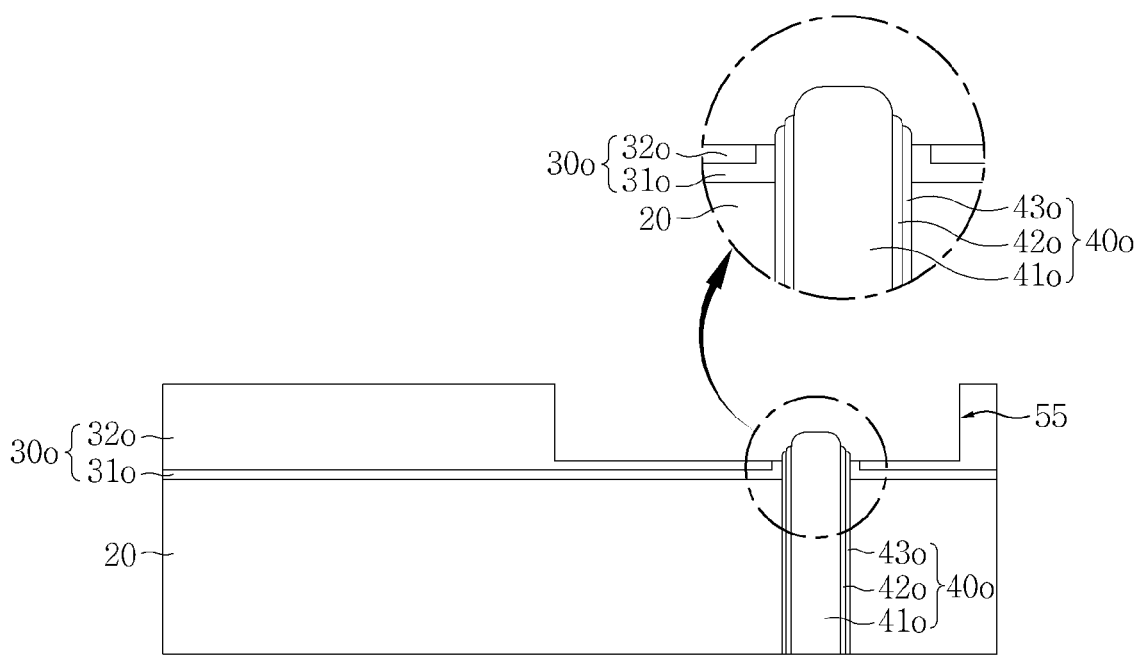
Figure 7P:
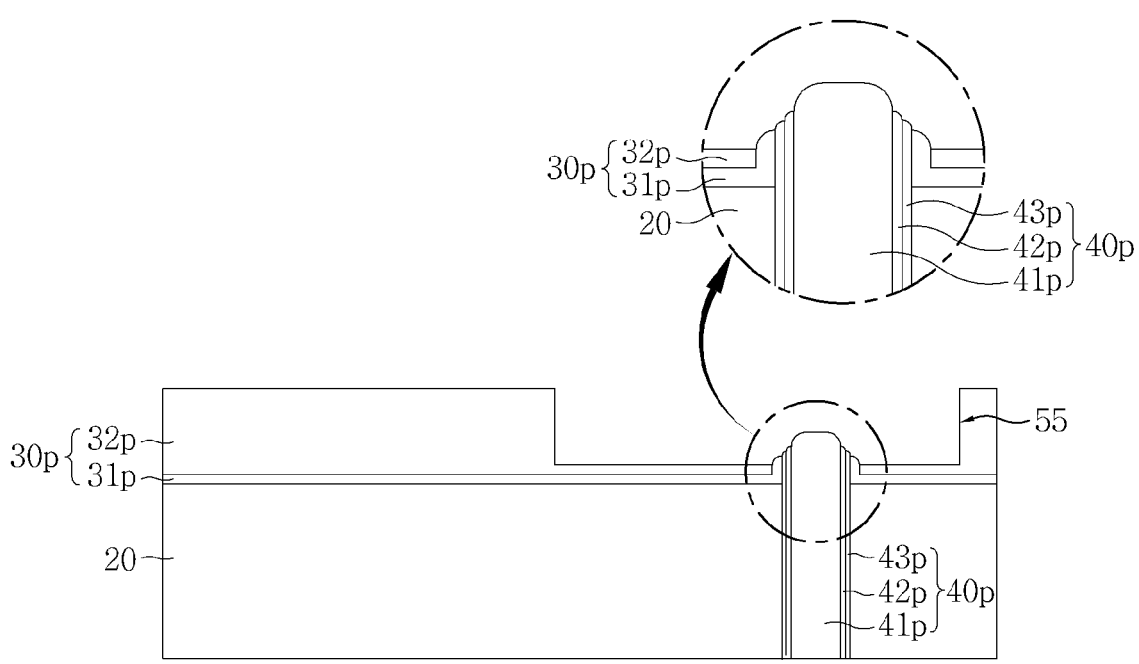
Figure 7Q:
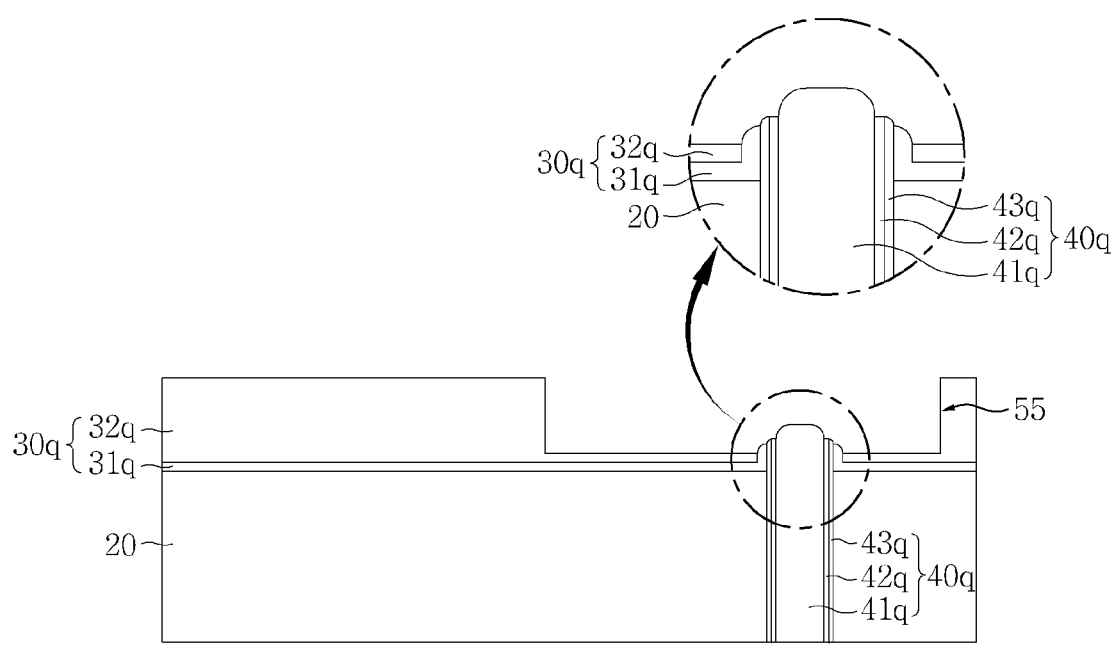

FIGS. 7A through 7Q are conceptual longitudinal cross-sectional views of via structures 40a to 40q having various shapes, which are exposed within grooves 55 in the methods of forming the via connection structures 10A-10Q according to various embodiments of the inventive concepts.

Referring to FIG. 7A, a method of forming the via connection structure 10A according to an embodiment of the inventive concepts may include removing a via liner 43a of the via structure 40a protruding into the groove 55. The via barrier layer 42a may cover the entire surface of the via core 41a.

Referring to FIG. 7B, a method of forming the via connection structure 10B according to an embodiment of the inventive concepts may include forming a via barrier layer 42b of the the via structure 40b protruding into the groove 55 to expose a surface of a top end of a via core 41b and partially or wholly cover a side surface of the via core 41b. The via barrier layer 42b may cover the entire surface of the via core 41b.

Referring to FIG. 7C, a method of forming a via connection structure 10C according to an embodiment of the inventive concepts may include forming a via barrier layer 42c of the via structure 40c protruding into the groove 55 to expose a surface of a top end of a via core 41c and partially or wholly cover a side surface of the via core 41c and forming a via liner 43c to expose a surface of a top end of the via barrier layer 42c protruding into the groove 55 and wholly cover a side surface of the via barrier layer 42c.

Referring to FIG. 7D, a method of forming a via connection structure 10D according to an embodiment of the inventive concepts may include forming a via barrier layer 42d of the via structure 40d protruding into the groove 55 to expose a surface of a top end of a via core 41d and partially or wholly cover a side surface of the via core 41d and forming a via liner 43d to expose a surface of a top end of the via barrier layer 42d protruding into the groove 55 and partially cover a side surface of the via barrier layer 42d.

Referring to FIG. 7E, a method of forming a via connection structure 10E according to an embodiment of the inventive concepts may include forming a via barrier layer 42e of the via structure 40e protruding into the groove 55 to expose a surface of a top end of a via core 41e and partially and wholly cover a side surface of the via core 41e and forming a via liner 43e to expose a surface of a top end and side surface of the via barrier layer 42e protruding into the groove 55. For example, the method may include forming the via liner 43e such that a top end of the via liner 43e is disposed at the same level as or at a similar level to a bottom surface of the groove 55.

Referring to FIG. 7F, a method of forming a via connection structure 10F according to an embodiment of the inventive concepts may removing a via barrier layer 42f and a via liner 43f of the via structure 40f protruding into the groove 55 to wholly expose a surface of a top end and side surface of a via core 41f.

Referring to FIG. 7G, a method of forming a via connection structure 10G according to an embodiment of the inventive concepts may include forming a lower insulating layer 31g and an upper insulating layer 32g and exposing a portion of a top end of the lower insulating layer 31g within the groove 55. A via core 41g and a via barrier layer 42g may protrude into the groove 55. The lower insulating layer 31g may surround a via structure 40g and contact a side surface of a via liner 43g. The upper insulating layer 32g may be spaced apart from and out of contact with the via liner 43g. The via barrier layer 42g may cover top and side surfaces of the protruding via core 41g. Top and side surfaces of the via barrier layer 42g may be in direct contact with an interconnection barrier layer 52. Within the groove 55, top surfaces of the via liner 43g, the lower insulating layer 31g, and the upper insulating layer 32g may be at the same level or at similar levels.

Referring to FIG. 7H, a method of forming a via connection structure 10H according to an embodiment of the inventive concepts may include forming a lower insulating layer and an upper insulating layer 32g and protruding a top end of a via liner 43h into the groove 55.

Referring to FIG. 7I, a method of forming a via connection structure 10I according to an embodiment of the inventive concepts may include forming a lower insulating layer 31i and an upper insulating layer 32i and protruding top ends of a via liner 43i and the lower insulating layer 31i within the groove 55. The top ends of the via liner 43i and the lower insulating layer 31i may be disposed at the same level or at similar levels.

Referring to FIG. 7J, a method of forming a via connection structure 10J according to an embodiment of the inventive concepts may include forming a lower insulating layer 31j and an upper insulating layer 32j and protruding top ends of a via liner 43j and the lower insulating layer 31j within the groove 55. The top end of the via liner 43j may be disposed at a higher level than the top end of the lower insulating layer 31j.

Referring to FIG. 7K, a method of forming a via connection structure 10K according to an embodiment of the inventive concepts may include forming a lower insulating layer 31k and an upper insulating layer 32k and protruding a via core 41k into the groove 55. A via barrier layer 42k may wholly or partially cover a side surface of the via core 41k. Top ends of the via barrier layer 42k, a via liner 43k, the lower insulating layer 31k, and the upper insulating layer 32k may be disposed at the same level or at similar levels.

Referring to FIG. 7L, a method of forming a via connection structure 10L according to an embodiment of the inventive concepts may include forming a lower insulating layer 31l and an upper insulating layer 32l and protruding a via core 41k into a groove 55. A via barrier layer 42k may wholly or partially cover a side surface of the via core 41k. The via barrier layer 42k may protrude into the groove 55. Top ends of a via liner 43k, the lower insulating layer 31k, and the upper insulating layer 32k may be disposed at the same level or at similar levels.

Referring to FIG. 7M, a method of forming a via connection structure 10M according to an embodiment of the inventive concepts may include forming a lower insulating layer 31m and an upper insulating layer 32m and protruding a via core 41m into the groove 55. A via barrier layer 42m may protrude into the groove 55 and partially or wholly cover a side surface of the via core 41m. A via liner 43m may protrude into the groove 55 and partially or wholly cover a side surface of the via barrier layer 42m.

Referring to FIG. 7N, a method of forming a via connection structure 10N according to an embodiment of the inventive concepts may include forming a lower insulating layer 31n and an upper insulating layer 32n and protruding a via core 41n into the groove 55. A via barrier layer 42n may protrude into the groove 55 and partially or wholly a side surface of the via core 41n. A via liner 43n may protrude into the groove 55 and partially or wholly cover a side surface of the via barrier layer 42n. A portion of the lower insulating layer 31n may protrude within the groove 55 and partially or wholly cover a side surface of the via liner 43n.

Referring to FIG. 7O, a method of forming a via connection structure 10O according to an embodiment of the inventive concepts may include forming a lower insulating layer 31o and an upper insulating layer 32o and protruding a via core 41o into the groove 55. A via barrier layer 42o protrude into the groove 55 and partially or wholly cover a side surface of the via core 41o. A via liner 43o may protrude into the groove 55 and partially or wholly cover a side surface of the via barrier layer 42o. A top surface of the lower insulating layer 31o may be disposed at the same level as or at a similar level to a surface of the upper insulating layer 32o.

Referring to FIG. 7P, a method of forming a via connection structure 10P according to an embodiment of the inventive concepts may include forming a lower insulating layer 31p and an upper insulating layer 32p and protruding a via core 41p into the groove 55. A via barrier layer 42p may protrude into the groove 55 and partially or wholly cover a side surface of a via barrier layer 42p. A portion of the lower insulating layer 31p may protrude within the groove 55 and partially or wholly cover a side surface of a via liner 43p.

Referring to FIG. 7Q, a method of forming a via connection structure 10Q according to an embodiment of the inventive concepts may include forming a lower insulating layer 31q and an upper insulating layer 32q and protruding a via core 41q into the groove 55. A via barrier layer 42q may protrude into the groove 55 and partially or wholly cover a side surface of the via core 41q. A via liner 43q may protrude into the groove 55 and partially or wholly cover a side surface of the via barrier layer 42q. Top ends of the via barrier layer 42q and a via liner 43q may be disposed at the same level or at similar levels. A portion of the lower insulating layer 31q may protrude within the groove 55 and partially or wholly cover a side surface of a via liner 43q.

The methods of forming the via connection structures according to various embodiments of the inventive concepts may include forming an interconnection structure 50 using a damascene process. Accordingly, an interconnection barrier layer 52 may completely surround bottom and side surfaces of an interconnection 51. For example, when the interconnection barrier layer 52 is removed using a wet etching process or a selective etching process, the interconnection barrier layer 52 may not completely surround the bottom or side surface of the interconnection 51, thus causing physical and/or electrical instability. The methods of forming the via connection structures according to various embodiments of the inventive concepts may adopt a CMP process instead of photolithography and etching processes. Thus, pitches of the via structures 40a to 40s and pitches of the interconnection structures 50 may become finer and more elaborate. In each of the methods of forming the via connection structures according to various embodiments of the inventive concepts, the via structure 40a to 40s may protrude into the interconnection structure 50. For instance, the via structure 40a to 40s may be inserted into the interconnection structure 50. Accordingly, a contact area between the via structure 40a to 40s and the interconnection structure 50 may increase so that a sheet resistance between the via structure 40a to 40s and the interconnection structure 50 can be reduced. Furthermore, since the interconnection structure 50 may be physically fixed by the via structure 40a to 40s, a contact failure or separation of components due to a floating phenomenon may be prevented.

Figure 8A:
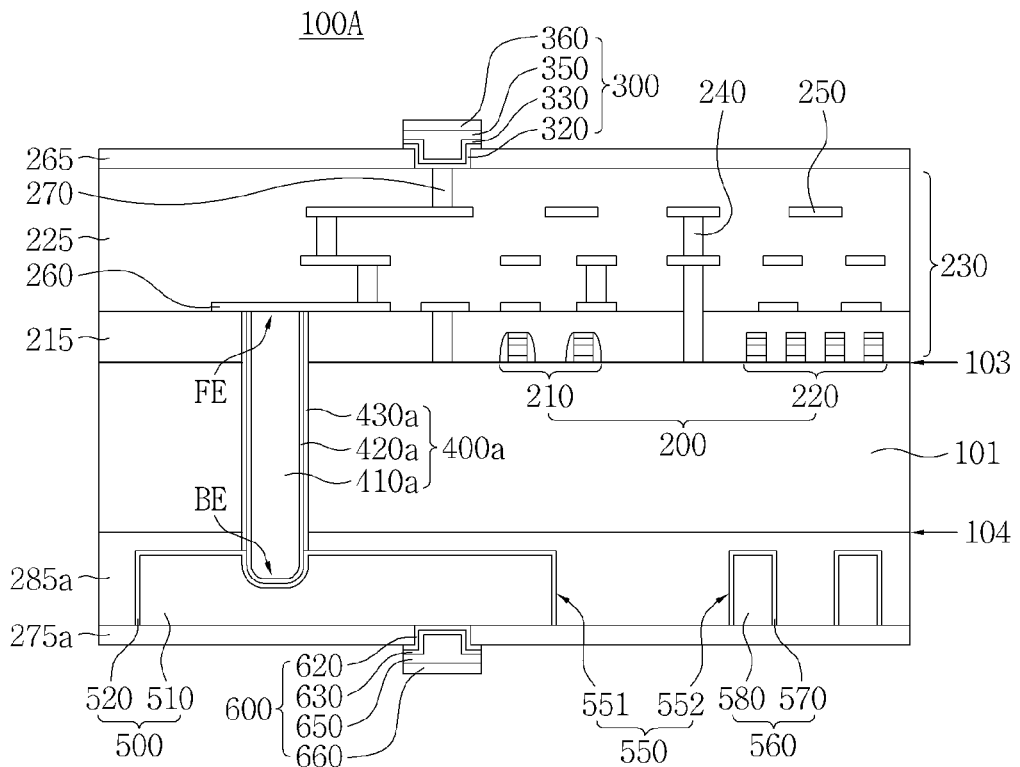
FIGS. 8A through 8S are conceptual longitudinal cross-sectional views of semiconductor devices according to various embodiments of the inventive concepts.

FIG. 8A through 8S are conceptual longitudinal cross-sectional views of semiconductor devices 100A to 100S according to various embodiments of the inventive concepts. Referring to FIG. 8A, the semiconductor device 100A according to an embodiment of the inventive concepts may include internal circuits 230 and a front-side input/output (I/O) pad 300 formed on a front side 103 of a substrate 101, a through-silicon via (TSV) structure 400a formed in the substrate 101, and a redistribution structure 500 and a back-side I/O pad 600 formed on a back side 104 of the substrate 101.

The substrate 101 may be a silicon wafer. For example, the substrate 101 may include a single crystalline silicon wafer, a silicon wafer including a silicon carbide (SiC) layer or a silicon germanium (SiGe) layer, or a silicon-on-insulator (SOI) wafer including an insulating layer. In the present embodiment, it is assumed that the substrate 101 is a single crystalline silicon wafer.

The internal circuits 230 including unit devices 200 may be formed on the front side 103 of the substrate 101. For instance, the unit devices 200 may include metal-oxide-semiconductor (MOS) transistors 210 and cell patterns 220. The MOS transistors 210 may include a complementary MOS (CMOS) logic circuit. The cell patterns 220 may include a flash memory string structure. For example, the cell patterns 220 may include a plurality of flash memory cells. Alternatively, when the semiconductor device 100A is a logic device, the cell patterns 220 may include various cell transistors.

The internal circuits 230 may include a plurality of conductive internal vias 240 and multilayered conductive internal interconnections 250. The internal vias 240 may connect between the substrate 101 and the internal interconnections 250 or between the internal interconnections 250 in a vertical direction and transmit electric signals. The internal interconnections 250 may transmit the electric signals in a horizontal direction. The internal circuits 230 may include a conductive material, such as doped silicon, a metal, a metal silicide, a metal alloy, or a metal compound. The internal circuits 230 may include a front-side I/O pad via plug 270. The front-side I/O pad via plug 270 may electrically connect a portion of an uppermost internal interconnection 250 and the front-side I/O pad 300. The front-side I/O pad via plug 270 may include a metal, such as copper (Cu), aluminum (Al), or tungsten (W).

The unit devices 200 may be covered with a first interlayer insulating layer 215. Although the first interlayer insulating layer 215 is formed as a multilayered type, the first interlayer insulating layer 215 having a single layer structure is illustrated for brevity. The first interlayer insulating layer 215 may include silicon oxide or silicon nitride. For example, when the first interlayer insulating layer 215 is a single layer, the first interlayer insulating layer 215 may include silicon oxide. The internal circuits 230 may be surrounded with a second interlayer insulating layer 225. Although the second interlayer insulating layer 225 may be formed as a multilayered type, the second interlayer insulating layer 225 having a single layer structure is illustrated for brevity. The second interlayer insulating layer 225 may include silicon oxide or silicon nitride.

A front-side passivation layer 265 may be formed on the second interlayer insulating layer 225. The front-side passivation layer 265 may include silicon oxide, silicon nitride, or polyimide. The front-side passivation layer 265 may have a front-side I/O pad opening 310 exposing an upper portion of the front-side I/O pad via plug 270.

The front-side I/O pad 300 may be formed within the front-side I/O pad opening 310 and on a surface of the front-side passivation layer 265. The front-side passivation layer 265 may surround a portion of a side surface of the front-side I/O pad 300. For example, the front-side I/O pad 300 may have a reversed stepped difference, while the front-side passivation layer 265 may be disposed under a bottom surface of the reversed stepped difference of the front-side I/O pad 300. The front-side I/O pad 300 may include a front-side I/O pad barrier layer 320, a front-side I/O pad seed layer 330, a front-side I/O pad metal layer 350, and/or a front-side I/O pad capping layer 360. The front-side I/O pad barrier layer 320 may include a barrier metal. For example, the front-side I/O pad barrier layer 320 may include titanium (Ti), titanium nitride (TiN), tantalum (Ta), tantalum nitride (TaN), titanium tungsten (TiW), or another refractory metal. The front-side I/O pad seed layer 330 may include a seed metal, such as copper (Cu), ruthenium (Ru), nickel (Ni), or tungsten (W). The front-side I/O pad metal layer 350 may include a metal, such as copper or nickel. The front-side I/O pad capping layer 360 may include gold (Au), silver (Ag), or nickel (Ni). The front-side I/O pad barrier layer 320 may be a multilayered type.

A through-silicon via (TSV) pad 260 may be formed above the front side 103 of the substrate 101, for example, on the first interlayer insulating layer 215. The TSV pad 260 may be electrically connected to some of the internal circuits 230. The TSV pad 260 may include a metal, a metal silicide, or a metal alloy. The TSV pad 260 may be a multilayered type. For example, the TSV pad 260 may include a metal layer serving as a barrier layer and a metal layer serving as a pad. For instance, the TSV pad 260 may include a TSV pad barrier layer formed to a relatively small thickness on a portion contacting the TSV structure 400a and a TSV pad metal layer formed as a single-layered or multilayered type on the TSV pad barrier layer. For example, the TSV pad barrier layer may include metal formed of Ti, TiN, Ta, TaN, or WN, or a metal silicide. The TSV pad metal layer may include a metal, such as tungsten (W), aluminum (Al), or copper (Cu), or a metal silicide.

The TSV structure 400a may be formed to penetrate the substrate 101. For example, the TSV structure 400a may include a front-side end FE facing the front side 103 of the substrate 101 and a back-side end BE facing the back side 104 of the substrate 101. For example, the front-side end FE of the TSV structure 400a may be disposed near the front side 103 of the substrate 101, and the back-side end BE of the TSV structure 400a may be disposed near the back side 104 of the substrate 101.

The TSV structure 400a may include a TSV core 410a, a TSV barrier layer 420a, and a TSV liner 430a. The TSV core 410a may be formed as a pillar type, and a side surface of the TSV core 410a may be surrounded with the TSV barrier layer 420a and the TSV liner 430a. For example, the TSV core 410a may include a metal, such as copper (Cu). The TSV barrier layer 420a may include a barrier metal, such as Ti, TiN, Ta, TaN, or TiW. The TSV barrier layer 420a may be formed as a single-layered or multilayered type. The TSV liner 430a may include an insulating material, such as silicon oxide.

The front-side end FE of the TSV structure 400a may be in contact with the TSV pad 260. The TSV core 410a may be exposed on the front-side end FE of the TSV structure 400a and in direct contact with the TSV pad 260.

The back-side end BE of the TSV structure 400a may protrude from a surface of the back side 104 of the substrate 101. For example, a top surface of the back-side end BE of the TSV structure 400a and a portion of a side surface of the back-side end BE may protrude from the back side 104 of the substrate 101. It is illustrated that the back-side end BE of the TSV structure 400a protrudes downward from the back side 104 of the substrate 101. The top surface of the back-side end BE of the TSV structure 400a and the portion of the side surface of the back side end BE may be covered with the TSV barrier layer 420a. The TSV liner 430a may not be formed on the top surface of the back-side end of the TSV structure 400a and the portion of the side surface of the TSV structure 400a. For instance, the TSV barrier layer 420a may be in direct contact with the redistribution structure 500.

A back-side insulating layer 285a may be formed on the back side 104 of the substrate 101. The back-side insulating layer 285a may include silicon oxide or silicon nitride. The back-side insulating layer 285a may include a groove 550. The groove 550 may include a redistribution groove 551 and an alignment key groove 552.

The redistribution structure 500 may be formed within the redistribution groove 551. The redistribution structure 500 may include a redistribution barrier layer 520 and a redistribution interconnection 510.

The back-side end BE of the TSV structure 400a may protrude into the redistribution groove 551. The redistribution barrier layer 520 may be formed on an exposed surface of the back-side end BE of the TSV structure 400a. For example, the redistribution barrier layer 520 may be conformally formed on the top and side surfaces of the back-side end BE of the TSV structure 400a that may protrude into the redistribution groove 551. The TSV barrier layer 420a may be exposed on the back-side end BE of the TSV structure 400a that may protrude into the redistribution groove 551 and in direct contact with the redistribution barrier layer 520. The redistribution barrier layer 520 may be conformally formed along a profile of the TSV structure 400a that may protrude into the redistribution groove 551. The back-side insulating layer 285a may surround a portion of a side surface of the TSV structure 400a. For example, the back-side insulating layer 285a formed under the redistribution groove 551 may surround the portion of the side surface of the TSV structure 400a.

When the side surface of the TSV structure 400a buried in the substrate 101 or the back-side insulating layer 285a is surrounded with a single barrier layer having a first thickness, for example, the TSV barrier layer 420a, a surface of the TSV structure 400a protruding into the redistribution groove 551 may be a multilayered barrier layer having a second thickness, for example, the TSV barrier layer 420a and the redistribution barrier layer 520. The second thickness may be greater than the first thickness. For instance, a portion of the TSV structure 400a, which may not be in contact with the redistribution structure 500, may have a relatively thin barrier layer and a portion of the TSV structure 400a, which may be in contact with the redistribution structure 500, may have a relatively thick barrier layer.

An alignment key structure 560 may be formed within the alignment key groove 552. The alignment key structure 560 may include an alignment key barrier layer 570 and an alignment key pattern 580. The alignment key groove 552 may have the same depth as the redistribution groove 551. The alignment key barrier layer 570 may be formed of the same material to the same thickness as the redistribution barrier layer 520. The alignment key pattern 580 may be formed of the same material as the redistribution interconnection 510.

A back-side passivation layer 275a may be formed on the redistribution structure 500 and the alignment key structure 560. The back-side passivation layer 275a may include silicon oxide, silicon nitride, or polyimide. The back-side passivation layer 275a may have a back-side I/O pad opening 610 exposing a portion of the redistribution interconnection 510.

The back-side I/O pad 600 may be formed within the back-side I/O pad opening 610 and a surface of the back-side passivation layer 275a. The back-side I/O pad 600 may include a back-side I/O pad barrier layer 620, a back-side I/O pad seed layer 630, a back-side I/O pad metal layer 650, and/or a back-side I/O pad capping layer 660. The back-side I/O pad barrier layer 620 may include a barrier metal. For example, the back-side I/O pad barrier layer 620 may include Ti, TiN, Ta, TaN, TiW, or another refractory metal. The back-side I/O pad barrier layer 620 may be formed as a single-layered or multilayered type. The back-side I/O pad seed layer 630 may include a seed metal, such as copper (Cu), ruthenium (Ru), nickel, or tungsten (W). The back-side I/O pad metal layer 650 may include a metal, such as copper or nickel. The back-side I/O pad capping layer 660 may include gold (Au), silver (Ag), or nickel (Ni). For example, the front-side I/O pad 300 and the back-side I/O pad 600 may be aligned in a vertical direction.

Figure 8B:
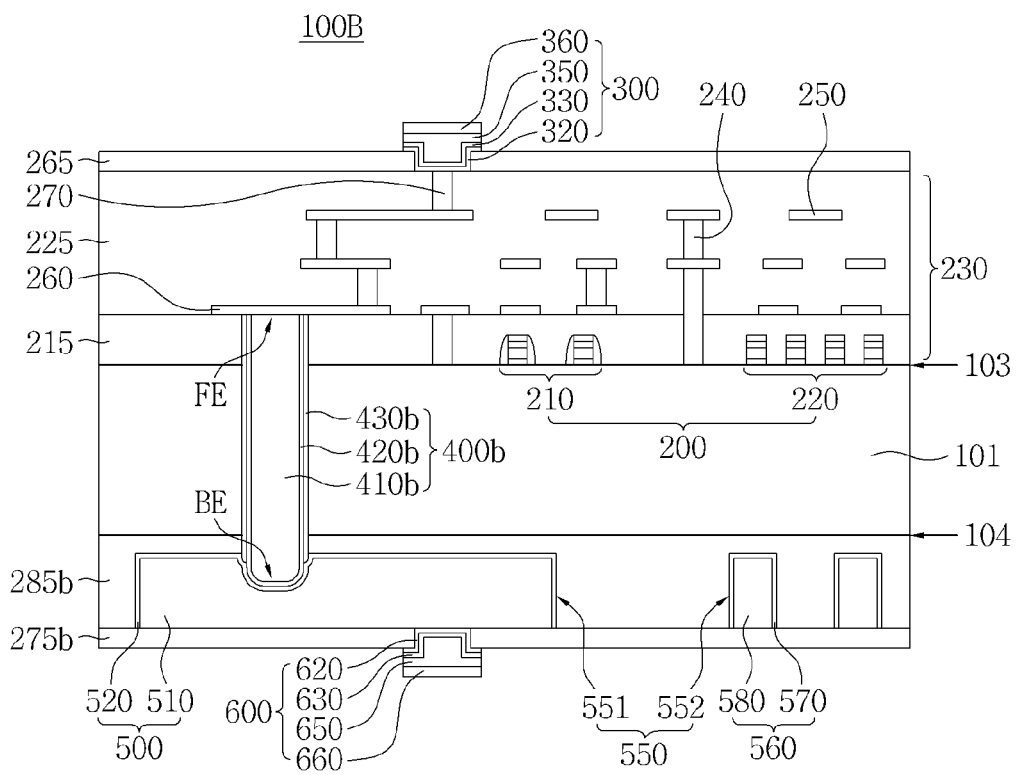

Referring to FIG. 8B, a semiconductor device 100B according to an embodiment of the inventive concepts may include a TSV structure 400b that may protrude into a redistribution groove 551. The TSV structure 400b may include a TSV core 410b and a TSV liner 420b, which may protrude into the redistribution groove 551. For example, the TSV barrier layer 420b may cover all top and side surfaces of the TSV core 410b, and a TSV liner 430b may cover a portion of a side surface of the TSV barrier layer 420b. A top end and partial side surface of the TSV liner 430b may be exposed within the redistribution groove 551 and in contact with a redistribution barrier layer 520.

Figure 8C:
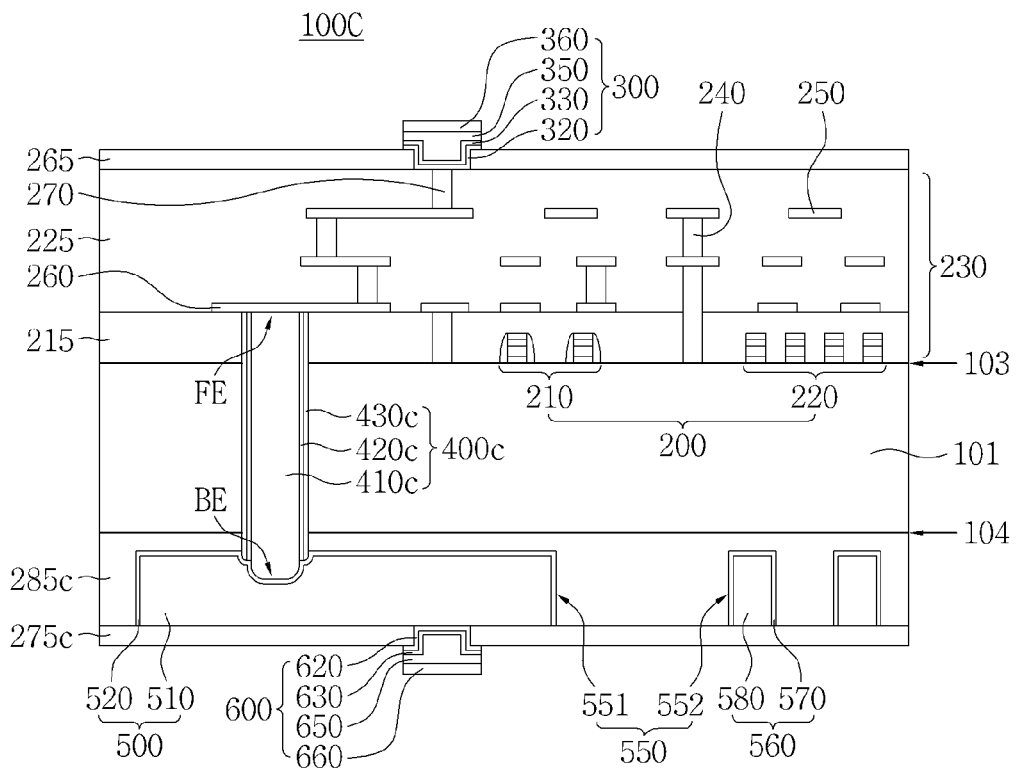

Referring to FIG. 8C, a semiconductor device 100C according to an embodiment of the inventive concepts may include a TSV structure 400c that may protrude into a redistribution groove 551. The TSV structure 400c may include a TSV core 410c, a TSV barrier layer 420, and a TSV liner 430c, which may protrude into the redistribution groove 551. For example, the TSV barrier layer 420c may cover a portion of a side surface of the TSV core 410c, while the TSV liner 430c may cover a side surface of the TSV barrier layer 420c. A top end of the TSV barrier layer 420c may be at a similar level to a top end surface of the TSV liner 430c. The top end of the TSV barrier layer 420c and a top end and partial side surface of the TSV liner 430c may be exposed within the redistribution groove 551 and in contact with a redistribution barrier layer 520. The TSV core 410c may be in direct contact with the redistribution barrier layer 520.

Figure 8D:
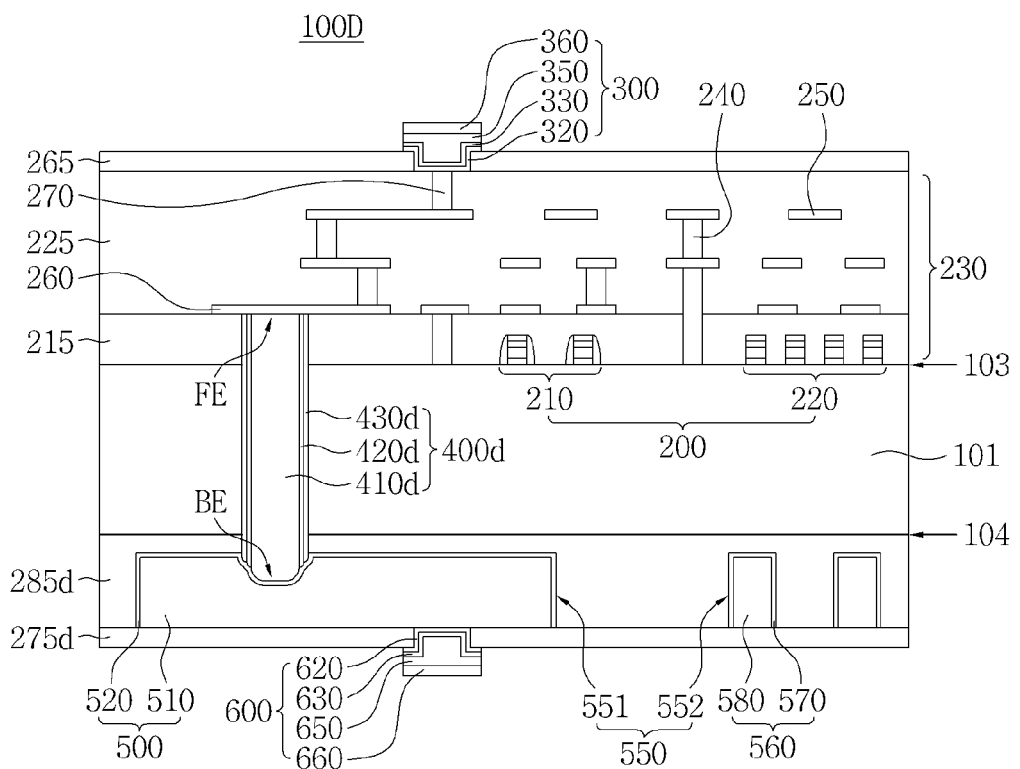

Referring to FIG. 8D, a semiconductor device 100D according to an embodiment of the inventive concepts may include a TSV structure 400d that may protrude into a redistribution groove 551. The TSV structure 400d may include a TSV core 410d, a TSV barrier layer 420d, and a TSV liner 430d, which may protrude into the redistribution groove 551. For instance, the TSV barrier layer 420d may cover a portion of a side surface of the TSV core 410d, and the TSV liner 430d may cover a portion of a side surface of the TSV barrier layer 420d. A top end of the TSV barrier layer 420d may be at a higher level than a top end of the TSV liner 430d. A top end and partial side surface of the TSV barrier layer 420d and a top end and partial side surface of the TSV liner 430d may be exposed within the redistribution groove 551 and in contact with a redistribution barrier layer 520.

Figure 8E:
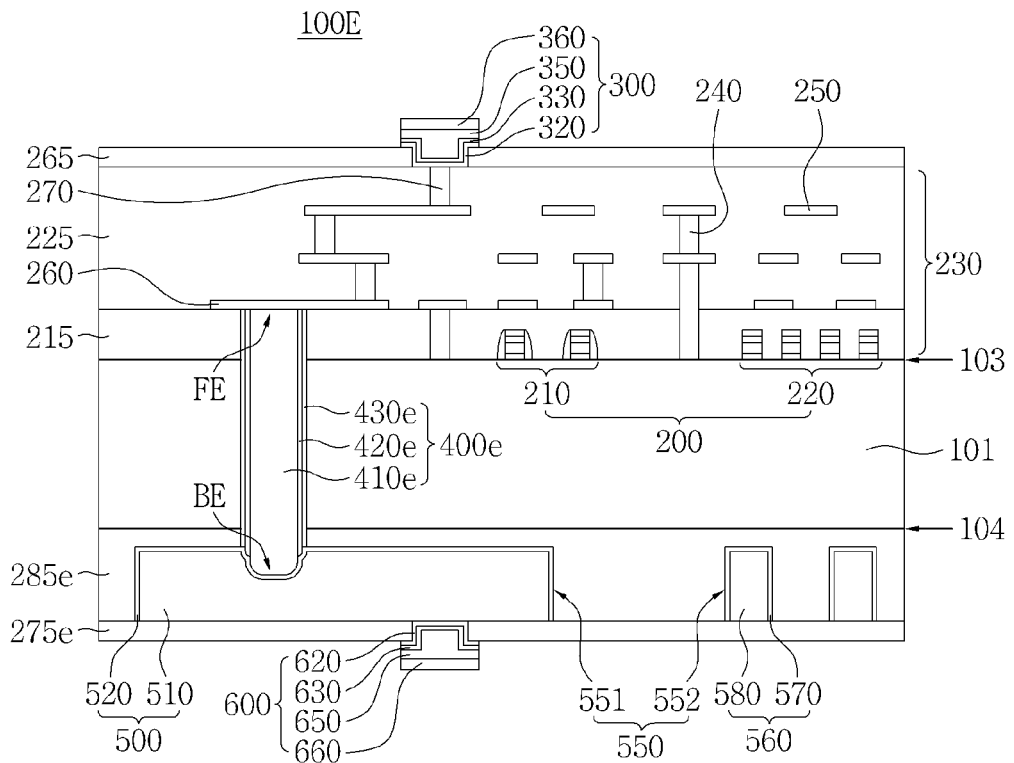

Referring to FIG. 8E, a semiconductor device 100E according to an embodiment of the inventive concepts may include a TSV structure 400e that may protrude into a redistribution groove 551. The TSV structure 400e may include a TSV core 410e and a TSV barrier layer 420e, which may protrude into the redistribution groove 551. For example, an upper portion and/or partial side surface of the TSV core 410e may not be covered with the TSV barrier layer 420e but exposed. The upper portion and/or partial side surface of the TSV core 410e may be in direct contact with the redistribution barrier layer 520. A top end of a TSV liner 430e may be at the same level as or at a similar level to a surface of a back-side insulating layer 285e.

Figure 8F:
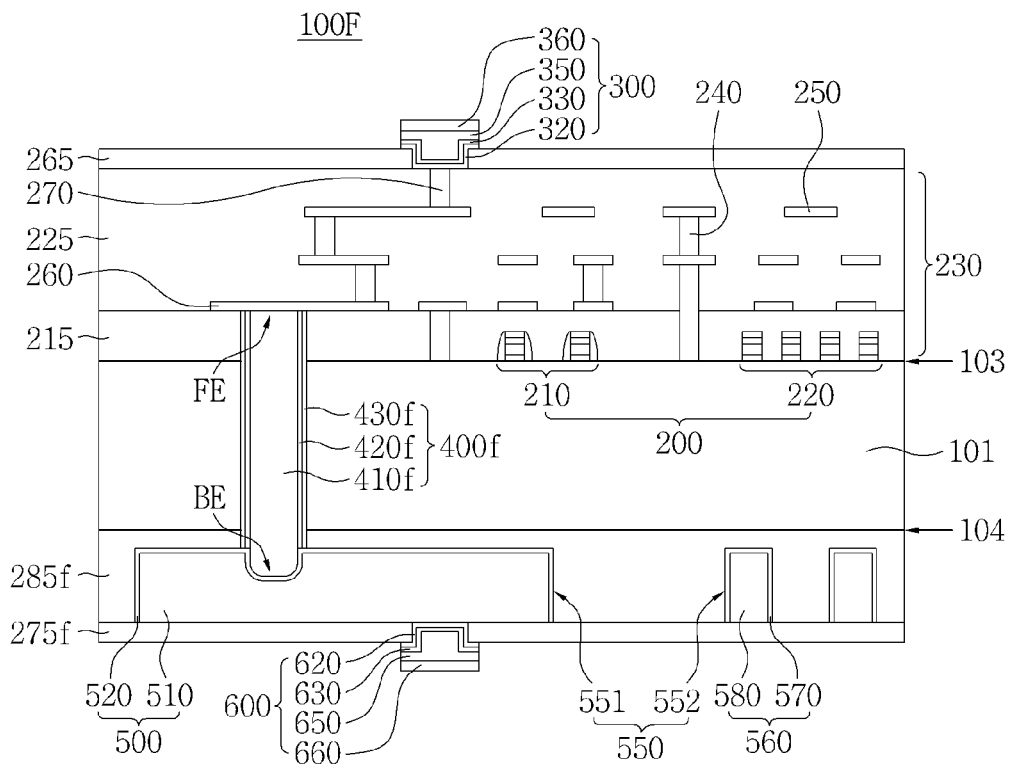

Referring to FIG. 8F, a semiconductor device 100F according to an embodiment of the inventive concepts may include a TSV structure 400f that protrudes into a redistribution groove 551. The TSV structure 400f may include a TSV core 410f that may protrude into the redistribution groove 551. For instance, an upper portion and partial side lateral surface of the TSV core 410f may not be covered with a TSV barrier layer 420f but exposed. For example, only the TSV core 410f may protrude into the redistribution groove 551. An upper portion and side surface of the protruding TSV core 410f may be in direct contact with a redistribution barrier layer 520. A top end of the TSV barrier layer 420f and a top end of a TSV liner 430f may be at the same level as or at a similar level to a surface of a back-side insulating layer 285f.

Figure 8G:
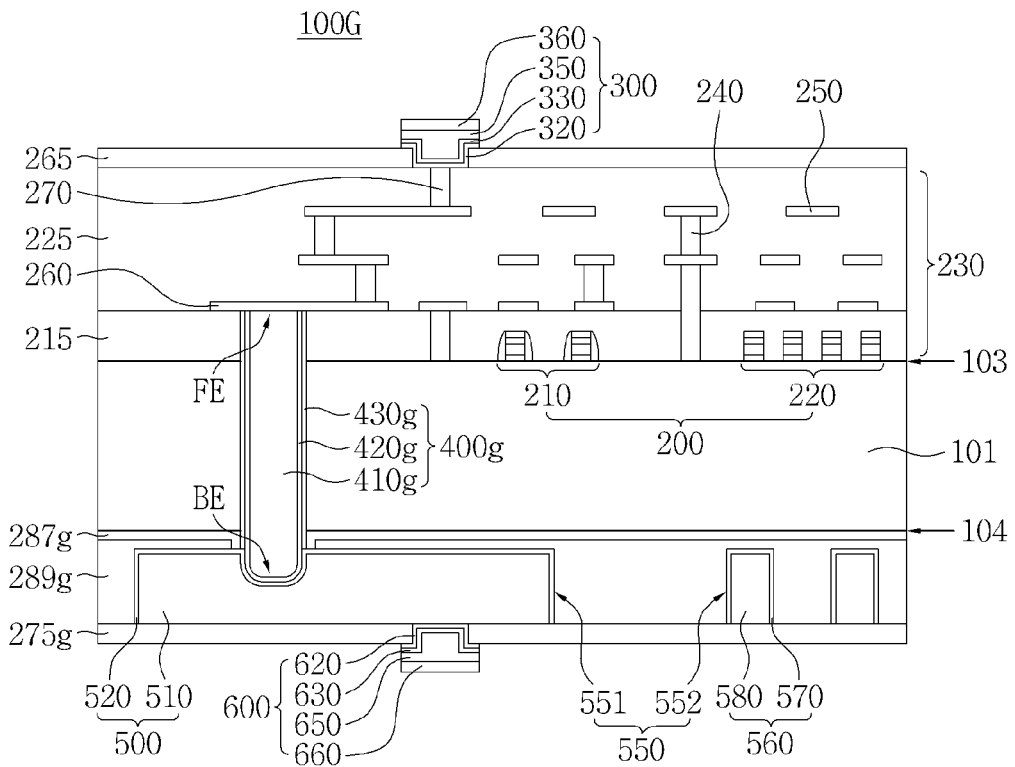

Referring to FIG. 8G, a semiconductor device 100G according to an embodiment of the inventive concepts may include a lower back-side insulating layer 287g formed on a back-side side 104 of a substrate 101, an upper back-side insulating layer 289g formed on the back-side insulating layer 287g and having a groove 550, and a TSV core 410g and a TSV barrier layer 420g, which may protrude into a redistribution groove 551. The lower back-side insulating layer 287g may be in contact with a side surface of a TSV structure 400g. A portion of the lower back-side insulating layer 287g, which may be near a back-side end BE of the TSV structure 400g, may be in contact with a redistribution barrier layer 520. The lower back-side insulating layer 287g may be formed on the back side 104 of the substrate 101 and cover a portion of the side surface of the TSV structure 400g. The upper back-side insulating layer 289g may be formed on the lower back-side insulating layer 287g and have the groove 550. The upper back-side insulating layer 289g may be out of contact with and spaced apart from the side surface of the TSV structure 400g. For example, the lower back-side insulating layer 287g may be interposed between the upper back-side insulating layer 289g and the TSV structure 400g. The TSV barrier layer 420g may cover top and side surfaces of the protruding TSV core 410g. Top and side surfaces of the TSV barrier layer 420g may be in direct contact with the redistribution barrier layer 520. Within a redistribution groove 551, top surfaces of a TSV liner 430g, the lower back-side insulating layer 287g, and the upper back-side insulating layer 289g may be at the same level or at similar levels.

Figure 8H:
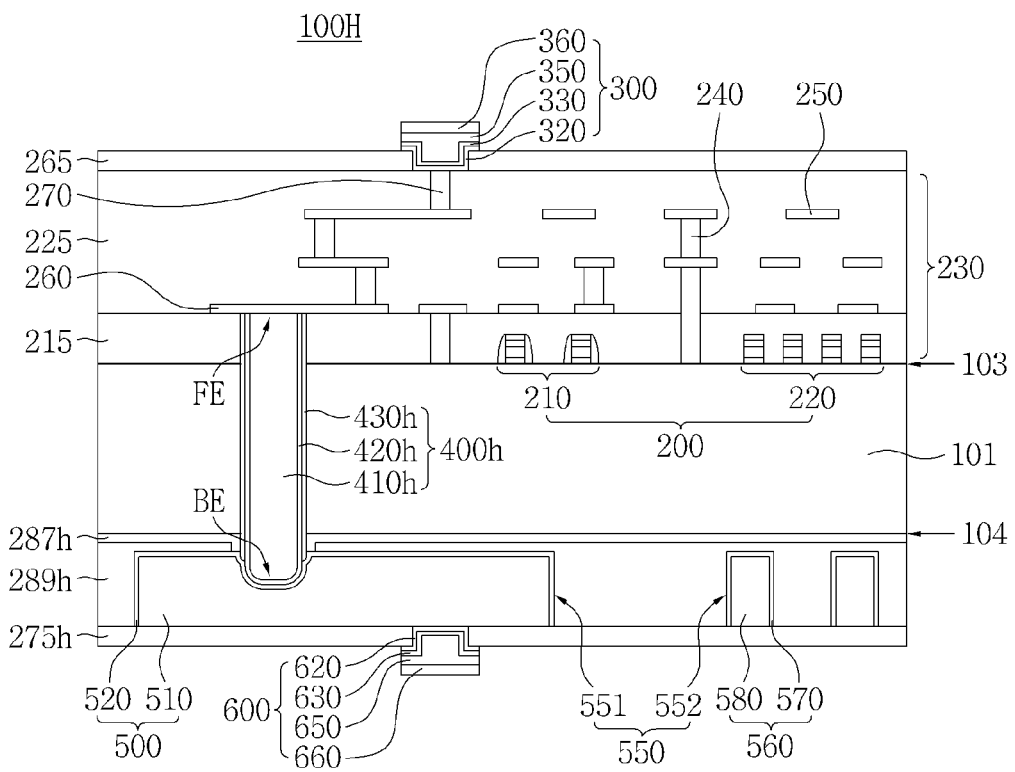

Referring to FIG. 8H, a semiconductor device 100H according to an embodiment of the inventive concepts may include a lower back-side insulating layer 287h and an upper back-side insulating layer 289h and further include a TSV structure 400h protruding into the redistribution groove 551. A TSV barrier layer 420h may cover top and side surfaces of a TSV core 410h. A TSV liner 430h may cover a portion of a side surface of the protruding TSV barrier layer 420h. For example, a top end of the TSV liner 430h may protrude from surfaces of the lower and upper back-side insulating layers 287*h* and 289*h* disposed within the redistribution groove 551. An upper portion and partial side surface of the TSV barrier layer 420*h* may be in direct contact with a redistribution barrier layer 520.

Figure 8I:
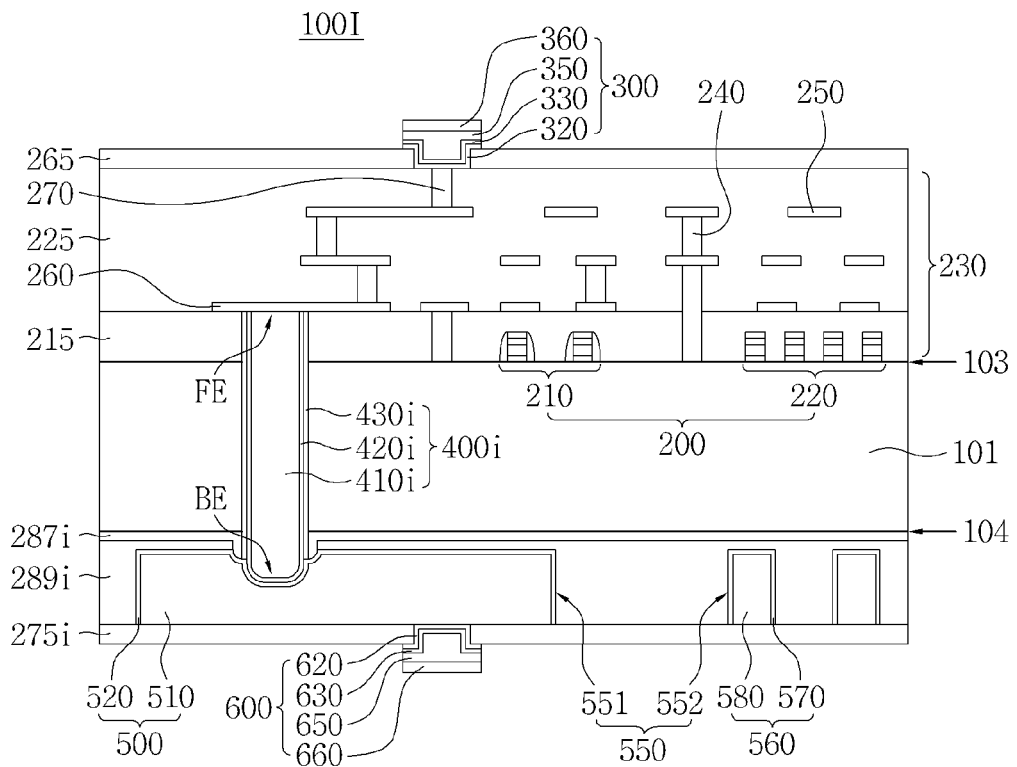

Referring to FIG. 8I, a semiconductor device 100I according to an embodiment of the inventive concepts may include a lower back-side insulating layer 287*i* and an upper back-side insulating layer 289*i*. The semiconductor device 100I may include a TSV structure 400*i* and the lower back-side insulating layer 287*i*, which may protrude into a redistribution groove 551. A protrusion of the lower back-side insulating layer 287*i* may cover a portion of a side surface of a TSV liner 430*i*. A top end of the protrusion of the lower back-side insulating layer 287*i* and a top end of the TSV liner 430*i* may be disposed at the same level or at similar levels. A portion of a side surface of the lower back-side insulating layer 287*i* may be in contact with a redistribution barrier layer 520.

Figure 8J:
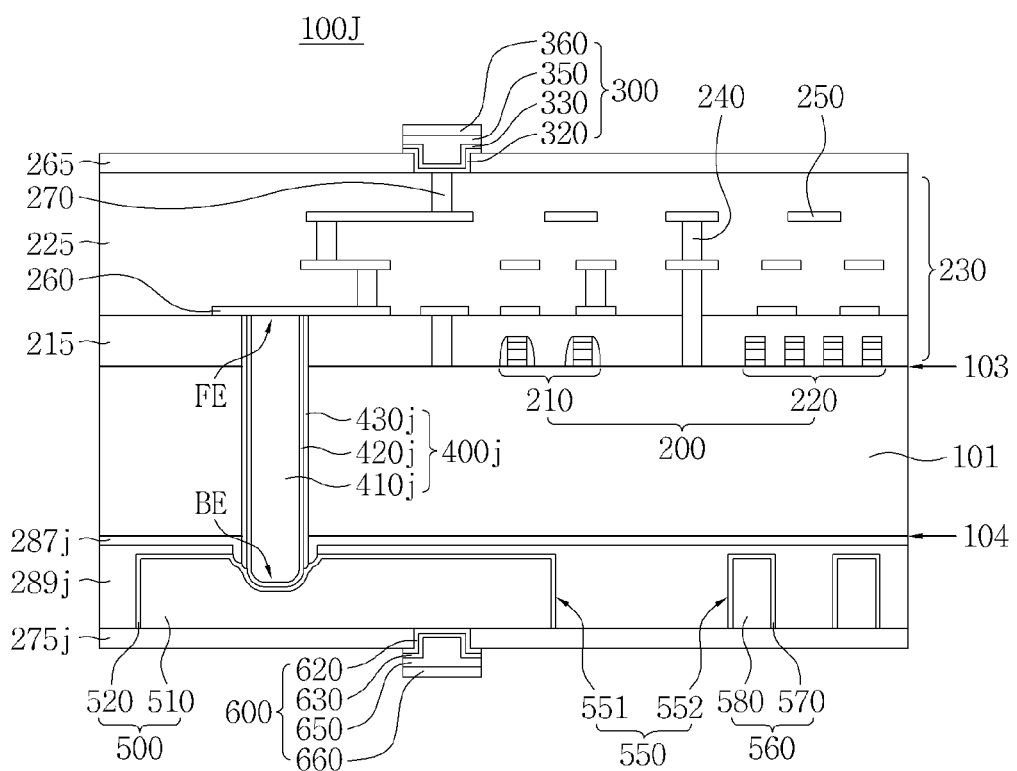

Referring to FIG. 8J, a semiconductor device 100J according to an embodiment of the inventive concepts may include a lower back-side insulating layer 287*j* and an upper back-side insulating layer 289*j*. The semiconductor device 100J may include a TSV structure 400*j* and the lower back-side insulating layer 287*j*, which may protrude into a redistribution groove 551. A protrusion of the lower back-side insulating layer 287*j* may cover a portion of a side surface of a TSV liner 430*j*. A portion of a side surface of the lower back-side insulating layer 287*j* may be in contact with a redistribution barrier layer 520.

Figure 8K:
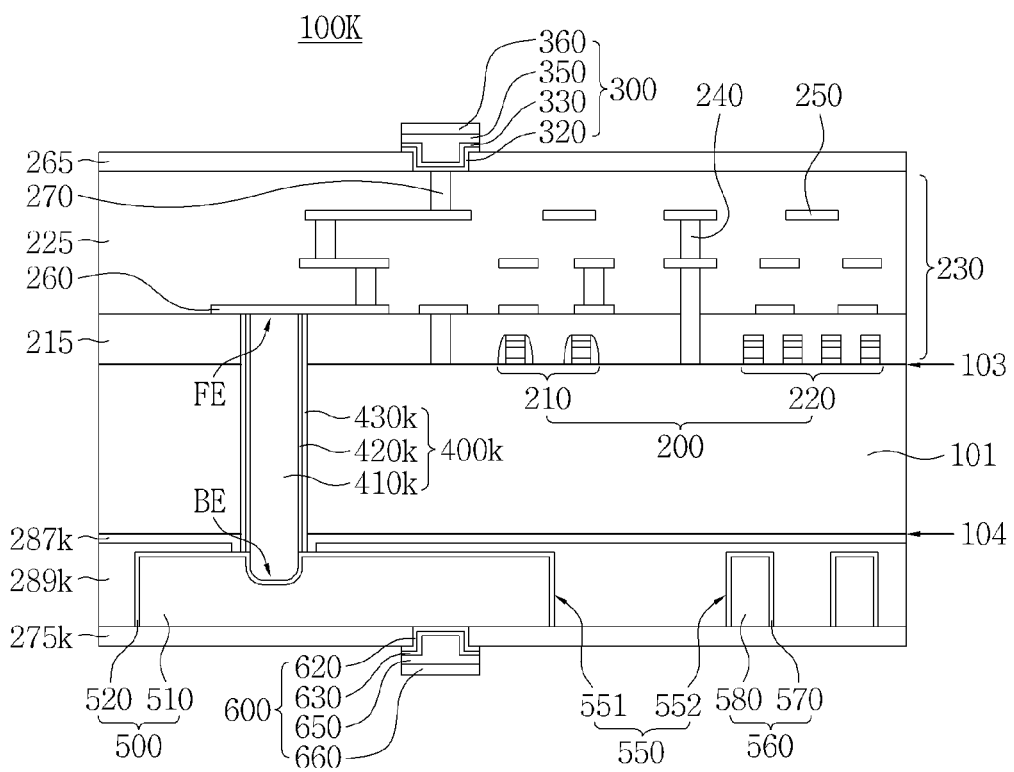

Referring to FIG. 8K, a semiconductor device 100K according to an embodiment of the inventive concepts may include a lower back-side insulating layer 287*k* and an upper back-side insulating layer 289*k* and further include a TSV core 410*k* protruding into a redistribution groove 551. For instance, surfaces of a TSV barrier layer 420*k*, a TSV liner 430*k*, the lower back-side insulating layer 287*k*, and the upper back-side insulating layer 289*k* may be disposed at the same level or at similar levels. Top and side surfaces of the protruding TSV core 410*k* may be in contact with a redistribution barrier layer 520.

Figure 8L:
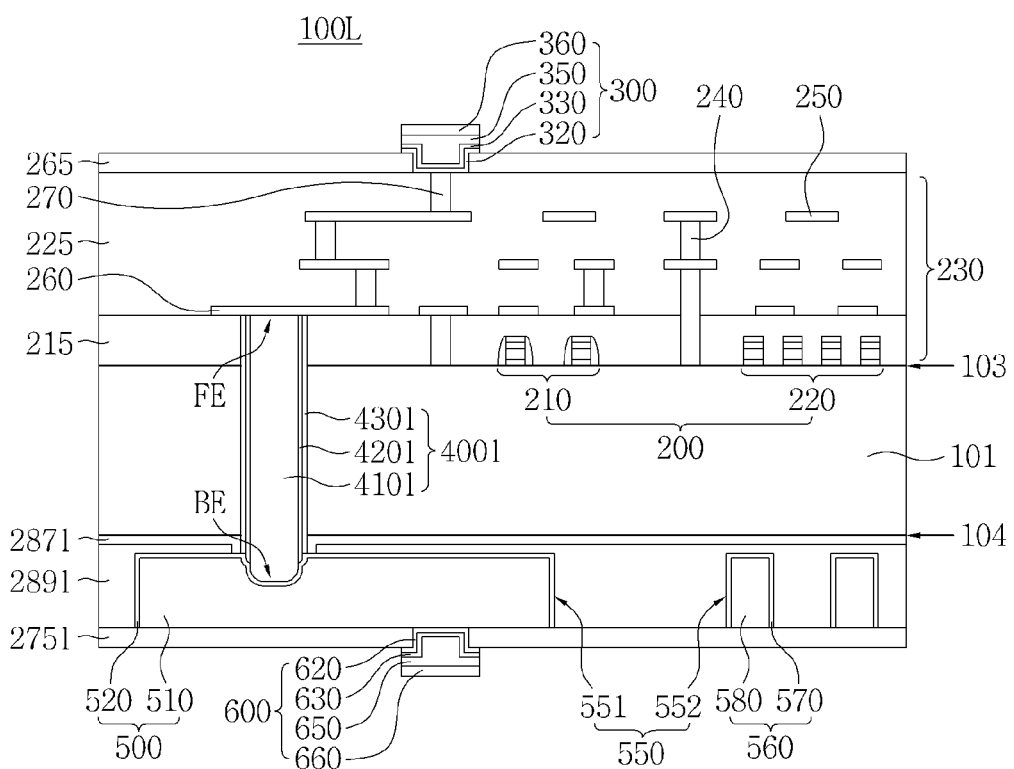

Referring to FIG. 8L, a semiconductor device 100L according to an embodiment of the inventive concepts may include a lower back-side insulating layer 287*l* and an upper back-side insulating layer 289*l* and further include a TSV core 410*l* and a TSV barrier layer 420*l*, which may protrude into a redistribution groove 551. For example, the TSV barrier layer 420*l* may cover a portion of a side surface of the TSV core 410*l*. Surfaces of a TSV liner 430*l*, the lower back-side insulating layer 287*l*, and the upper back-side insulating layer 289*l* may be disposed at the same level or at similar levels. A top surface and partial side surface of the protruding TSV core 410*l* may be in contact with a redistribution barrier layer 520.

Figure 8M:
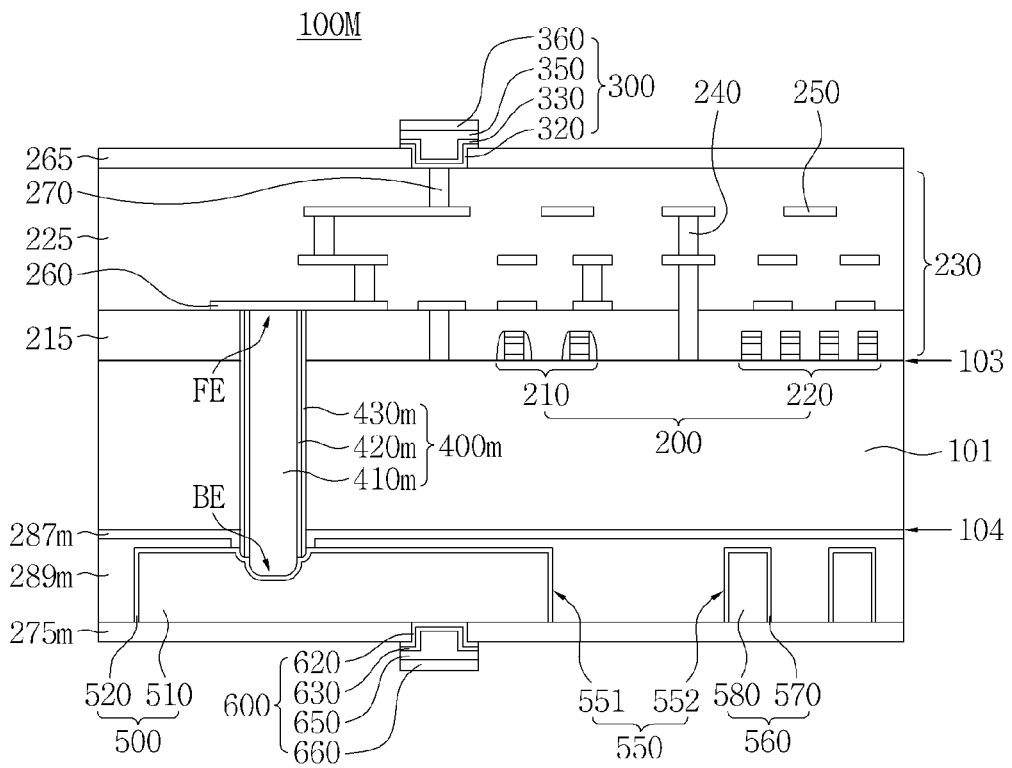

Referring to FIG. 8M, a semiconductor device 100M according to an embodiment of the inventive concepts may include a lower back-side insulating layer 287*m* and an upper back-side insulating layer 289*m* and further include a TSV structure 400*m* protruding into a redistribution groove 551. For example, a TSV barrier layer 420*m* may cover a portion of a side surface of a TSV core 410*m*. A TSV liner 430*m* may cover a side surface of the TSV barrier layer 420*m*. A top end of the TSV barrier layer 420*m* and a top end of the TSV liner 430*m* may be disposed at the same level or at similar levels. Surfaces of the lower and upper back-side insulating layers 287*m* and 289*m* may be disposed at the same level or at similar levels. A top surface and partial side surface of the protruding TSV core 410*m* may be in contact with a redistribution barrier layer 520.

Figure 8N:
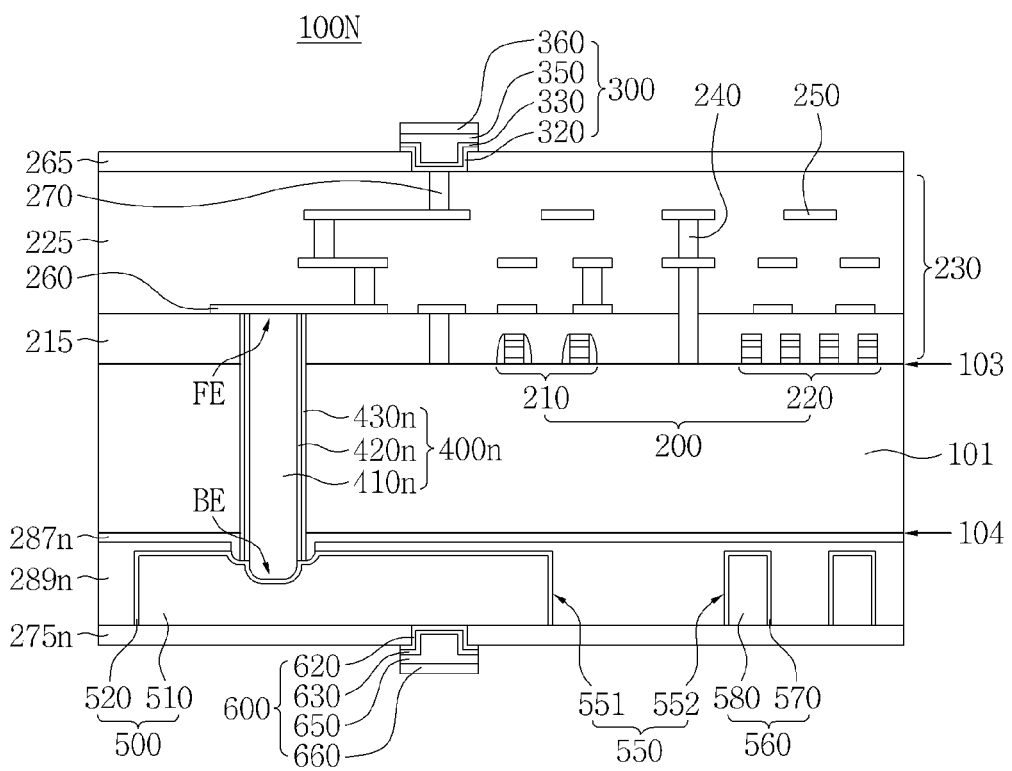

Referring to FIG. 8N, a semiconductor device 100N according to an embodiment of the inventive concepts may include a lower back-side insulating layer 287*n* and an upper back-side insulating layer 289*n*. The semiconductor device 100N may include a TSV structure 400*n* and the lower back-side insulating layer 287*n*, which may protrude into a redistribution groove 551. For instance, a TSV barrier layer 420*n* may cover a portion of a side surface of a TSV core 410*n*. A TSV liner 430*n* may cover a side surface of the TSV barrier layer 420*n*. The protruding lower back-side insulating layer 287*n* may cover a side surface of a TSV liner 430*n*. Top ends of the TSV barrier layer 420*n*, the TSV liner 430*n*, and the lower back-side insulating layer 287*n* may be disposed at the same level or at similar levels. A top surface and partial side surface of the protruding TSV core 410*n* may be in contact with a redistribution barrier layer 520.

Figure 8O:
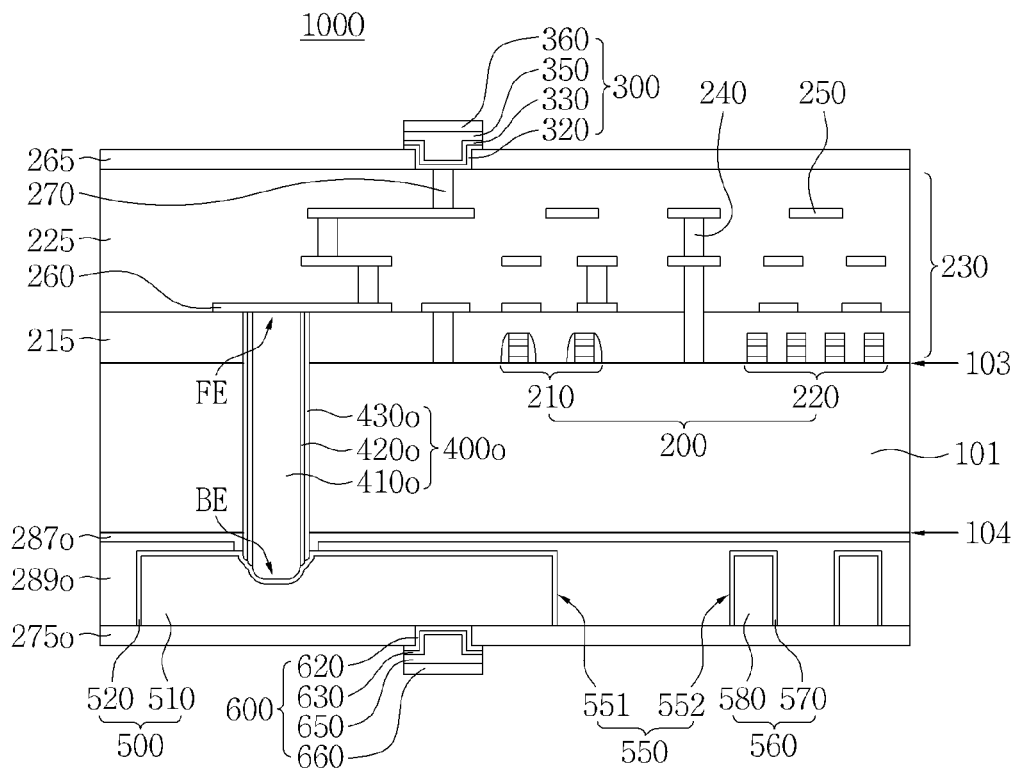

Referring to FIG. 8O, a semiconductor device 100O according to an embodiment of the inventive concepts may include a lower back-side insulating layer 287*o* and an upper back-side insulating layer 289*o* and further include a TSV structure 400*o* protruding into a redistribution groove 551. For example, a TSV barrier layer 420*o* may cover a portion of a side surface of a TSV core 410*o*. A TSV liner 430*o* may cover a portion of a side surface of the TSV barrier layer 420*o*. A top surface and partial side surface of the protruding TSV core 410*o* may be in contact with a redistribution barrier layer 520.

Figure 8P:
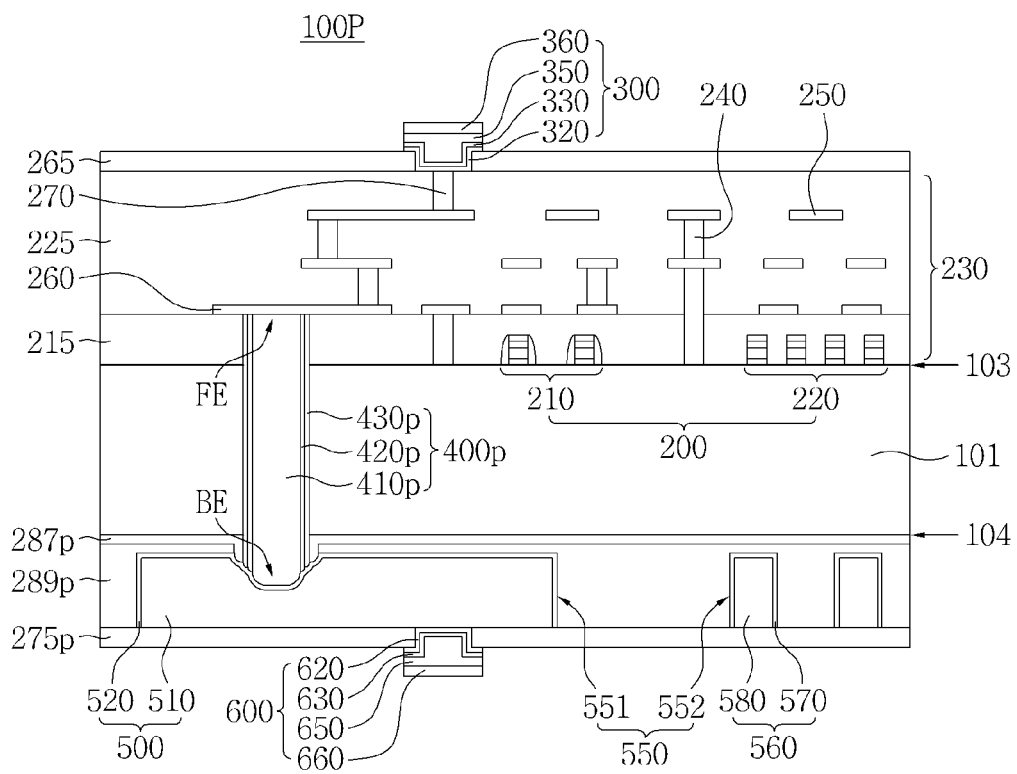

Referring to FIG. 8P, a semiconductor device 100P according to an embodiment of the inventive concepts may include a lower back-side insulating layer 287*p* and an upper back-side insulating layer 289*p*. The semiconductor device 100P may include a TSV structure 400*p* and the lower back-side insulating layer 287*p*, which may protrude into a redistribution groove 551. For example, a TSV barrier layer 420*p* may cover a portion of a side surface of a TSV core 410*p*. A TSV liner 430*p* may cover a portion of a side surface of the TSV barrier layer 420*p*. The protruding lower back-side insulating layer 287*p* may cover a side surface of the TSV liner 430*p*. A top surface and partial side surface of the protruding TSV core 410*p* may be in contact with a redistribution barrier layer 520.

Figure 8Q:
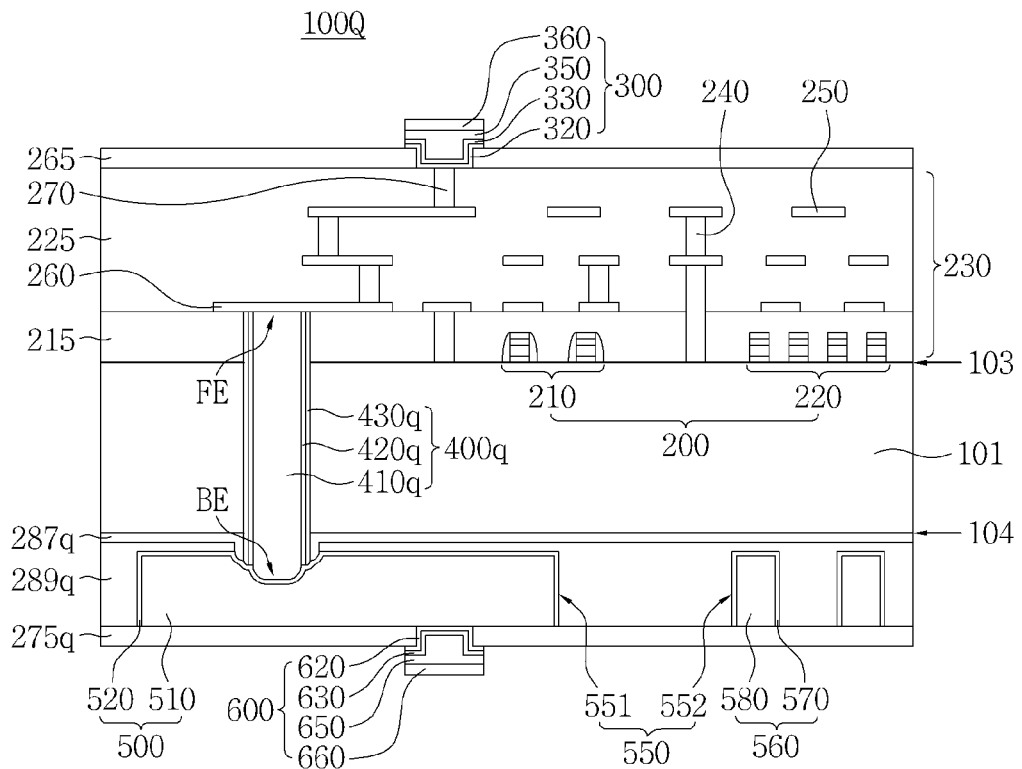

Referring to FIG. 8Q, a semiconductor device 100Q according to an embodiment of the inventive concepts may include a lower back-side insulating layer 287*q* and an upper back-side insulating layer 289*q*. The semiconductor device 100N may include a TSV structure 400*q* and the lower back-side insulating layer 287*q*, which may protrude into a redistribution groove 551. For example, a TSV barrier layer 420*q* may cover a portion of an exposed side surface of a TSV core 410*q*. A TSV liner 430*q* may cover an exposed surface of the TSV barrier layer 420*q*. A top end of the TSV liner 430*q* and a top end of the TSV barrier layer 420*q* may be disposed at the same level or at similar levels. The protruding lower back-side insulating layer 287*q* may cover a portion of a side surface of the TSV liner 430*q*. A top surface and partial side surface of the TSV core 410*q* may be in contact with a redistribution barrier layer 520.

Figure 8R:
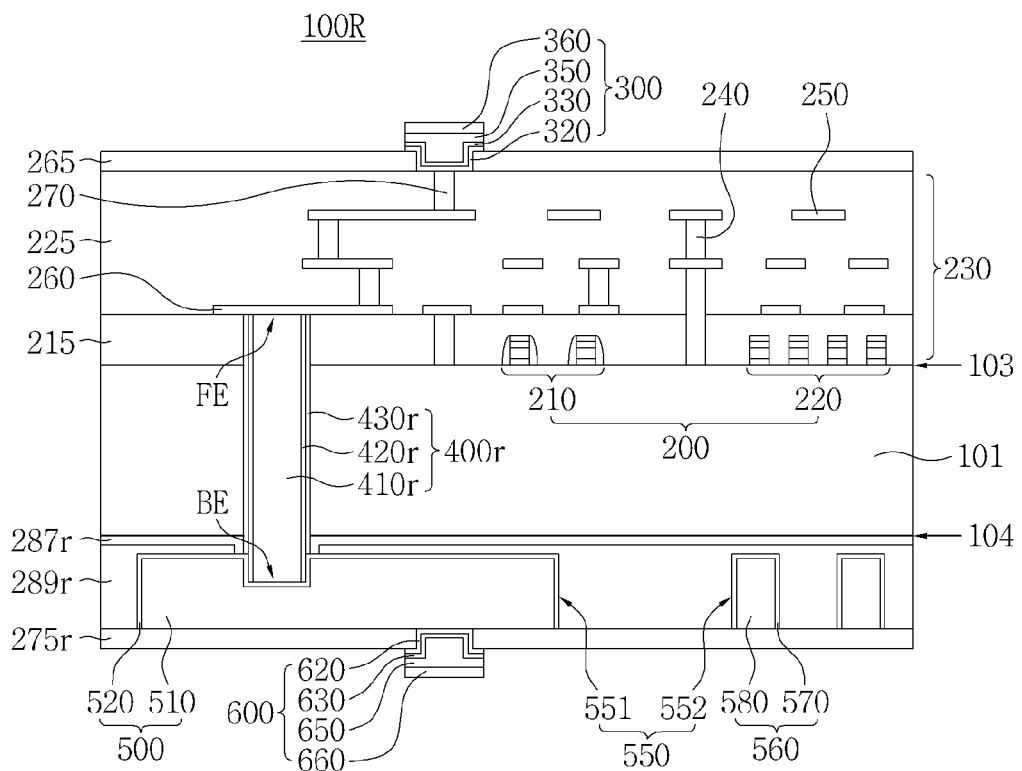

Referring to FIG. 8R, a semiconductor device 100R according to an embodiment of the inventive concepts may include a TSV core 410*r* and a TSV barrier layer 420*r*, which may protrude into a redistribution groove 551. The TSV barrier layer 420*r* may partially or wholly cover an exposed side surface of the TSV core 410*r*. A top end of the TSV core 410*r* and a top end of the TSV barrier layer 420r may be disposed at the same level or at similar levels.

Referring to FIG. 8S, a semiconductor device 100S according to an embodiment of the inventive concepts 100S may include a TSV structure 400s that may protrude into a redistribution groove 551, and a TSV liner 430s may partially or wholly cover an exposed surface of the TSV barrier layer 420s. A top end of the TSV core 410s and a top end of the TSV barrier layer 420s may be disposed at the same level or at similar levels.

Each of the semiconductor devices 100A to 100S according to various embodiments of the inventive concepts may include the redistribution structure 500 formed using a damascene process. Thus, the redistribution barrier layer 520 may completely surround bottom and side surfaces of the redistribution interconnection 510. For example, when the redistribution barrier layer 520 is removed using a wet etching process or selective etching process, the redistribution barrier layer 520 may not completely surround the bottom or side surface of the redistribution interconnection 510, thus causing physical and/or electrical instability. The semiconductor devices S100A to 100S according to various embodiments of the inventive concepts may be planarly formed using a CMP process instead of photolithography and etching processes, and pitches of the TSV structures 400a to 400s and pitches of the redistribution structures 500 may become finer and more elaborate. In each of the semiconductor devices 100A to 100S according to various embodiments of the inventive concepts, the TSV structure 400a to 400s may protrude into the redistribution structure 500. For instance, the TSV structure 400a to 400s may be inserted into the redistribution structure 500. Accordingly, a contact area between the TSV structure 400 and the redistribution structure 500 may increase so that a sheet resistance between the TSV structure 400a to 400s and the redistribution structure 500 can be reduced. Furthermore, since the redistribution structure 500 may be physically fixed by the TSV structure 400a to 400s, a contact failure or separation of components due to a floating phenomenon may be prevented.

Figure 9A:
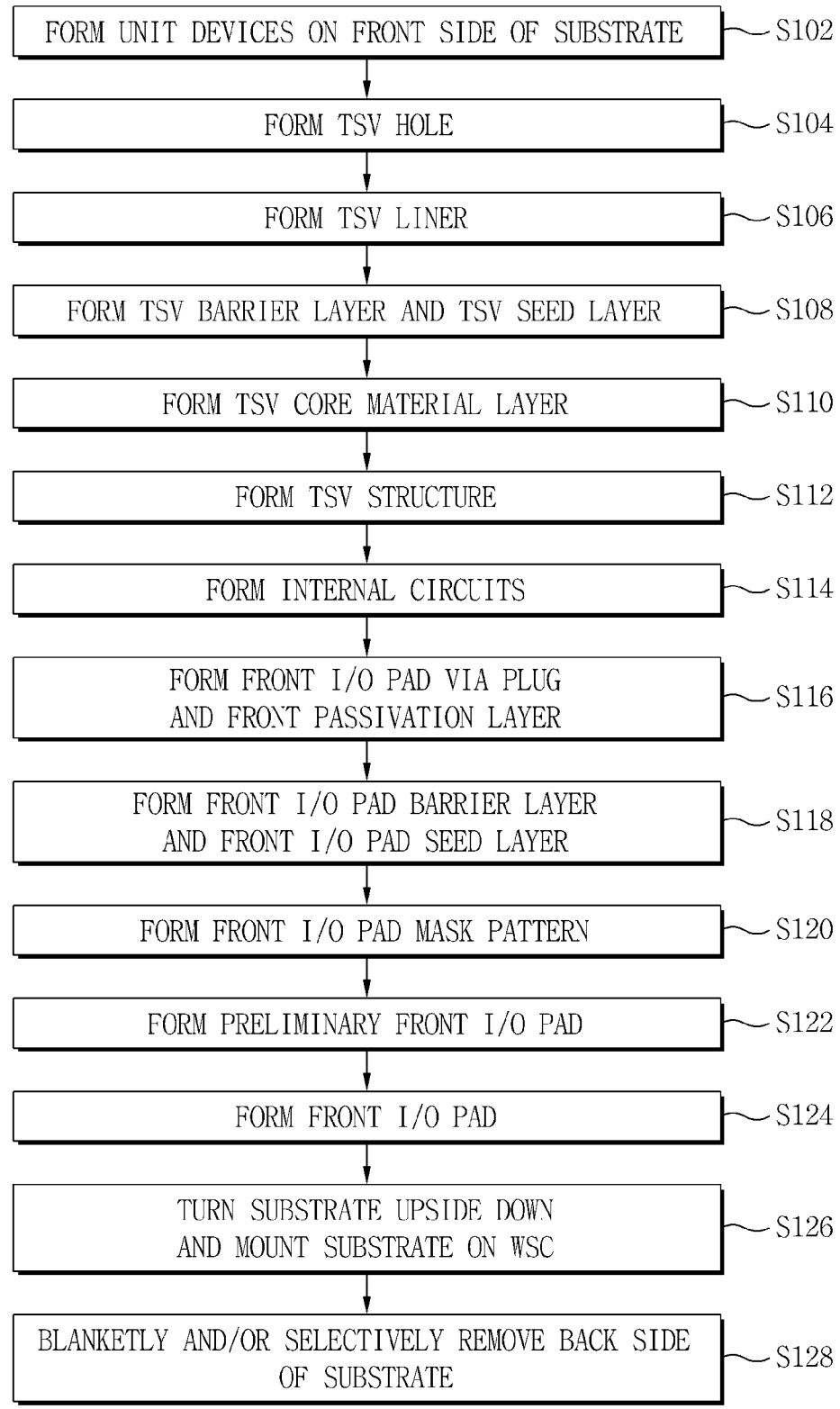
FIGS. 9A through 9J are flowcharts illustrating methods of fabricating semiconductor devices according to various embodiments of the inventive concepts.
Figure 9B:
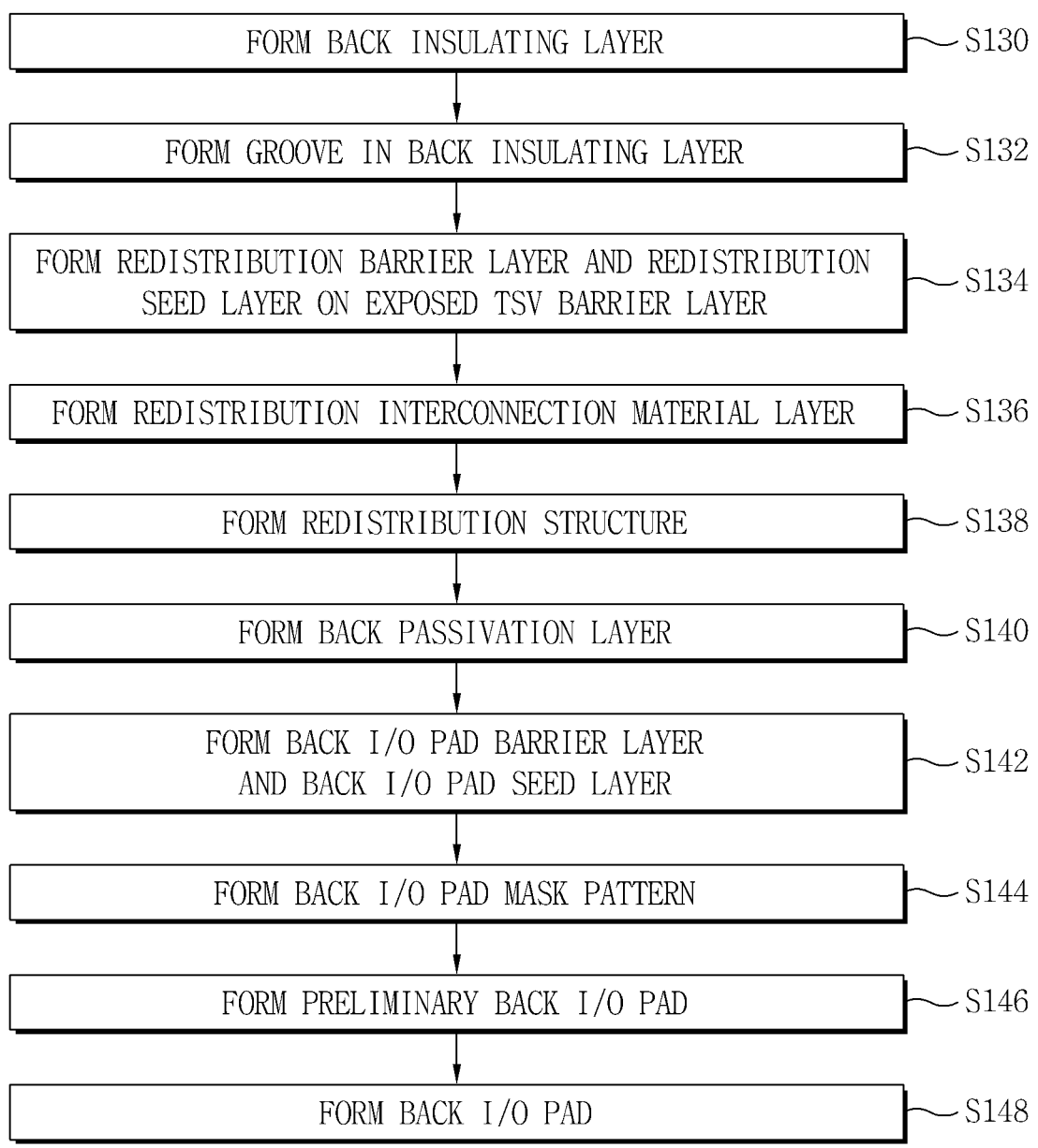
Figure 9C:
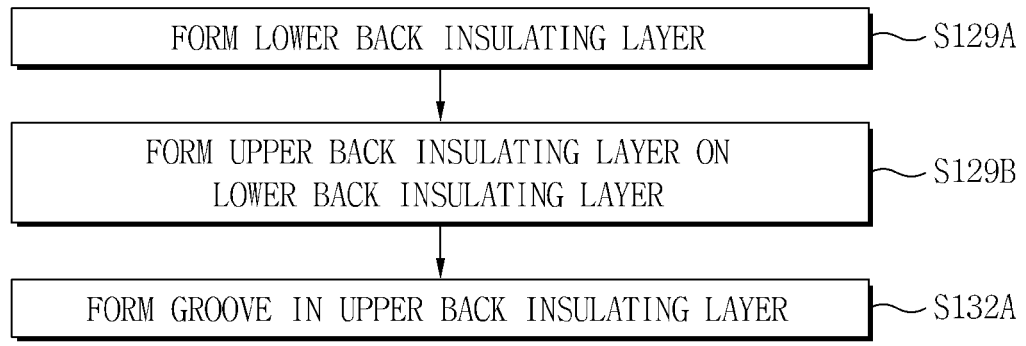
Figure 9D:
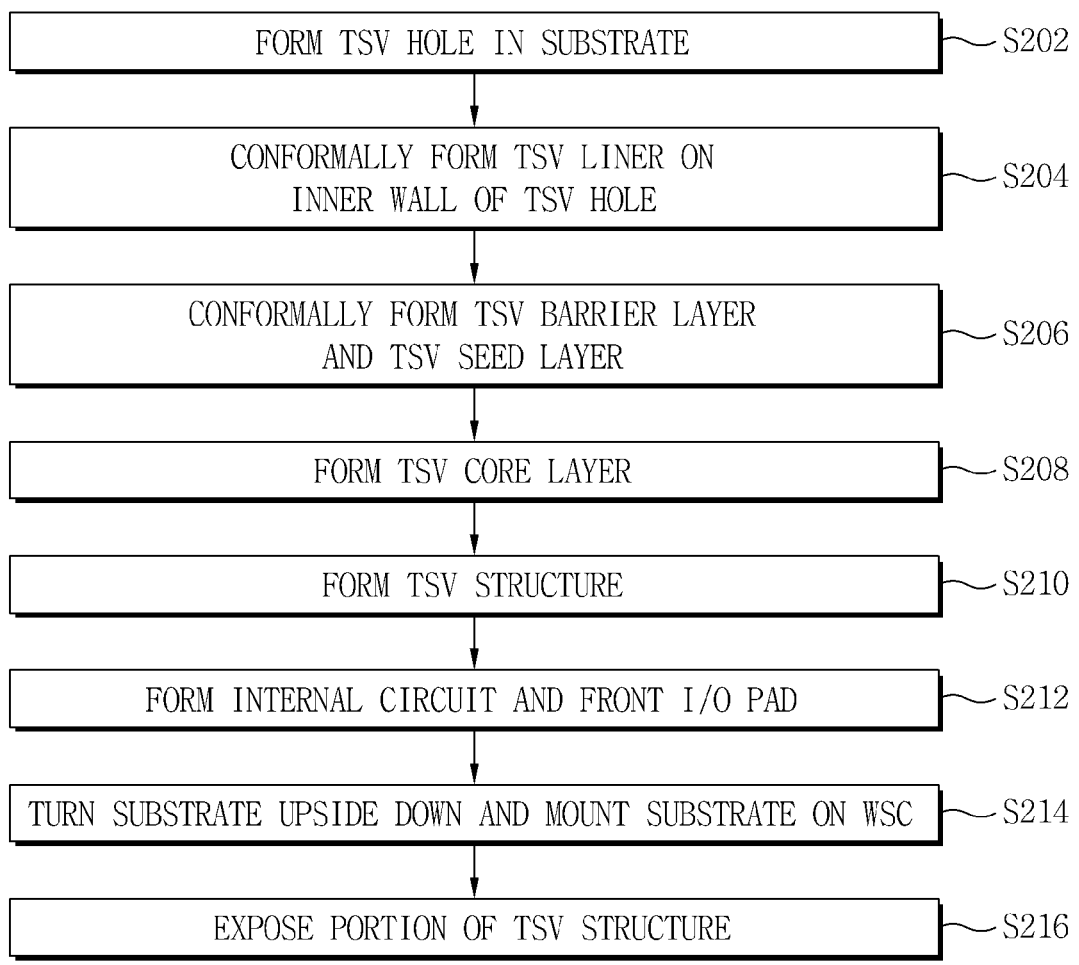
Figure 9E:
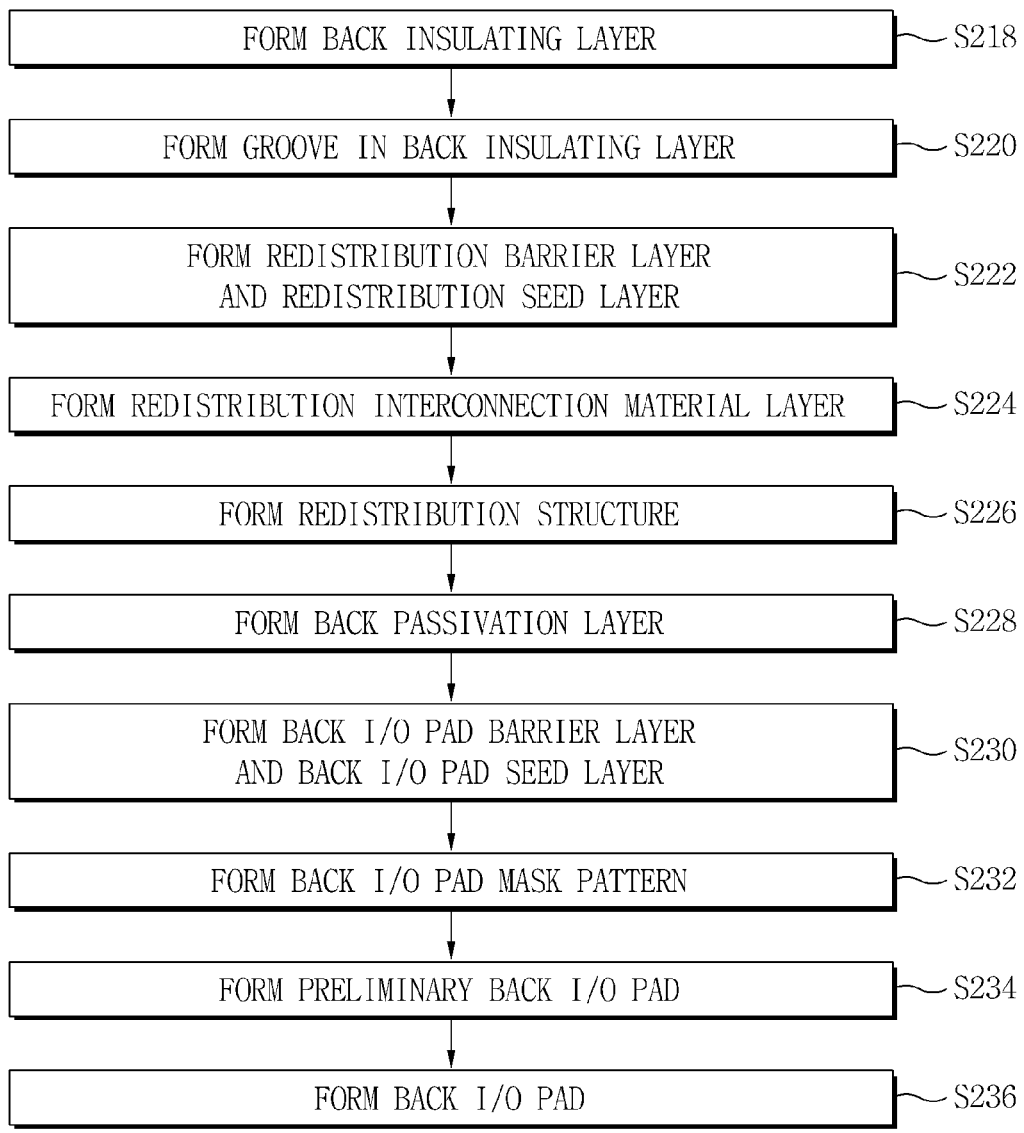
Figure 9F:
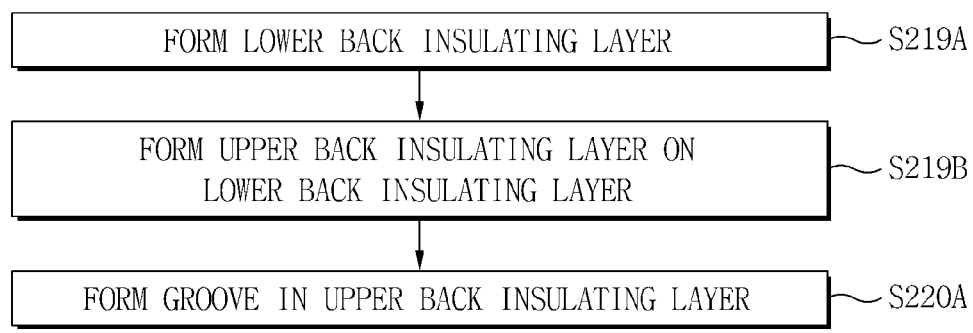
Figure 9G:
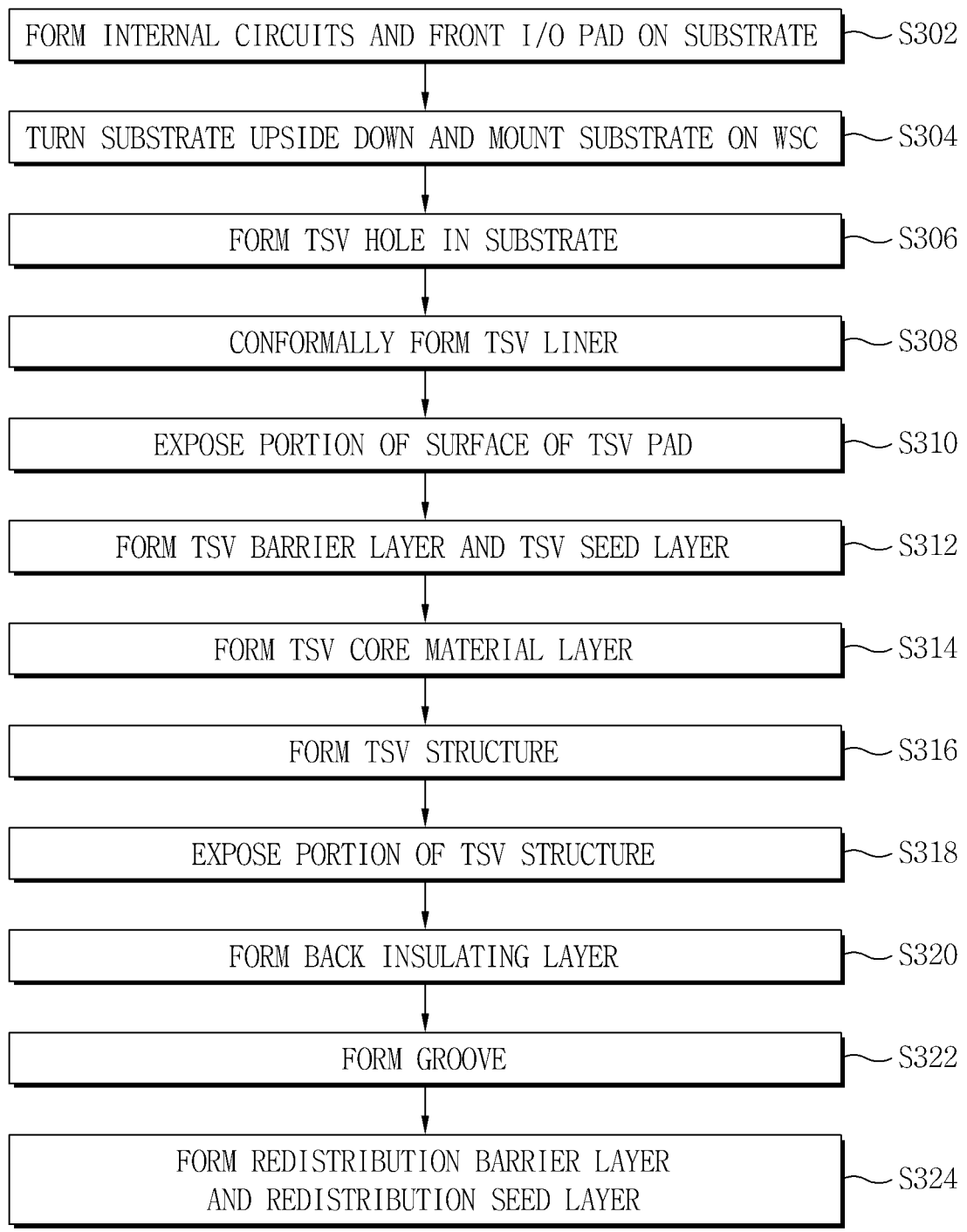
Figure 9H:
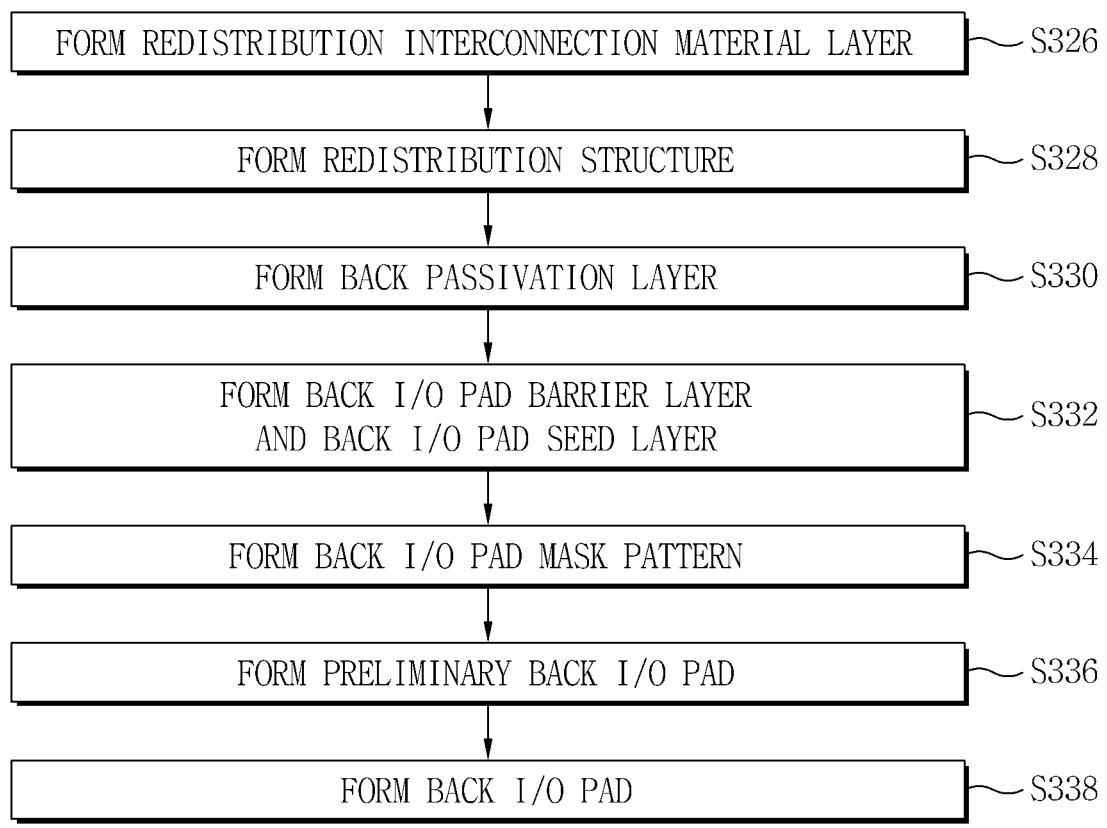
Figure 9I:
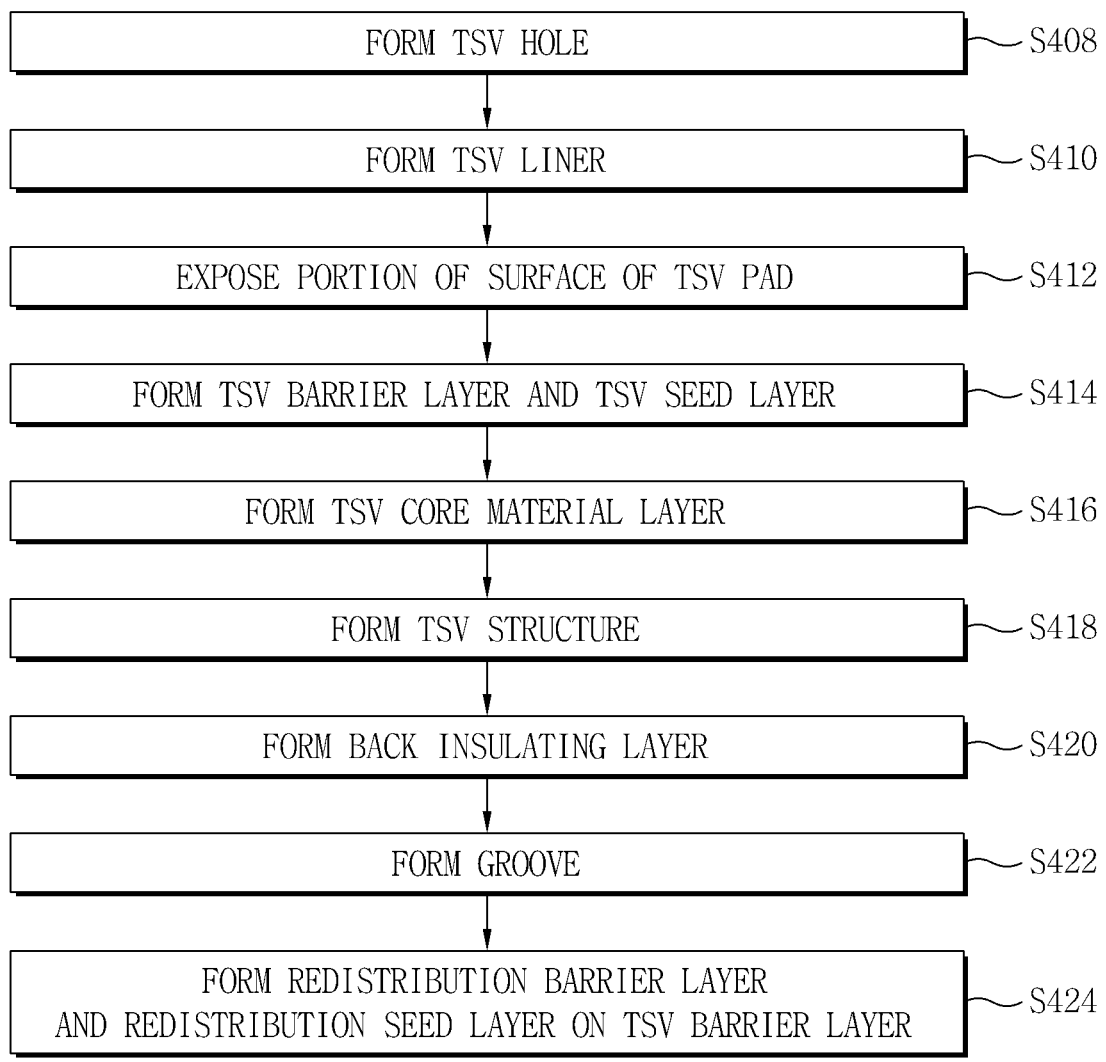
Figure 9J:
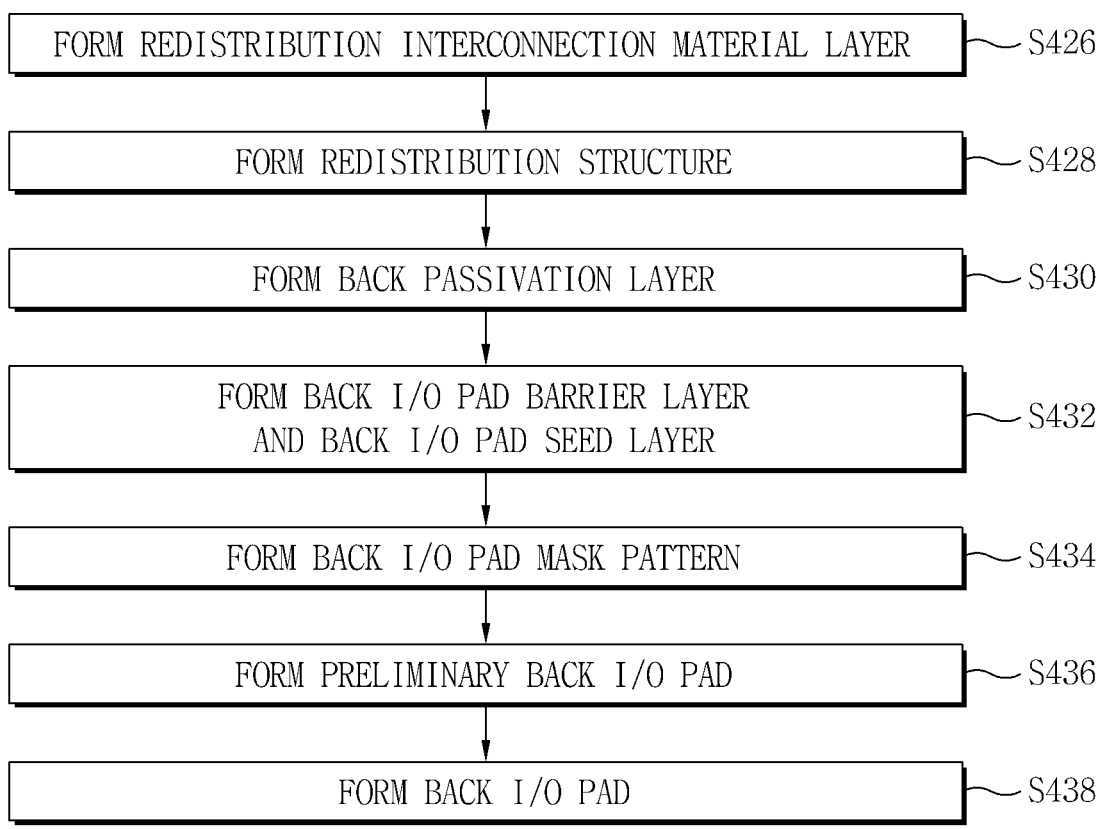
Figure 10A:
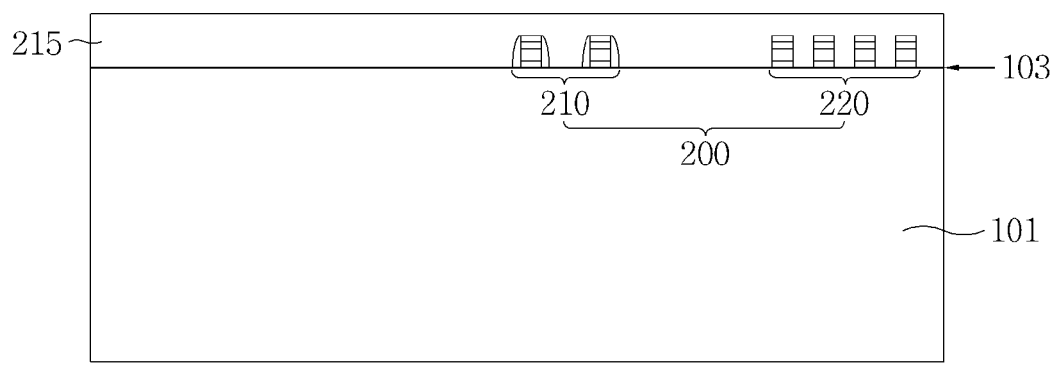
FIGS. 10A through 10X are longitudinal cross-sectional views illustrating a method of fabricating a semiconductor device according to an embodiment of the inventive concepts.
Figure 10B:
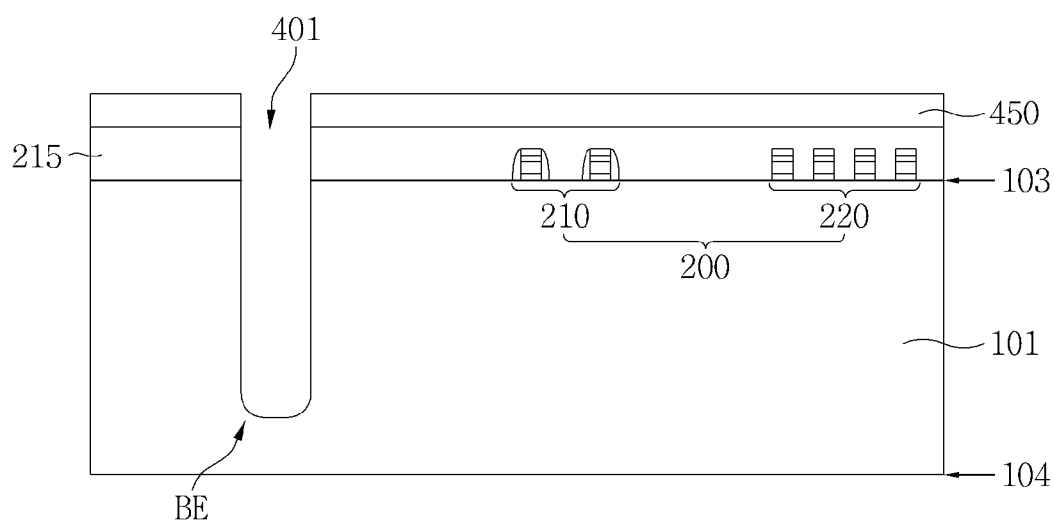
Figure 10C:
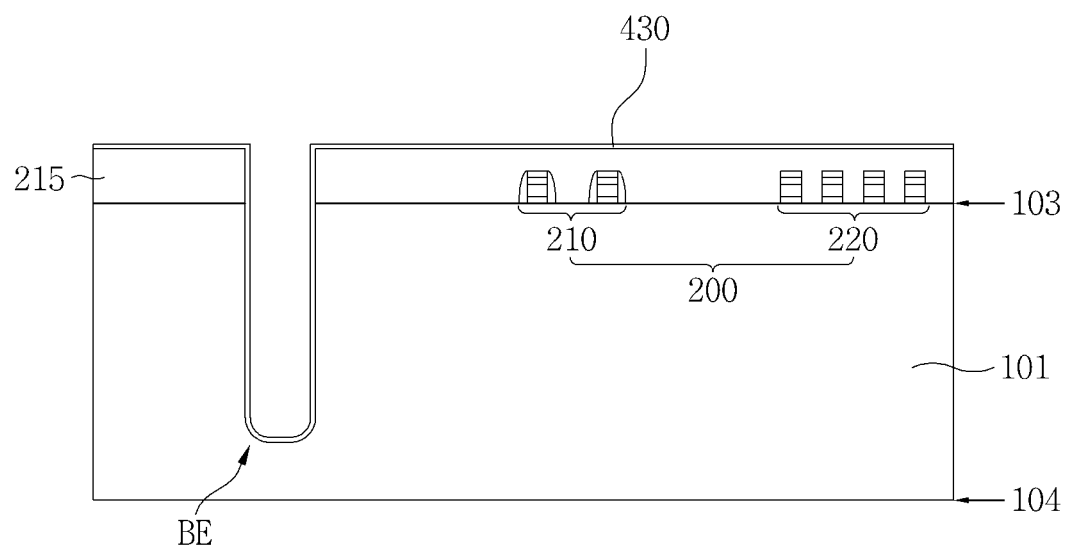
Figure 10D:
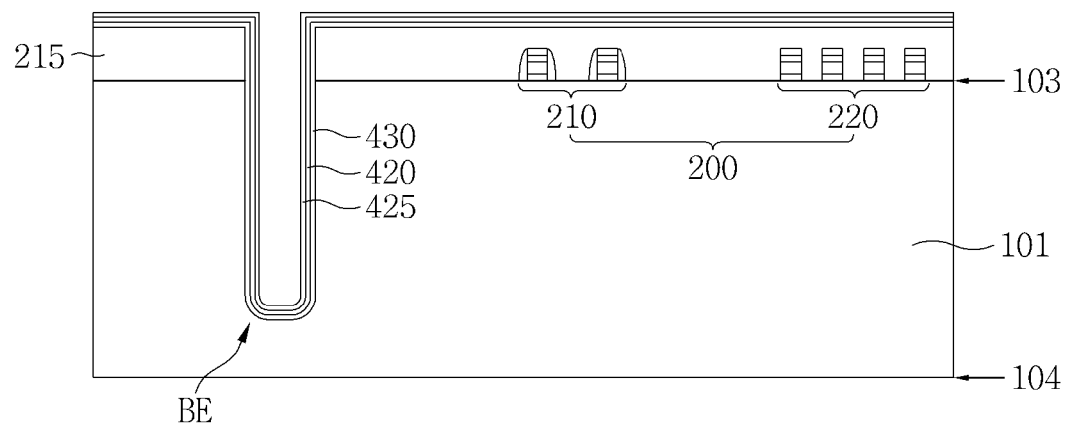
Figure 10E:
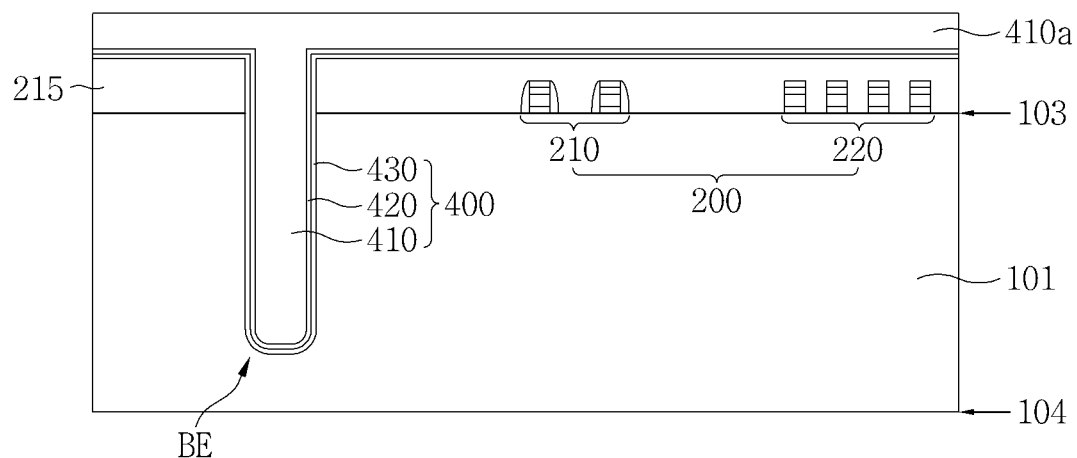
Figure 10F:
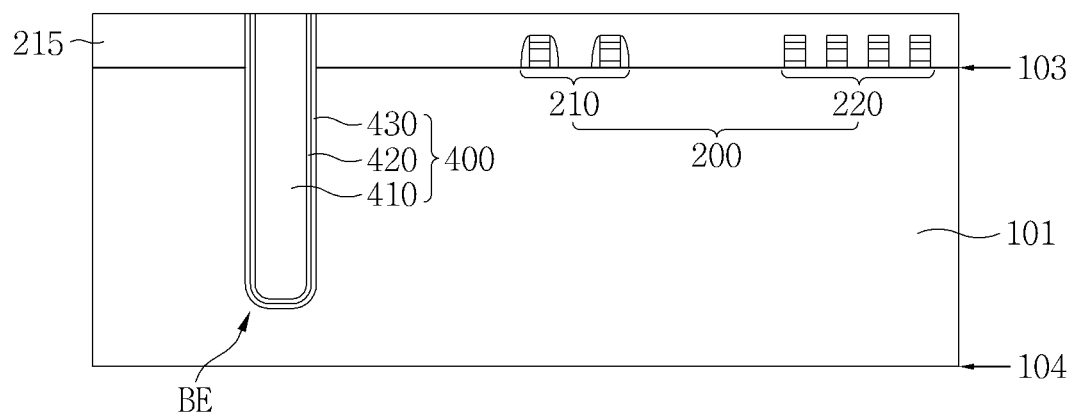
Figure 10G:
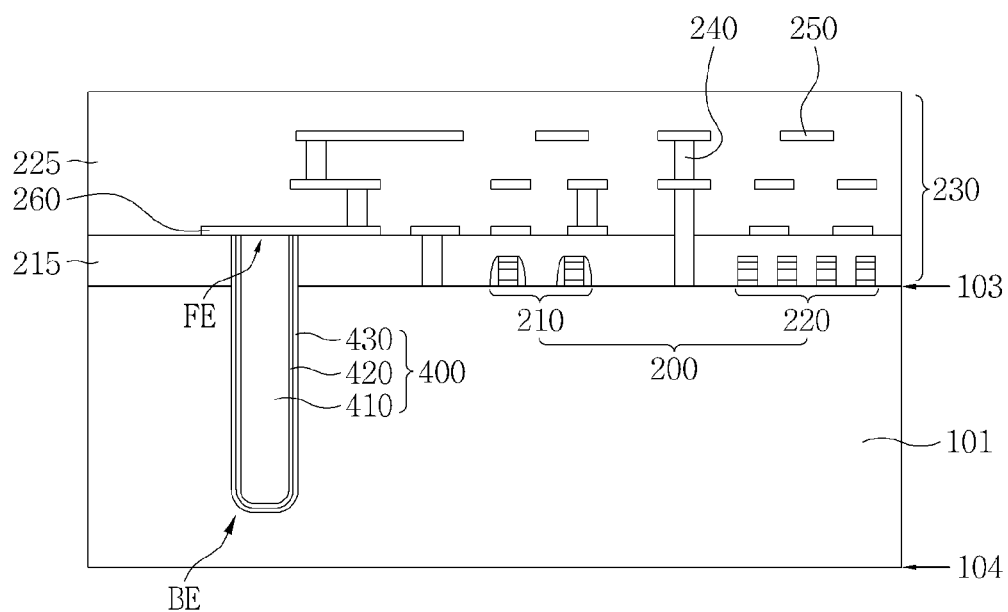
Figure 10H:
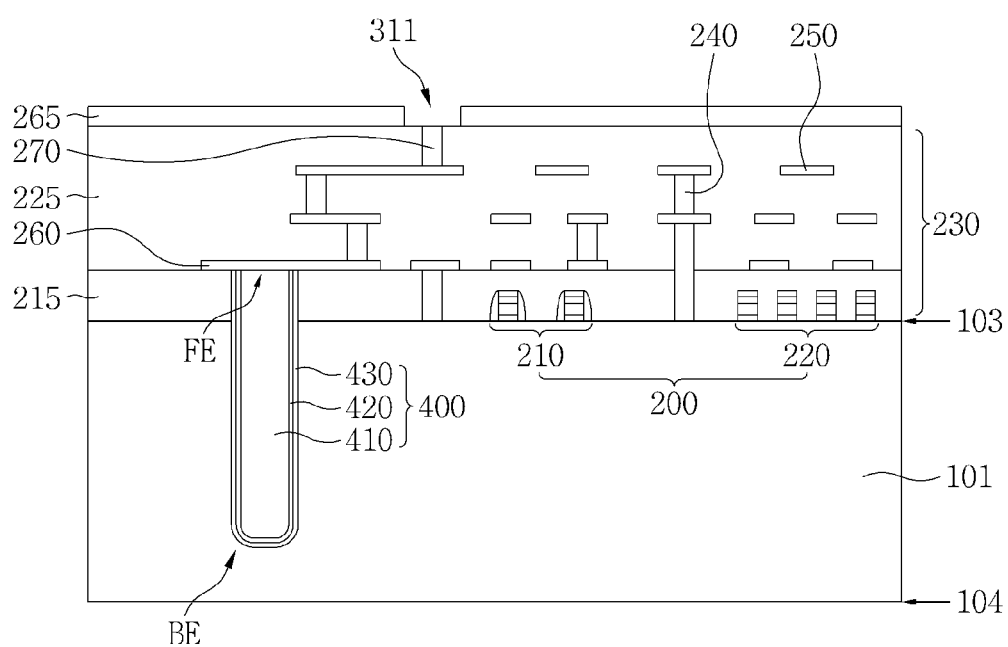
Figure 10I:
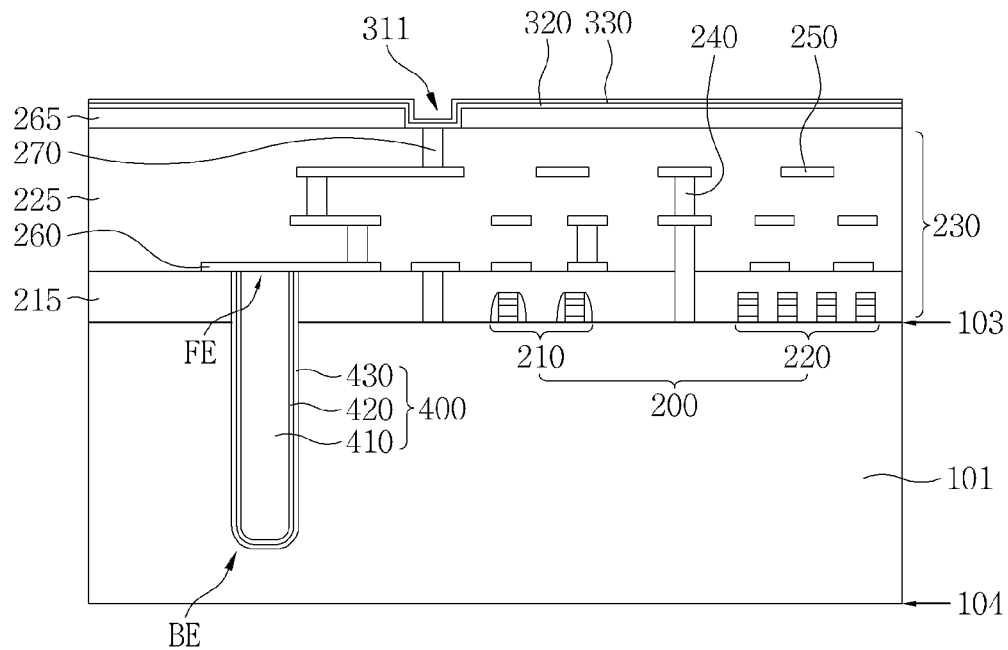
Figure 10J:
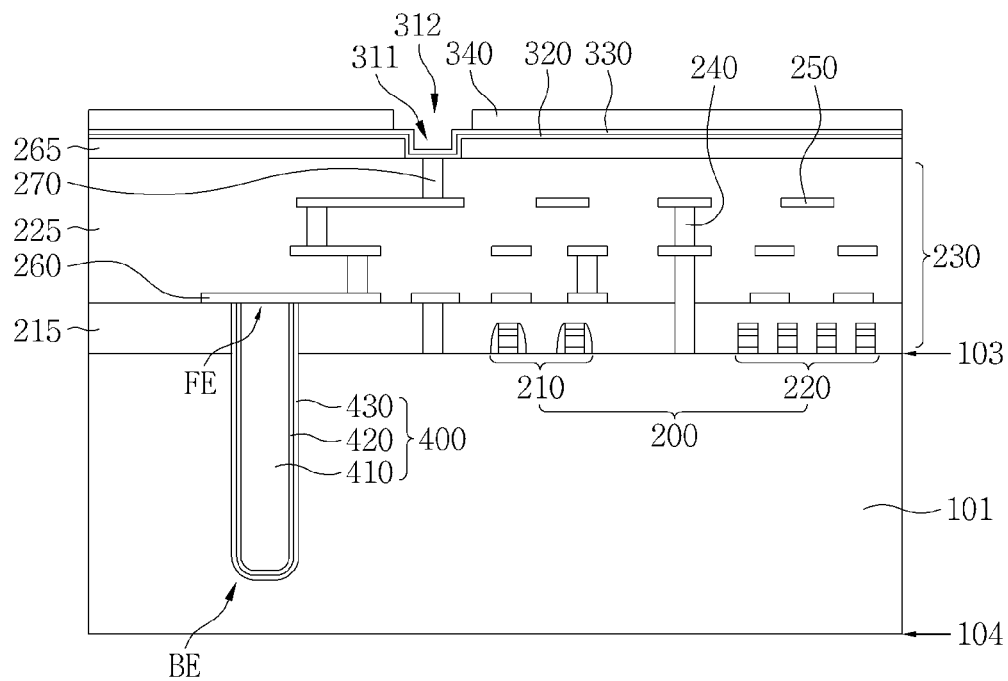
Figure 10K:
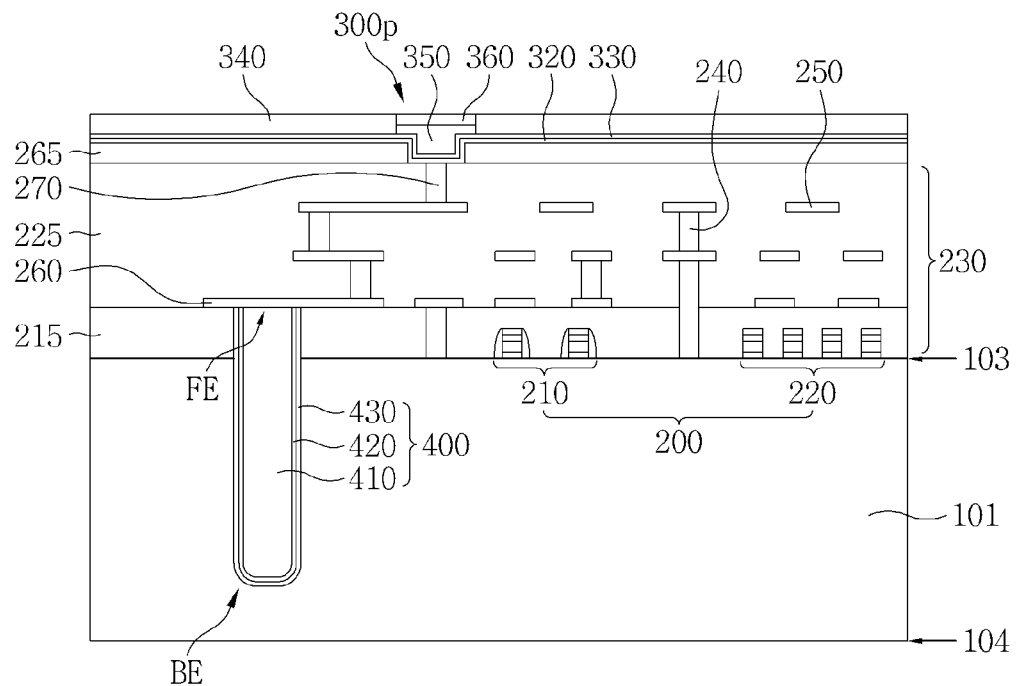
Figure 10L:
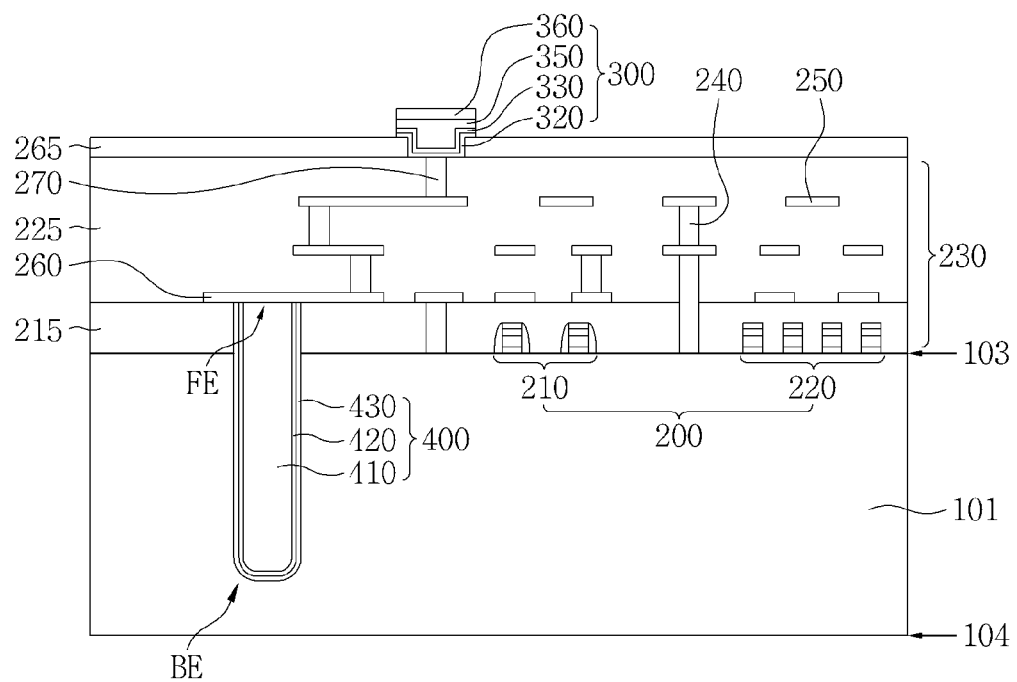
Figure 10M:
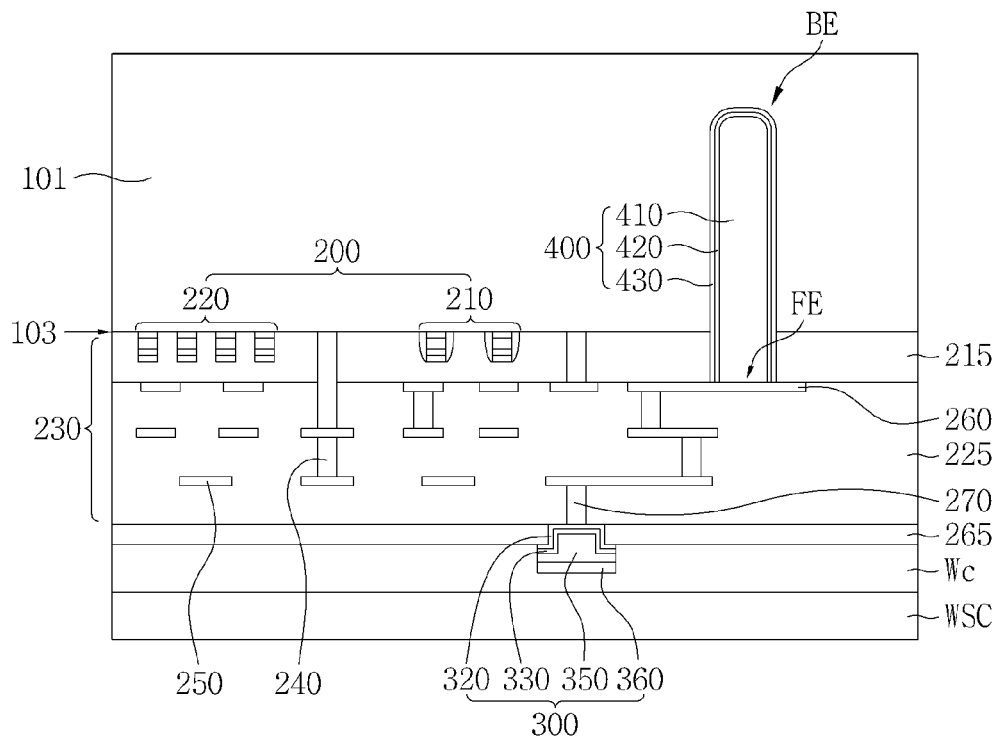
Figure 10N:
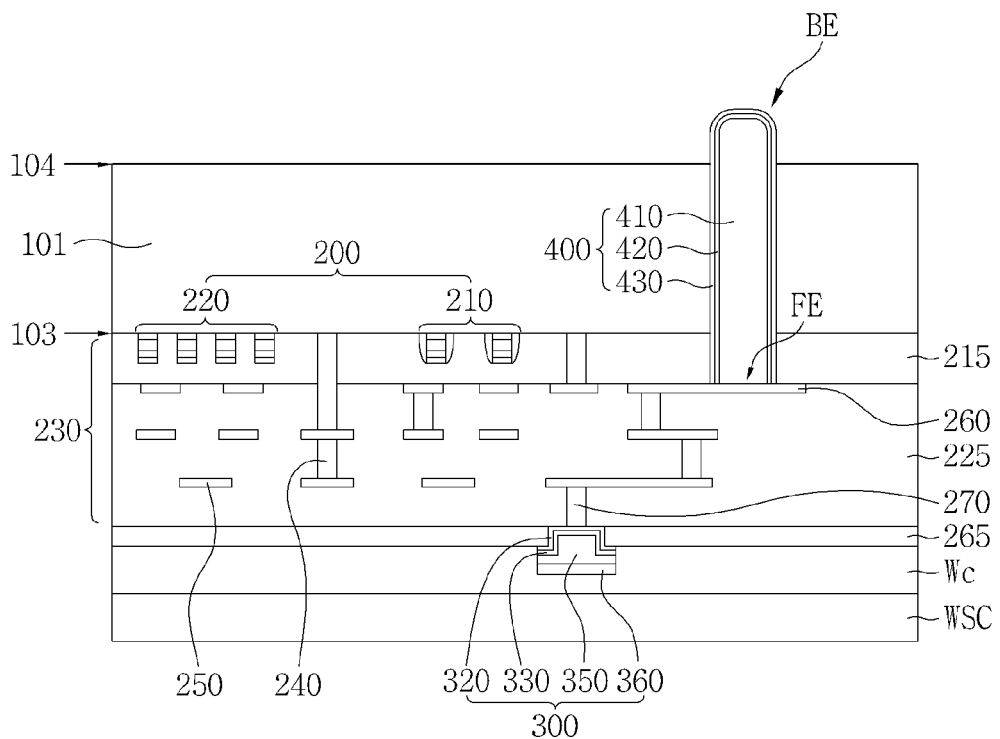
Figure 10O:
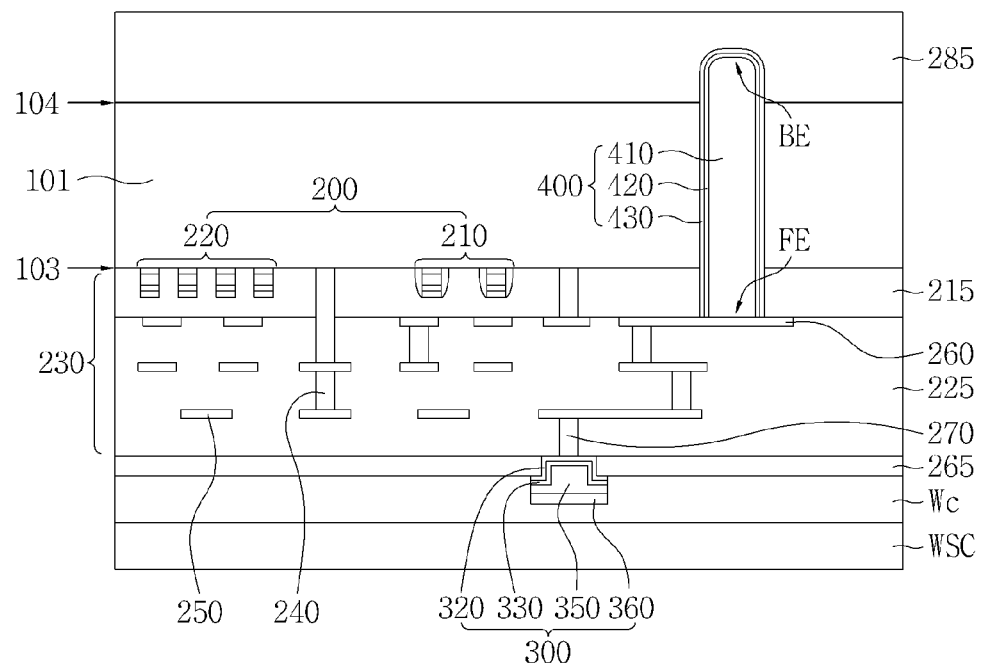
Figure 10P:
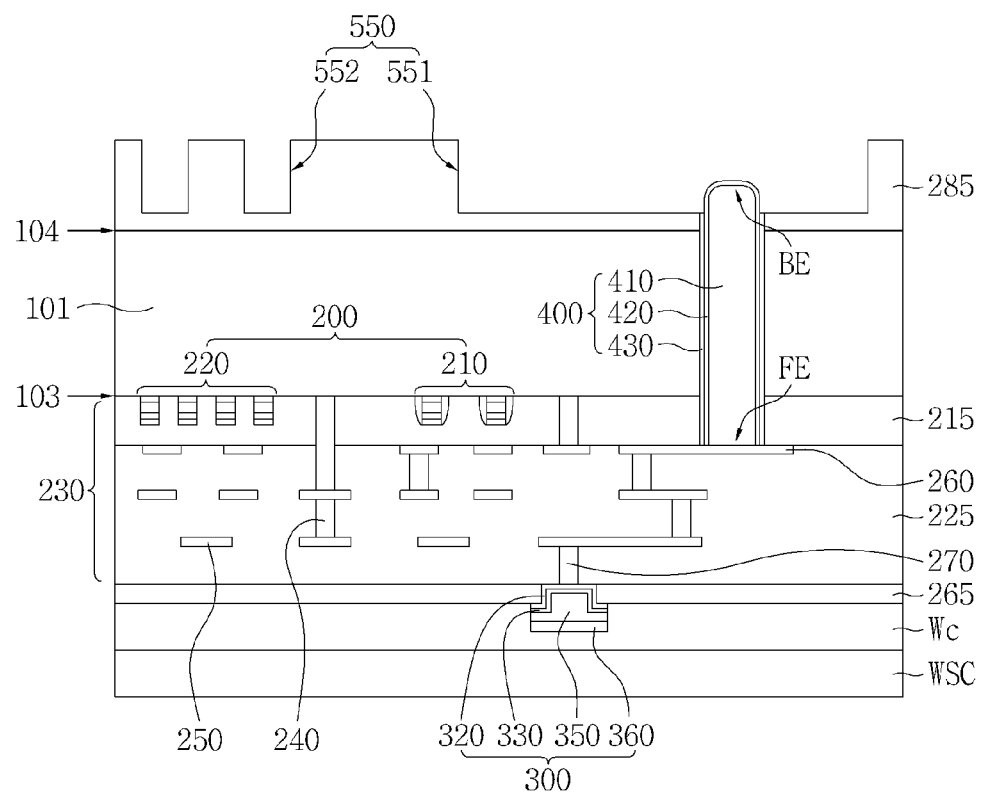
Figure 10Q:
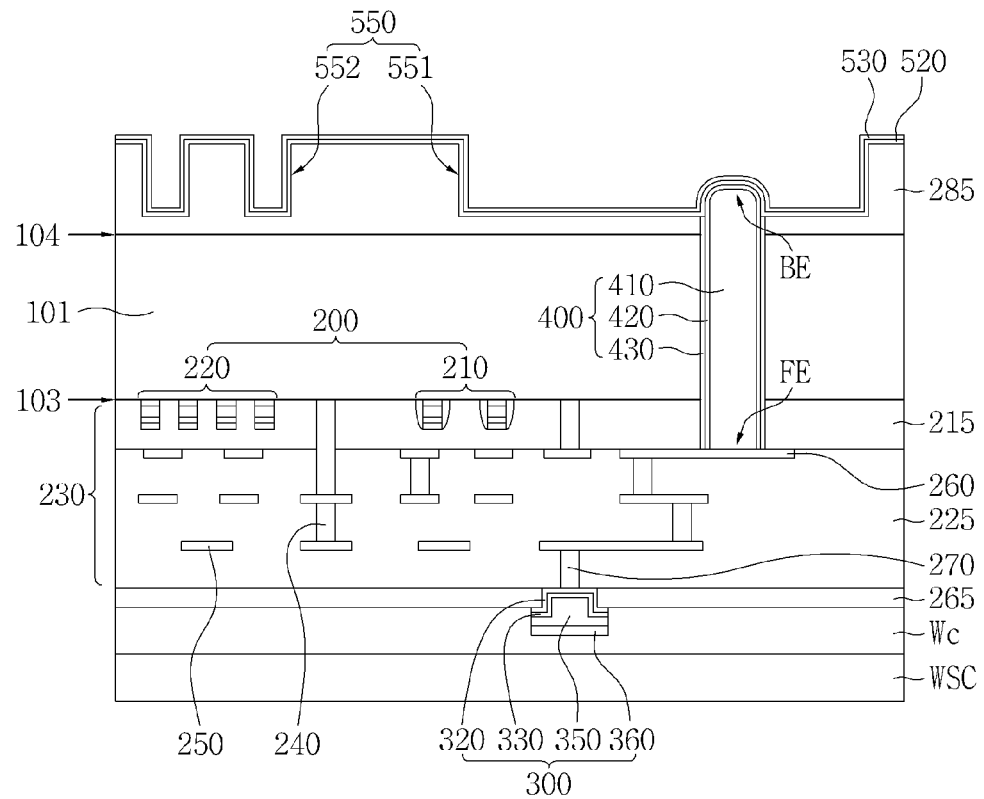
Figure 10R:
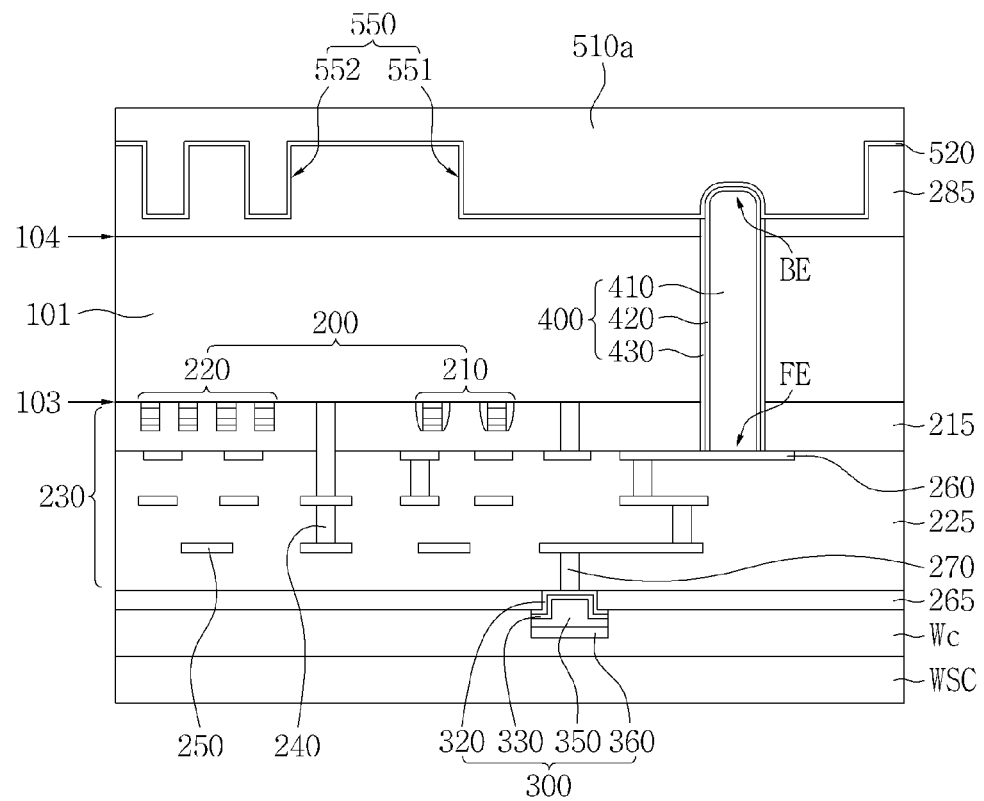
Figure 10S:
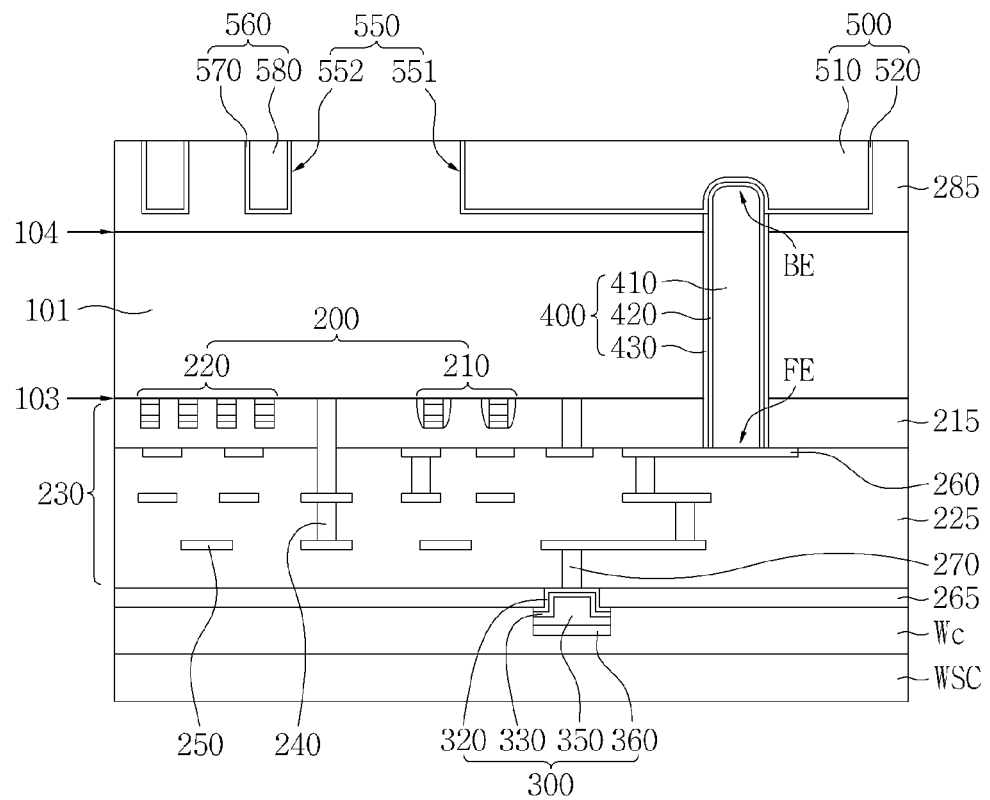
Figure 10T:
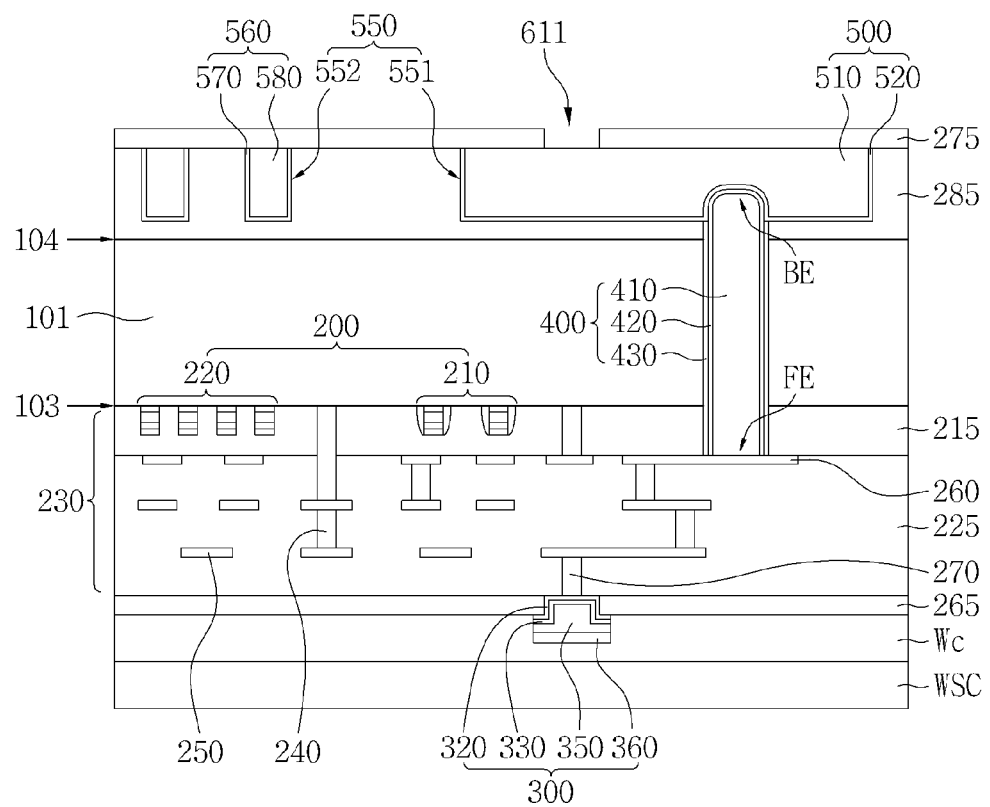
Figure 10U:
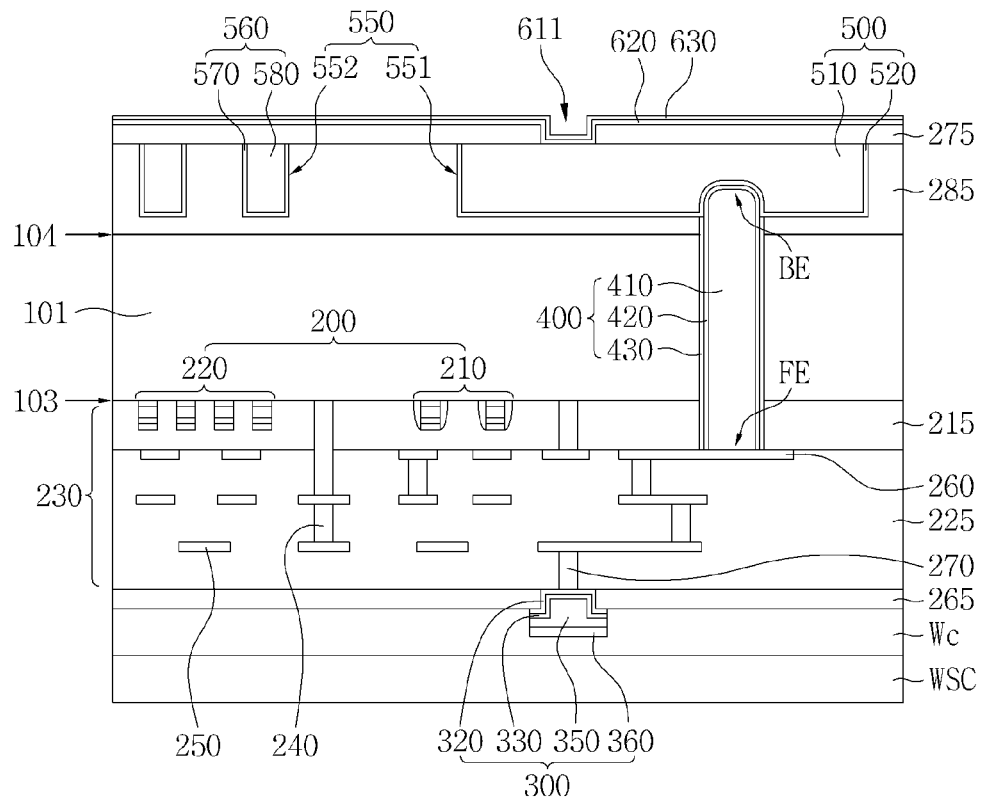
Figure 10V:
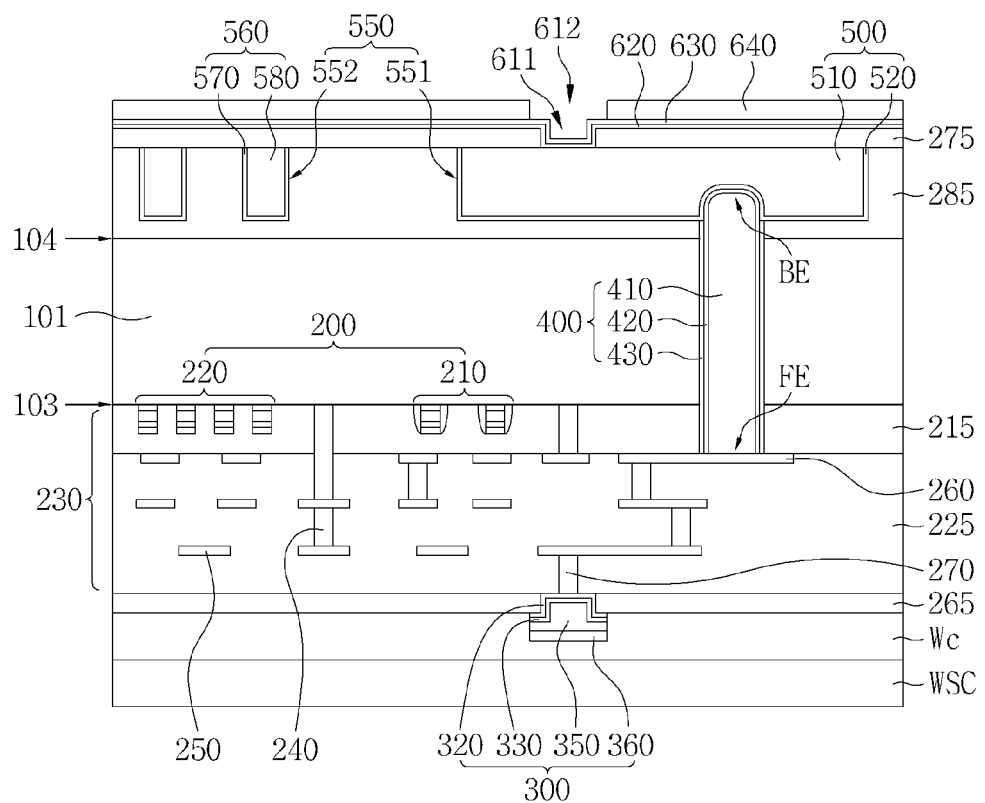
Figure 10W:
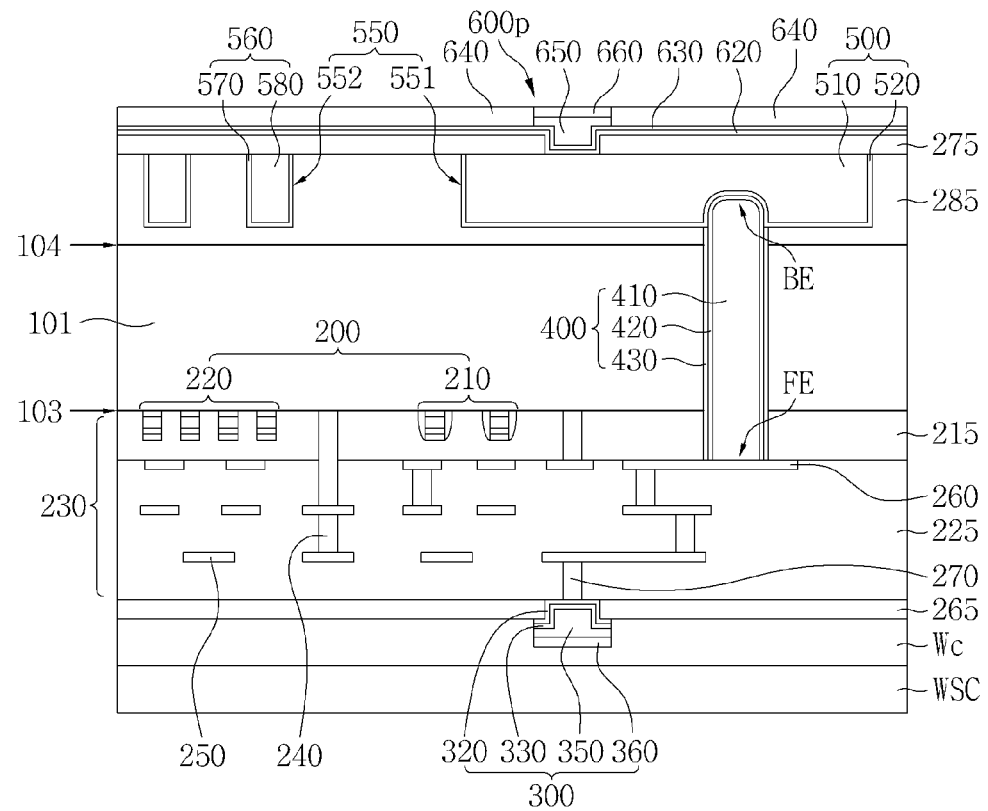
Figure 10X:
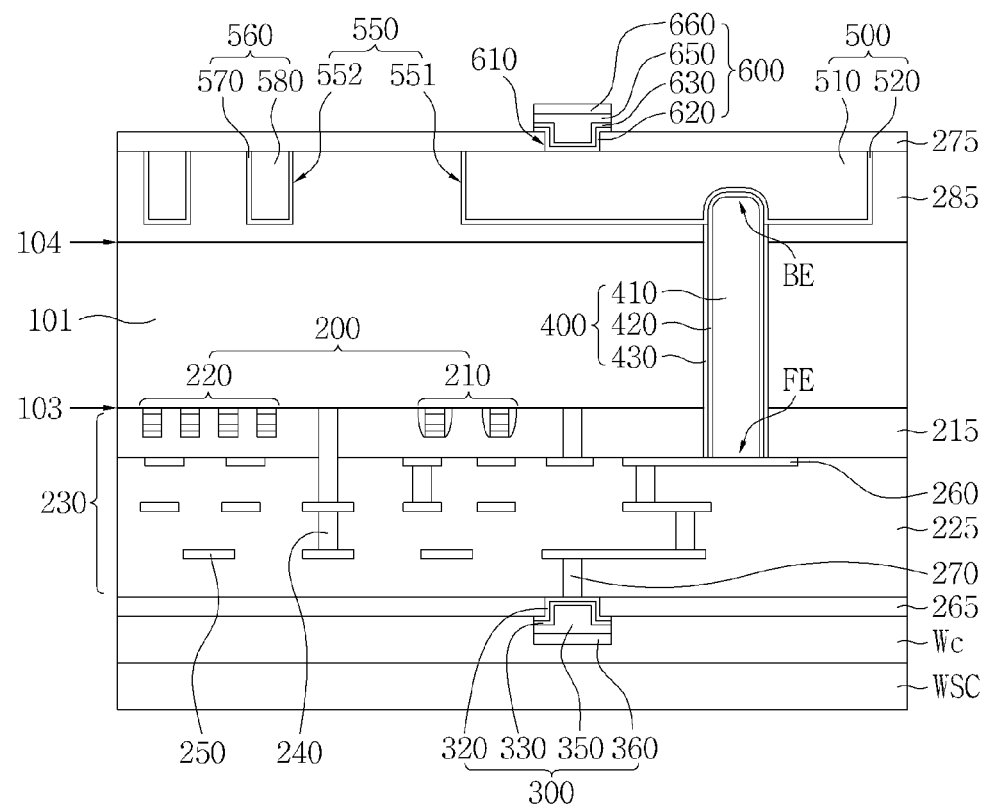

FIGS. 9A through 9J are flowcharts illustrating methods of fabricating semiconductor devices 100A to 100S according to various embodiments of the inventive concepts, and FIGS. 10A through 10X are longitudinal cross-sectional views illustrating a method of fabricating a semiconductor device according to an embodiment of the inventive concepts.

Referring to FIGS. 9A and 10A, a method of fabricating a semiconductor device according to an embodiment of the inventive concepts may include forming unit devices 200 on a front side 103 of a substrate 101 (operation S102). A description of the unit devices 200 will be understood with reference to FIG. 8A. The unit devices 200 may be covered with a first interlayer insulating layer 215. The first interlayer insulating layer 215 may include silicon oxide.

Referring to FIGS. 9A and 10B, the method of fabricating the semiconductor device according to the present embodiment of the inventive concepts may include forming a TSV hole 401 in the substrate 101 (operation S104). The formation of the TSV hole 401 may include forming a TSV hole mask pattern 450 on the first interlayer insulating layer 215 and etching the substrate 101 and the first interlayer insulating layer 215 using the TSV hole mask pattern 450 as an etch mask. The TSV hole mask pattern 450 may include silicon nitride, silicon oxynitride, or an organic material. A lowermost end of the TSV hole 401 may be disposed inside the substrate 101, for example, in a bulk. The TSV hole 401 may not penetrate a back side 104 of the substrate 101. After the TSV hole 401 is formed, the TSV hole mask pattern 450 may be removed.

Referring to FIGS. 9A and 10C, the method of fabricating the semiconductor device according to the present embodiment of the inventive concepts may include conformally forming a TSV liner 430 on an inner wall of the TSV hole 401 (operation S106). The TSV liner 430 may include silicon oxide or silicon nitride. For example, the TSV liner 430 may be conformally deposited on the inner wall of the TSV hole 401 using an atomic layer deposition (ALD) process, a plasma-enhanced chemical vapor deposition (PECVD) process, or a sub-atmospheric CVD (SACVD) process. Alternatively, the TSV liner 430 may be obtained by thermally oxidizing the inner wall of the TSV hole 401 using a thermal oxidation process. In the present embodiment, it is assumed that the TSV liner 430 includes a silicon oxide layer formed using an SACVD process.

Referring to FIGS. 9A and 10D, the method of fabricating the semiconductor device according to the present embodiment of the inventive concepts may include forming a TSV barrier layer 420 and a TSV seed layer 425 on the TSV liner 430 (operation S108). The formation of the TSV barrier layer 420 may include conformally forming a barrier metal on the TSV liner 430 using a physical vapor deposition (PVD) process, such as a sputtering process, or a metal-organic CVD (MOCVD) process. The TSV barrier layer 420 may include Ti, TiN, Ta, TaN, or WN. The TSV barrier layer 420 may be formed as a single-layered or multilayered type. The formation of the TSV seed layer 425 may include conformally forming copper (Cu), ruthenium (Ru), tungsten (W), or another seed metal on the TSV barrier layer 420 using a PVD process or a CVD process.

Referring to FIGS. 9A and 10E, the method of fabricating the semiconductor device according to the present embodiment of the inventive concepts may include forming a TSV core material layer 410a to fill the TSV hole 401 (operation S110). The TSV core material layer 410a may be formed using a plating process. When the TSV seed layer 425 and TSV the core material layer 410a include the same material, a boundary therebetween may disappear. For example, when the TSV seed layer 425 and the TSV core material layer 410a include copper (Cu), a boundary therebetween may disappear. Thus, the TSV seed layer 425 is not shown in FIG. 10E.

Referring to FIGS. 9A and 10F, the method of fabricating the semiconductor device according to the present embodiment of the inventive concepts may include forming a TSV structure 400 (operation S112). The TSV structure 400 may include a TSV core 410, a TSV barrier layer 420, and a TSV liner 430. The formation of the TSV structure 400 may include removing the TSV core material layer 410a, the TSV seed layer 425, the TSV barrier layer 420, and the TSV liner 430, which may be formed on a top surface of the first interlayer insulating layer 215, using a CMP process. For instance, the formation of the TSV structure 400 may include removing the TSV core material layer 410a and the TSV seed layer 425 using a first CMP process, removing the TSV barrier layer 420 using a second CMP process, and removing the TSV liner 430 using a wet etching process or cleaning process. Alternatively, the formation of the TSV structure 400 may include removing the TSV core material layer 410a and the TSV seed layer 425 using a CMP process and removing the TSV barrier layer 420 and/or the TSV liner 430 using a wet etching or cleaning process.

Referring to FIGS. 9A and 10G, the method of fabricating the semiconductor device according to the present embodiment of the inventive concepts may include forming internal circuits 230 on a front side 103 of the substrate 101 (operation S114). The internal circuits 230 may include a plurality of conductive inner vias 240 and multilayered conductive inner interconnections 250. Each of the internal vias 240 may be illustrated as a vertically extending pillar type, and each of the internal interconnections 250 may be illustrated as a horizontally extending mesa type. The internal circuits 230 may be covered with the first interlayer insulating layer 215 and a second interlayer insulating layer 225. A TSV pad 260 may be spaced apart from the surface of the substrate 101 and formed in the second interlayer insulating layer 225. For instance, the TSV pad 260 may be formed on the first interlayer insulating layer 215. The TSV pad 260 may include a metal such as W, Cu, Al or any metals. Although the second interlayer insulating layer 225 will be formed as a multilayered type, the second interlayer insulating layer 225 is illustrated as a single-layered type for brevity.

Referring to FIGS. 9A and 10H, the method of fabricating the semiconductor device according to the present embodiment of the inventive concepts may include forming a front-side I/O pad via plug 270 and a front-side passivation layer 265 on the second interlayer insulating layer 225 (operation S116). The front-side I/O pad via plug 270 may include a metal. For example, the front-side I/O pad via plug 270 may include an uppermost metal layer. The front-side passivation layer 265 may include silicon nitride, silicon oxide, or polyimide. The front-side passivation layer 265 may include a lower front-side I/O pad opening 311 exposing an upper portion of the front-side I/O pad via plug 270.

Referring to FIGS. 9A and 10I, the method of fabricating the semiconductor device according to the present embodiment of the inventive concepts may include forming a front-side I/O pad barrier layer 320 and a front-side I/O pad seed layer 330 within the lower front-side I/O pad opening 311 (operation S118). The formation of the front-side I/O pad barrier layer 320 may include conformally forming a barrier metal on the front-side passivation layer 265 using a PVD process, such as a sputtering process, or a MOCVD process. The front-side I/O pad barrier layer 320 may include Ti, TiN, Ta, TaN, WN, or another refractory metal. The front-side I/O pad barrier layer 320 may be formed as a single-layered or multilayered type. The formation of the front-side I/O pad seed layer 330 may include conformally forming copper (Cu), ruthenium (Ru), tungsten (W), or another metal on the front-side I/O pad barrier layer 320 using a PVD process, such as a sputtering process, or a CVD process.

Referring to FIGS. 9A and 10J, the method of fabricating the semiconductor device according to the present embodiment of the inventive concepts may include forming a front-side I/O pad mask pattern 340 on the front-side I/O pad seed layer 330 (operation S120). The front-side I/O pad mask pattern 340 may have an upper front-side I/O pad opening 312 exposing the lower front-side I/O pad opening 311. The front-side I/O pad mask pattern 340 may include photoresist.

Referring to FIGS. 9A and 10K, the method of fabricating the semiconductor device according to the present embodiment of the inventive concepts may include forming a preliminary front-side I/O pad 300p (operation S122). The formation of the preliminary front-side I/O pad 300p may include forming a front-side I/O pad metal layer 350 and a front-side I/O pad capping layer 360 within the lower front-side I/O pad opening 311 and the upper front-side I/O pad opening 312, respectively. The formation of the front-side I/O pad metal layer 350 may include forming a meal, such as nickel (Ni) or tungsten (IN), using a plating process. The formation of the front-side I/O pad capping layer 360 may include plating gold, nickel, or silver on the front-side I/O pad metal layer 350.

Referring to FIGS. 9A and 10L, the method of fabricating the semiconductor device according to the present embodiment of the inventive concepts may include forming a front-side I/O pad 300 (operation S124). The formation of the front-side I/O pad 300 may include removing the front-side I/O pad mask pattern 340 and removing the front-side I/O pad barrier layer 320 and the front-side I/O pad seed layer 330, which are exposed on the front-side passivation layer 265, using a wet etching process.

Referring to FIGS. 9A and 10M, the method of fabricating the semiconductor device according to the present embodiment of the inventive concepts may include turning the substrate 101 upside down and mounting the substrate 101 on a wafer support carrier WSC (operation S126). A cushion layer Wc may be disposed on the wafer support carrier WSC to protect the front-side I/O pad 300 from physical shock.

Referring to FIGS. 9A and 10N, the method of fabricating the semiconductor device according to the present embodiment of the inventive concepts may include blanketly and/or selectively removing the back side 104 of the substrate 101 to expose a back-side end BE of the TSV structure 400 (operation S128). For instance, a top surface and partial side surface of the back-side end BE of the TSV structure 400 may be exposed. The removal of the back side 104 of the substrate 101 may include, for example, a grinding process and/or an etchback process.

Referring to FIGS. 9B and 10O, the method of fabricating the semiconductor device according to the present embodiment of the inventive concepts may include forming a back-side insulating layer 285 to cover the exposed TSV structure 400 (operation S130). The back-side insulating layer 285 may be a single layer including silicon nitride.

Referring to FIGS. 9B and 10P, the method of fabricating the semiconductor device according to the present embodiment of the inventive concepts may include forming a groove 550 in the back-side insulating layer 285 (operation S132). The groove 550 may include a redistribution groove 551 and an alignment key groove 552. The redistribution groove 551 may expose a portion of the TSV structure 400. For example, the redistribution groove 551 may expose the top and side surfaces of the back-side end BE of the TSV structure 400. During this process, the exposed TSV liner 430 may be removed to expose the TSV barrier layer 420. Referring to FIGS. 9B and 10Q, the method of fabricating the semiconductor device according to the present embodiment of the inventive concepts may include forming a redistribution barrier layer 520 and a redistribution seed layer 530 within the redistribution groove 551 (operation S134). The redistribution barrier layer 520 and the redistribution seed layer 530 may be conformally formed on a bottom surface and inner wall of the redistribution groove 551 and the exposed surface of the TSV structure 400. The formation of the redistribution barrier layer 520 may include conformally forming a barrier metal on the back-side insulating layer 285 using a PVD process, such as a sputtering process, or a MOCVD process. The redistribution barrier layer 520 may include Ti, TiN, Ta, TaN, WN, or another refractory metal. The redistribution barrier layer 520 may be formed as a single-layered or multilayered type. The formation of the redistribution seed layer 530 may include conformally forming copper (Cu), ruthenium (Ru), tungsten (W), or another metal on the redistribution barrier layer 520 using a PVD process, such as a sputtering process, or a CVD process. During this process, the redistribution barrier layer 520 and the redistribution seed layer 530 may also be formed within the alignment key groove 552. A double layer, for example, the TSV barrier layer 420 and the redistribution barrier layer 520, may be formed on the exposed surface of the TSV structure 400.

Referring to FIGS. 9B and 10R, the method of fabricating the semiconductor device according to the present embodiment of the inventive concepts may include forming a redistribution interconnection material layer 510a (operation S136). The formation of the redistribution interconnection material layer 510a may include completely filling the redistribution groove 551 using a plating process. When the redistribution interconnection material layer 510a and the redistribution seed layer 530 include the same material, a boundary therebetween may disappear. For brevity of the drawings, the boundary between the redistribution interconnection material layer 510a and the redistribution seed layer 530 is omitted. When the redistribution interconnection material layer 510a and the redistribution seed layer 530 include different materials, the boundary therebetween may be present. The redistribution interconnection material layer 510a may also fill the alignment key groove 552.

Referring to FIGS. 9B and 10S, the method of fabricating the semiconductor device according to the present embodiment of the inventive concepts may include forming a redistribution structure 500 (operation S138). The formation of the redistribution structure 500 may include removing the redistribution interconnection material layer 510a, the redistribution seed layer 530, and the redistribution barrier layer 520, which are disposed on a top surface of the back-side insulating layer 285, using a CMP process. For example, the formation of the redistribution structure 500 may include removing the redistribution interconnection material layer 510a and the redistribution seed layer 530 using a first CMP process and removing the redistribution barrier layer 520 using a second CMP process. During this process, a redistribution interconnection 510 and an alignment key 560 may be formed. Alternatively, the formation of the redistribution structure 500 may include removing the redistribution interconnection material layer 510a and the redistribution seed layer 530 using a CMP process and removing the redistribution barrier layer 520 using a wet etching process.

Referring to FIGS. 9B and 10T, the method of fabricating a semiconductor device according to the present embodiment of the inventive concepts may include forming a back-side passivation layer 275 (operation S140). The back-side passivation layer 275 may have a lower back-side I/O pad opening 611 partially exposing the surface of the redistribution interconnection 510. The back-side passivation layer 275 may include silicon oxide, silicon nitride, or polyimide.

Referring to FIGS. 9B and 10U, the method of fabricating the semiconductor device according to the present embodiment of the inventive concepts may include forming a back-side I/O pad barrier layer 620 and a back-side I/O pad seed layer 630 within the lower back-side I/O pad opening 611 and/or on the back-side passivation layer 275 (operation S142). The formation of the back-side I/O pad barrier layer 620 may include conformally forming a barrier metal on the back-side passivation layer 275 using a PVD process, such as a sputtering process, or a MOCVD process. The back-side I/O pad barrier layer 620 may include Ti, TiN, Ta, TaN, or WN. The back-side I/O pad barrier layer 620 may be formed as a single-layered or multilayered type. The formation of the back-side I/O pad seed layer 630 may include conformally forming copper (Cu), ruthenium (Ru), tungsten (W), or another metal on the back-side I/O pad barrier layer 620 using a PVD process, such as a sputtering process, or a CVD process.

Referring to FIGS. 9B and 10V, the method of fabricating the semiconductor device according to the present embodiment of the inventive concepts may include forming a back-side I/O pad mask pattern 640 on the back-side I/O pad barrier layer 620 and the back-side I/O pad seed layer 630 (operation S144). The back-side I/O pad mask pattern 640 may have an upper back-side I/O pad opening 612 exposing the lower back-side I/O pad opening 611. The back-side I/O pad mask pattern 640 may include photoresist.

Referring to FIGS. 9B and 10W, the method of fabricating the semiconductor device according to the present embodiment of the inventive concepts may include forming a preliminary back-side I/O pad 600p (operation S146). The formation of the preliminary back-side I/O pad 600p may include forming a back-side I/O pad metal layer 650 and a back-side I/O pad capping layer 660 within the upper and lower back-side I/O pad openings 612 and 611. The formation of the back-side I/O pad metal layer 650 may include forming a metal layer, such as a nickel (Ni) or tungsten (W) layer, using a plating process. The formation of the back-side I/O pad capping layer 660 may include plating gold (Au) or silver (Ag) on the back-side I/O pad metal layer 650.

Referring to FIGS. 9B and 10X, the method of fabricating the semiconductor device according to the present embodiment of the inventive concepts may include forming a back-side I/O pad 600 (operation S148). The formation of the back-side I/O pad 600 may include removing the back-side I/O pad mask pattern 640 and removing the back-side I/O pad barrier layer 620 and the back-side I/O pad seed layer 630, which are exposed on the back-side passivation layer 275, using a wet etching process. Subsequently, the resultant structure may be separated from the wafer support carrier WSC, thereby completing the formation of the semiconductor device 100A shown in FIG. 7A.

FIGS. 11A through 11D are longitudinal cross-sectional views illustrating a method of fabricating a semiconductor device according to another embodiment of the inventive concepts.

Figure 11A:
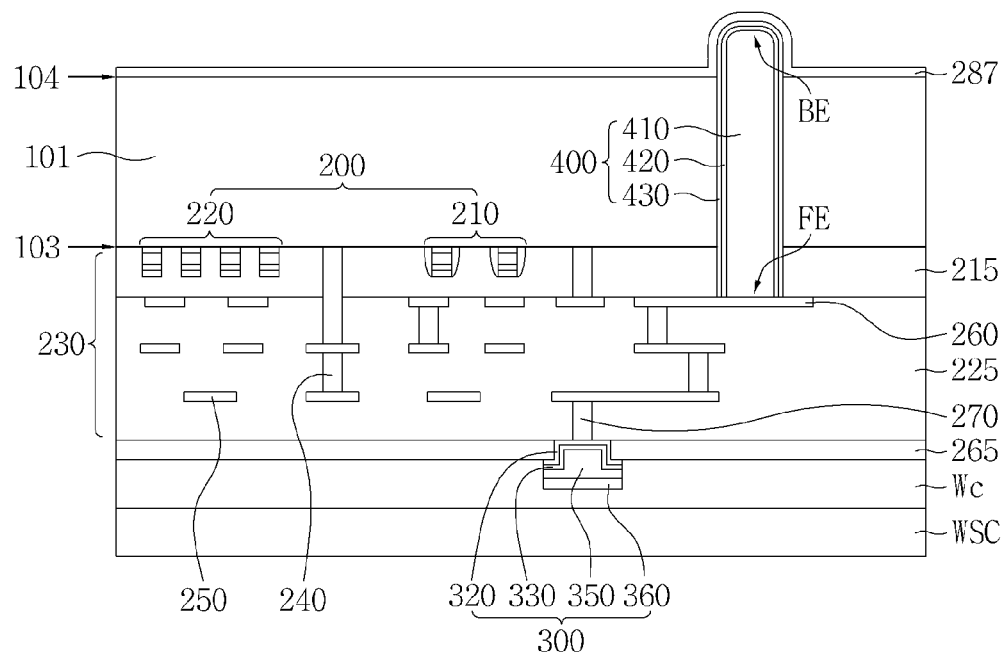
FIGS. 11A through 11D are longitudinal cross-sectional views illustrating a method of fabricating a semiconductor device according to another embodiment of the inventive concepts.

Referring to FIGS. 9C and 11A, the method of fabricating the semiconductor device according to the present embodiment of the inventive concepts may include exposing a back-side end BE of a TSV structure 400 with reference to FIGS. 9A and 10A through 10N and forming a lower back-side insulating layer 287 to cover the exposed back-side end BE of the TSV structure 400 (operation S129A). The lower back-side insulating layer 287 may be conformally formed on a surface of a substrate 101 and the exposed surface of the TSV structure 400. The lower back-side insulating layer 287 may include silicon oxide.

Figure 11B:
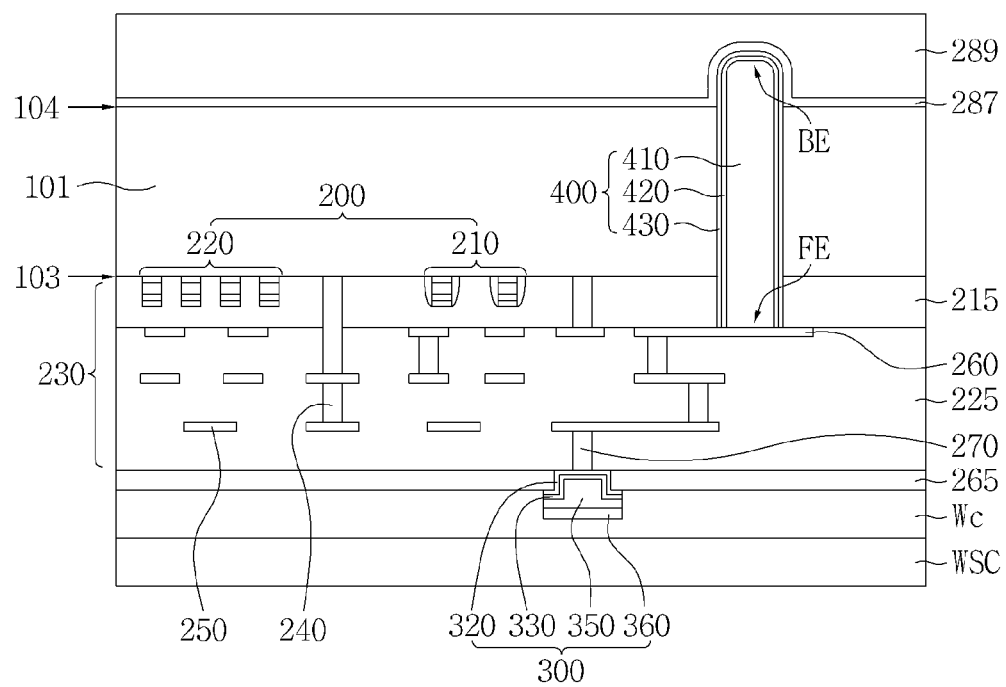

Referring to FIGS. 9C and 11B, the method of fabricating the semiconductor device according to the present embodiment of the inventive concepts may include forming an upper back-side insulating layer 289 on the lower back-side insulating layer 287 (operation S129B). The upper back-side insulating layer 289 may be formed to a greater thick than the lower back-side insulating layer 287. The upper back-side insulating layer 289 may include silicon nitride.

Figure 11C:
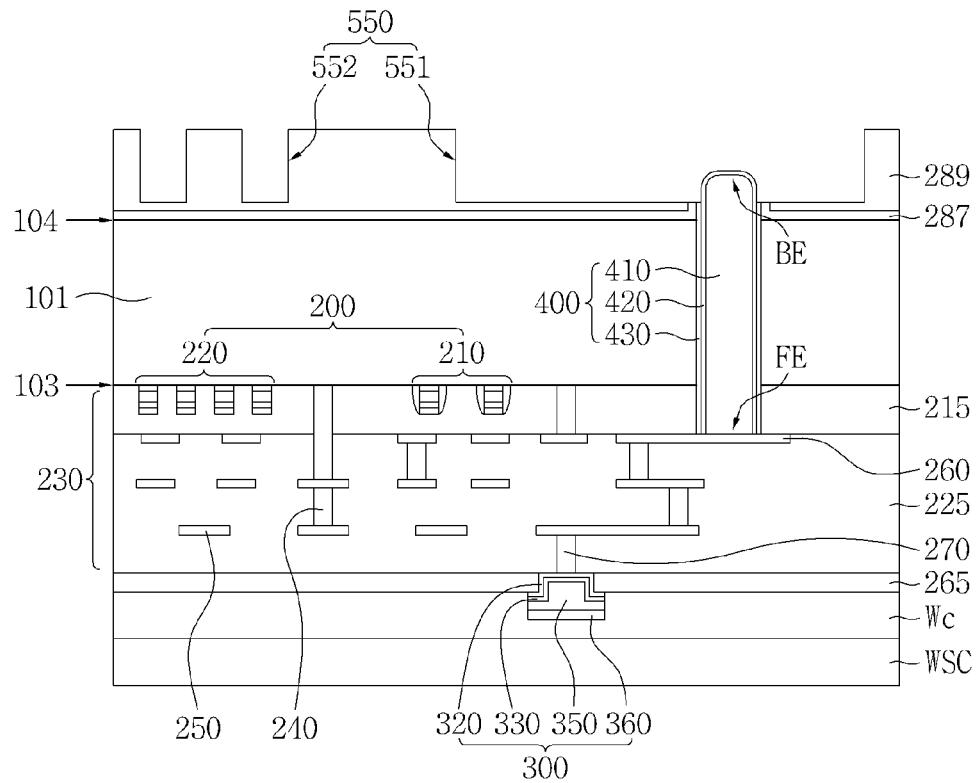

Referring to FIGS. 9C and 11C, the method of fabricating the semiconductor device according to the present embodiment of the inventive concepts may include forming a groove 550 in the upper back-side insulating layer 289 to expose the surface of the TSV structure 400 (operation S132A). The groove 550 may include a redistribution groove 551 and an alignment key groove 552. The redistribution groove 551 may expose top and side surfaces of the back-side end BE of the TSV structure 400. During this process, the exposed TSV liner 430 may be removed. A portion of the lower back-side insulating layer 287 may be exposed on a bottom surface of the redistribution groove 551.

Figure 11D:
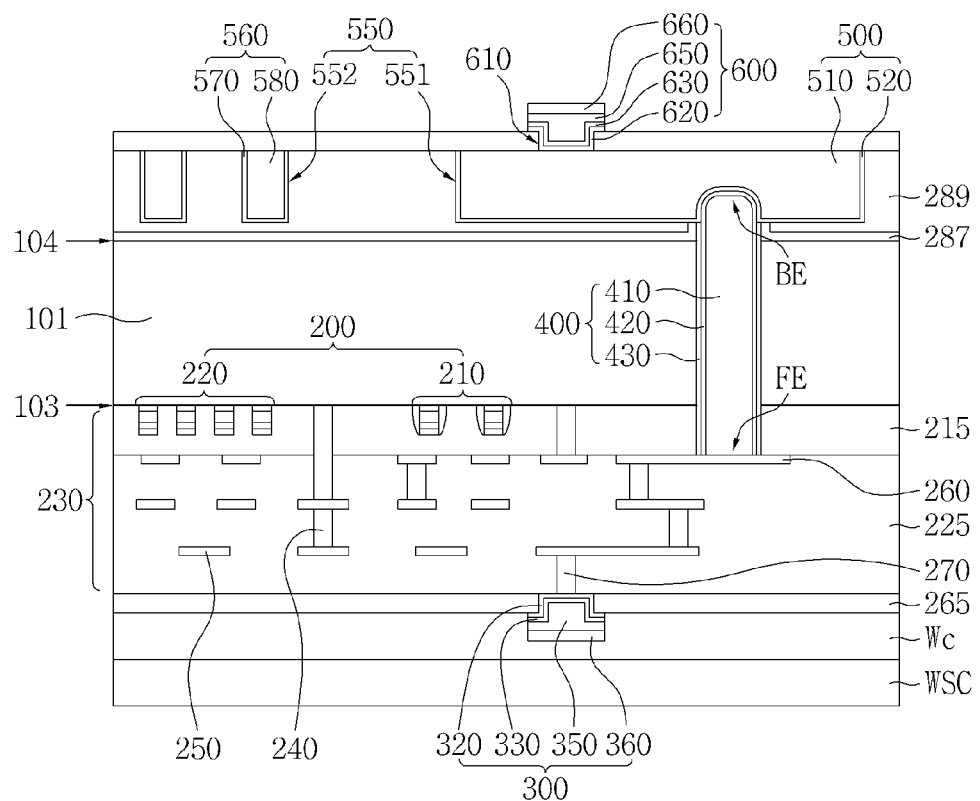

Referring to FIGS. 9C and 11D, the method of fabricating the semiconductor device according to the present embodiment of the inventive concepts may include forming a back-side I/O pad 600 by performing the processes described with reference to FIGS. 9B and 10Q through 10X (operation S134-S140). A portion of redistribution barrier layer 520 and a portion of the lower back-side insulating layer 287 may be in contact with a side surface of the TSV structure 400.

FIGS. 12A through 12G are longitudinal cross-sectional views illustrating a method of fabricating a semiconductor device according to another embodiment of the inventive concepts.

Figure 12A:
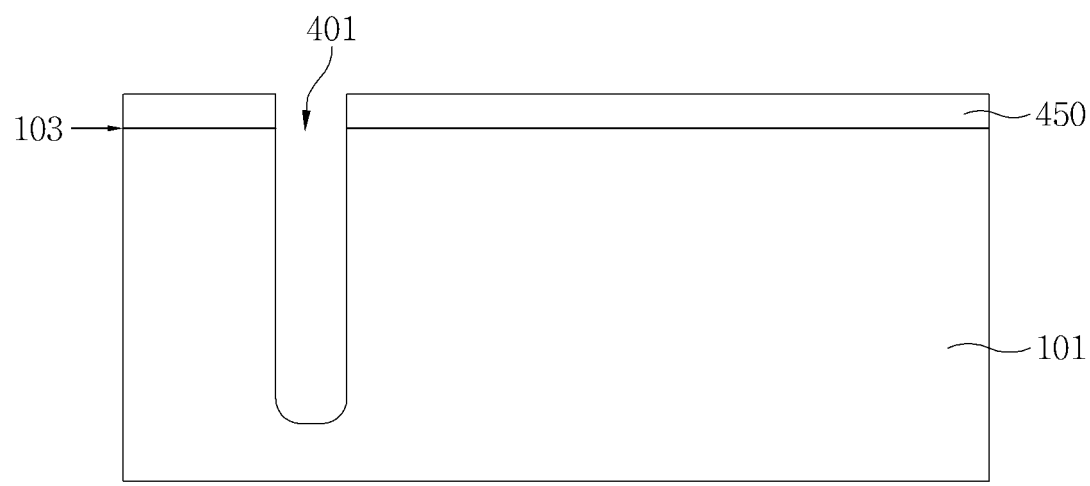
FIGS. 12A through 12G are longitudinal cross-sectional views illustrating a method of fabricating a semiconductor device according to another embodiment of the inventive concepts.

Referring to FIGS. 9D and 12A, the method of fabricating a semiconductor device according to the present embodiment of the inventive concepts may include forming a TSV hole 401 in a substrate 101 (operation S202). The formation of the TSV hole 401 in the substrate 101 may include forming a TSV hole mask pattern 450 on a front side 103 of the substrate 101 and etching the substrate 101 using the TSV hole mask pattern 450 as an etch mask. The TSV hole mask pattern 450 may include silicon oxide and/or silicon nitride. The TSV hole mask pattern 450 may be formed as a single-layered or multilayered type. For instance, a silicon oxide layer may be formed on the substrate 101, and a silicon nitride layer may be formed on the silicon oxide layer. In the present embodiment, it is conceptually assumed that the TSV hole mask pattern 450 is a single material layer. A lowermost end of the TSV hole 401 may be disposed in the substrate 101, for example, in a bulk. After the TSV hole 401 is formed, the TSV hole mask pattern 450 may be removed.

Figure 12B:
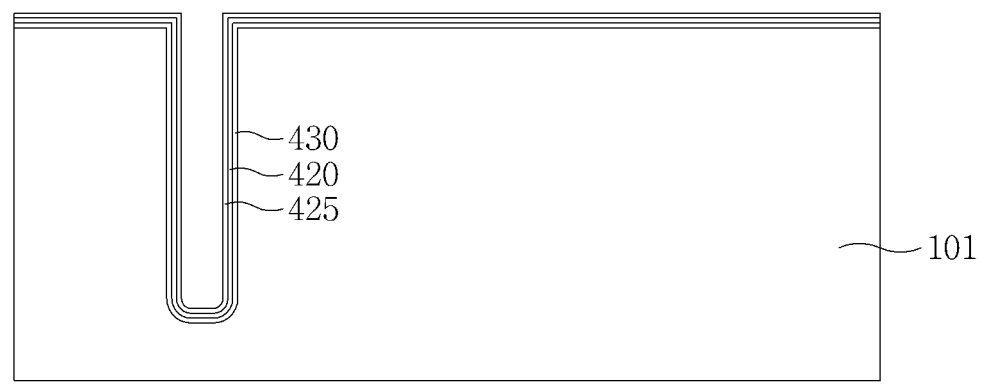

Referring to FIGS. 9D and 12B, the method of fabricating the semiconductor device according to the present embodiment of the inventive concepts may include conformally forming a TSV liner 430 on an inner wall of the TSV hole 401 (operation S204). Afterwards, the method of fabricating the semiconductor device according to the present embodiment of the inventive concepts may include conformally forming a TSV barrier layer 420 and a TSV seed layer 425 on the TSV liner 430 (operation S206).

Figure 12C:
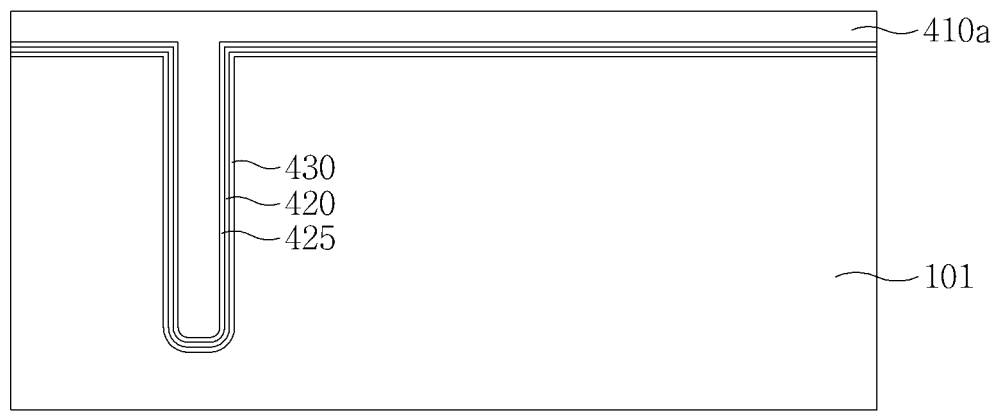

Referring to FIGS. 9D and 12C, the method of fabricating the semiconductor device according to the present embodiment of the inventive concepts may include forming a TSV core material layer 410a to fill the TSV hole 401 (operation S208).

Figure 12D:
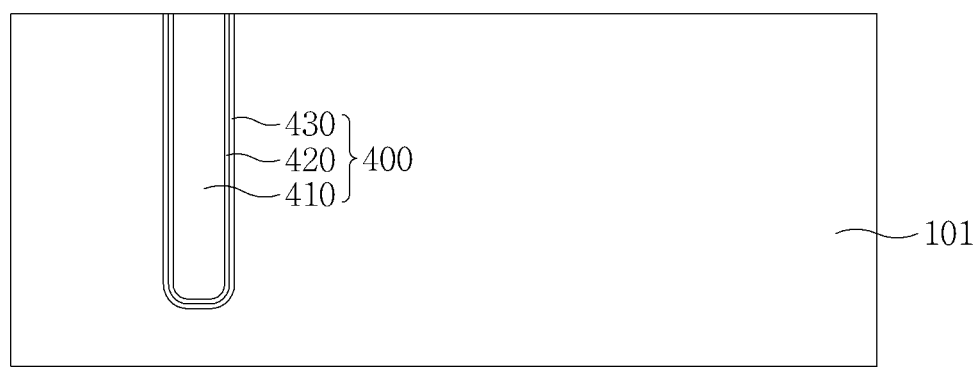

Referring to FIGS. 9D and 12D, the method of fabricating the semiconductor device according to the present embodiment of the inventive concepts may include forming a TSV structure 400 (operation S210).

Figure 12E:
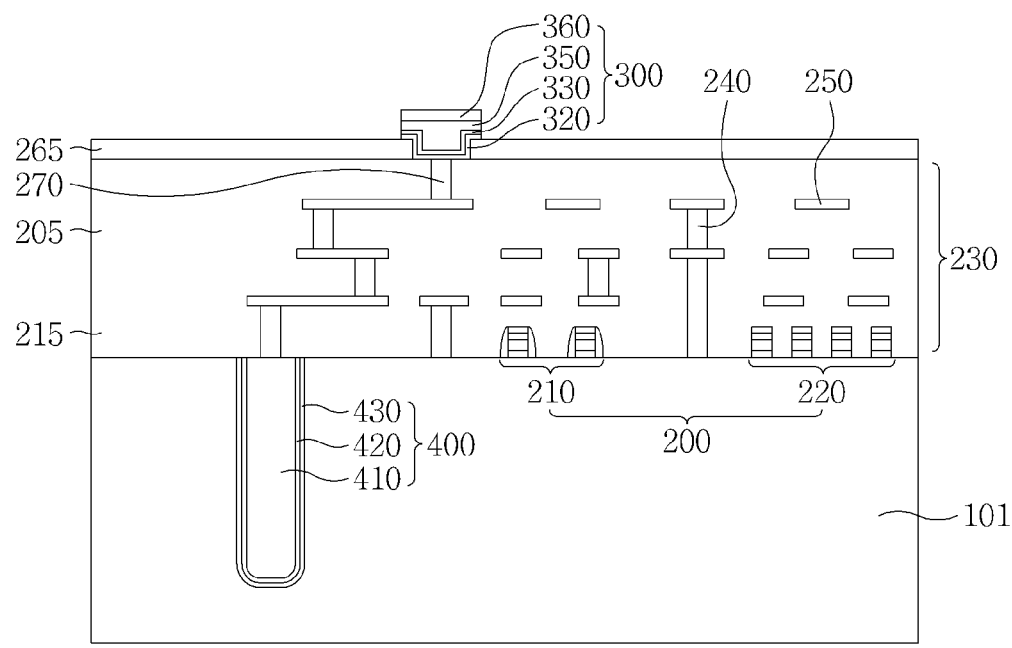

Referring to FIGS. 9D and 12E, the method of fabricating the semiconductor device according to the present embodiment of the inventive concepts may include forming internal circuits 230 and a front-side I/O pad 300 (operation S212). The TSV pad 260 of FIGS. 10G to 11D may be not formed. For example, the TSV structure 400 may be in directly contact with one of the internal vias 240.

Figure 12F:
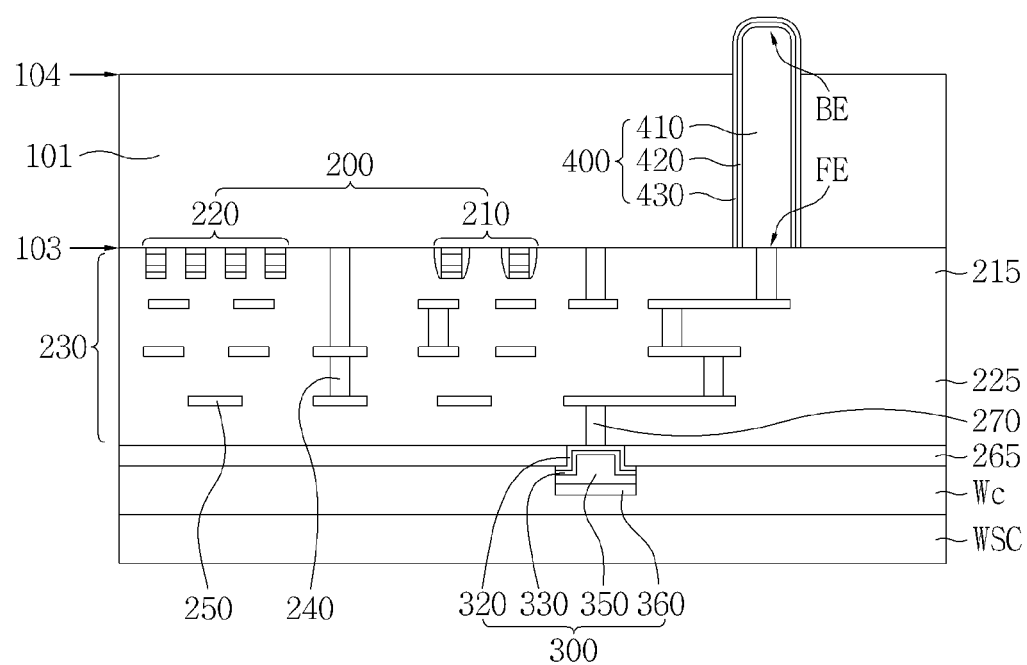

Referring to FIGS. 9D and 12F, the method of fabricating the semiconductor device according to the present embodiment of the inventive concepts may include turning the substrate 101 upside down and mounting the substrate 101 on a wafer support carrier WSC (operation S214). Furthermore, the method may include blanketly and/or selectively removing a back side 104 of the substrate 101 to expose a portion of the TSV structure 400 (operation S216).

Figure 12G:
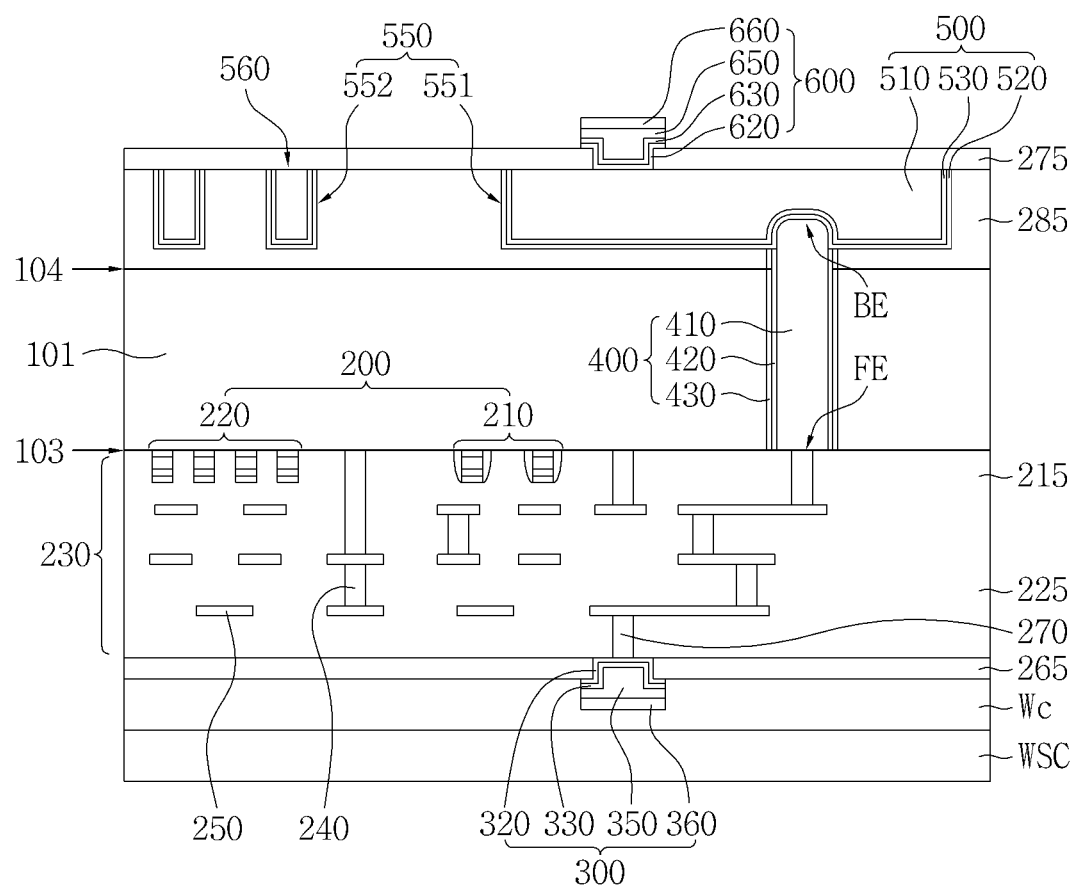

Referring to FIGS. 9E and 12G and referring further to FIGS. 10O through 10X, the method of fabricating the semiconductor device according to the present embodiment of the inventive concepts may include forming a back-side insulating layer 285 to cover the exposed TSV structure 400 (operation S218), forming a groove 550 in the back-side insulating layer 285 (operation S220), forming a redistribution barrier layer 530 and a redistribution seed layer 520 in the groove 550 (operation S222), forming a redistribution interconnection material layer 510a (operation S224), forming a redistribution structure 500 (operation S226), forming a back-side passivation layer 275 having a lower back-side I/O pad opening 611 to partially expose a surface of the redistribution interconnection 510 (operation S228), forming a back-side I/O pad barrier layer 620 and a back-side I/O pad seed layer 630 within the lower back-side I/O pad opening 611 and/or on the back-side passivation layer 275 (operation S230), forming a back-side I/O pad mask pattern 640 having an upper back-side I/O pad opening 612 exposing the lower back-side I/O pad opening 611 on the back-side I/O pad barrier layer 620 and the back-side I/O pad seed layer 630 (operation S232), forming a preliminary back-side I/O pad 600p (operation S234), and forming a back-side I/O pad 600 (operation S236). A boundary between the redistribution seed layer 530 and the redistribution interconnection 510 is exemplarily illustrated.

FIGS. 13A through 13D are longitudinal cross-sectional views illustrating a method of fabricating a semiconductor device according to another embodiment of the inventive concepts.

Figure 13A:
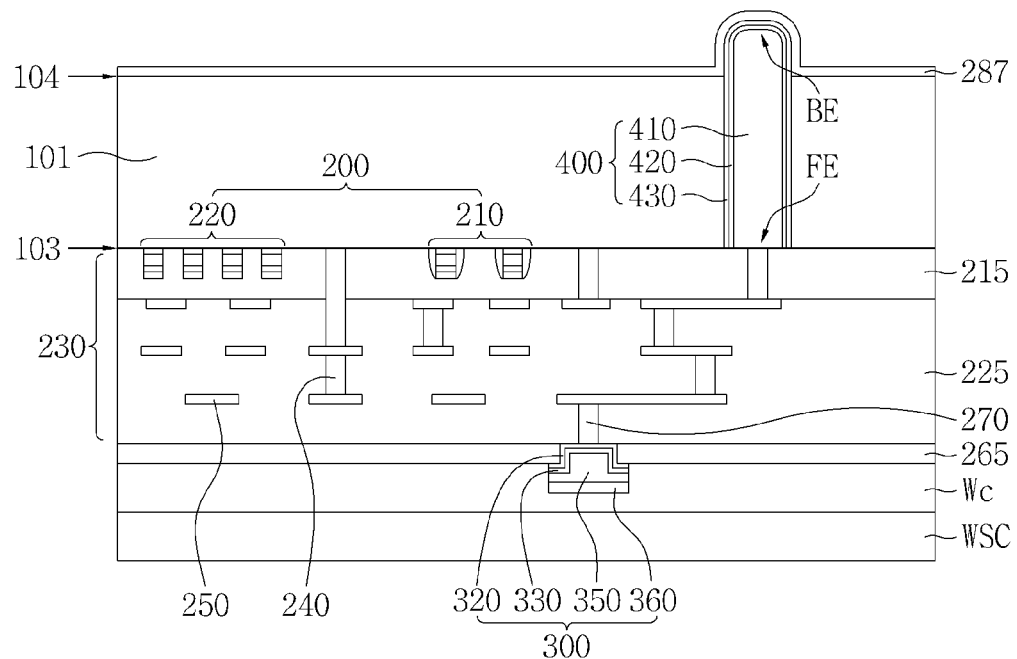
FIGS. 13A through 13D are longitudinal cross-sectional views illustrating a method of fabricating a semiconductor device according to another embodiment of the inventive concepts.

Referring to FIGS. 9F and 13A, the method of fabricating the semiconductor device according to the present embodiment of the inventive concepts may include exposing a back-side end BE of a TSV structure 400 with reference to FIGS. 9D and 12A through 12F and forming a lower back-side insulating layer 287 to cover the TSV structure 400 exposed on the back side 104 of the substrate 101 (operation S219A).

Figure 13B:
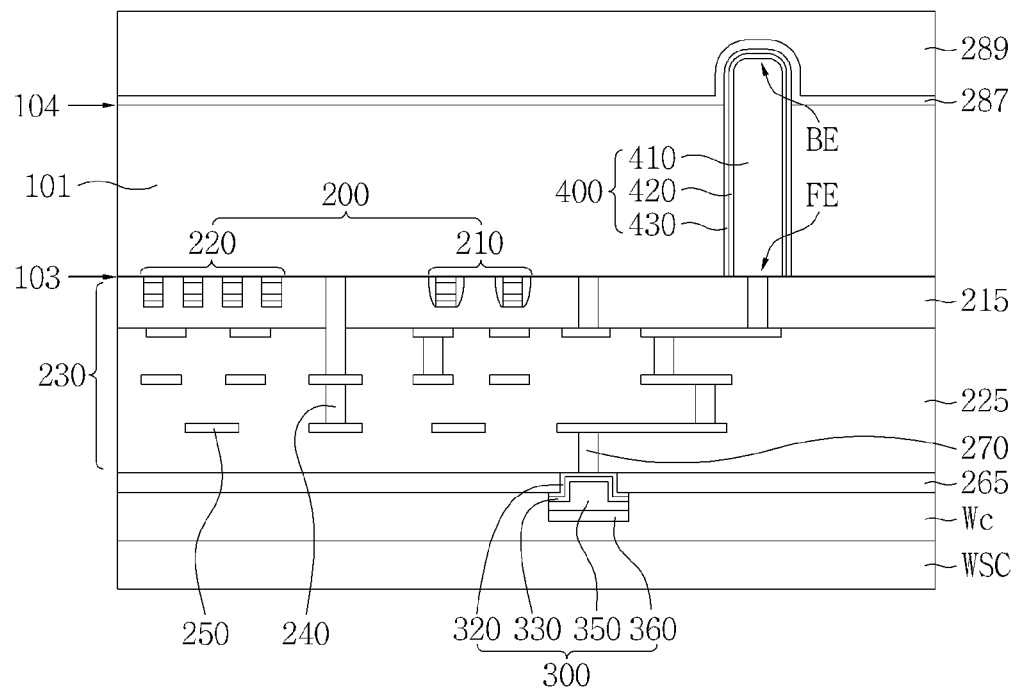

Referring to FIGS. 9F and 13B, the method of fabricating the semiconductor device according to the present embodiment of the inventive concepts may include forming an upper back-side insulating layer 289 on the lower back-side insulating layer 287 (operation S219B).

Figure 13C:
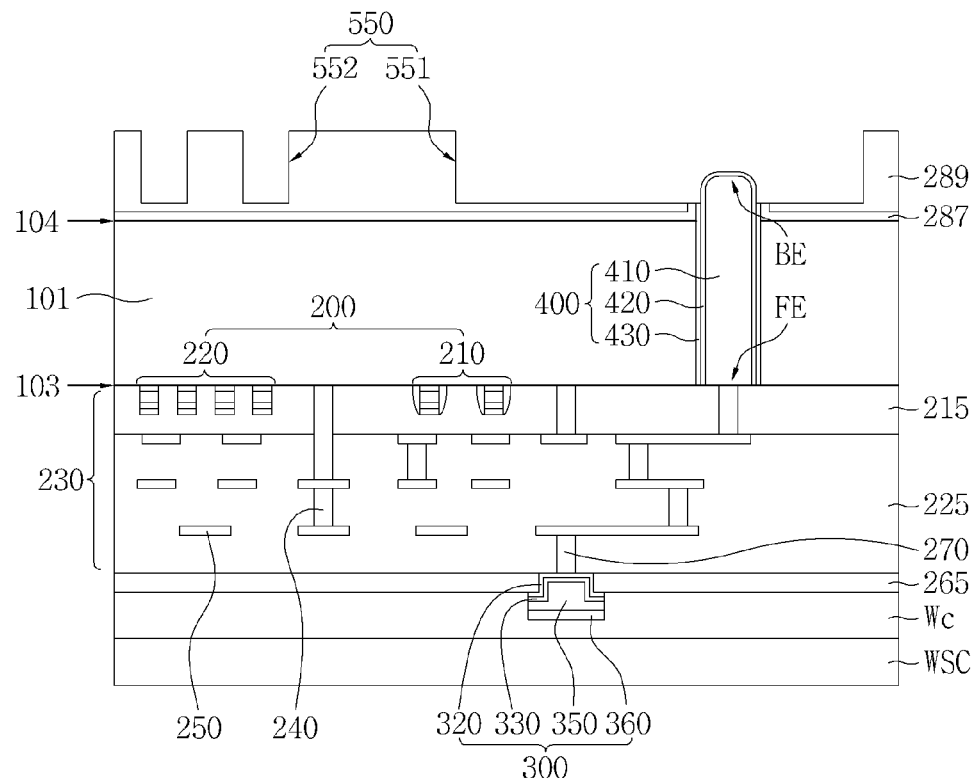

Referring to FIGS. 9E and 13C, the method of fabricating the semiconductor device according to the present embodiment of the inventive concepts may include forming a redistribution groove 551 in the upper back-side insulating layer 289 to expose the surface of the TSV structure 400 (operation S220A). For instance, a redistribution groove 551 may expose top and side surfaces of the back-side end BE of the TSV structure 400. During this process, the exposed TSV liner 430 may be removed. A portion of the lower back-side insulating layer 287 may be exposed on a bottom surface of the redistribution groove 551.

Figure 13D:
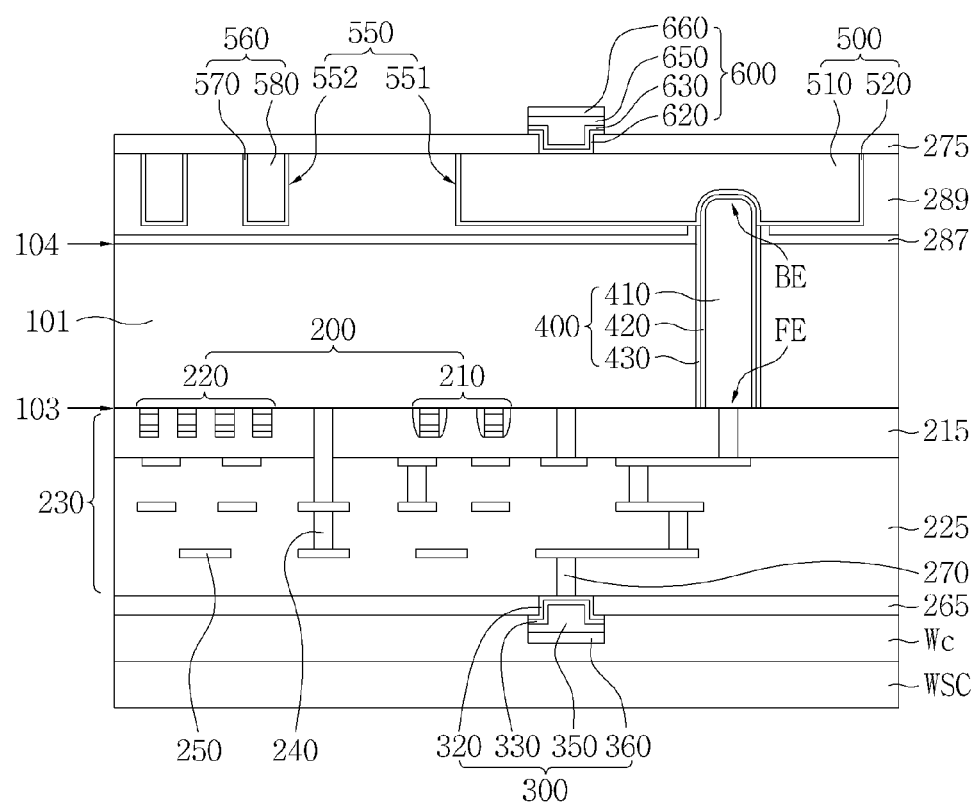

Referring to FIGS. 9F and 13D, the method of fabricating the semiconductor device according to the present embodiment of the inventive concepts may include forming a redistribution barrier layer 530 and a redistribution seed layer 530 within the groove 550 (operation S222), forming a redistribution interconnection material layer 510a (operation S224), forming a redistribution structure 500 (operation S226), forming a back-side passivation layer 275 having a lower back-side I/O pad opening 611 to partially expose a surface of the redistribution interconnection 510 (operation S228), forming a back-side I/O pad barrier layer 620 and a back-side I/O pad seed layer 630 within the lower back-side I/O pad opening 611 and/or on the back-side passivation layer 275 (operation S230), forming a back-side I/O pad mask pattern 640 having an upper back-side I/O pad opening 612 on the back-side I/O pad barrier layer 620 and the back-side I/O pad seed layer 630 to expose the lower back-side I/O pad opening 611 (operation S232), forming a preliminary back-side I/O pad 600*p* (operation S234), and forming a back-side I/O pad 600 (operation S236).

Figure 14A:
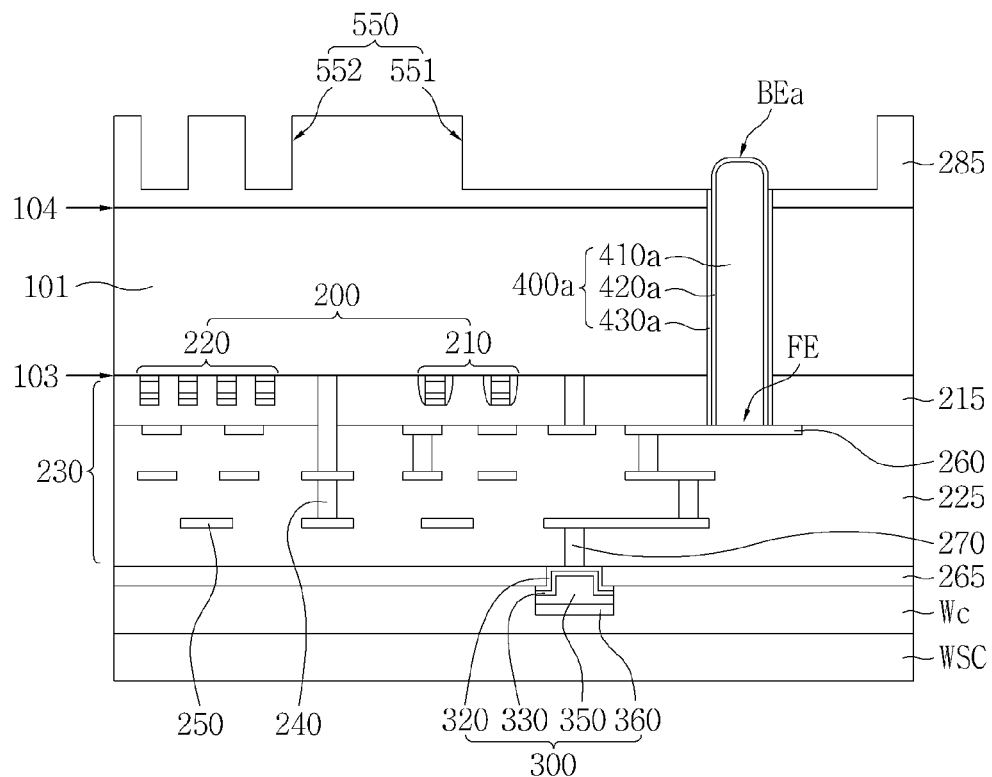
FIGS. 14A through 14Q are conceptual longitudinal cross-sectional views of TSV structures having various shapes, which are exposed within redistribution grooves according to some embodiments of the inventive concepts.
Figure 14B:
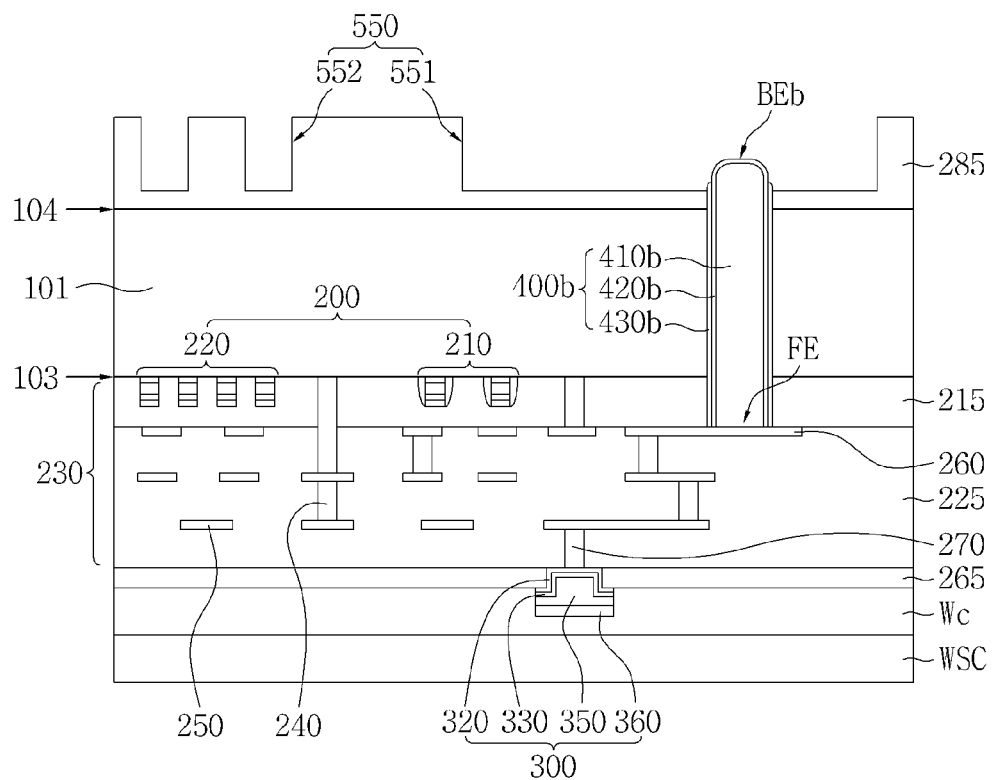
Figure 14C:
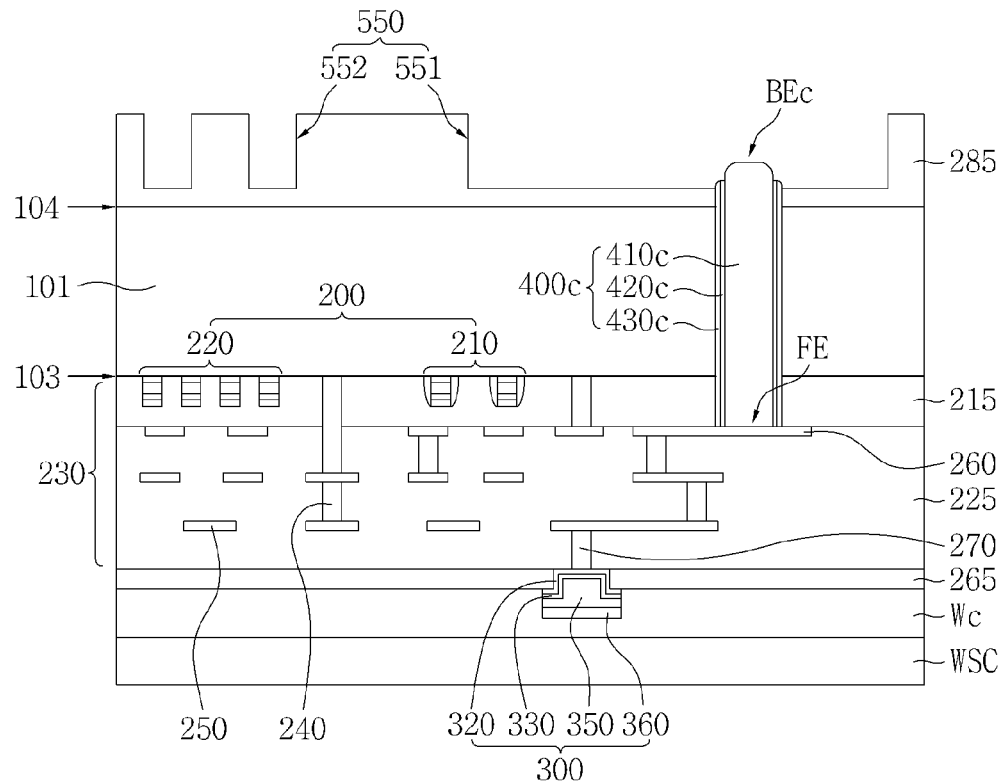
Figure 14D:
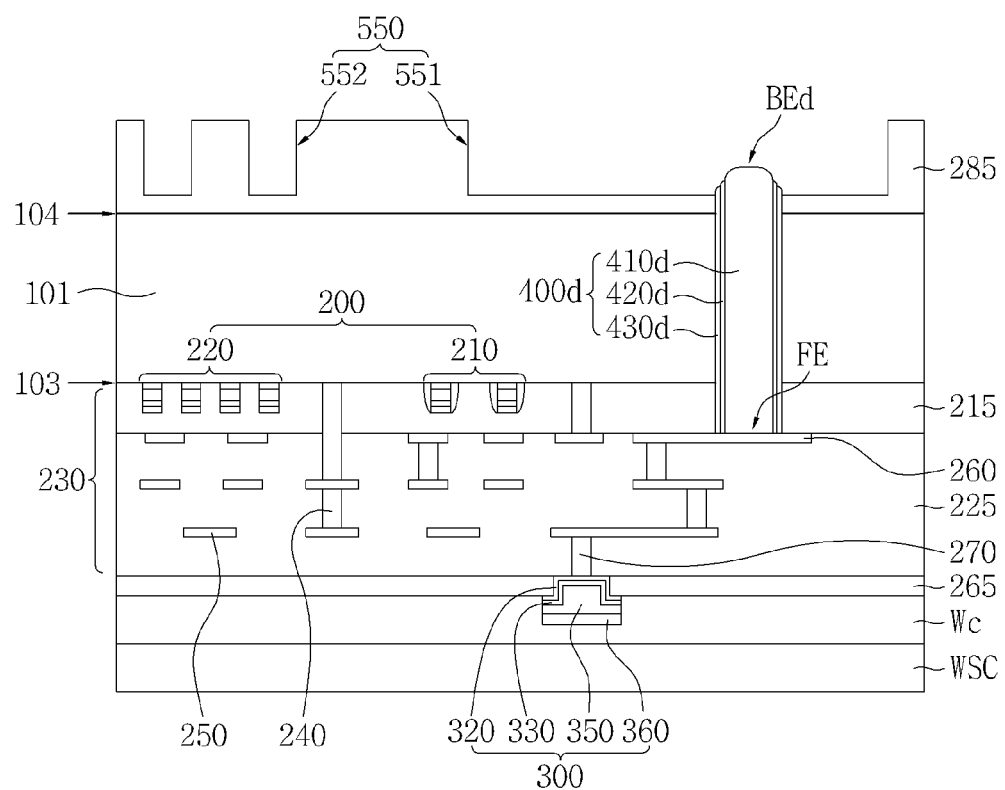
Figure 14E:
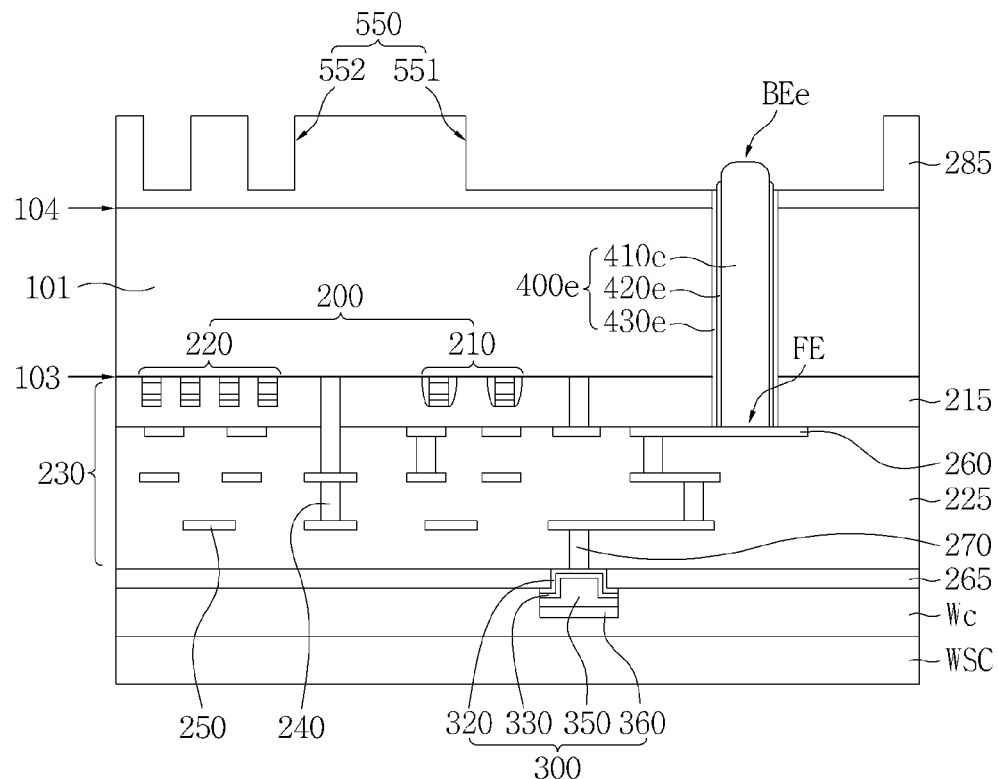
Figure 14F:
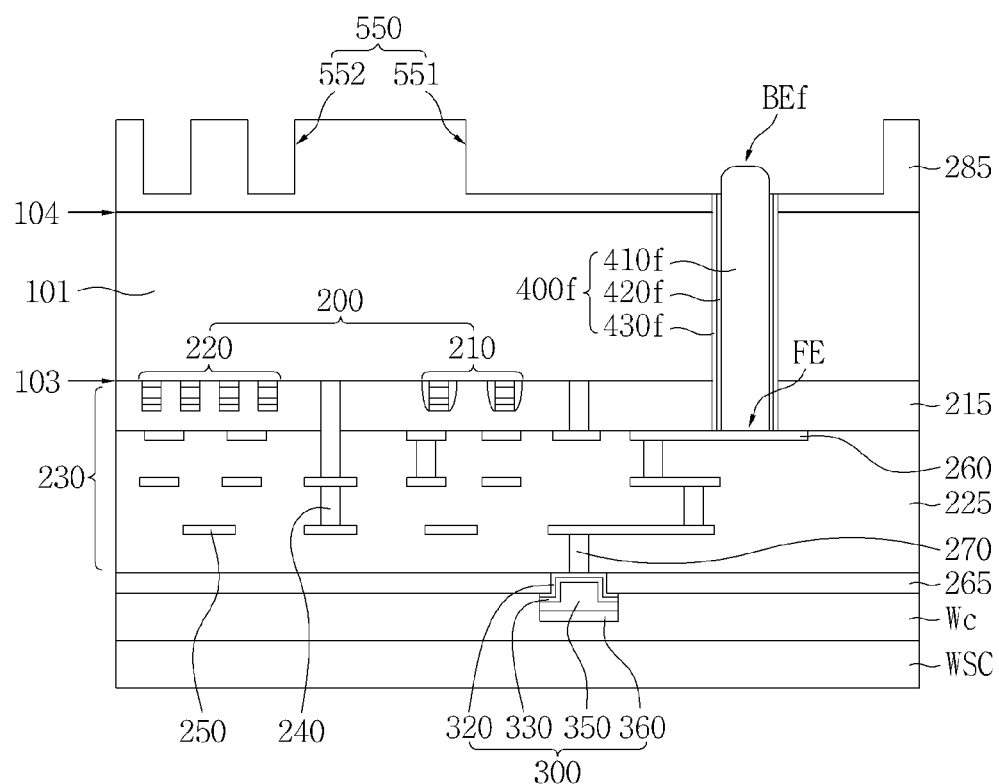
Figure 14G:
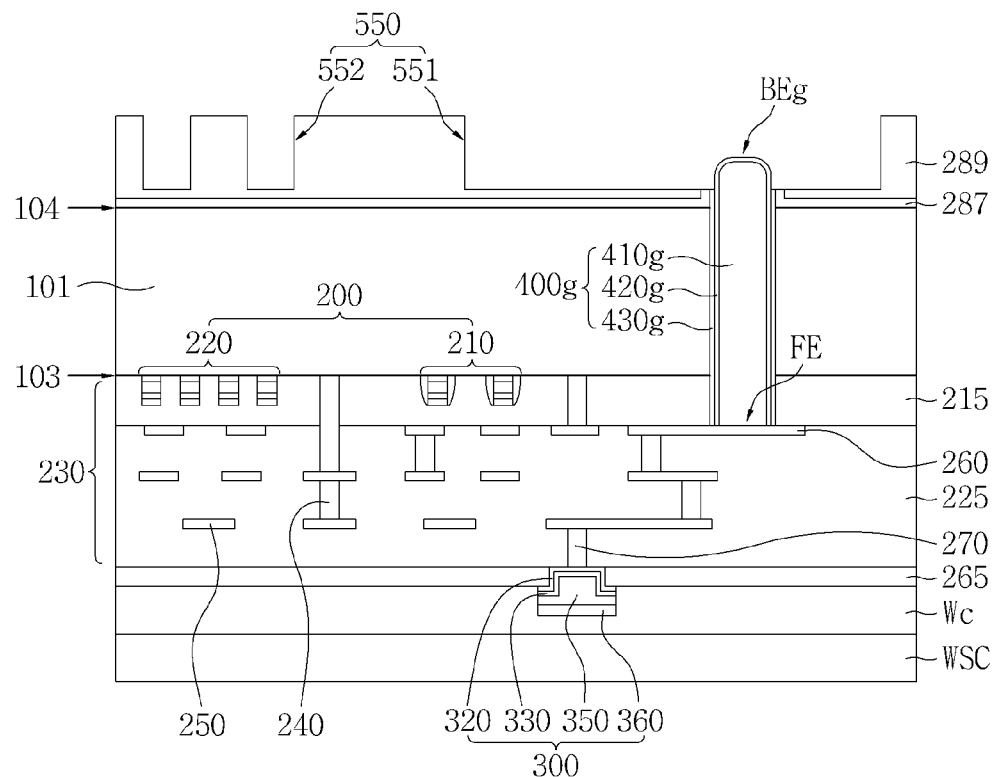
Figure 14H:
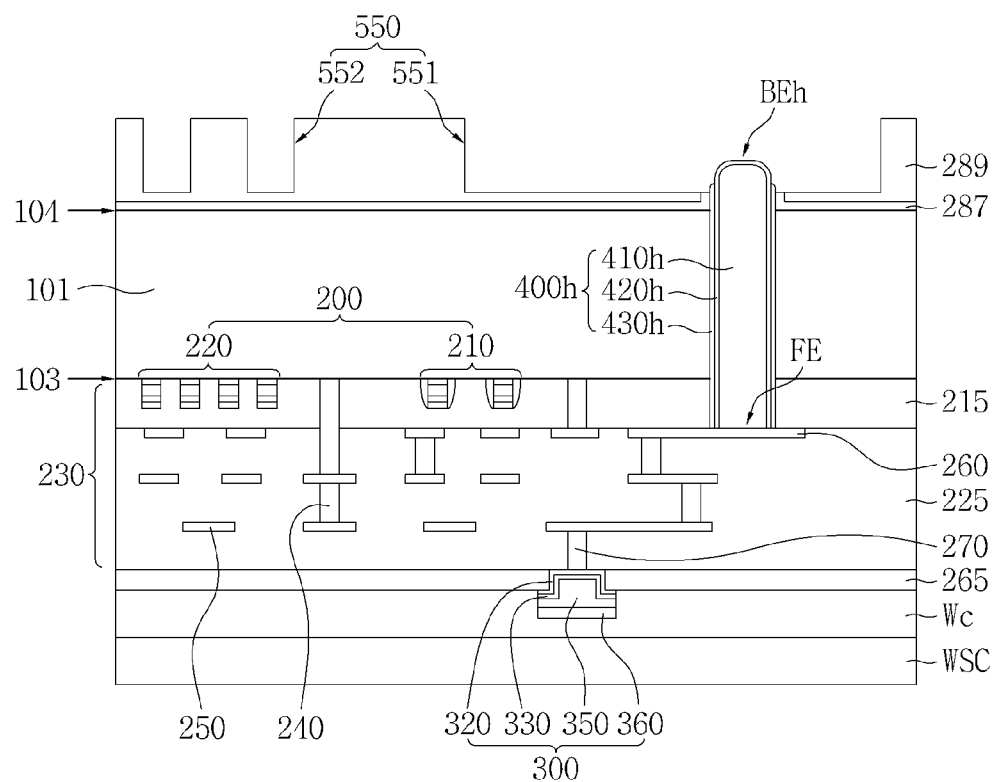
Figure 14I:
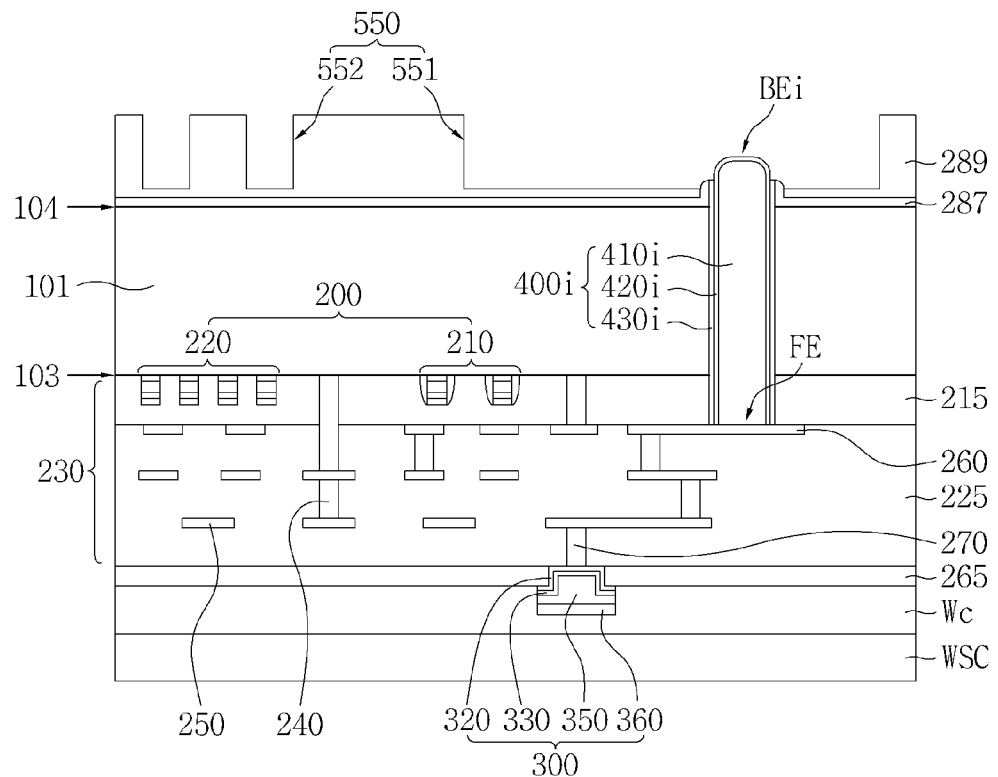
Figure 14J:
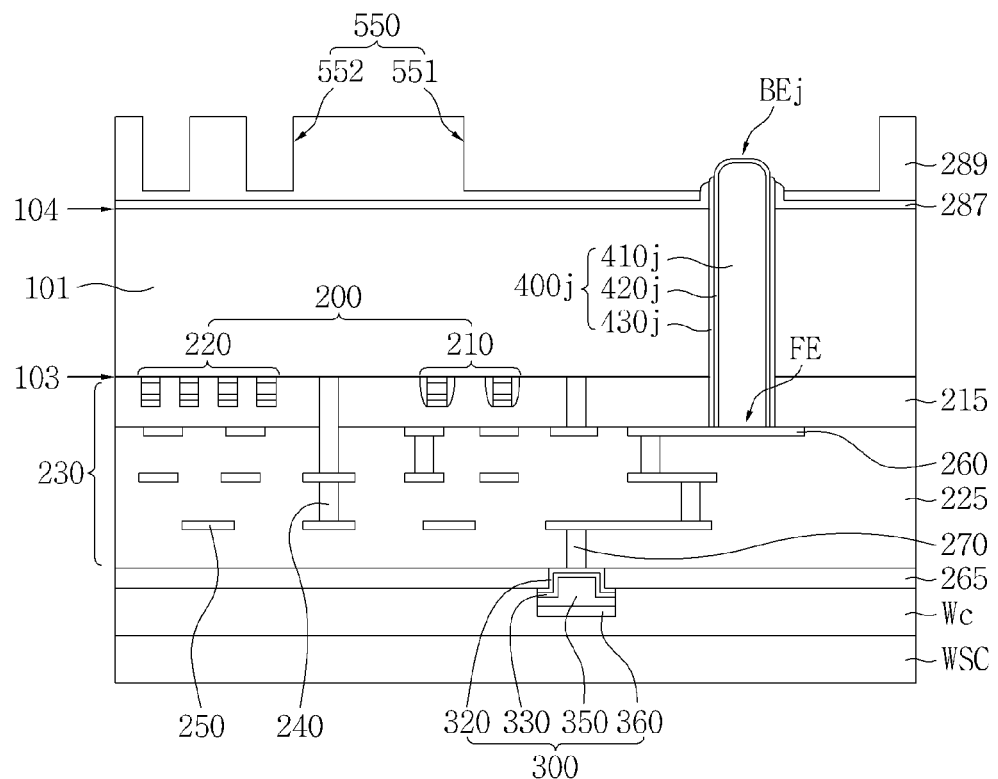
Figure 14K:
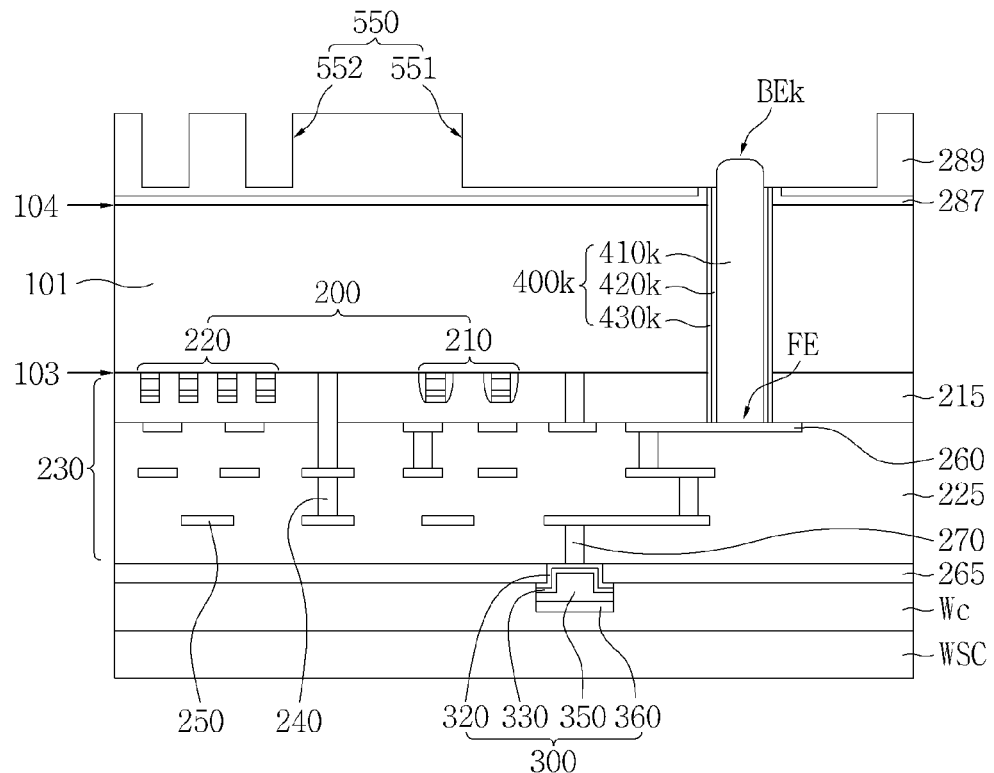
Figure 14L:
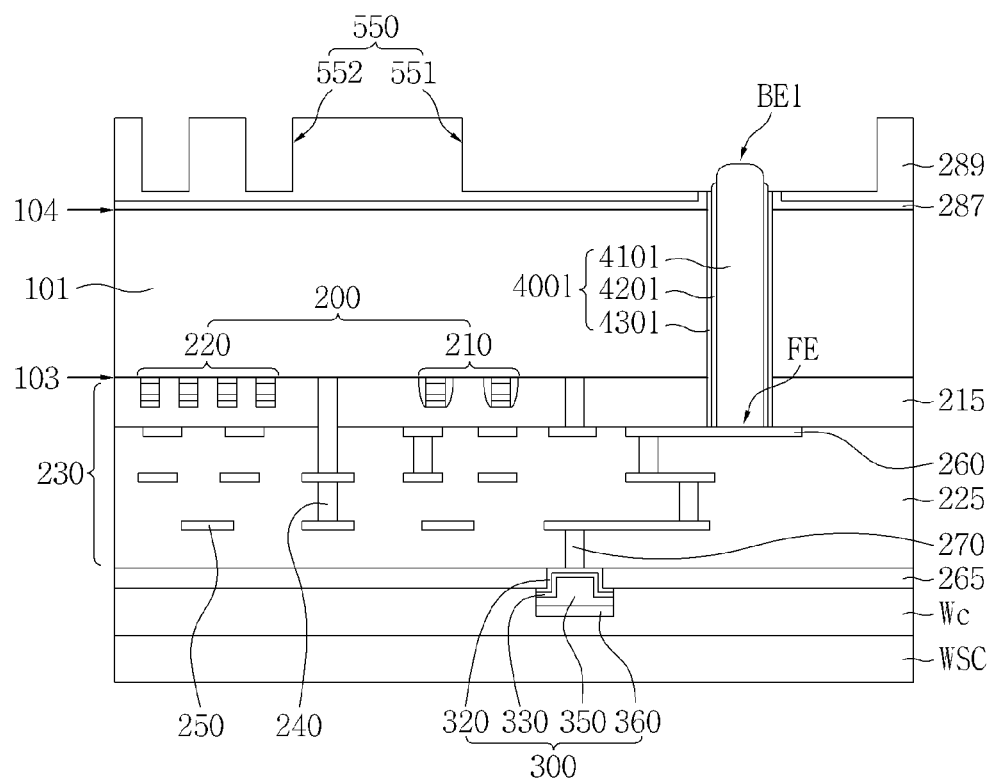
Figure 14M:
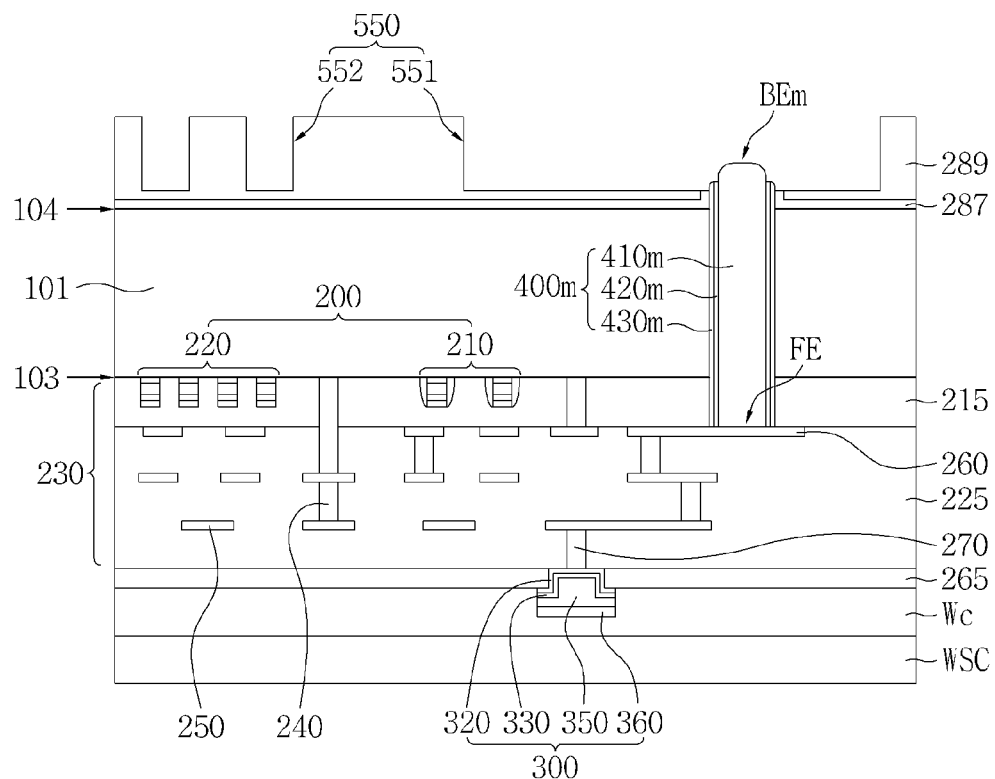
Figure 14N:
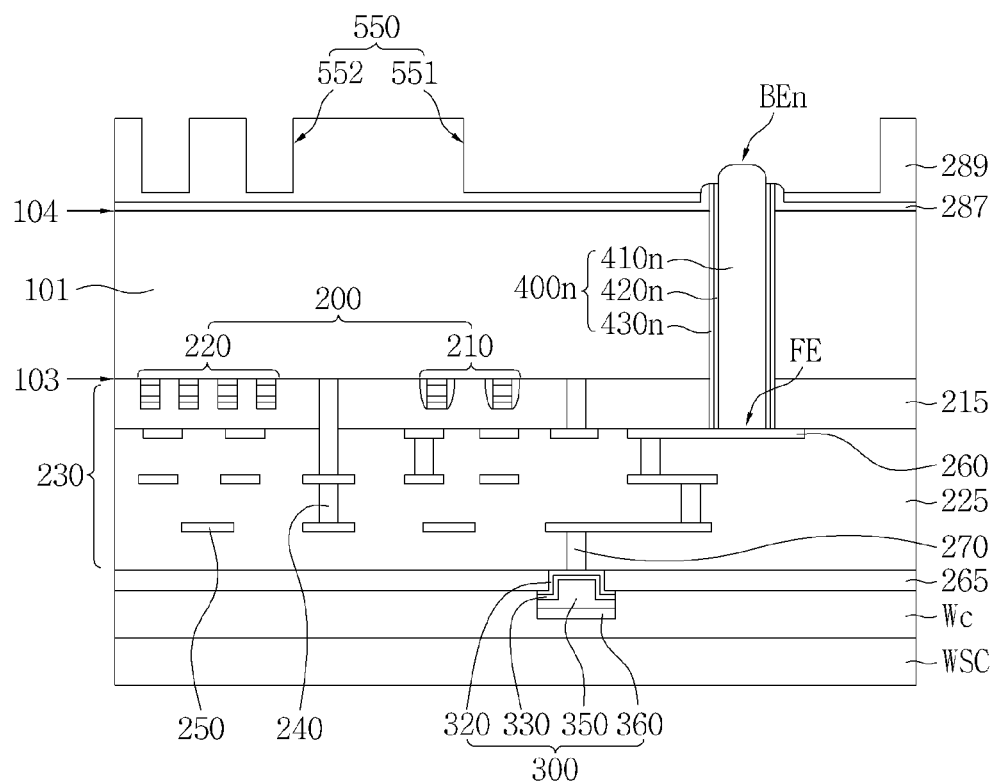
Figure 14O:
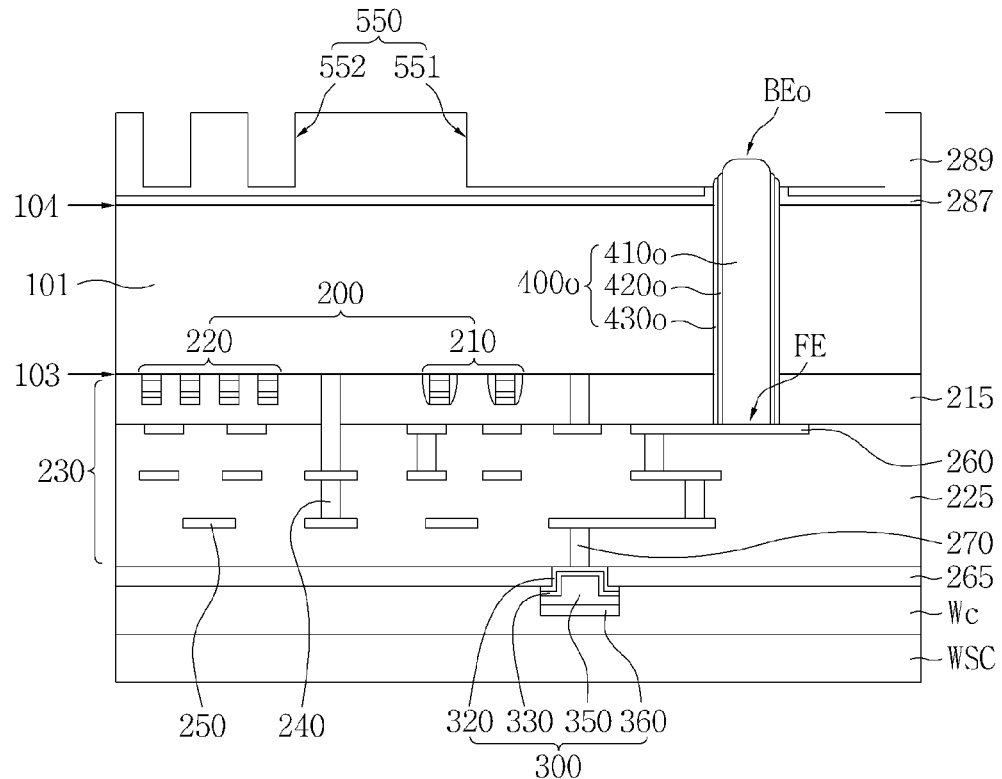
Figure 14P:
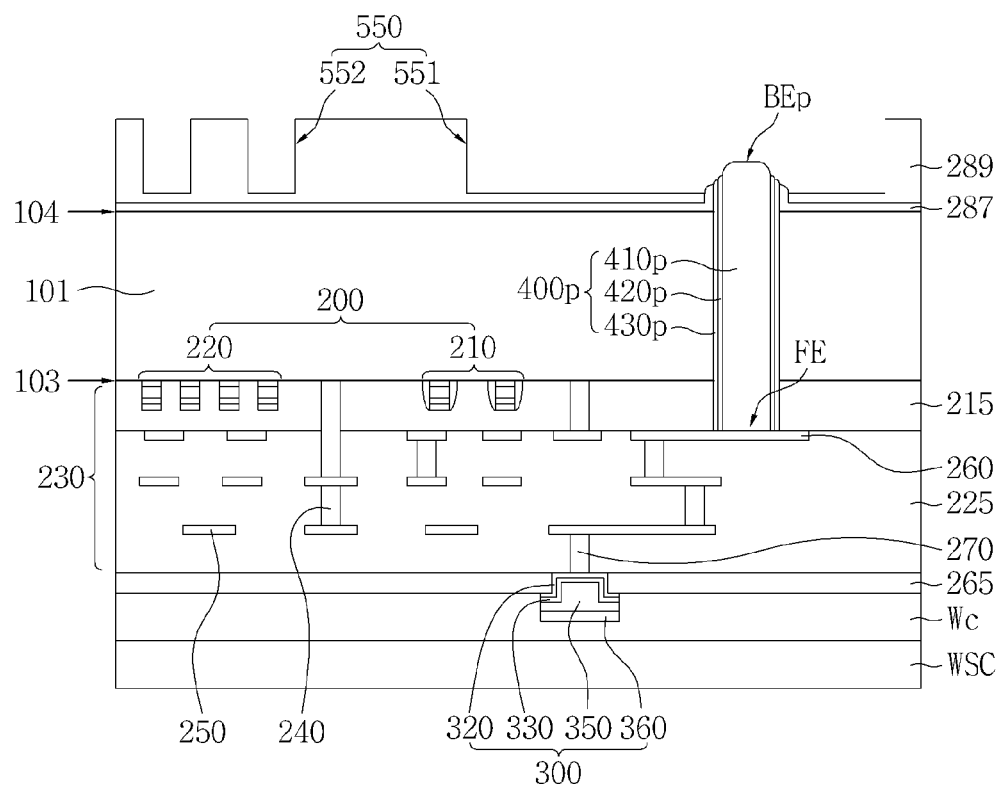
Figure 14Q:
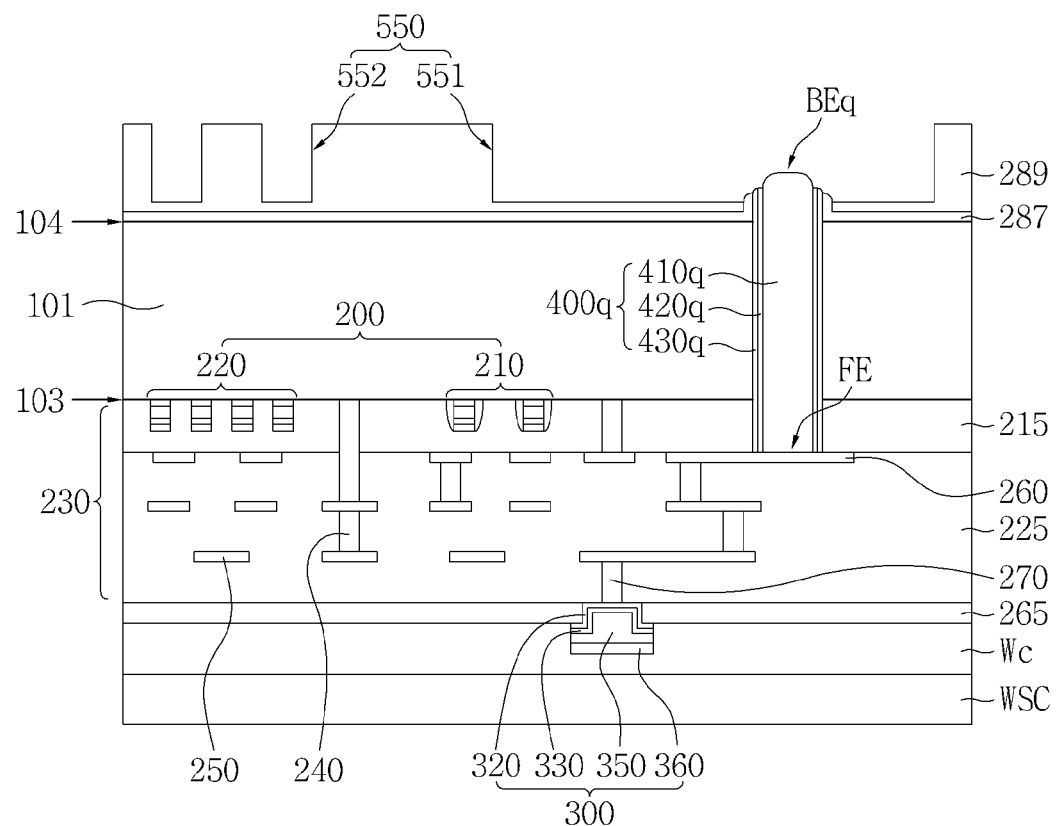

FIGS. 14A through 14Q are conceptual longitudinal cross-sectional views of TSV structures 400*a* to 400*q* having various shapes, which are exposed within redistribution grooves 551, in methods of fabricating semiconductor devices according to various embodiments of the inventive concepts.

Referring to FIG. 14A, a TSV liner 430*a* may be removed from a back-side end BEa of the TSV structure 400*a* protruding into the redistribution groove 551 to expose a TSV barrier layer 420*a*. The TSV barrier layer 420*a* may cover the entire surface of the TSV core 410*a*.

Referring to FIG. 14B, in a back-side end BEb of the TSV structure 400*b* protruding into the redistribution groove 551, a TSV barrier layer 420*b* may expose a surface of a top end of a TSV core 410*b* and partially or wholly cover a side surface of the TSV core 410*b*. The TSV barrier layer 420*b* may cover the entire surface of the TSV core 410*b*.

Referring to FIG. 14C, in a back-side end BEc of the TSV structure 400*c* protruding into the redistribution groove 551, a TSV barrier layer 420*c* may expose a surface of a top end of a TSV core 410*c* and partially or wholly cover a side surface of the TSV core 410*c*, and a TSV liner 430*c* may expose a surface of a top end of the TSV barrier layer 420*c* protruding into the redistribution groove 551 and cover the entire side surface of the TSV barrier layer 420*c*.

Referring to FIG. 14D, in a back-side end BEd of the TSV structure 400*d* protruding into the redistribution groove 551, a TSV barrier layer 420*d* may expose a surface of a top end of a TSV core 410*d* and partially or wholly cover a side surface of the TSV core 410*d*, and a TSV liner 430*d* may expose a surface of a top end of a TSV barrier layer 420*d* protruding into the redistribution groove 551 and partially cover a side surface of the TSV barrier layer 420*d*.

Referring to FIG. 14E, in a back-side end BEe of a TSV structure 400*e* protruding into the redistribution groove 551, a TSV barrier layer 420*e* may expose a surface of a top end of a TSV core 410*e* and partially or wholly cover a side surface of the TSV core 410*e*, and a TSV liner 430*e* may expose a top end and side surface of the TSV barrier layer 420*e* protruding into the redistribution groove 551. For example, a top end of the TSV liner 430*e* may be formed at the same level as or at a similar level to a bottom surface of the redistribution groove 551.

Referring to FIG. 14F, in a back-side end BEf of the TSV structure 400*f* protruding into the redistribution groove 551, a TSV barrier layer 420*f* and a TSV liner 430*f* may be removed to wholly expose a top end and side surface of a TSV core 410*f*.

Referring to FIG. 14G, in a back-side end BEg of a TSV structure 400*g* protruding into the redistribution groove 551, a portion of a top end of a lower back-side insulating layer 287 may be exposed within a redistribution groove 551 of an upper back-side insulating layer 289. A TSV core 410*g* and a TSV barrier layer 420*g* may protrude into the redistribution groove 551. The lower back-side insulating layer 287 may surround the TSV structure 400*g* and in contact with a side surface of a TSV liner 430*g*. The upper back-side insulating layer 289 may be spaced apart from and out of contact with the TSV liner 430*g*. The TSV barrier layer 420*g* may cover top and side surfaces of the protruding TSV core 410*g*. Within the redistribution groove 551, top surfaces of the TSV liner 430*g*, the lower back-side insulating layer 287, and the upper back-side insulating layer 289 may be disposed at the same level or at similar levels.

Referring to FIG. 14H, in a back-side end BEh of the TSV structure 400*h* protruding into the redistribution groove 551, a top end of a TSV liner 430*h* may protrude into the redistribution groove 551.

Referring to FIG. 14I, in a back-side end BEi of the TSV structure 400*i* protruding into the redistribution groove 551, top ends of a TSV liner 430*i* and a lower back-side insulating layer 287 may protrude within the redistribution groove 551. The top ends of the TSV liner 430*i* and the lower back-side insulating layer 287 may be disposed at the same level or at similar levels.

Referring to FIG. 14J, in a back-side end BEj of a TSV structure 400*j* protruding into the redistribution groove 551, top ends of a TSV liner 430*j* and a lower back-side insulating layer 287 may protrude within the redistribution groove 551, and the top end of the TSV liner 430*j* may be disposed at a higher level than the top end of the lower back-side insulating layer 287.

Referring to FIG. 14K, in a back-side end BEk of the TSV structure 400*k* protruding into the redistribution groove 551, a TSV core 410*k* may protrude into the redistribution groove 551, and a TSV barrier layer 420*k* may partially or wholly cover a side surface of the TSV core 410*k*. Top ends of a TSV barrier layer 420*k*, a TSV liner 430*k*, a lower back-side insulating layer 287, and an upper back-side insulating layer 289 may be disposed at the same level or at similar levels.

Referring to FIG. 14L, in a back-side end BEl of a TSV structure 400*l* protruding into the redistribution groove 551, a TSV core 410*k* may protrude into the redistribution groove 551, and a TSV barrier layer 420*k* may partially or wholly a side surface of the TSV core 410*k*. The TSV barrier layer 420*k* may protrude into the redistribution groove 551. Top ends of a TSV liner 430*k*, a lower back-side insulating layer 287, and an upper back-side insulating layer 289 may be disposed at the same level or at similar levels.

Referring to FIG. 14M, in a back-side end BEm of a TSV structure 400*m* protruding into the redistribution groove 551, a TSV core 410*m* may protrude into the redistribution groove 551, and a TSV barrier layer 420*m* may protrude into the redistribution groove 551 and partially or wholly cover a side surface of the TSV core 410*m*. A TSV liner 430*m* may protrude into the redistribution groove 551 and partially or wholly cover a side surface of the TSV barrier layer 420*m*.

Referring to FIG. 14N, in a back-side end BEn of a TSV structure 400*n* protruding into the redistribution groove 551, a TSV core 410*n* may protrude into the redistribution groove 551, and a TSV barrier layer 420*n* may protrude into the redistribution groove 551 and partially or wholly cover a side surface of the TSV core 410*n*. A TSV liner 430*n* may protrude into the redistribution groove 551 and partially or wholly cover a side surface of the TSV barrier layer 420*n*. A portion of a lower back-side insulating layer 287 may protrude within the redistribution groove 551 and partially or wholly cover a side surface of the TSV liner 430*n*.

Referring to FIG. 14O, in a back-side end BEo of the TSV structure 400*o* protruding into the redistribution groove 551, a TSV core 410*o* may protrude into the redistribution groove 551, and a TSV barrier layer 420*o* may protrude into the redistribution groove 551 and partially or wholly cover a side surface of the TSV core 410*o*. A TSV liner 430*o* may protrude into the redistribution groove 551 and partially or wholly cover a side surface of the TSV barrier layer 420*o*. A top surface of a lower back-side insulating layer 287 may be disposed at the same level as or at a similar level to a surface of an upper back-side insulating layer 289.

Referring to FIG. 14P, in a back-side end BEp of a TSV structure 400p protruding into a redistribution groove 551, a TSV core 410p may protrude into the redistribution groove 551, and a TSV barrier layer 420p may protrude into the redistribution groove 551 and partially or wholly cover a side surface of the TSV core 410p. A TSV liner 430p may protrude into the redistribution groove 551 and partially or wholly cover a side surface of the TSV barrier layer 420p. A portion of the lower back-side insulating layer 287 may protrude within the redistribution groove 551 and partially or wholly cover a side surface of the TSV liner 430p.

Referring to FIG. 14Q, in a back-side end BEq of a TSV structure 400q protruding into the redistribution groove 551, a TSV core 410q may protrude into the redistribution groove 551, and a TSV barrier layer 420q may protrude into the redistribution groove 551 and partially or wholly cover a side surface of the TSV core 410q. A TSV liner 430q may protrude into the redistribution groove 551 and partially or wholly cover a side surface of the TSV barrier layer 420q. Top ends of the TSV barrier layer 420q and the TSV liner 430q may be disposed at the same level or at similar levels. A portion of a lower back-side insulating layer 287 may protrude within the redistribution groove 551 and partially or wholly cover a side surface of the TSV liner 430q.

FIGS. 15A through 15M are longitudinal cross-sectional views illustrating a method of fabricating a semiconductor device according to another embodiment of the inventive concepts.

Figure 15A:
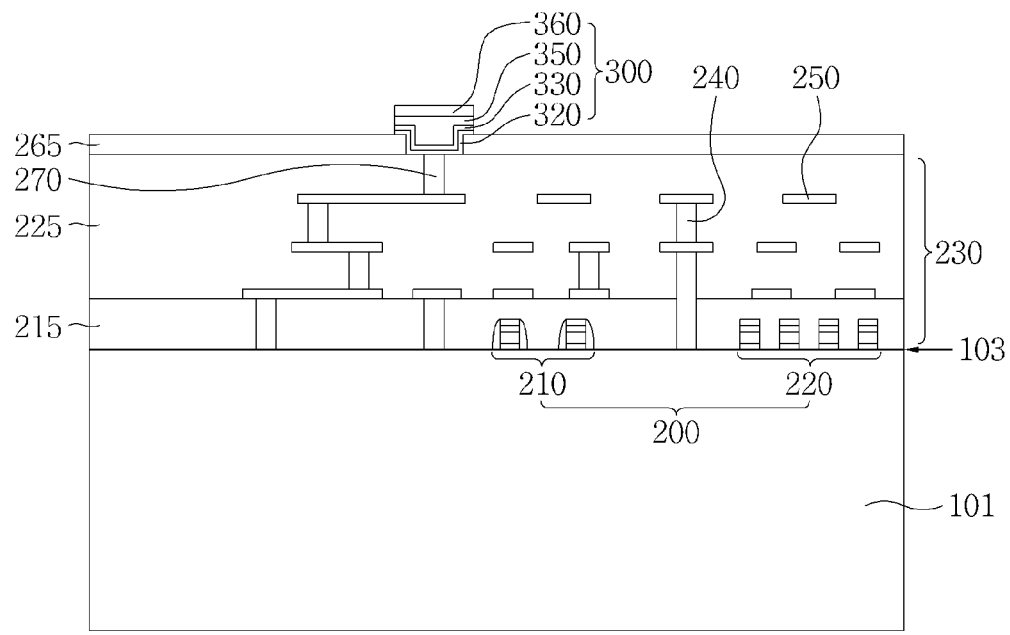
FIGS. 15A through 15M are longitudinal cross-sectional views illustrating a method of fabricating a semiconductor device according to another embodiment of the inventive concepts.

Referring to FIGS. 9G and 15A, a method of fabricating a semiconductor device according to an embodiment of the inventive concepts may include forming internal circuits 230 and a front-side I/O pad 300 on a substrate 101 (operation S302). During this process, a TSV pad 260 may be formed.

Figure 15B:
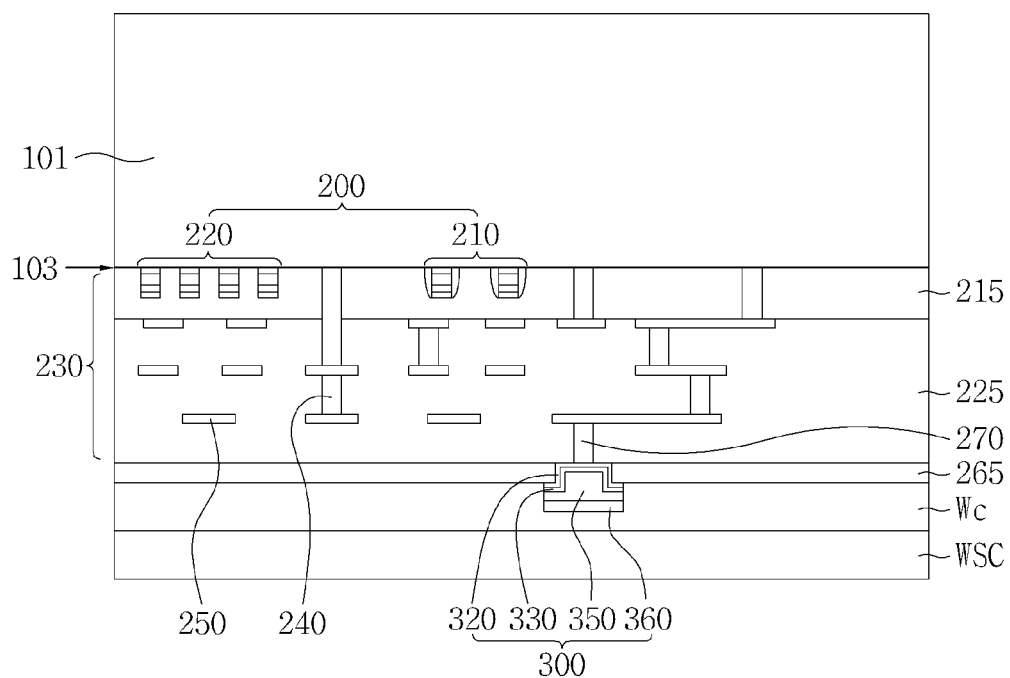

Referring to FIGS. 9G and 15B, the method of fabricating the semiconductor device according to the present embodiment of the inventive concepts may include turning the substrate 101 upside down and mounting the substrate 101 on a wafer support carrier WSC (operation S304).

Figure 15C:
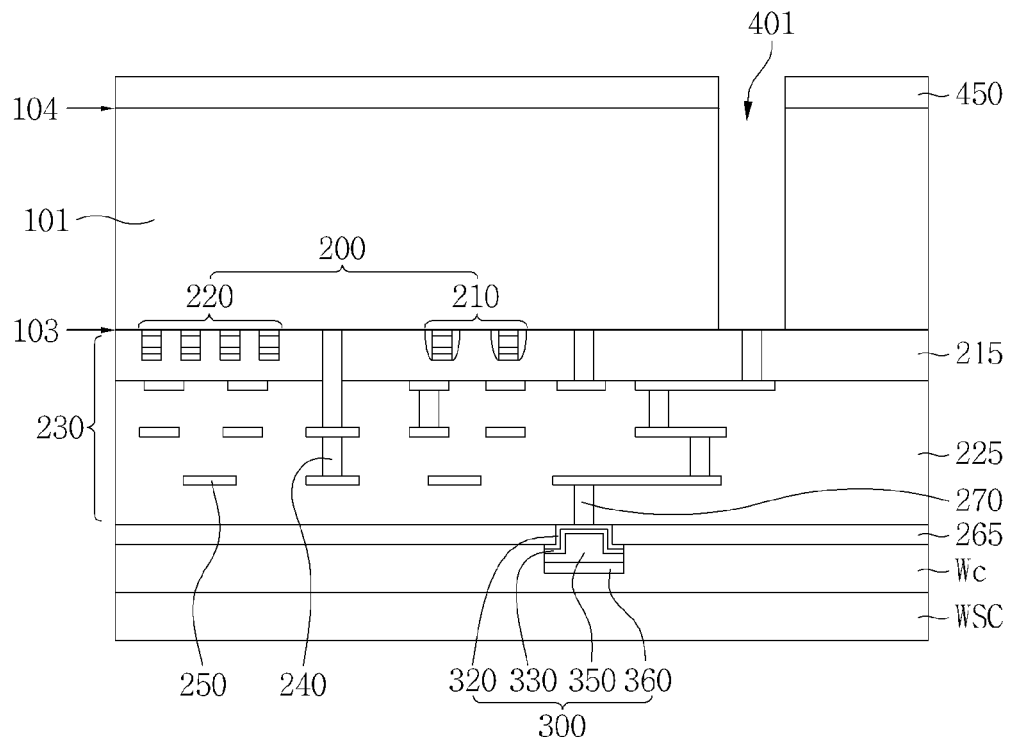

Referring to FIGS. 9G and 15C, the method of fabricating the semiconductor device according to the present embodiment of the inventive concepts may include forming a TSV hole 401 in a substrate 101 (operation S306). The formation of the TSV hole 401 may include forming a TSV hole mask pattern 450 on a back side 104 of the substrate 101 and etching the substrate 101 using the TSV hole mask pattern 450 as an etch mask. The TSV hole mask pattern 450 may include silicon oxide or silicon nitride. The TSV hole mask pattern 450 may be formed as a single-layered or multilayered type. For instance, a silicon oxide layer may be formed on the substrate 101, and a silicon nitride layer may be formed on the silicon oxide layer. In the present embodiment, it is conceptually assumed that the TSV hole mask pattern 450 is a single material layer. Afterwards, the TSV hole mask pattern 450 may be removed. The present embodiment describes an exemplary case where the TSV hole mask pattern 450 is not removed but remains. Before forming the TSV hole 401, a process of blanketly removing the back side 104 of the substrate 101 to thin out the substrate 101 may be performed.

Figure 15D:
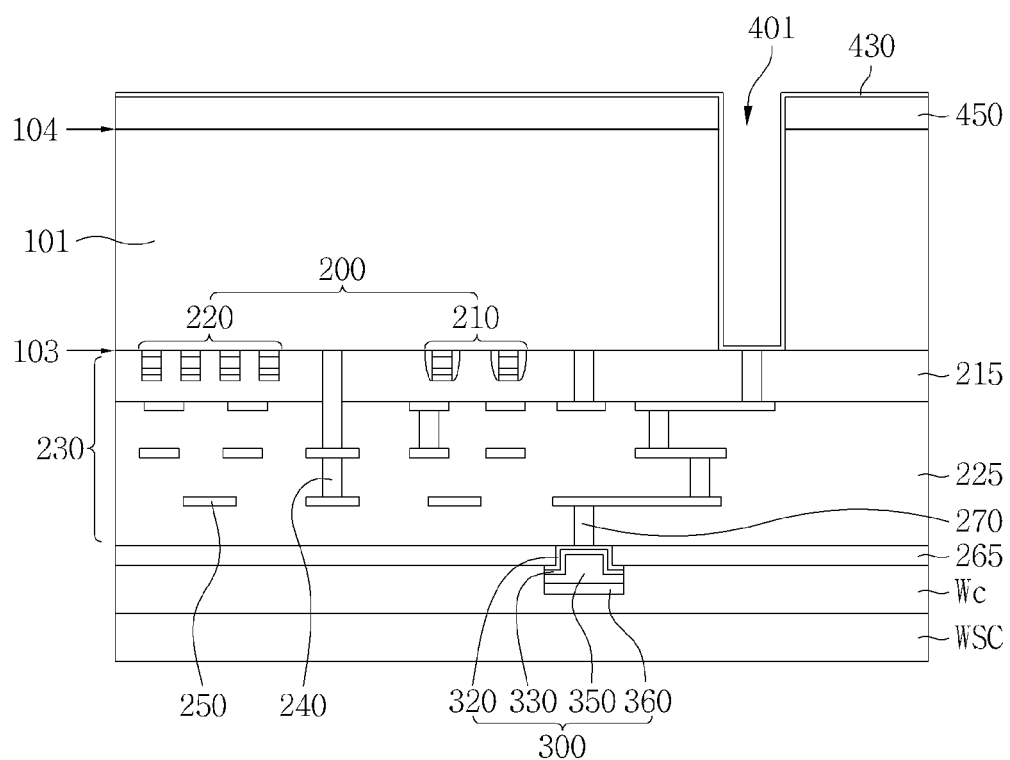

Referring to FIGS. 9G and 15D, the method of fabricating the semiconductor device according to the present embodiment of the inventive concepts may include conformally forming a TSV liner 430 on inner walls and a bottom of the TSV hole 401 (operation S308).

Figure 15E:
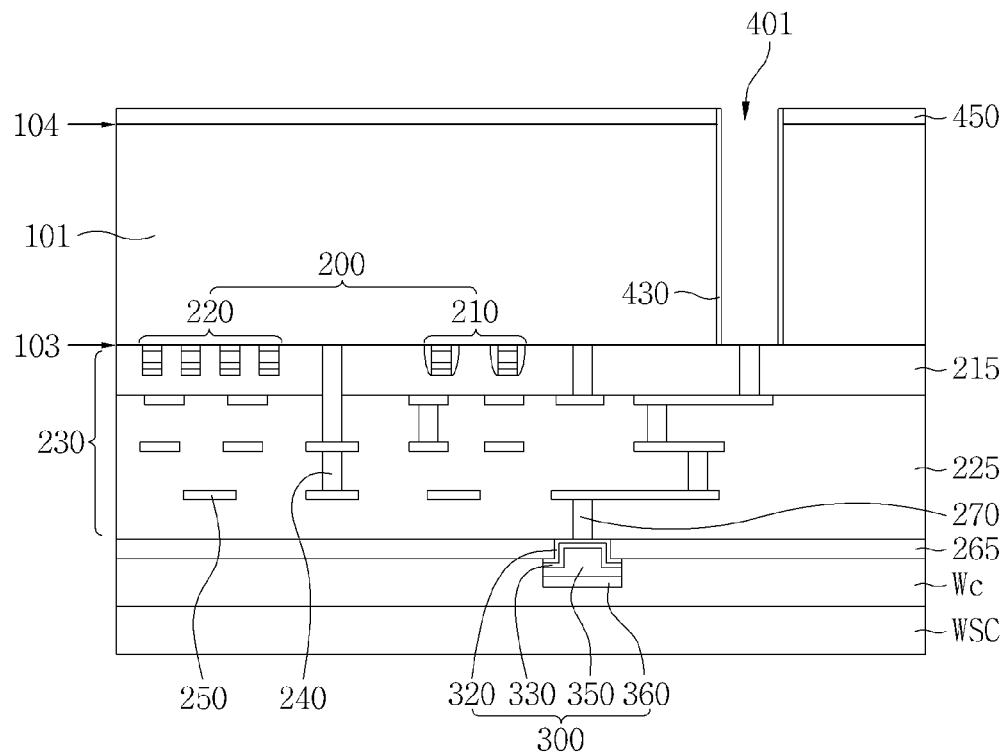

Referring to FIGS. 9G and 15E, the method of fabricating the semiconductor device according to the present embodiment of the inventive concepts may include removing the TSV liner 430 formed on inner walls of the TSV hole 401 (operation S310). During this process, the TSV hole mask pattern 450 may be thinned out or removed. The present embodiment describes an exemplary case where the TSV hole mask pattern 450 is thinned out.

Figure 15F:
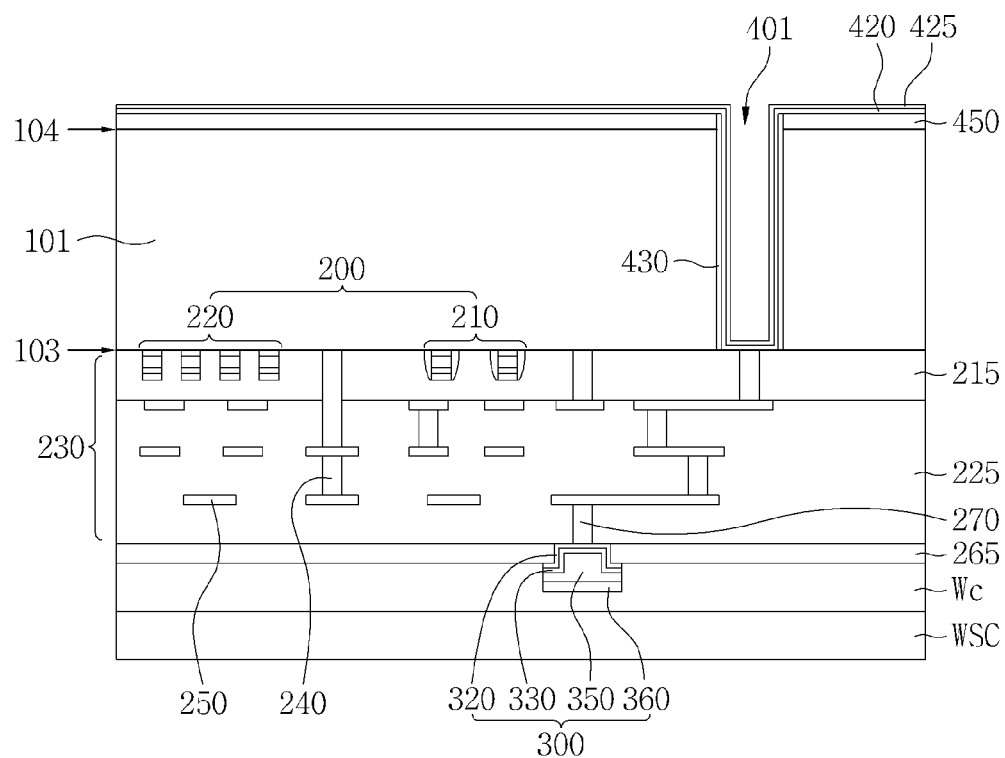

Referring to FIGS. 9G and 15F, the method of fabricating the semiconductor device according to the present embodiment of the inventive concepts may include conformally forming a TSV barrier layer 420 and a TSV seed layer 425 on a TSV liner 430 (operation S312).

Figure 15G:
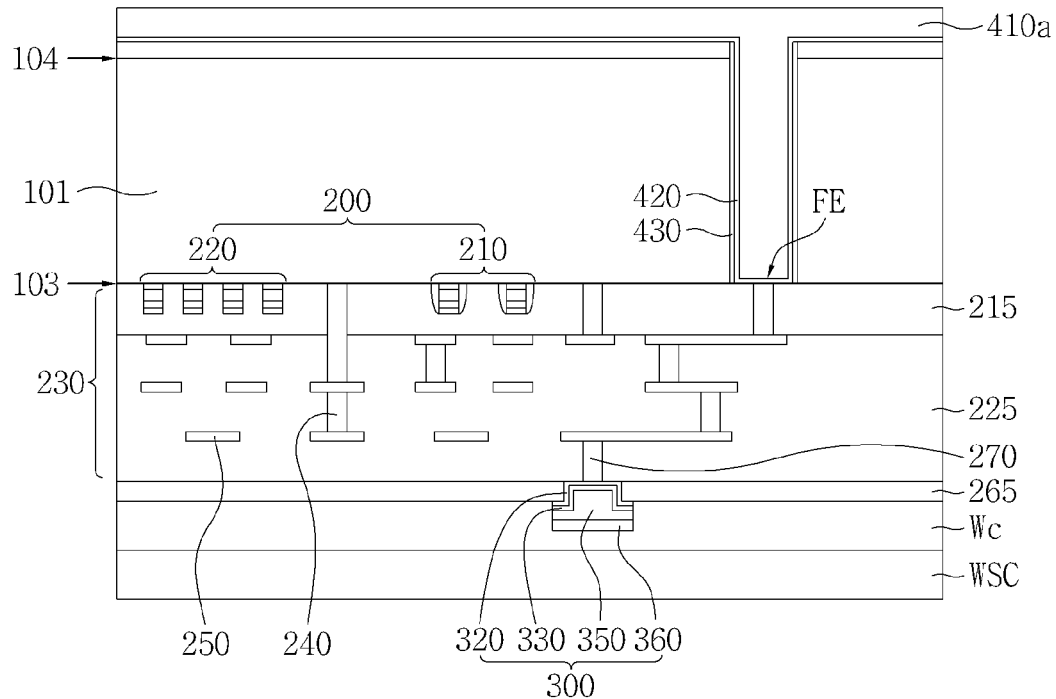

Referring to FIGS. 9G and 15G, the method of fabricating the semiconductor device according to the present embodiment of the inventive concepts may include forming a TSV core material layer 510a to fill the TSV hole 401 (operation S314).

Figure 15H:
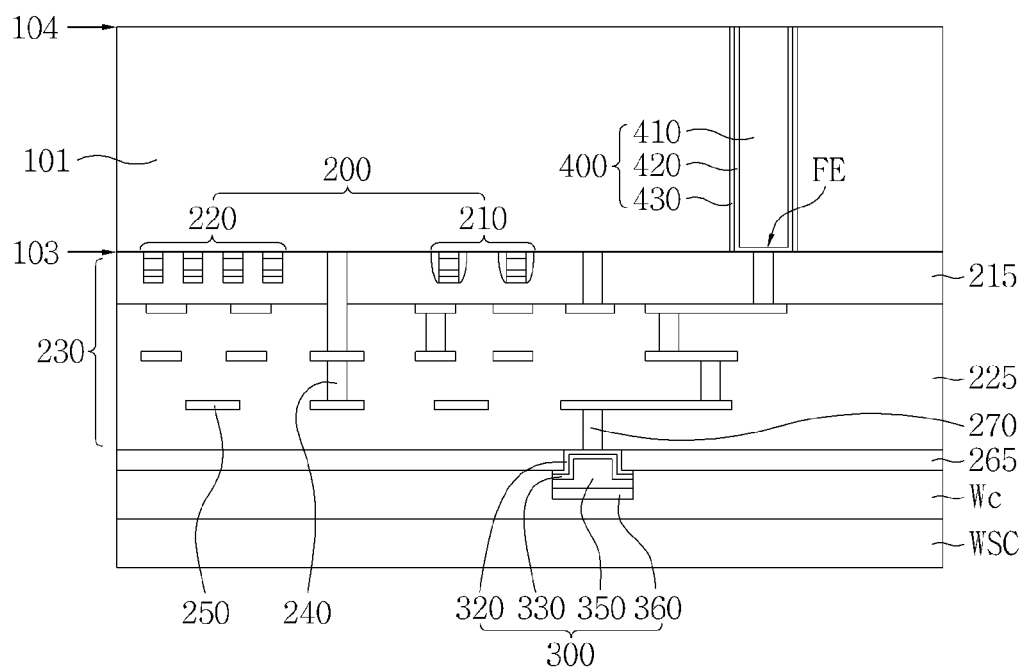
Figure 15I:
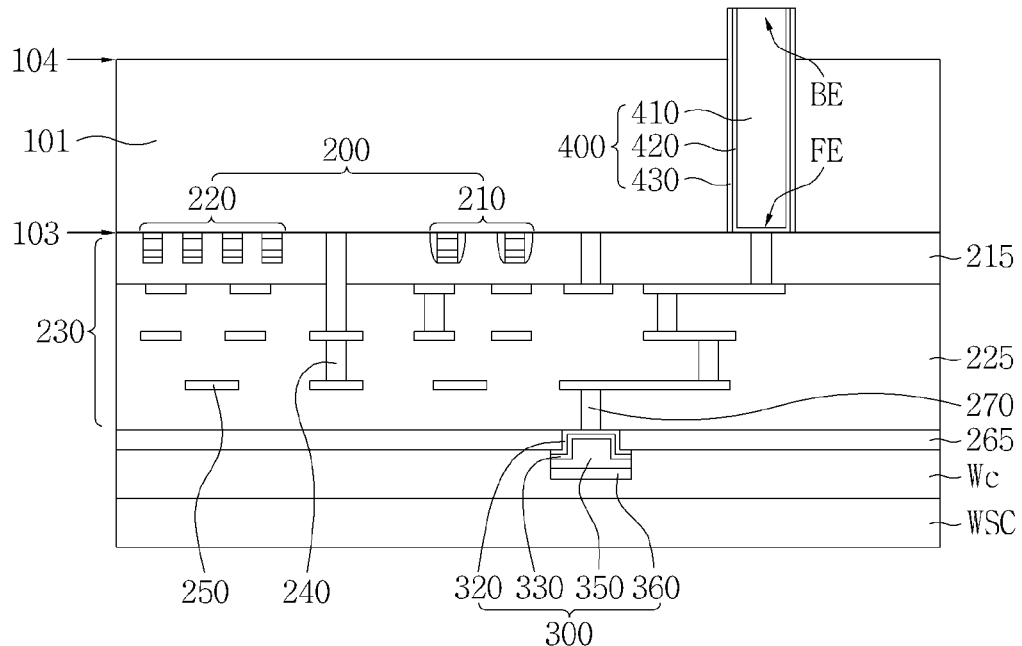

Referring to FIGS. 9G and 15H, the method of fabricating the semiconductor device according to the present embodiment of the inventive concepts may include forming a TSV structure 400 (operation S316). The formation of the TSV structure 400 may include removing the TSV core material layer 510a, the TSV seed layer 425, the TSV barrier layer 420, the TSV liner 430, and/or the TSV hole mask pattern 450, which are formed on the back side 104 of the substrate 101, using a CMP process and/or an etchback process Referring to FIGS. 9G and 15I, the method of fabricating the semiconductor device according to the embodiment of the inventive concepts may include blanketly and/or selectively the back side 104 of the substrate 101 to expose a portion of the TSV structure 400 (operation S318). During this process, the exposed TSV liner 430 may be removed. The TSV barrier layer 420 may be exposed on a top surface of the TSV structure 400.

Figure 15J:
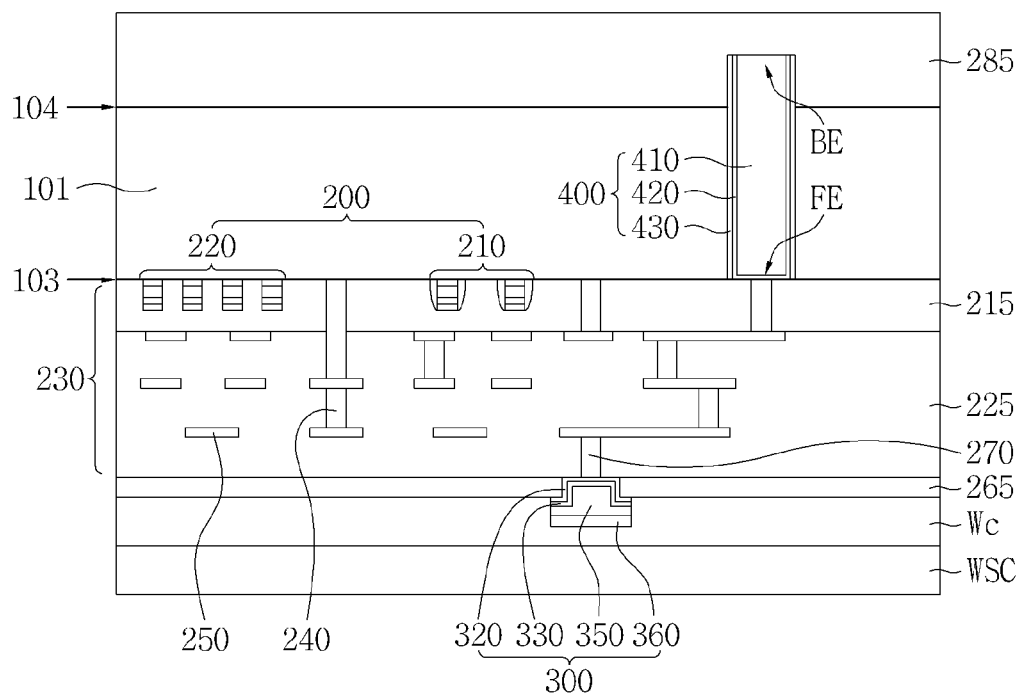

Referring to FIGS. 9G and 15J, the method of fabricating the semiconductor device according to the present embodiment of the inventive concepts may include forming a back-side insulating layer 285 to cover the exposed TSV structure 400 (operation S320). For instance, silicon oxide may be interposed between the substrate 101 and the back-side insulating layer 285.

Figure 15K:
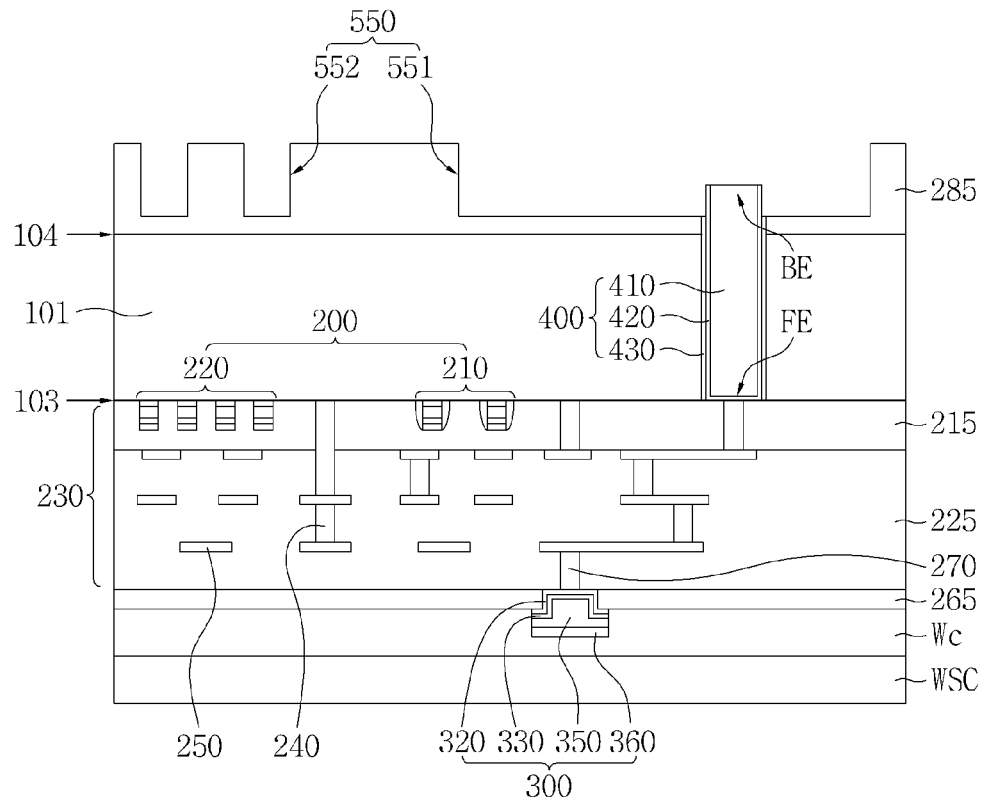

Referring to FIGS. 9G and 15K, the method of fabricating the semiconductor device according to the present embodiment of the inventive concepts may include forming a groove 550 in the back-side insulating layer 285 (operation S322).

Figure 15L:
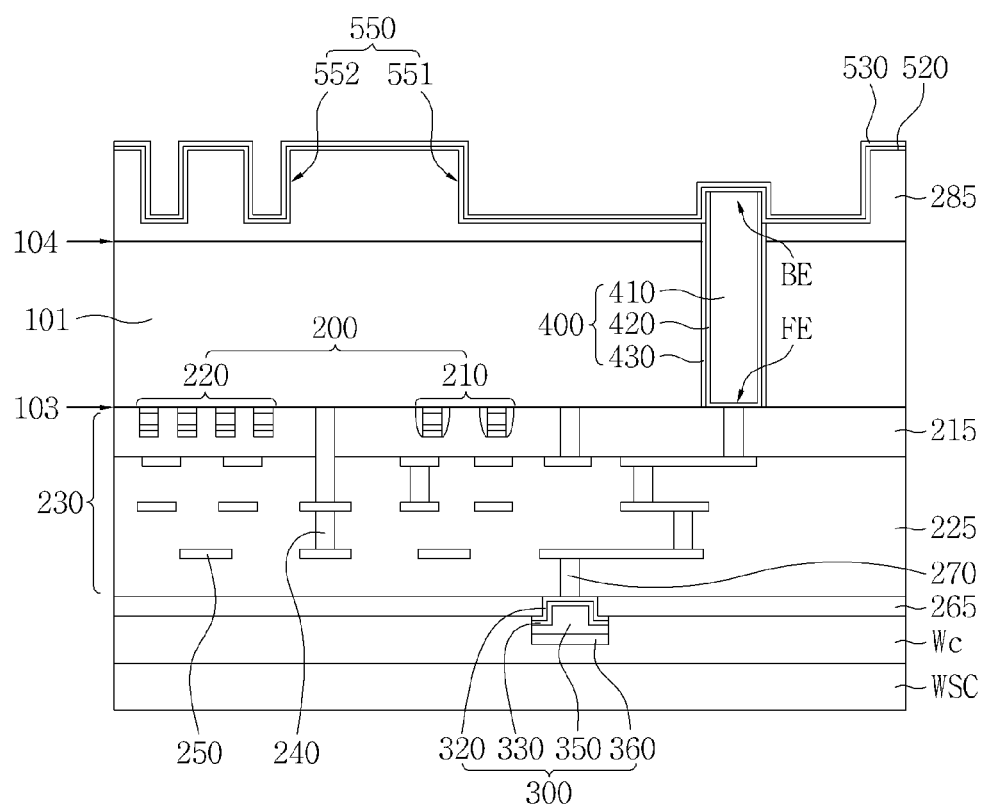

Referring to FIGS. 9G and 15L, the method of fabricating the semiconductor device according to the present embodiment of the inventive concepts may include forming a redistribution barrier layer 520 and a redistribution seed layer 530 within a redistribution groove 551 (operation S324). The redistribution barrier layer 520 and the redistribution seed layer 530 may be conformally formed on a bottom surface and inner wall of the redistribution groove 551 and the exposed TSV structure 400.

Figure 15M:
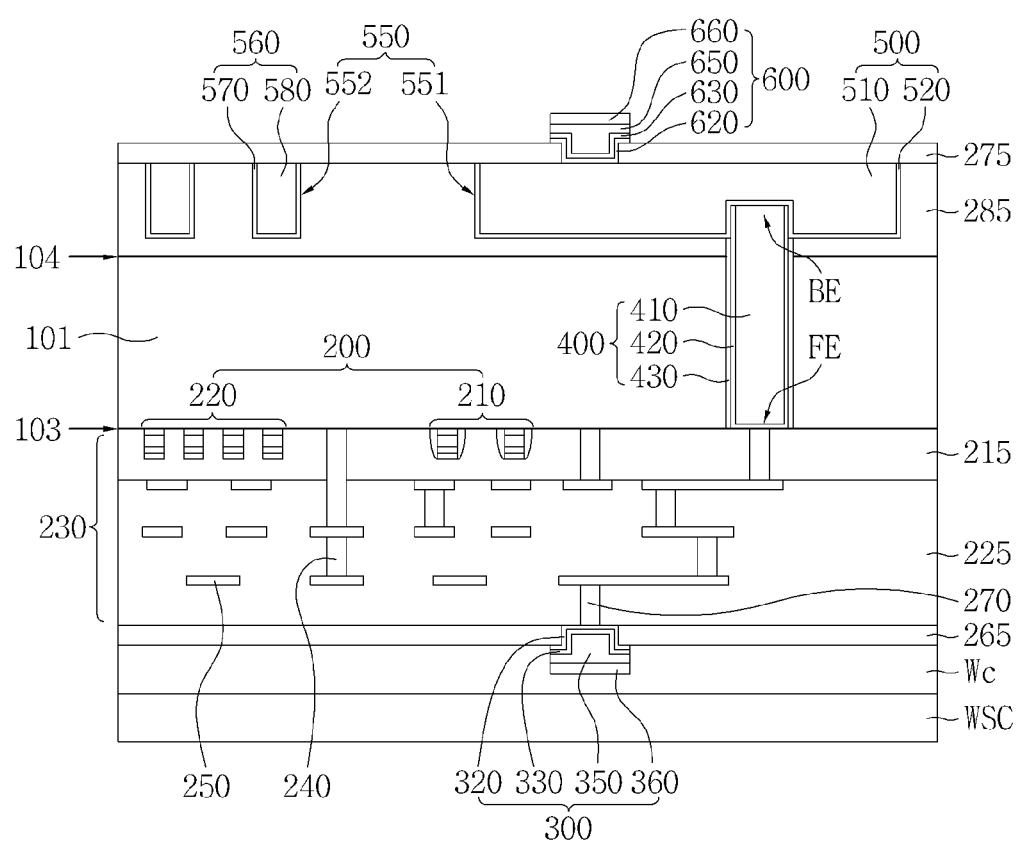

Referring to FIGS. 9H and 15M, the method of fabricating the semiconductor device according to the present embodiment of the inventive concepts may include forming a redistribution interconnection material layer 510a by performing the processes described with reference to FIGS. 10R through 10X (operation S326), forming a redistribution structure 500 (operation S328), forming a back-side passivation layer 275 having a lower back-side I/O pad opening 611 partially exposing a surface of a redistribution interconnection 510 (operation S330), forming a back-side I/O pad barrier layer 620 and a back-side I/O pad seed layer 630 within the lower back-side I/O pad opening 611 and/or on the back-side passivation layer 275 (operation S332), forming a back-side I/O pad mask pattern 640 on the back-side I/O pad barrier layer 620 and the back-side I/O pad seed layer 630 (operation S334), forming a preliminary back-side I/O pad 600p (operation S336), and forming a back-side I/O pad 600 (operation S338). For example, the semiconductor device 100I shown in FIG. 8I may be formed.

FIGS. 16A through 16K are longitudinal cross-sectional views illustrating a method of fabricating a semiconductor device according to another embodiment of the inventive concepts.

Figure 16A:
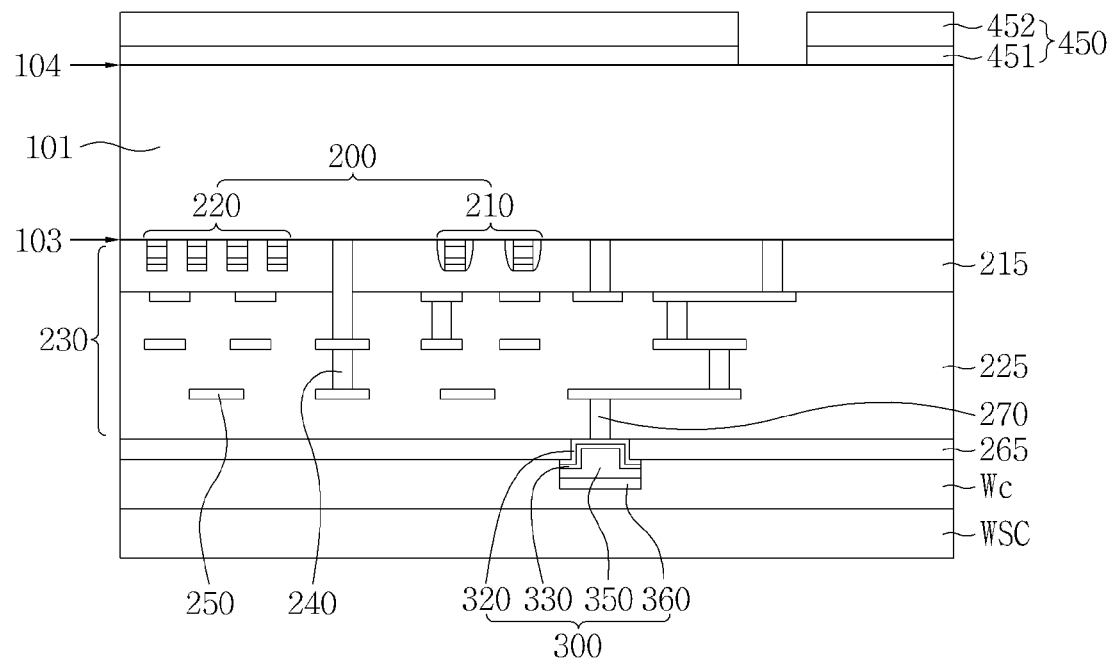
FIGS. 16A through 16K are longitudinal cross-sectional views illustrating a method of fabricating a semiconductor device according to another embodiment of the inventive concepts.

Referring to FIG. 16A and referring further to FIGS. 9G, 15A, and 15B, the method of fabricating the semiconductor device according to the embodiment of the inventive concepts may include forming internal circuits 230 and a front-side I/O pad 300 on a substrate 101 (operation S302), turning the substrate 101 upside down and mounting the substrate 101 on a wafer support carrier WSC (operation S304), and forming a TSV hole mask pattern 450 on a back side 104 of the substrate 101 (operation S306). The TSV hole mask pattern 450 may be formed as a multilayered type. For example, the TSV hole mask pattern 450 may include a lower TSV hole mask pattern 451 including silicon oxide and an upper TSV hole mask pattern 452 including silicon nitride.

Figure 16B:
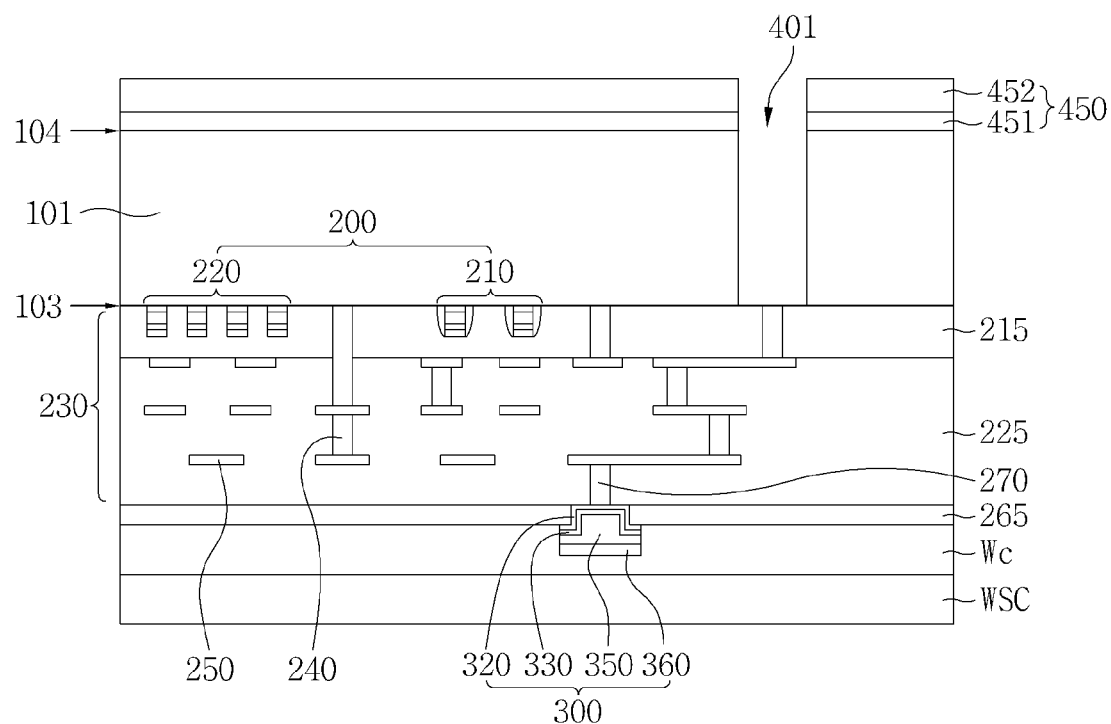

Referring to FIGS. 9I and 16B, the method of fabricating the semiconductor device according to the present embodiment of the inventive concepts may include forming a TSV hole 401 (operation S408).

Figure 16C:
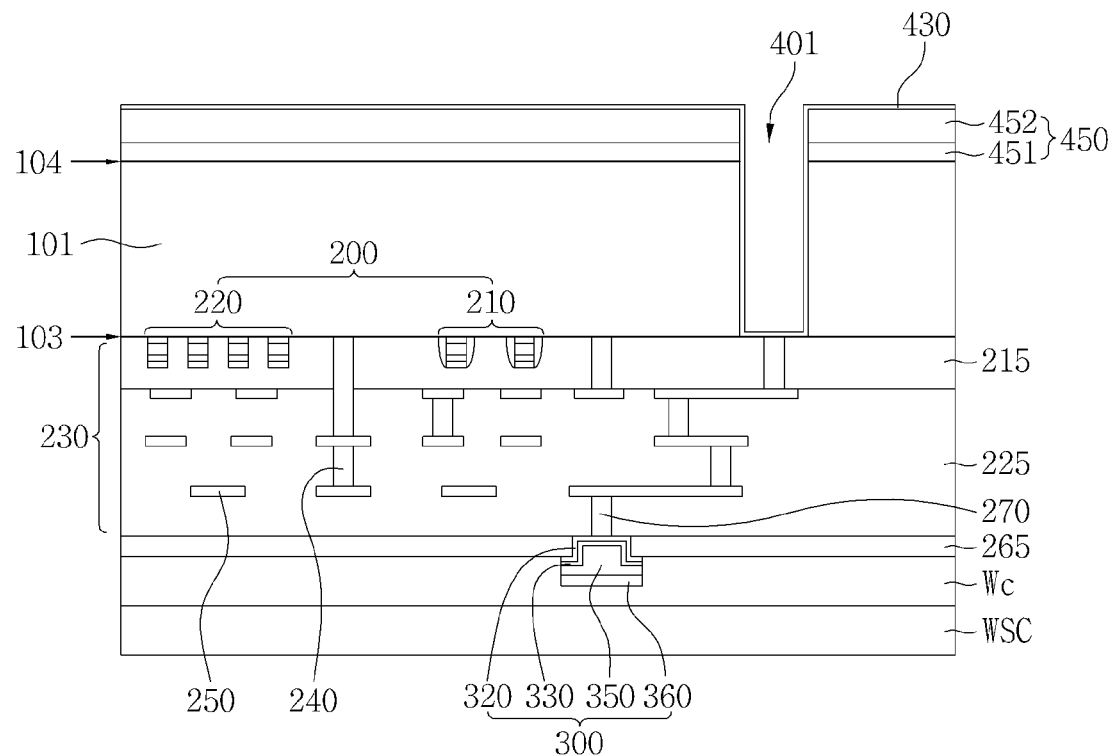

Referring to FIGS. 9I and 16C, the method of fabricating the semiconductor device according to the present embodiment of the inventive concepts may include conformally forming a TSV liner 430 on an inner wall of the TSV hole 401 (operation S410).

Figure 16D:
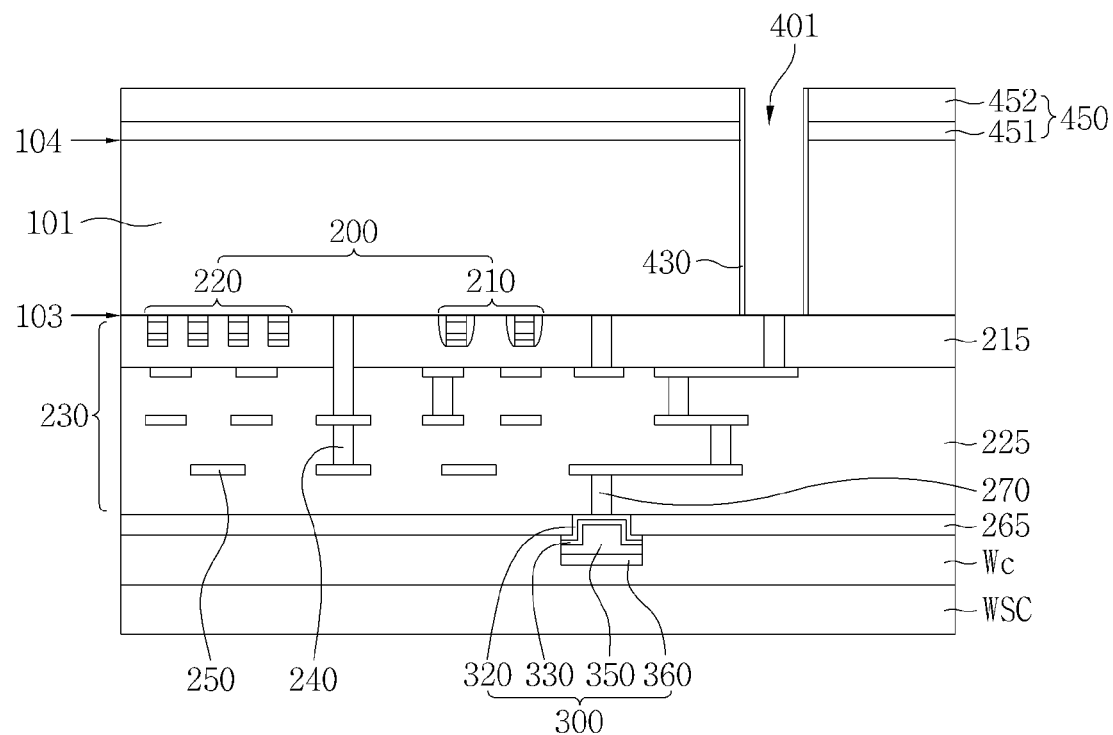

Referring to FIGS. 9I and 16D, the method of fabricating the semiconductor device according to the present embodiment of the inventive concepts may include partially removing the TSV liner 430 disposed on a bottom surface of the TSV hole 401 (operation S412). During this process, the TSV liner 430 formed on the TSV hole mask pattern 450 may also be removed.

Figure 16E:
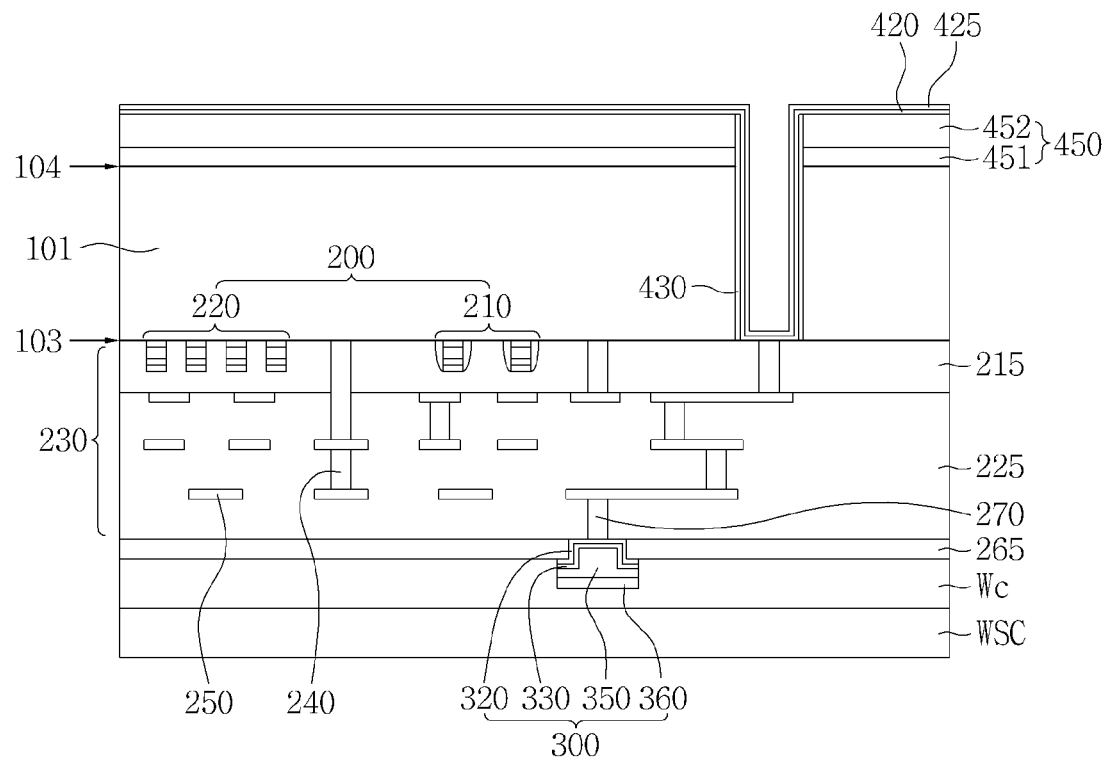

Referring to FIGS. 9I and 16E, the method of fabricating the semiconductor device according to the present embodiment of the inventive concepts may include conformally forming a TSV barrier layer 420 and a TSV seed layer 425 on the TSV liner 430 (operation S414).

Figure 16F:
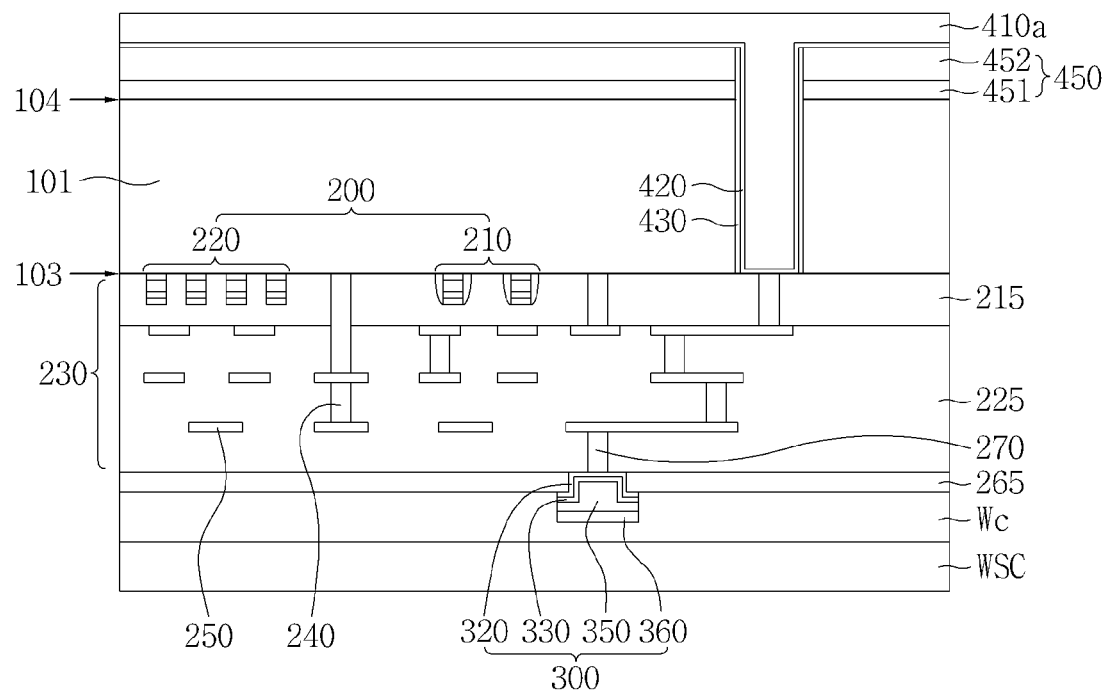

Referring to FIGS. 9I and 16F, the method of fabricating the semiconductor device according to the present embodiment of the inventive concepts may include forming a TSV core material layer 410a to fill the TSV hole 401 (operation S416). In FIG. 16F, a boundary between the TSV seed layer 425 and the TSV core material layer 410a is omitted.

Figure 16G:
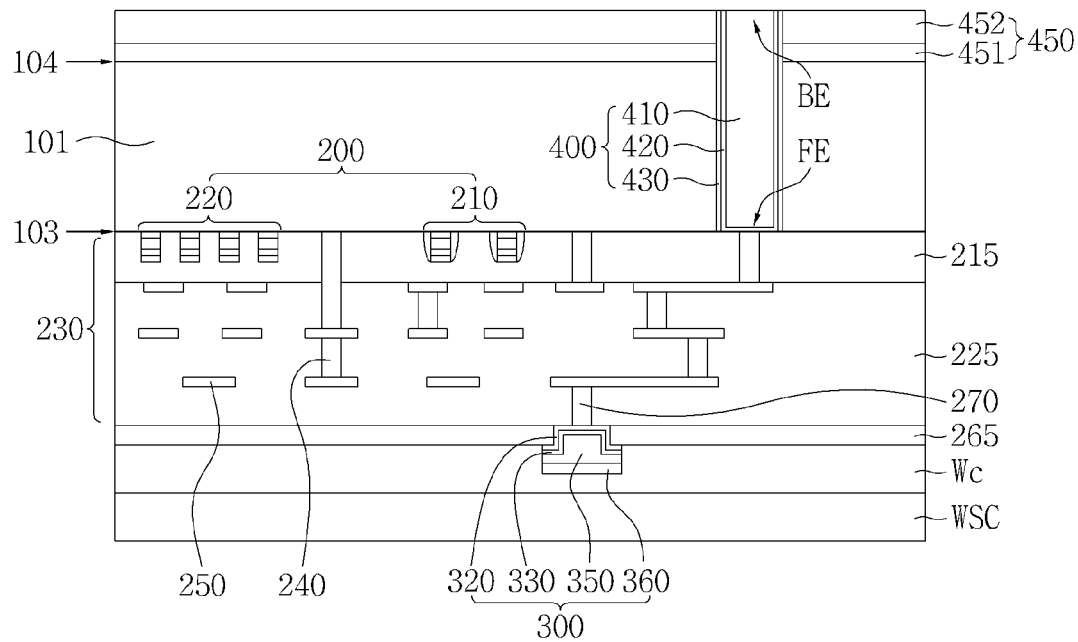

Referring to FIGS. 9I and 16G, the method of fabricating the semiconductor device according to the present embodiment of the inventive concepts may include forming a TSV structure 400 (operation S418). The formation of the TSV structure 400 may include removing the TSV core material layer 410a and the TSV barrier layer 420, which are formed on the upper TSV hole mask layer 452, using a CMP process and/or an etching process.

Figure 16H:
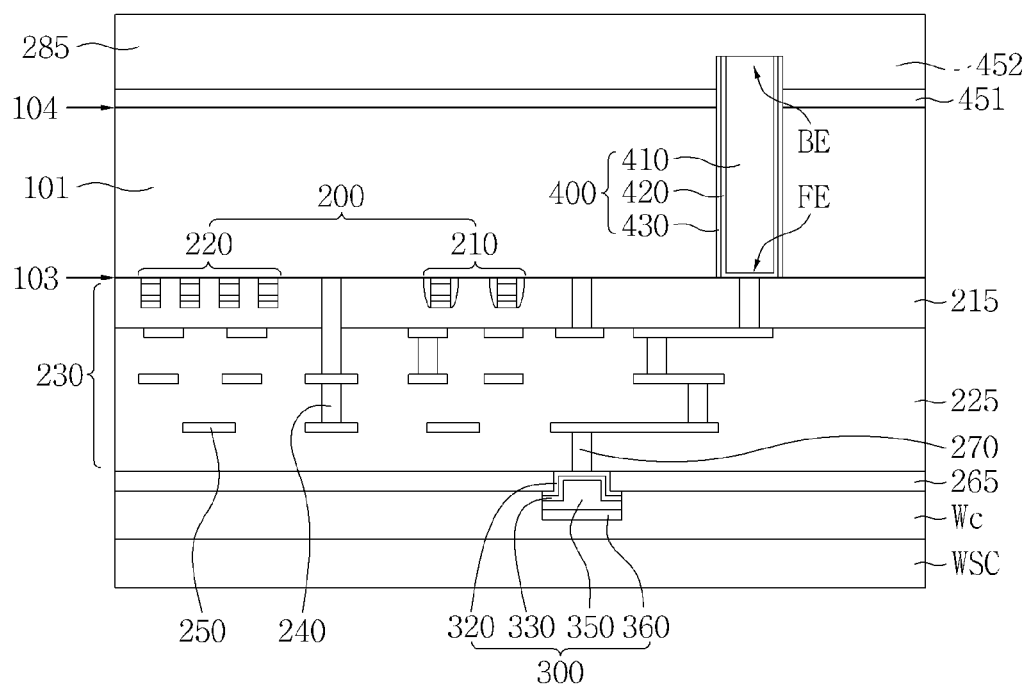

Referring to FIGS. 9I and 16H, the method of fabricating the semiconductor device according to the present embodiment of the inventive concepts may include forming a back-side insulating layer 285 to cover the exposed TSV structure 400 (operation S420). When the back-side insulating layer 285 and the upper TSV hole mask pattern 452 includes the same material, a boundary therebetween may disappear.

Figure 16I:
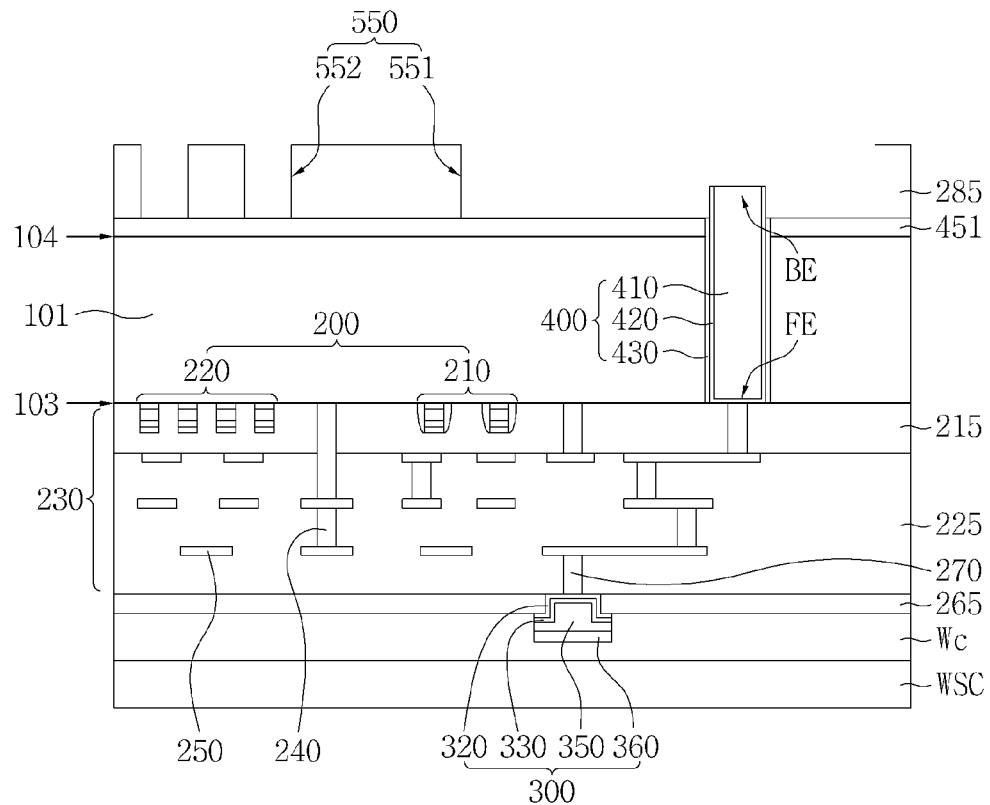

Referring to FIGS. 9I and 16I, the method of fabricating the semiconductor device according to the present embodiment of the inventive concepts may include forming a groove 550 in the back-side insulating layer 285 (operation S422). The groove 550 may include a redistribution groove 551 and an alignment key groove 552. The redistribution groove 551 may expose an end of the TSV structure 400. During this process, the TSV liner 430 formed on the exposed surface of the TSV structure 400 may be removed. For instance, the TSV barrier layer 420 may be exposed within the redistribution groove 551.

Figure 16J:
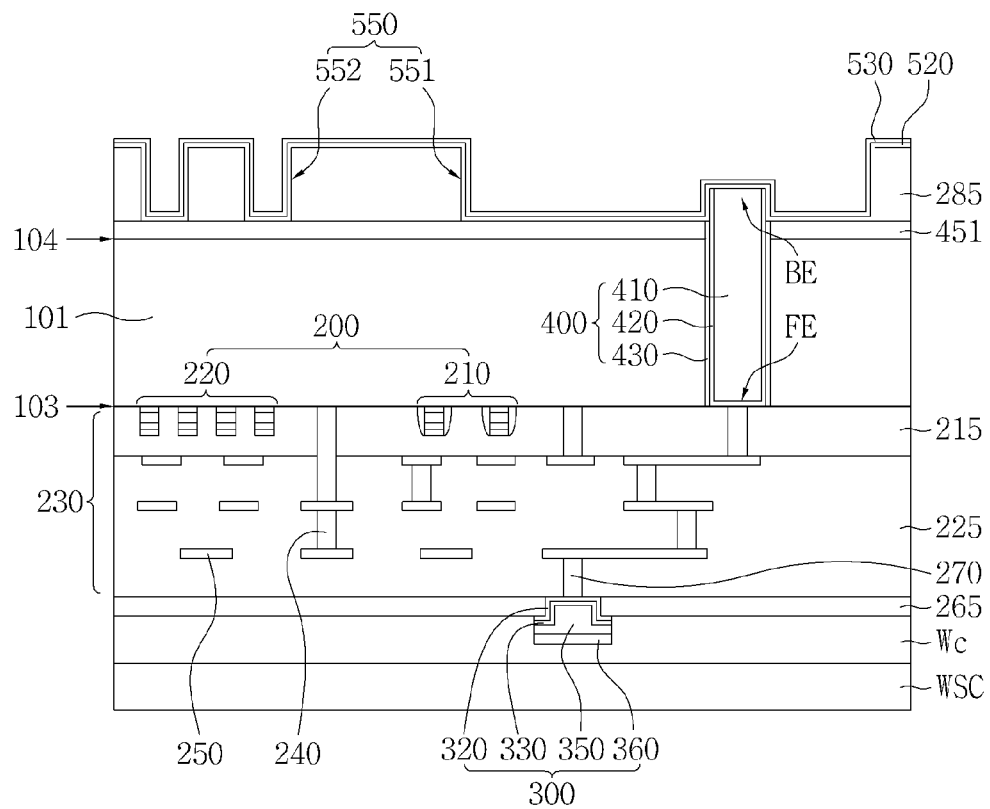

Referring to FIGS. 9I and 16J, the method of fabricating the semiconductor device according to the embodiment of the inventive concepts may include forming a redistribution barrier layer 520 and a redistribution seed layer 530 on the back-side insulating layer 285 (operation S424). The redistribution barrier layer 520 and the redistribution seed layer 530 may be conformally formed on a bottom surface and inner wall of the redistribution groove 551 and the exposed TSV structure 400.

Figure 16K:
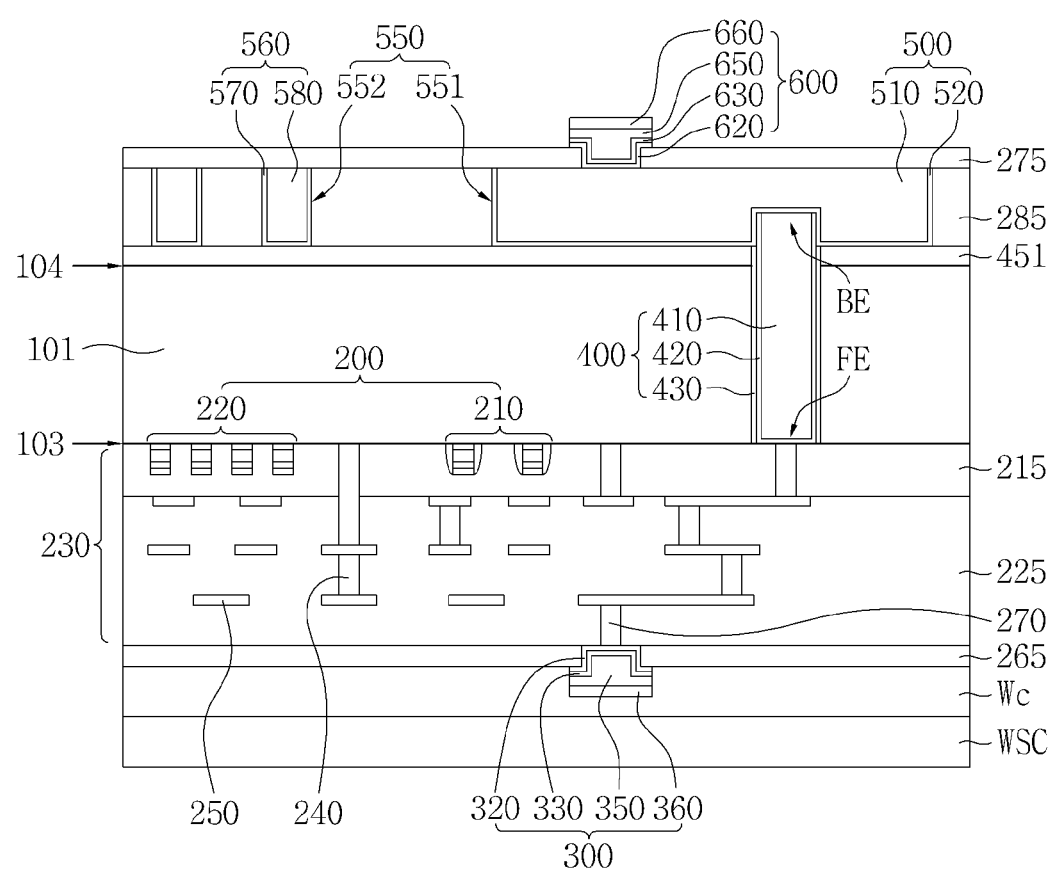

Referring to FIGS. 9J and 16K, the method of fabricating the semiconductor device according to the present embodiment of the inventive concepts may include forming a redistribution interconnection material layer 510a by performing the processes described with reference to FIGS. 9L and 10R through 10X (operation S426), forming a redistribution structure 500 (operation S428), forming a back-side passivation layer 275 having a lower I/O pad opening 611 to partially expose a surface of a redistribution interconnection 510 (operation S430), forming a back-side I/O pad barrier layer 620 and a back-side I/O pad seed layer 630 within the lower back-side I/O pad opening 611 and/or on the back-side passivation layer 275 (operation S432), forming a back-side I/O pad mask pattern 640 on the back-side I/O pad barrier layer 620 and the back-side I/O pad seed layer 630 (operation S434), forming a preliminary back-side I/O pad 600p (operation S436), and forming a back-side I/O pad 600 (operation S438). A boundary between the redistribution interconnection 510 and the interconnection seed layer 530 is exemplarily illustrated.

The methods of fabricating the semiconductor devices according to various embodiments of the inventive concepts may include forming the redistribution structure 500 formed using a damascene process. Thus, the redistribution barrier layer 520 may completely surround bottom and side surfaces of the redistribution interconnection 510. For example, when the redistribution barrier layer 520 is removed using a wet etching process or selective etching process, the redistribution barrier layer 520 may not completely surround the bottom or side surface of the redistribution interconnection 510, thus causing physical and/or electrical instability. The methods of fabricating the semiconductor devices according to various embodiments of the inventive concepts may adopt a CMP process instead of photolithography and etching processes. Thus, pitches of the TSV structures 400 and pitches of the redistribution structures 500 may become finer and more elaborate. In each of the methods of fabricating the semiconductor devices according to various embodiments of the inventive concepts, the TSV structure 400 may protrude into the redistribution structure 500. For instance, the TSV structure 400 may be inserted into the redistribution structure 500. Accordingly, a contact area between the TSV structure 400 and the redistribution structure 500 may increase so that a sheet resistance between the TSV structure 400 and the redistribution structure 500 can be reduced. Furthermore, since the redistribution structure 500 may be physically fixed by the TSV structure 400, a contact failure or separation of components due to a floating phenomenon may be prevented. In the methods of fabricating the semiconductor devices according to various embodiments of the inventive concepts, the redistribution structure 500 and the alignment key structure 560 may be simultaneously formed. An additional process of forming the alignment key structure 560 may be omitted. The redistribution groove 551 and the alignment key groove 552 may be simultaneously formed to the same depth. The redistribution barrier layer 520 and the alignment key barrier layer 570 may be simultaneously formed of the same material. The redistribution interconnection 510 and the alignment key pattern 580 may be simultaneously formed of the same material. Accordingly, processes for forming the semiconductor devices may be simplified to improve productivity and reduce fabrication cost.

FIGS. 17A through 17D are conceptual longitudinal cross-sectional views of stack structures 1000A to 1000D of semiconductor devices according to various embodiments of the inventive concepts.

Figure 17A:
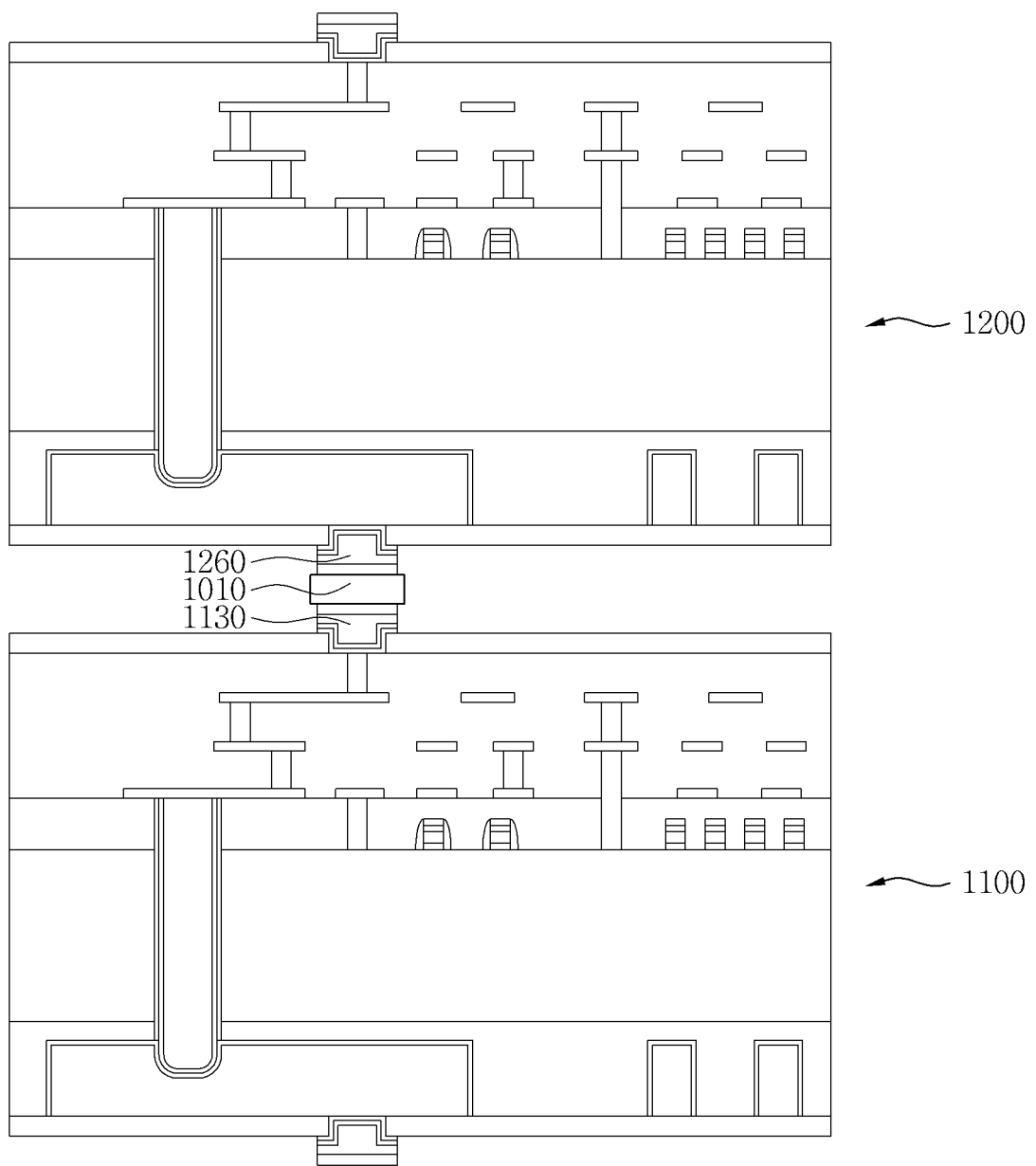
FIGS. 17A through 17D are conceptual longitudinal cross-sectional views of stack structures of semiconductor devices according to various embodiments of the inventive concepts.

Referring to FIG. 17A, a stack structure 1000A of semiconductor devices according to an embodiment of the inventive concepts may include a lower semiconductor device 1100 and an upper semiconductor device 1200. A front-side I/O pad 1130 of the lower semiconductor device 1100 and a back-side I/O pad 1260 of the upper semiconductor device 1200 may be electrically connected to each other using a bump 1010. For example, the semiconductor-device stack structure 1000A in which the front-side I/O pad 1130 of the lower semiconductor device 1100 and the back-side I/O pad 1260 of the upper semiconductor device 1200 may be electrically connected may be obtained. The bump 1010 may include a solder material. For example, the bump 1010 may include tin (Sn), silver (Ag), and copper (Cu). The bump 1010 may further include nickel (Ni). The lower and upper semiconductor devices 1100 and 1200 may have the same structure. For instance, the front-side I/O pad 1130 and back-side I/O pad 1260 may be vertically aligned with each other.

Figure 17B:
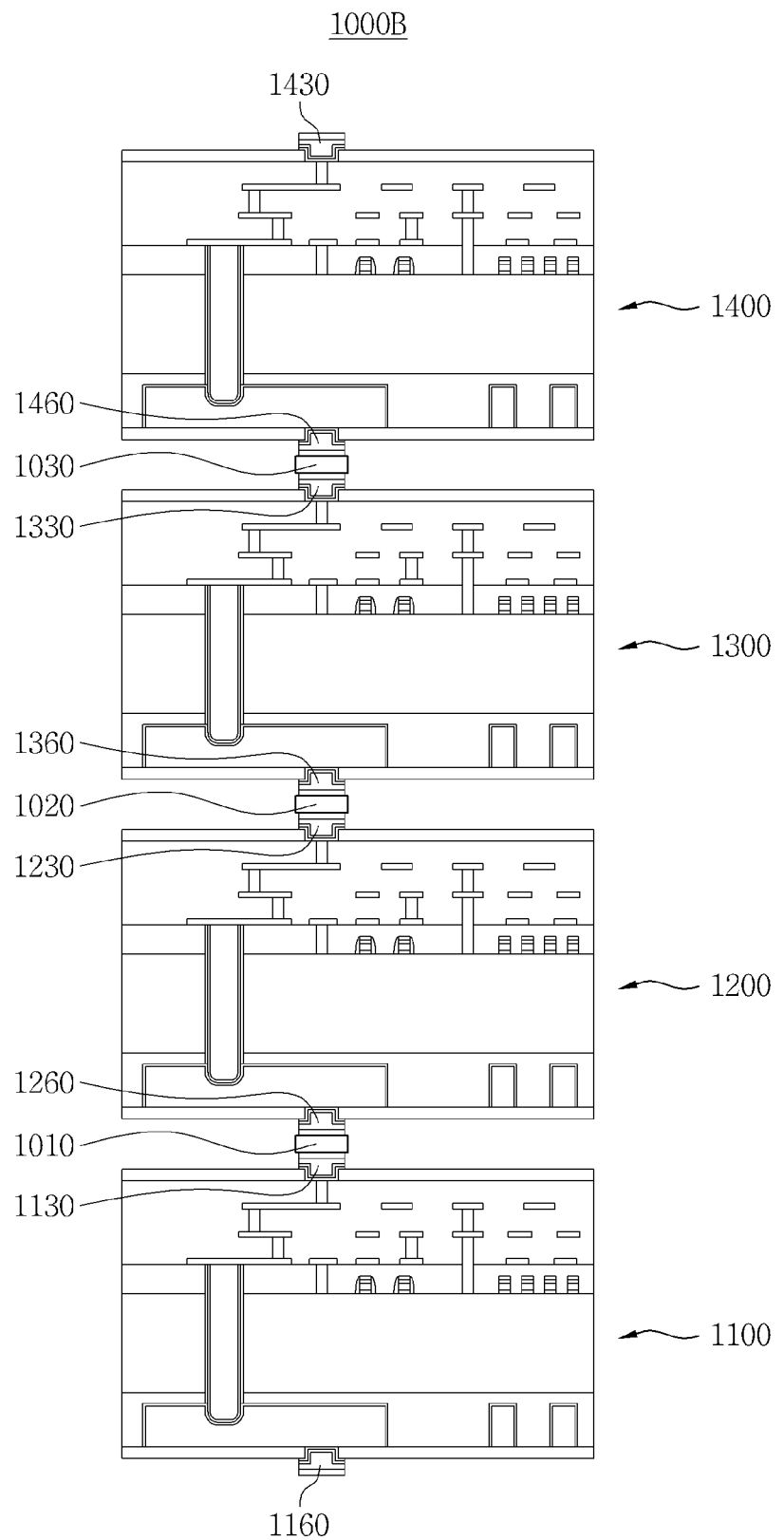

Referring to FIG. 17B, a stack structure 1000B of semiconductor devices according to another embodiment of the inventive concepts may include a plurality of semiconductor devices 1100, 1200, 1300, and 1400 stacked sequentially. For example, the stack structure 1000B may include a plurality of semiconductor devices 1100, 1200, 1300, and 1400 of the same structure. Front-side I/O pads 1130, 1230, 1330, and 1430 and back-side I/O pads 1160, 1260, 1360, and 1460 may be vertically aligned with one another. The stack structure 1000B of the semiconductor devices may include, for example, semiconductor devices in equal number to a power of two, such as 4, 8, 16, or 32. Adjacent ones of the front-side I/O pads 1130, 1230, 1330, and 1430 and the back-side I/O pads 1160, 1260, 1360, and 1460 may be physically and/or electrically connected to one another through bumps 1110, 1120, and 1130, respectively. For example, the front-side I/O pad 1130 of the lowermost semiconductor device 1100 may be electrically connected to the back-side I/O pad 1460 of the uppermost semiconductor device 1400.

Figure 17C:
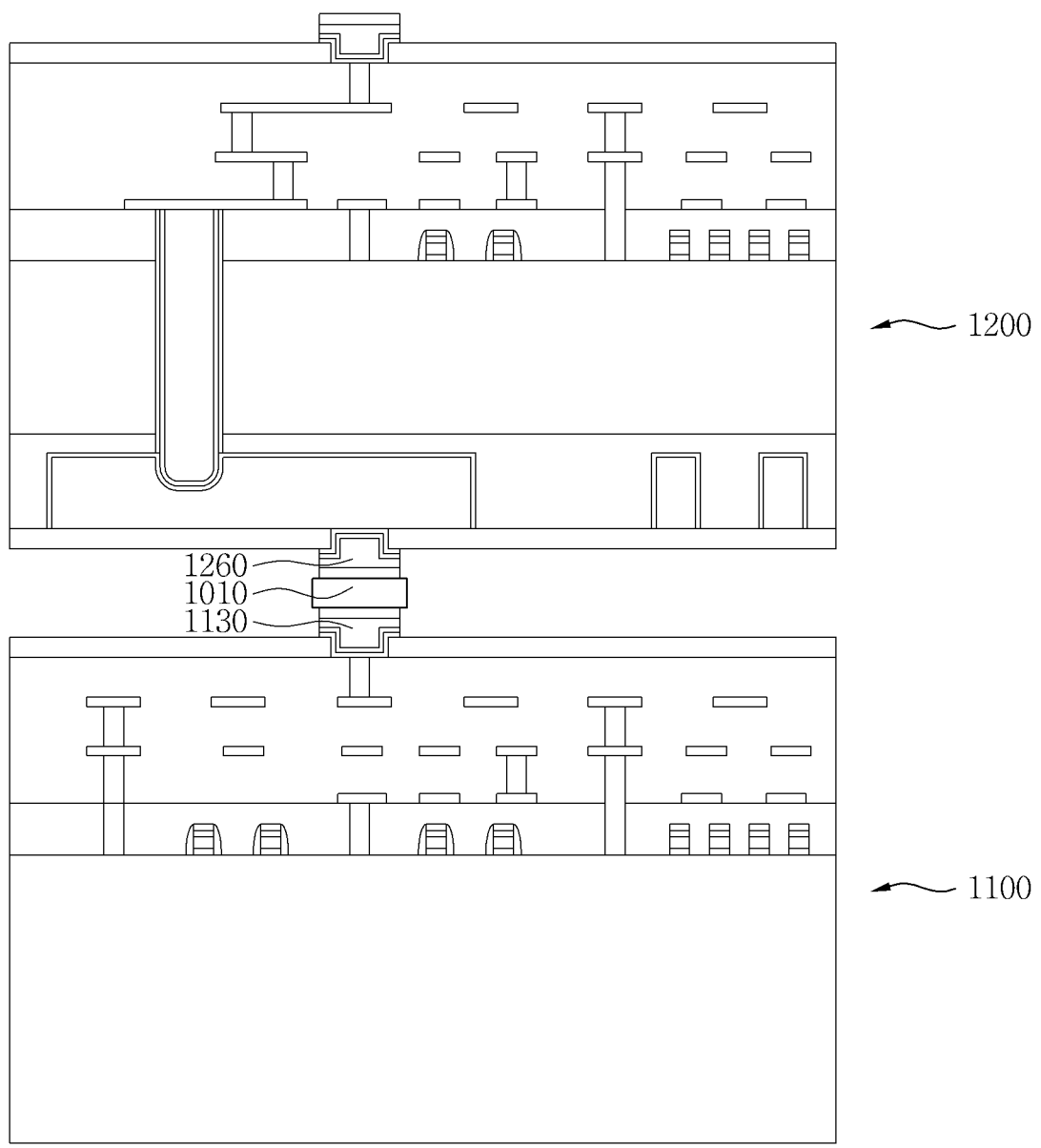

Referring to FIG. 17C, a stack structure 1000C of semiconductor devices according to another embodiment of the inventive concepts may include a lower semiconductor device 1100 and an upper semiconductor device 1200. For example, the lower semiconductor device 1100 may include a logic device, and the upper semiconductor device 1200 may include a memory device. For instance, a front-side I/O pad 1130 of the lower semiconductor device 1100 may be physically and/or electrically connected to a back-side I/O pad 1260 of the upper semiconductor device 1200.

Figure 17D:
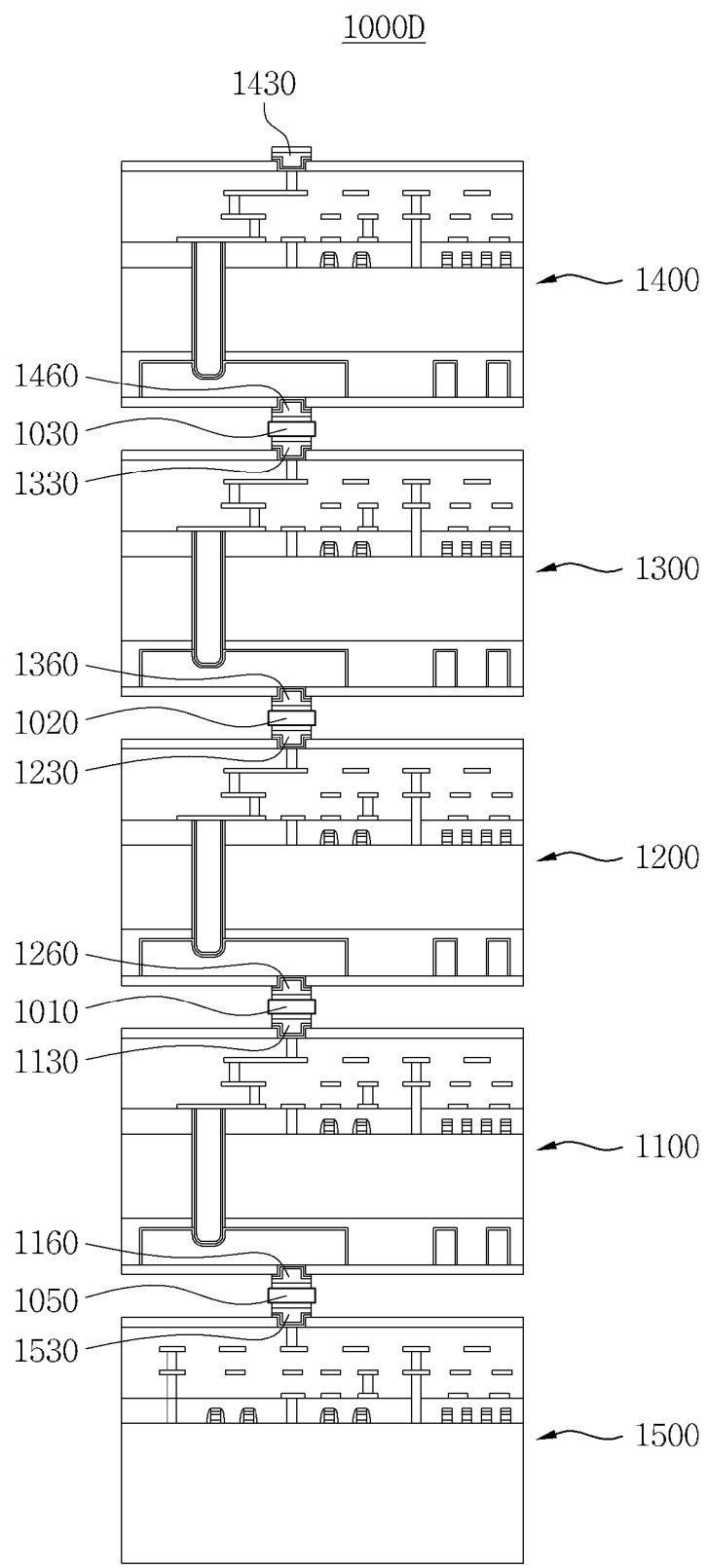

Referring to FIG. 17D, a stack structure 1000D of semiconductor devices according to another embodiment of the inventive concepts may include a lower semiconductor device 1500 and a plurality of upper semiconductor devices 1100, 1200, 1300, and 1400. For instance, the lower semiconductor device 1500 may include a logic device, and the upper semiconductor devices 1100, 1200, 1300, and 1400 may include memory devices. Front-side I/O pads 1130, 1230, 1330, and 1530 of the semiconductor devices 1100, 1200, 1300, 1400 and 1500 and back-side I/O pads 160, 1260, 1360, and 1460 of the semiconductor devices 1100, 1200, 1300, and 1400 may be electrically connected to one another using bumps 1010, 1020, 1030, and 1050.

Figure 18:
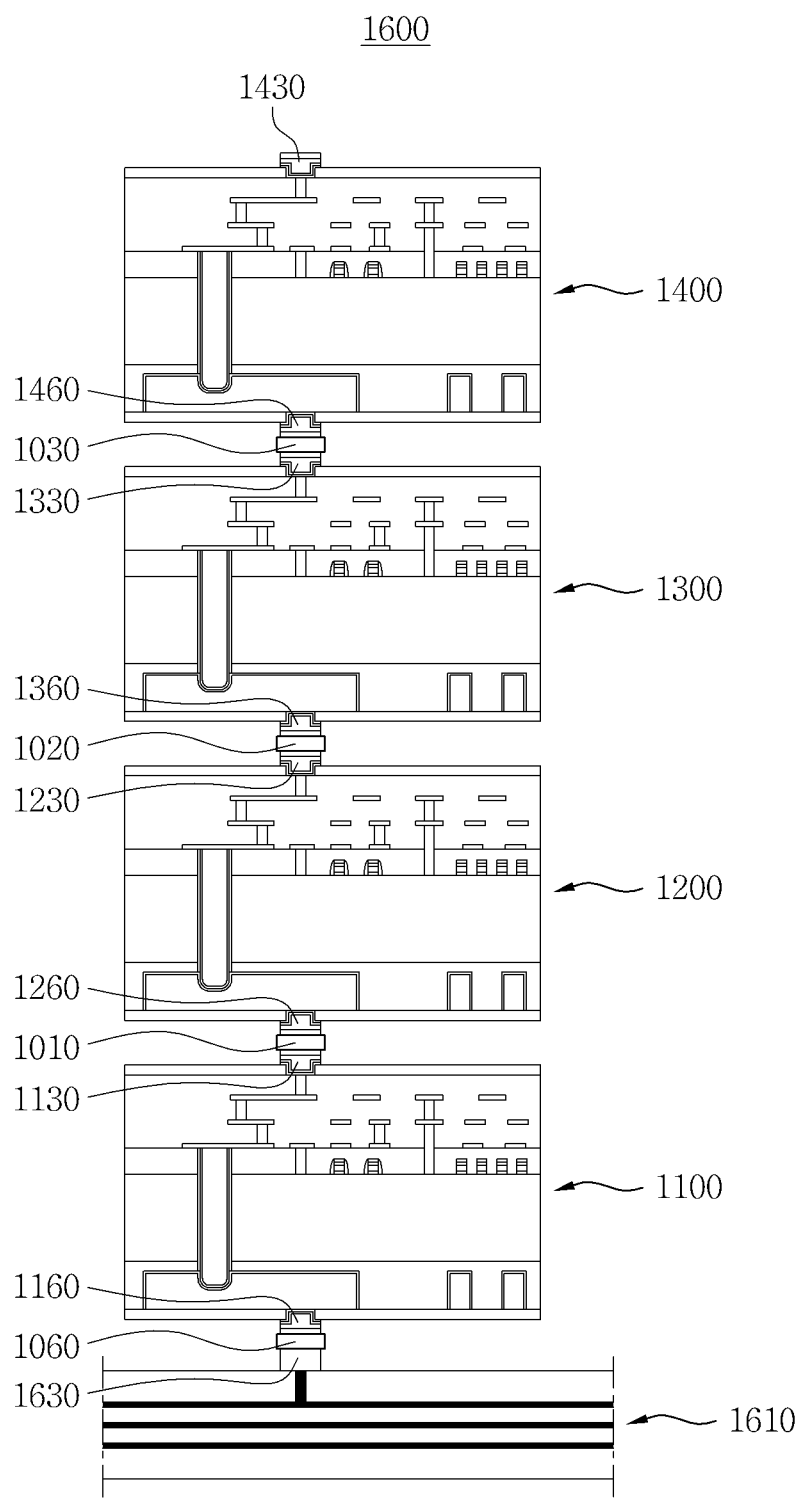
FIG. 18 is a conceptual longitudinal cross-sectional view of a semiconductor package according to an embodiment of the inventive concepts.

FIG. 18 is a conceptual longitudinal cross-sectional view of a semiconductor package 1600 according to an embodiment of the inventive concepts. Referring to FIG. 18, the semiconductor package 1600 according to the present embodiment of the inventive concepts may include a plurality of semiconductor devices 1100, 1200, 1300, and 1400 stacked on a package substrate 1610. For example, each of the semiconductor devices 1100, 1200, 1300, and 1400 may include a flash memory device. A back-side I/O pad 1160 of the lowermost semiconductor device 1100 may be electrically connected to a bump land 1630 of the package substrate 1610 using a bump 1060.

Figure 19:
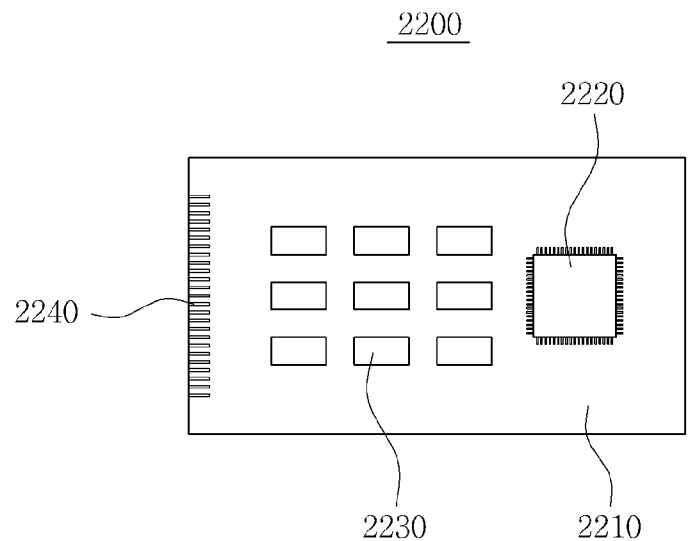
FIG. 19 is a conceptual diagram of a module including a semiconductor device according to an embodiment of the inventive concepts.

FIG. 19 is a conceptual diagram of a module 2200 including a semiconductor device according to an embodiment of the inventive concepts, according to an embodiment of the inventive concepts. Referring to FIG. 19, the module 2200 according to the embodiment of the inventive concepts may include a semiconductor package 2030 mounted on a module substrate 2210. The semiconductor package 2230 may include at least one of the via connection structures 10A to 10S or semiconductor devices 100A to 100Q according to various embodiments of the inventive concepts. The module 2200 may further include a microprocessor (MP) 2220 mounted on the module substrate 2210. Input/output (I/O) terminals 2240 may be disposed on at least one side of the module substrate 2210.

Figure 20:
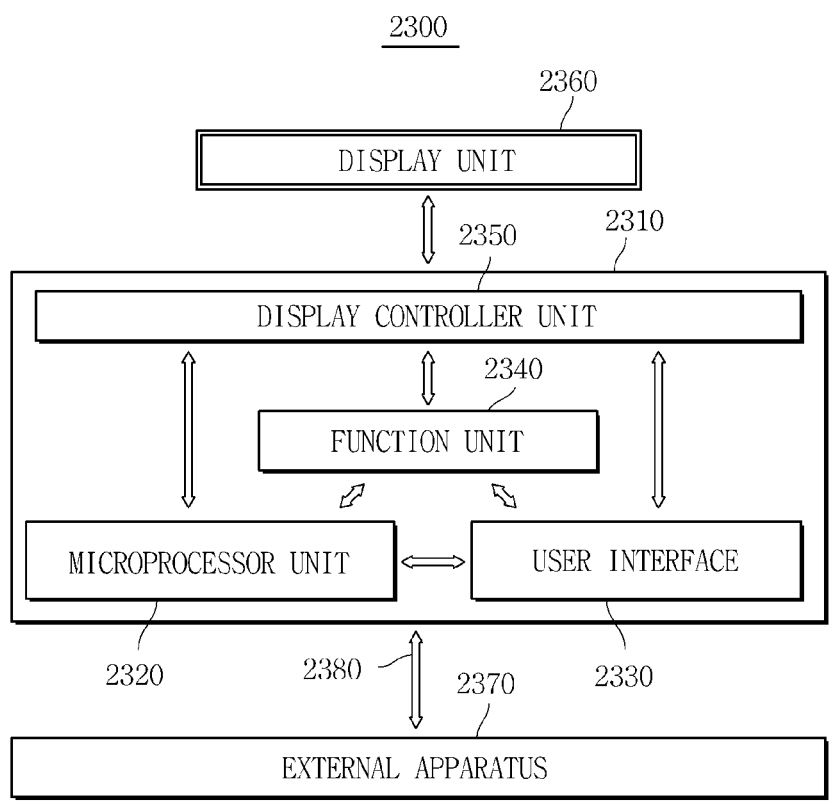
FIGS. 20 and 21 are conceptual block diagrams of electronic systems including at least one of via connection structures or semiconductor devices according to various embodiments of the inventive concepts.

FIG. 20 is a conceptual block diagram of an electronic system 2300 including at least one of the via connection structures 10A to 10S or semiconductor devices 100A to 100Q according to various embodiments of the inventive concepts. Referring to FIG. 20, the via connection structures 10A to 10S or semiconductor devices 100A to 100Q according to various embodiments of the inventive concepts may be applied to the electronic system 2300. The electronic system 2300 may include a body 2310, an MP unit 2320, a power supply 2330, a function unit 2340, and/or a display controller unit 2350. The body 2310 may include a system board or mother board including a printed circuit board (PCB). The MP unit 2320, the power supply 2330, the function unit 2340, and the display controller unit 2350 may be mounted on the body 2310. The display unit 2360 may be disposed on a top surface of the body 2310 or outside the body 2310. For example, the display unit 2360 may be disposed on a surface of the body 2310 and display an image processed by the display controller unit 2350. The power supply 2330 may receive a predetermined voltage from an external battery (not shown), divide the voltage into voltages having required voltage levels, and supply the divided voltages to the MP unit 2320, the function unit 2340, and the display controller unit 2350. The MP unit 2320 may receive a voltage from the power supply 2330 and control the function unit 2340 and the display unit 2360. The function unit 2340 may serve various functions of the electronic system 2300. For example, when the electronic system 2300 is a mobile electronic product, such as a portable phone, the function unit 2340 may include several components capable of serving wireless communication functions, for example, outputting an image to the display unit 2360 or outputting a voice to a speaker, by dialing or communicating with an external apparatus 2370. When a camera is also mounted, the function unit 2340 may serve as an image processor. In applied embodiments, when the electronic system 2300 is connected to a memory card to increase capacity, the function unit 2340 may be a memory card controller. The function unit 2340 may transmit and receive signals to and from the external apparatus 2370 through a wired or wireless communication unit 2380. Furthermore, when the electronic system 2300 requires a universal serial bus (USB) to increase functionality, the function unit 2340 may serve as an interface controller. At least one of the via connection structures 10A to 10S or semiconductor devices 100A to 100Q described in the various embodiments of the inventive concepts may be included in the function unit 2340.

Figure 21:
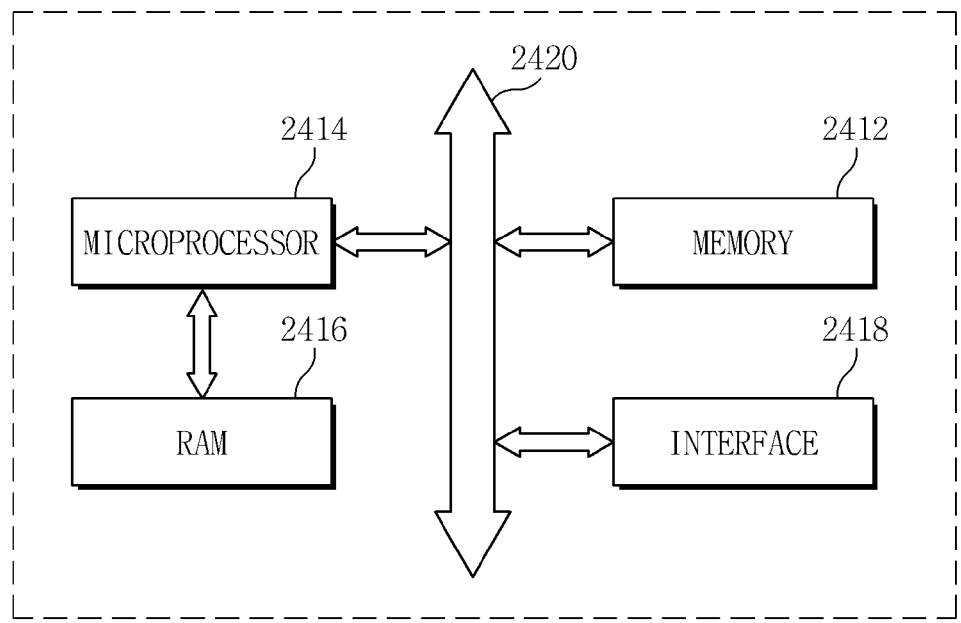

FIG. 21 is a conceptual block diagram of an electronic system 2400 including at least one of the via connection structures 10A to 10S or semiconductor devices 100A to 100Q according to various embodiments of the inventive concepts. Referring to FIG. 21, the electronic system 2400 may include at least one of the via connection structures 10A to 10S or semiconductor devices 100A to 100Q according to various embodiments of the inventive concepts. The electronic system 2400 may be applied to a mobile device or computer. For example, the electronic system 2400 may include a memory system 2412, an MP 2414, a random access memory (RAM) 2416, and a user interface 2418, which may perform data communication using a bus 2420. The MP 2414 may program and control the electronic system 2400. The RAM 2416 may be used as an operation memory of the MP 2414. For example, the MP 2414 or the RAM 2416 may include at least one of the via connection structures 10A to 10S or semiconductor devices 100A to 100Q according to the embodiments of the inventive concepts. The MP 2414, the RAM 2416, and/or other components may be assembled within a single package. The user interface 2418 may be used to input data to the electronic system 2400 or output data from the electronic system 2400. The memory system 2412 may store codes for operating the MP 2414, data processed by the MP 2414, or external input data. The memory system 2412 may include a controller and a memory.

Figure 22:
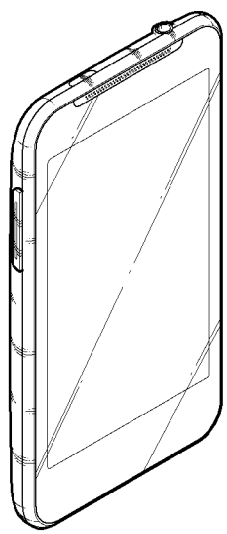
FIG. 22 is a schematic diagram of a wireless mobile phone including at least one of via connection structures or semiconductor devices according to various embodiments of the inventive concepts.

FIG. 22 is a schematic diagram of a wireless mobile phone 2500 including at least one of the via connection structures 10A to 10S or semiconductor devices 100A to 100Q according to various embodiments of the inventive concepts. The wireless mobile phone 2500 may be interpreted as a tablet personal computer (PC). In addition, at least one of the semiconductor packages according to various embodiments of the inventive concepts may be used not only for a tablet PC but also for a portable computer such as a laptop computer, an MPEG-1 audio layer 3 (MP3) player, an MP4 player, a navigation device, a solid-state disk (SSD), a table computer, or electronic devices for automotive and household uses.

Each of via connection structures according to various embodiments of the inventive concepts can include an interconnection barrier layer configured to completely surround bottom and side surfaces of an interconnection. Thus, physical and/or electrical contact stability between the interconnection and the interconnection barrier layer can be improved. Since the via connection structures according to the various embodiments of the inventive concepts can be planarly formed using a CMP process, pitches of via structures and pitches of interconnection structures can become finer and more elaborate.

In each of the via connection structures according to various embodiments of the inventive concepts, the via structure can protrude into the interconnection structure so that a sheet resistance between the via structure and the interconnection structure can be reduced. Furthermore, since the interconnection structure can be physically fixed by the via structure, a contact failure or separation of components due to a floating phenomenon can be prevented.

Each of semiconductor devices according to various embodiments of the inventive concepts can include a redistribution barrier layer configured to completely surround bottom and side surfaces of a redistribution interconnection. Thus, physical and/or electrical contact stability between the redistribution interconnection and the redistribution barrier layer can be improved. Since the semiconductor devices according to various embodiments of the inventive concepts can be planarly formed using a CMP process, pitches of TSV structures and pitches of redistribution structures can be finer and more elaborate.

In each of the semiconductor devices according to various embodiments of the inventive concepts, the TSV structure can protrude into the redistribution structure so that a sheet resistance between the TSV structure and the redistribution structure can be reduced. Furthermore, since the redistribution structure can be physically fixed by the TSV structure, a contact failure or separation of components due to a floating phenomenon can be prevented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

We claim:

1. A semiconductor device, comprising:
a silicon substrate;
an insulating layer on a first side of the silicon substrate;
an interconnection structure in the insulating layer;
   a via structure vertically penetrating the silicon substrate, the via structure protruding into the insulating layer and the interconnection structure;
an internal circuit structure on a second side of the silicon substrate, the second side being opposite the first side, the internal circuit structure including:
   unit devices, and
   internal connection structures, at least one of the internal connection structures electrically connecting the via structure to a second side pad, and at least one internal connection structure electrically connecting the via structure to at least one of the unit devices; and
the second side pad on the internal circuit structure.

2. The semiconductor device of claim 1, further comprising an insulating material between the silicon substrate and the insulating layer.

3. The semiconductor device of claim 1, wherein a portion of the via structure includes a via core, a via barrier layer on the via core, and a via liner on the via barrier layer.

4. The semiconductor device of claim 1, wherein the interconnection structure includes an interconnection barrier layer lining a groove in the insulating layer and covering a portion of the via structure; the interconnection structure includes an interconnection filling a remainder of the groove.

5. The semiconductor device of claim 4, wherein the via structure protrudes into the interconnection.

6. The semiconductor device of claim 1, wherein a portion of the via structure in the interconnection structure forms an end of the via structure, and the end is rounded.

7. The semiconductor device of claim 1, wherein a portion of the via structure in the interconnection structure forms an end of the via structure, and the end is planar.

8. The semiconductor device of claim 1, wherein:
the interconnection structure includes a via region, a pad region and an interconnection region, the interconnection region electrically connects the via region and the pad region;
a pad is on the pad region; and
the via structure protrudes into the via region.

9. The semiconductor device of claim 8, wherein:
the via region and the pad region have greater horizontal widths than a horizontal width of the interconnection region, and the via region has at least one portion with a greater horizontal width than the horizontal width of the pad region.

10. The semiconductor device of claim 1, further comprising:
a first side pad on the interconnection structure; and
an alignment key structure in the insulating layer.

11. The semiconductor device of claim 1, wherein:
the internal circuit structure includes,
    a first interlayer insulating layer on the second side of the silicon substrate, the first interlayer insulating layer covering at least one of the unit devices, and
    a second interlayer insulating layer on the first interlayer insulating layer, the second interlayer insulating layer covering at least one of the internal connection structures; and
the via structure is in at least a portion of the first interlayer insulating layer and not the second interlayer insulating layer.

12. The semiconductor device of claim 1, wherein:
the internal circuit structure includes,
    a first interlayer insulating layer on the second side of the silicon substrate, the first interlayer insulating layer covering at least one of the unit devices, and
    a second interlayer insulating layer on the first interlayer insulating layer, the second interlayer insulating layer covering at least one of the internal connection structures; and
the via structure is not in the first interlayer insulating layer and is not in the second interlayer insulating layer.

13. The semiconductor device of claim 1, wherein the insulating layer is a single layer.

14. The semiconductor device of claim 1, wherein:
the insulating layer includes a first insulating layer on the silicon substrate, and a second insulating layer on the first insulating layer;
the interconnection structure is only in the second insulating layer.

15. The semiconductor device of claim 14, wherein the first insulating layer is disposed between the via structure and the second insulating layer.

16. The semiconductor device of claim 14, wherein:
the interconnection structure includes an interconnection barrier layer lining a groove in the insulating layer and covering a portion of the via structure;
the interconnection structure includes an interconnection filling a remainder of the groove.

17. The semiconductor device of claim 16, wherein the via structure protrudes into the interconnection.

18. The semiconductor device of claim 14, wherein:
the interconnection structure includes a via region, a pad region and an interconnection region, the interconnection region electrically connects the via region and the pad region;
a pad is on the pad region; and
the via structure protrudes into the via region.

19. The semiconductor device of claim 18, wherein:
the via region and the pad region have greater horizontal widths than a horizontal width of the interconnection region, and the via region has at least one portion with a greater horizontal width than the horizontal width of the pad region.

20. A semiconductor device, comprising:
a silicon substrate;
a MOS transistor on a front-side of the silicon substrate;
interlayer insulating layers covering the MOS transistor on the front-side of the silicon substrate;
a front-side passivation layer on the interlayer insulating layers;
a front-side I/O pad on the front-side passivation layer;
a back-side insulating layer on a back-side of the silicon substrate;
a back-side interconnection structure in the back-side insulating layer; and
a via structure vertically penetrating the silicon substrate and the back-side insulating layer,
wherein a back-side end of the via structure protrudes into the back-side interconnection structure.

21. The semiconductor device of claim 20, wherein the interlayer insulating layer includes:
a first interlayer insulating layer covering the MOS transistor; and
a second interlayer insulating layer on the first insulating layer,
wherein the via structure penetrates the first interlayer insulating layer and does not penetrates the second interlayer insulating layer, and
wherein a front-side end of the via structure and the first interlayer insulating layer are co-planar.

22. The semiconductor device of claim 21, further comprising:
a via pad on the front-side end of the via structure and the first interlayer insulating layer; and
a back-side I/O pad on the back-side interconnection.

23. The semiconductor device of claim 21, further comprising:
an inner via and an inner interconnection in the second interlayer insulating layer,
wherein the inner via and the inner interconnection electrically connect the via structure to the front-side I/O pad.

24. A semiconductor device comprising:
a substrate having a first side and a second side opposite the first side;
a first insulating layer on the first side of the silicon substrate;
a first interconnection structure in the first insulating layer;
a first passivation layer on the first insulating layer;
a first pad on the first passivation layer, the first pad being electrically connected to the first interconnection structure;
a second insulating layer on the second side of the silicon substrate;
a second interconnection structure in the second insulating layer;

a second passivation layer on the second insulating layer and the second interconnection structure;

a second pad on the second passivation layer, the second pad being electrically connected to the second interconnected structure; and a via structure vertically penetrating from the first side of the substrate to the second side of the substrate, wherein the via structure has a first end nearing the first side of the substrate, and a second end nearing the second side of the substrate and protruding into the second interconnection structure.

25. The semiconductor device of claim 24, further comprising:

a via pad on the first end of the via structure, the via pad being electrically connected to the first pad, wherein the second interconnection structure comprises:
an interconnection barrier layer; and
an interconnection,
wherein the interconnection barrier layer conformably covers an end protruding into the second interconnection structure.

* * * * *